(12) United States Patent
Xiong et al.

(10) Patent No.: US 10,281,092 B2
(45) Date of Patent: May 7, 2019

(54) LED TUBE LAMP

(71) Applicant: JIAXING SUPER LIGHTING ELECTRIC APPLIANCE CO., LTD, Jiaxing (CN)

(72) Inventors: Aiming Xiong, Jiaxing (CN); Xintong Liu, Jiaxing (CN)

(73) Assignee: Jiaxing Super Lighting Electric Appliance Co., Ltd., Jiaxing, Zhejiang (CN)

( * ) Notice: Subject to any disclaimer, the term of this patent is extended or adjusted under 35 U.S.C. 154(b) by 0 days.

(21) Appl. No.: 16/106,060

(22) Filed: Aug. 21, 2018

(65) Prior Publication Data

US 2019/0017661 A1    Jan. 17, 2019

Related U.S. Application Data

(63) Continuation of application No. 15/662,094, filed on Jul. 27, 2017, now Pat. No. 10,054,271, which is a
(Continued)

(30) Foreign Application Priority Data

| Mar. 10, 2015 | (CN) | 2015 1 0104823 |
|---|---|---|
| Mar. 25, 2015 | (CN) | 2015 1 0133689 |
| Mar. 26, 2015 | (CN) | 2015 1 0134586 |
| Apr. 3, 2015 | (CN) | 2015 1 0155807 |
| Apr. 22, 2015 | (CN) | 2015 1 0193980 |
| May 29, 2015 | (CN) | 2015 1 0284720 |
| Jun. 17, 2015 | (CN) | 2015 1 0338027 |
| Jun. 26, 2015 | (CN) | 2015 1 0364735 |
| Jun. 26, 2015 | (CN) | 2015 1 0373492 |
| Jun. 29, 2015 | (CN) | 2015 1 0378322 |
| Jul. 10, 2015 | (CN) | 2015 1 0406595 |
| Jul. 20, 2015 | (CN) | 2015 1 0428680 |

(Continued)

(51) Int. Cl.
*H05B 37/00* (2006.01)
*H05B 41/00* (2006.01)
(Continued)

(52) U.S. Cl.
CPC ............. *F21K 9/278* (2016.08); *F21K 9/272* (2016.08); *F21K 9/275* (2016.08); *F21V 3/061* (2018.02);
(Continued)

(58) Field of Classification Search
None
See application file for complete search history.

(56) References Cited

U.S. PATENT DOCUMENTS 9,480,123 B2 * 10/2016 Van Dijk ............ H05B 33/0884
10,117,296 B1    10/2018 Zhao
(Continued)

*Primary Examiner* — Anh Q Tran
(74) *Attorney, Agent, or Firm* — Muir Patent Law, PLLC

(57) ABSTRACT

An LED tube lamp is disclosed. The LED tube lamp is a ballast-bypass LED tube lamp that includes a lamp tube, two end caps, an LED module, and a power supply module including an electric shock detection circuit. The electric shock detection circuit is capable of forming a current path electrically connected to a power loop of the LED tube lamp for detecting whether a human touches the conductive part of the LED tube lamp when one end of the LED tube lamp has been inserted into a lamp socket.

33 Claims, 37 Drawing Sheets

Related U.S. Application Data continuation-in-part of application No. 15/626,238, filed on Jun. 19, 2017, which is a continuation of application No. 15/373,388, filed on Dec. 8, 2016, now Pat. No. 9,689,536, which is a continuation-in-part of application No. 15/339,221, filed on Oct. 31, 2016, now Pat. No. 9,939,140, and a continuation-in-part of application No. 15/211,813, filed on Jul. 15, 2016, now Pat. No. 9,756,698, said application No. 15/339,221 is a continuation-in-part of application No. 15/210,989, filed on Jul. 15, 2016, now Pat. No. 9,587,817, which is a continuation-in-part of application No. 15/205,011, filed on Jul. 8, 2016, now Pat. No. 9,629,211, which is a continuation-in-part of application No. 15/150,458, filed on May 10, 2016, now Pat. No. 9,794,990, said application No. 15/211,813 is a continuation-in-part of application No. 15/150,458, filed on May 10, 2016, now Pat. No. 9,794,990, said application No. 15/373,388 is a continuation-in-part of application No. 15/084,483, filed on Mar. 30, 2016, now Pat. No. 9,521,718, and a continuation-in-part of application No. 15/065,892, filed on Mar. 10, 2016, now Pat. No. 9,526,145, said application No. 15/210,989 is a continuation-in-part of application No. 15/066,645, filed on Mar. 10, 2016, now Pat. No. 9,497,821, which is a continuation-in-part of application No. 14/865,387, filed on Sep. 25, 2015, now Pat. No. 9,609,711, said application No. 15/065,892 is a continuation-in-part of application No. 14/865,387, filed on Sep. 25, 2015, now Pat. No. 9,609,711, said application No. 15/150,458 is a continuation-in-part of application No. 14/865,387, filed on Sep. 25, 2015, now Pat. No. 9,609,711, said application No. 15/084,483 is a continuation-in-part of application No. 14/865,387, filed on Sep. 25, 2015, now Pat. No. 9,609,711.

(30) Foreign Application Priority Data

| Date | | Number |
|---|---|---|
| Jul. 27, 2015 | (CN) | 2015 1 0448220 |
| Aug. 8, 2015 | (CN) | 2015 1 0486115 |
| Aug. 14, 2015 | (CN) | 2015 1 0499512 |
| Aug. 26, 2015 | (CN) | 2015 1 0530110 |
| Sep. 6, 2015 | (CN) | 2015 1 0557717 |
| Sep. 18, 2015 | (CN) | 2015 1 0595173 |
| Sep. 25, 2015 | (CN) | 2015 1 0617370 |
| Oct. 8, 2015 | (CN) | 2015 1 0645134 |
| Oct. 27, 2015 | (CN) | 2015 1 0705222 |
| Oct. 30, 2015 | (CN) | 2015 1 0726365 |
| Nov. 27, 2015 | (CN) | 2015 1 0848766 |
| Dec. 9, 2015 | (CN) | 2015 1 0903680 |
| Jan. 22, 2016 | (CN) | 2016 1 0044148 |
| Jan. 26, 2016 | (CN) | 2016 1 0050944 |
| Jan. 26, 2016 | (CN) | 2016 1 0051691 |
| Feb. 15, 2016 | (CN) | 2016 1 0085895 |
| Feb. 16, 2016 | (CN) | 2016 1 0087627 |
| Feb. 23, 2016 | (CN) | 2016 1 0098424 |
| Mar. 3, 2016 | (CN) | 2016 1 0120993 |
| Mar. 9, 2016 | (CN) | 2016 1 0132513 |
| Mar. 14, 2016 | (CN) | 2016 1 0142140 |
| Mar. 25, 2016 | (CN) | 2016 1 0177706 |
| Apr. 29, 2016 | (CN) | 2016 1 0281812 |
| May 18, 2016 | (CN) | 2016 1 0327806 |
| Jun. 14, 2016 | (CN) | 2016 1 0420790 |
| Jun. 20, 2016 | (CN) | 2016 1 0452437 |
| Oct. 8, 2016 | (CN) | 2016 1 0876593 |
| Oct. 8, 2016 | (CN) | 2016 1 0878349 |
| Oct. 12, 2016 | (CN) | 2016 1 0890527 |
| Oct. 27, 2016 | (CN) | 2016 1 0955338 |
| Oct. 27, 2016 | (CN) | 2016 1 0955342 |
| Nov. 3, 2016 | (CN) | 2016 1 0975119 |
| Nov. 25, 2016 | (CN) | 2016 1 1057357 |
| Jan. 19, 2017 | (CN) | 2017 1 0036966 |
| Mar. 16, 2017 | (CN) | 2017 1 0158971 |
| Mar. 21, 2017 | (CN) | 2017 1 0170620 |
| Apr. 19, 2017 | (CN) | 2017 1 0258874 |
| Apr. 28, 2017 | (CN) | 2017 1 0295599 |
| Jul. 19, 2017 | (CN) | 2017 1 0591551 |

(51) Int. Cl.

| | |
|---|---|
| *F21K 9/278* | (2016.01) |
| *F21K 9/272* | (2016.01) |
| *H05B 33/08* | (2006.01) |
| *F21V 25/02* | (2006.01) |
| *F21V 29/70* | (2015.01) |
| *F21V 23/02* | (2006.01) |
| *F21V 23/00* | (2015.01) |
| *F21V 15/015* | (2006.01) |
| *F21K 9/275* | (2016.01) |
| *H05K 1/00* | (2006.01) |
| *F21V 3/06* | (2018.01) |
| *F21Y 103/10* | (2016.01) |
| *F21Y 115/10* | (2016.01) |
| *F21V 29/83* | (2015.01) |

(52) U.S. Cl.

CPC .......... *F21V 15/015* (2013.01); *F21V 23/003* (2013.01); *F21V 23/005* (2013.01); *F21V 23/023* (2013.01); *F21V 25/02* (2013.01); *F21V 29/70* (2015.01); *H05B 33/0803* (2013.01); *H05B 33/0815* (2013.01); *H05B 33/0845* (2013.01); *H05B 33/0857* (2013.01); *H05B 33/0884* (2013.01); *H05B 33/0887* (2013.01); *H05K 1/00* (2013.01); *F21V 23/02* (2013.01); *F21V 29/83* (2015.01); *F21Y 2103/10* (2016.08); *F21Y 2115/10* (2016.08); *Y02B 20/346* (2013.01)

(56) References Cited

U.S. PATENT DOCUMENTS

| | | | |
|---|---|---|---|
| 2011/0228526 A1* | 9/2011 | Hartikka | H05B 33/0803 362/221 |
| 2015/0181661 A1* | 6/2015 | Hsia | F21V 25/04 315/160 |

* cited by examiner

LED TUBE LAMP

RELATED APPLICATIONS

This application is a Continuation application of U.S. patent application Ser. No. 15/662,094, filed on Jul. 27, 2017, which is a Continuation-In-Part application of U.S. patent application Ser. No. 15/626,238, filed on Jun. 19, 2017, which is a Continuation application of U.S. patent application Ser. No. 15/373,388, filed on Dec. 8, 2016, which is a Continuation-In-Part application of U.S. patent application Ser. No. 15/339,221, filed on Oct. 31, 2016, U.S. patent application Ser. No. 15/211,813, filed on Jul. 15, 2016, U.S. patent application Ser. No. 15/084,483, filed on Mar. 30, 2016, and U.S. patent application Ser. No. 15/065,892, filed on Mar. 10, 2016. U.S. patent application Ser. No. 15/339,221 is also a Continuation-In-Part application of U.S. patent application Ser. No. 15/210,989, filed on Jul. 15, 2016, which is a Continuation-In-Part application of U.S. patent application Ser. No. 15/066,645, filed on Mar. 10, 2016, which is a Continuation-In-Part application of U.S. patent application Ser. No. 14/865,387, filed on Sep. 25, 2015, the disclosure of each of which is incorporated in its entirety by reference herein. U.S. patent application Ser. No. 15/210,989, filed on Jul. 15, 2016 is also a Continuation-In-Part application of U.S. patent application Ser. No. 15/205,011, filed on Jul. 8, 2016, which is a Continuation-In-Part application of U.S. patent application Ser. No. 15/150,458, filed on May 10, 2016, which is a Continuation-In-Part Ser. No. 14/865,387, filed on Sep. 25, 2015, the disclosure of each of which is incorporated in its entirely by reference herein. U.S. patent application Ser. No. 15/211,813 is also a Continuation-In-Part application of U.S. patent application Ser. No. 15/150,458, filed on May 10, 2016, which is a Continuation-In-Part application of U.S. patent application Ser. No. 14/865,387, filed on Sep. 25, 2015. U.S. patent application Ser. No. 15/084,483, filed on Mar. 30, 2016, is also a Continuation-In-Part application of U.S. patent application Ser. No. 14/865,387, filed on Sep. 25, 2015. U.S. patent application Ser. No. 15/065,892, filed on Mar. 10, 2016, is also a Continuation-In-Part application of U.S. patent application Ser. No. 14/865,387, filed on Sep. 25, 2015. U.S. patent application Ser. No. 14/865,387, filed on Sep. 25, 2015 claims priority under 35 U.S.C. 119(e) to Chinese Patent Applications No.: CN 201410507660.9 filed on 2014 Sep. 28; CN 201410508899.8 filed on 2014 Sep. 28; CN 201510104823.3 filed on 2015 Mar. 10; CN 201510134586.5 filed on 2015 Mar. 26; CN 201510133689.x filed on 2015 Mar. 25; CN 201510155807.7 filed on 2015 Apr. 3; CN 201510193980.6 filed on 2015 Apr. 22; CN 201510284720.x filed on 2015 May 29; CN 201510338027.6 filed on 2015 Jun. 17; CN 201510373492.3 filed on 2015 Jun. 26; CN 201510364735.7 filed on 2015 Jun. 26; CN 201510378322.4 filed on 2015 Jun. 29; CN 201510406595.5 filed on 2015 Jul. 10; CN 201510486115.0 filed on 2015 Aug. 8; CN 201510428680.1 filed on 2015 Jul. 20; CN 201510557717.0 filed on 2015 Sep. 6; CN 201510595173.7 filed on 2015 Sep. 18, the disclosures of each of which are incorporated herein in their entirety by reference.

In addition, U.S. patent application Ser. No. 15/066,645, from which U.S. patent application Ser. No. 15/210,989 claims priority as a Continuation-In-Part also claims priority under 35 U.S.C. 119(e) to Chinese Patent Applications Nos.: CN 201510530110.3 filed on 2015 Aug. 26; CN 201510499512.1 filed on 2015 Aug. 14; CN 201510448220.5 filed on 2015 Jul. 27; and CN 201510645134.3 filed on 2015 Oct. 8, the disclosures of each of which are incorporated herein in their entirety by reference.

In addition, U.S. patent application Ser. No. 15/205,011, from which U.S. patent application Ser. No. 15/210,989 claims priority as a Continuation-in-Part also claims priority under 35 U.S.C. 119(e) to Chinese Patent Application Nos.: CN 201610327806.0, filed on May 18, 2016; and CN 201610420790.8, filed on Jun. 14, 2016, the disclosures of each of which are incorporated herein in their entirety by reference.

In addition, U.S. patent application Ser. No. 15/210,989 also claims priority under 35 U.S.C. 119(e) to Chinese Patent Application Nos.: CN 201510848766.X, filed on Nov. 27, 2015; CN 201510903680.2, filed on Dec. 9, 2015; CN 201610132513.7, filed on Mar. 9, 2016; CN 201610142140.1, filed on Mar. 14, 2016; and CN 201610452437.8, filed on Jun. 20, 2016, the disclosures of each of which are incorporated herein in their entirety by reference. In addition, U.S. patent application Ser. No. 15/210,989 also claims priority under 35 U.S.C. 119(e) to Chinese Patent Application Nos.: CN 201510530110.3, filed on Aug. 26, 2015; CN 201510499512.1, filed on Aug. 14, 2015; CN 201510617370.4, filed on Sep. 25, 2015; CN 201510645134.3, filed on Oct. 8, 2015; CN 201510726365.7, filed on Oct. 30, 2015; CN 201610044148.4, filed on Jan. 22, 2016; CN 201610051691.7, filed on Jan. 26, 2016; CN 201610085895.2, filed on Feb. 15, 2016; CN 201610087627.4, filed on Feb. 16, 2016; CN 201610281812.7, filed on Apr. 29, 2016; CN 201510705222.8, filed on Oct. 27, 2015; CN 201610050944.9, filed on Jan. 26, 2016; CN 201610098424.5, filed on Feb. 23, 2016; and CN 201610120993.5, filed on Mar. 3, 2016, the disclosures of each of which are incorporated herein by reference in their entirety.

In addition, U.S. patent application Ser. No. 15/339,221 also claims priority under 35 U.S.C. 119(e) to Chinese Patent Application No.: CN 201610876593.7, filed on Oct. 8, 2016, the entire contents of which are incorporated herein by reference.

In addition, U.S. patent application Ser. No. 15/373,388 claims priority under 35 U.S.C. 119(e) to Chinese Patent Application No.: CN 201610878349.4, filed on Oct. 8, 2016; CN 201610955338.1, filed on Oct. 27, 2016; CN 201610955342.8, filed on Oct. 27, 2016; CN 201610975119.X, filed on Nov. 3, 2016; CN 201611057357.9, filed on November 25; CN 201610177706.4, filed on Mar. 25, 2016; and CN 201610890527.5, filed on Oct. 12, 2016, the disclosures of each of which are incorporated herein by reference in their entirety.

In addition, U.S. patent application Ser. No. 15/662,094 claims priority under 35 U.S.C. 119(e) to Chinese Patent Application No.: CN 201710036966.4, filed on Jan. 19, 2017; CN 201710170620.3, filed on Mar. 21, 2017; CN 201710158971.2, filed on Mar. 16, 2017; CN 201710258874.0, filed on Apr. 19, 2017; CN 201710295599.X, filed on Apr. 28, 2017; and CN 201710591551.3, filed on Jul. 19, 2017, the disclosures of each of which are incorporated herein by reference in their entirety.

TECHNICAL FIELD

The disclosed embodiments relate to the features of light emitting diode (LED) lighting. More particularly, the disclosed embodiments describe various improvements for LED tube lamps.

BACKGROUND

LED lighting technology is rapidly developing to replace traditional incandescent and fluorescent lighting. LED tube lamps are mercury-free in comparison with fluorescent tube lamps that need to be filled with inert gas and mercury. Thus, it is not surprising that LED tube lamps are becoming a highly desired illumination option among different available lighting systems used in homes and workplaces, which used to be dominated by traditional lighting options such as compact fluorescent light bulbs (CFLs) and fluorescent tube lamps. Benefits of LED tube lamps include improved durability and longevity and far less energy consumption. Therefore, when taking into account all factors, they would typically be considered as a cost effective lighting option.

Typical LED tube lamps have a lamp tube, a circuit board disposed inside the lamp tube with light sources being mounted on the circuit board, and end caps accompanying a power supply provided at two ends of the lamp tube with the electricity from the power supply transmitting to the light sources through the circuit board. However, existing LED tube lamps have certain drawbacks. For example, the typical circuit board is rigid and allows the entire lamp tube to maintain a straight tube configuration when the lamp tube is partially ruptured or broken, and this gives the user a false impression that the LED tube lamp remains usable and is likely to cause the user to be electrically shocked upon handling or installation of the LED tube lamp.

Conventional circuit design of LED tube lamps typically doesn't provide suitable solutions for complying with relevant certification standards. For example, since there are usually no electronic components in a fluorescent lamp, it's fairly easy for a fluorescent lamp to be certified under EMI (electromagnetic interference) standards and safety standards for lighting equipment as provided by Underwriters Laboratories (UL). However, there are a considerable number of electronic components in an LED tube lamp, and therefore consideration of the impacts caused by the layout (structure) of the electronic components is important, resulting in difficulties in complying with such standards.

Further, the driving of an LED uses a DC driving signal, but the driving signal for a fluorescent lamp is a low-frequency, low-voltage AC signal as provided by an AC powerline, a high-frequency, high-voltage AC signal provided by a ballast, or even a DC signal provided by a battery for emergency lighting applications. Since the voltages and frequency spectrums of these types of signals differ significantly, simply performing a rectification to produce the required DC driving signal in an LED tube lamp may not achieve the LED tube lamp's compatibility with traditional driving systems of a fluorescent lamp.

Currently, LED tube lamps used to replace traditional fluorescent lighting devices can be primarily categorized into two types. One is for ballast-compatible LED tube lamps, e.g., T-LED lamp, which directly replaces fluorescent tube lamps without changing any circuit on the lighting device; and the other one is for ballast by-pass LED tube lamps, which omit traditional ballast on their circuit and directly connect the commercial electricity to the LED tube lamp. The latter LED tube lamp is suitable for the new surroundings in fixtures with new driving circuits and LED tube lamps. The ballast-compatible LED tube lamp is also known as "Type-A" LED tube lamp, and the ballast by-pass LED tube lamp provided with a lamp driving circuit is also known as a "Type-B" LED tube lamp. In the prior art, when a Type-B LED tube lamp has an architecture with dual-end power supply and one end cap thereof is inserted into a lamp socket but the other is not, since the lamp socket corresponding to the Type-B LED tube lamp is configured to directly receive the commercial electricity without passing through a ballast, an electric shock situation could take place for the user touching the metal or conductive part of the end cap which has not been inserted into the lamp socket. In addition, duo to the frequency of the voltage provided from the ballast being much higher than the voltage directly provided from the commercial electricity/AC mains, the skin effect occurs when the leakage current is generated in the Type-B LED tube lamp, and thus the human body would not be harmed by the leakage current.

Therefore, since the Type-B LED tube lamp has higher risk of electric shock/hazard, compared to the Type-A, the Type B-LED tube lamp is requested to have extremely low leakage current for meeting the strict requirements in the safety certification standard (e.g., UL, CE, GS).

Due to the above technical issues, even many well-known international luminaries and LED lamps manufacturers also strand at the bottleneck on development of the ballast by-pass/Type-B LED tuba lamps having dual-end power supply structure. Taking GE lighting corporation for the example, according to the marketing material titled "Considering LED tubes" published on Jul. 8, 2014, and the marketing material titled "Dollars&Sense: Type-B LED Tubes" published on Oct. 21, 2016, GE lighting corporation asserts, over and over again, that the drawback of the risk of electric shock that occurs in the Type-B LED tube lamp cannot be overcome, and thus GE lighting corporation would not perform further product commercialization and sales consideration.

In the prior art, a solution of disposing a mechanical structure on the end cap for preventing electric shock is proposed. In this electric shock protection design, the connection between the external power and the internal circuit of the tube lamp can be cut off or established by the mechanical component's interaction/shifting when a user installs the tube lamp, so as to achieve the electric shock protection.

SUMMARY

It's specially noted that the present disclosure may actually include one or more inventions claimed currently or not yet claimed, and for avoiding confusion due to unnecessarily distinguishing between those possible inventions at the stage of preparing the specification, the possible plurality of inventions herein may be collectively referred to as "the (present) invention" herein.

Various embodiments are summarized in this section, and may be described with respect to the "present invention," which terminology is used to describe certain presently disclosed embodiments, whether claimed or not, and is not necessarily an exhaustive description of all possible embodiments, but rather is merely a summary of certain embodiments. Certain of the embodiments described below as various aspects of the "present invention" can be combined in different manners to form an LED tube lamp or a portion thereof.

The present disclosure provides a novel LED tube lamp, and aspects thereof.

According to certain embodiments, a ballast by-pass LED tube lamp is provided. The ballast by-pass LED tube lamp has at least two external connection terminals connected to the opposite sides of the ballast by-pass LED tube lamp. The ballast by-pass LED tube lamp includes a driving circuit, an LED module, a current limiting circuit and an electric shock detection circuit. The driving circuit, electrically connected to the external connection terminals for receiving an external driving signal and configured to convert the external driving signal into a lamp driving signal, wherein the external driving signal has a frequency substantially equal to 50 Hz or 60 Hz. The LED module, electrically connected to the driving circuit for receiving the lamp driving signal. The current limiting circuit, electrically connected between the external connection terminals and the LED module, and configured to limit a current flowing through the external connection terminals and the LED module to less than a predetermined value when being enabled and conduct a current above the predetermined value when being disabled. The electric shock detection circuit, configured to temporarily turn on a detection path of the ballast by-pass LED tube lamp for 10 μs to 30 μs and detect an equivalent impedance of the detection path being turned on. The electric shock detection circuit controls the enable/disable state of the current limiting circuit according to the equivalent impedance.

According to certain embodiments, a ballast by-pass LED tube lamp is provided. The ballast by-pass LED tube lamp includes a lamp tube, two end caps, a power supply module and an LED module. The end caps are respectively disposed on opposite sides of the lamp tube. Each end cap has an external connection terminal for receiving an external driving signal having a frequency substantially equal to 50 Hz or 60 Hz. The power supply module, electrically connected to the external connection terminals and configured to generate a lamp driving signal based on the external driving signal. The LED module, disposed in the lamp tube and electrically connected to the power supply module for receiving the lamp driving signal. The power supply module includes a current limiting circuit and an electric shock detection circuit. The current limiting circuit is electrically connected between at least one of the external connection terminals and the LED module and configured to limit a current flowing through the external connection terminals and the LED module to less than a predetermined value when being enabled and to conduct a current above the predetermined value when being disabled. The electric shock detection circuit, configured to detect a signal on a detection path of the ballast by-pass LED tube lamp and control the enable/disable state of the current limiting circuit according to a detection result. At least some electronic components of the power supply module are connected via a power circuit board, and the power circuit board is disposed in at least one of the end caps parallel to an axial direction of the lamp tube.

According to certain embodiments, a DC-to-DC power converter with leakage current protection is provided. The DC-to-DC power converter has an input side and an output side and includes a constant current controller, a power switch, a conversion circuit, a feedback circuit and a detection circuit. The constant current controller is configured to generate a lighting control signal having a pulse waveform. The power switch is electrically connected to the constant current controller and configured to be switched according to the lighting control signal. The conversion circuit is electrically connected to the power switch and configured to absorb and release power received from the input side in response to the switching state of the power switch so as to generate a driving signal at the output side. The feedback circuit is configured to generate a feedback signal by sampling a signal on at least one of the input side and the output side and to transmit the feedback signal to the constant current controller. Under an installation detection mode, the constant current controller outputs the lighting control signal with at least one first pulse and determines whether to enter a normal driving mode according to the installation detection signal. Under the normal driving mode, the constant current controller outputs the lighting control signal with a plurality of second pulses and modulates the second pulses according to the feedback signal.

DETAILED DESCRIPTION

Figure 1A:
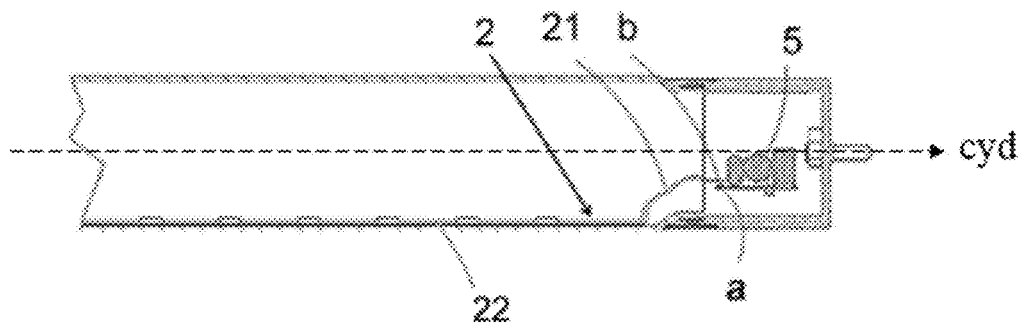
FIGS. 1A-1C are plane cross-sectional views schematically illustrating an LED tube lamp including an LED light strip that is a bendable circuit sheet with ends thereof passing across the transition region of the lamp tube of the LED tube lamp to be connected to a power supply according to some exemplary embodiments.

The present disclosure provides a novel LED tube lamp. The present disclosure will now be described in the following embodiments with reference to the drawings. The following descriptions of various embodiments of this invention are presented herein for purpose of illustration and giving examples only. It is not intended to be exhaustive or to be limited to the precise form disclosed. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of components may be exaggerated for clarity. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers, or steps, these elements, components, regions, layers, and/or steps should not be limited by these terms. Unless the context indicates otherwise, these terms are only used to distinguish one element, component, region, layer, or step from another element, component, region, or step, for example as a naming convention. Thus, a first element, component, region, layer, or step discussed below in one section of the specification could be termed a second element, component, region, layer, or step in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct connection (i.e., touching) unless the context indicates otherwise.

Embodiments described herein will be described referring to plane views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Terms such as "transistor", used herein may include, for example, a field-effect transistor (FET) of any appropriate type such as N-type metal-oxide-semiconductor field-effect transistor (MOSFET), P-type MOSFET, GaN FET, SiC FET, bipolar junction transistor (BJT), Darlington BJT, heterojunction bipolar transistor (HBT), etc.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) is not electrically connected to that component. Moreover, items that are "directly electrically connected," to each other are electrically connected through one or more passive elements, such as, for example, wires, pads, internal electrical lines, etc. As such, directly electrically connected components do not include components electrically connected through active elements, such as transistors or diodes, or through capacitors. Directly electrically connected elements may be directly physically connected and directly electrically connected.

Components described as thermally connected or in thermal communication are arranged such that heat will follow a path between the components to allow the heat to transfer from the first component to the second component. Simply because two components are part of the same device or board does not make them thermally connected. In general, components which are heat-conductive and directly connected to other heat-conductive or heat-generating components (or connected to those components through intermediate heat-conductive components or in such close proximity as to permit a substantial transfer of heat) will be described as thermally connected to those components, or in thermal communication with those components. On the contrary, two components with heat-insulative materials therebetween, which materials significantly prevent heat transfer between the two components, or only allow for incidental heat transfer, are not described as thermally connected or in thermal communication with each other. The terms "heat-conductive" or "thermally-conductive" do not apply to any material that provides incidental heat conduction, but are intended to refer to materials that are typically known as good heat conductors or known to have utility for transferring heat, or components having similar heat conducting properties as those materials.

Embodiments may be described, and illustrated in the drawings, in terms of functional blocks, units and/or modules. Those skilled in the art will appreciate that these blocks, units and/or modules are physically implemented by electronic (or optical) circuits such as logic circuits, discrete components, analog circuits, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules. Further, the blocks, units and/or modules of the various embodiments may be physically combined into more complex blocks, units and/or modules.

If any terms in this application conflict with terms used in any application(s) from which this application claims priority, or terms incorporated by reference into this application or the application(s) from which this application claims priority, a construction based on the terms as used or defined in this application should be applied.

It should be noted that, the following description of various embodiments of the present disclosure is described herein in order to clearly illustrate the inventive features of the present disclosure. However, it is not intended that various embodiments can only be implemented alone. Rather, it is contemplated that various of the different embodiments can be and are intended to be used together in a final product, and can be combined in various ways to achieve various final products. Thus, people having ordinary skill in the art may combine the possible embodiments together or replace the components/modules between the different embodiments according to design requirements. The embodiments taught herein are not limited to the form described in the following examples, any possible replacement and arrangement between the various embodiments are included.

Applicant's prior U.S. patent application Ser. No. 14/724,840 (US PGPUb No. 2016/0091156, the disclosure of which is incorporated herein in its entirety by reference), as an illustrated example, has addressed certain issues associated with the occurrence of electric shock in using a conventional LED lamp by providing a bendable circuit sheet. Some of the embodiments disclosed in U.S. patent application Ser. No. 14/724,840 can be combined with one or more of the example embodiments disclosed herein to further reduce the occurrence of electric shock in using an LED lamp.

FIG. 1A is a plane cross-sectional view schematically illustrating an LED tube lamp including an LED light strip and a power supply module according to some exemplary embodiments. Referring to FIG. 1A, an LED tube lamp may include an LED light strip 2 and a power supply 5, in which the power supply 5 can be a modularized element, which means the power supply 5 can be integrated into a single power supply circuit or can be integrated into several separated power supply circuits. For example, in an embodiment, the power supply 5 can be a single unit (i.e., all components of the power supply 5 are disposed on a single body/carrier) disposed in one of the end caps at one end of the lamp tube. In another embodiment, the power supply 5 can be two separate units (i.e., the components of the power supply 5 are divided into two parts) disposed in different end caps at respective ends of the lamp tube.

In the embodiment of FIG. 1A, the power supply 5 is illustrated as being integrated into one module for example (hereinafter referred to as a power supply module 5) and is disposed in the end cap parallel to the axial direction cyd of the lamp tube. More specifically, the axial direction cyd of the lamp tube, which refers to the direction pointed to by the axis of the lamp tube, is perpendicular to the end wall of the end caps. Disposing the power supply module 5 parallel to the axial direction cyd means the circuit board, with the electronic components of the power supply module, is parallel to the axial direction cyd. Therefore, the normal direction of the circuit board is perpendicular to the axial direction cyd. In certain embodiments, the power supply module 5 can be arranged in a position where the axial direction cyd passes, in a position above the axial plane/axial direction cyd, or in a position below the axial plane/axial direction cyd (relative to the figure). The invention is not limited thereto.

Figure 1B:
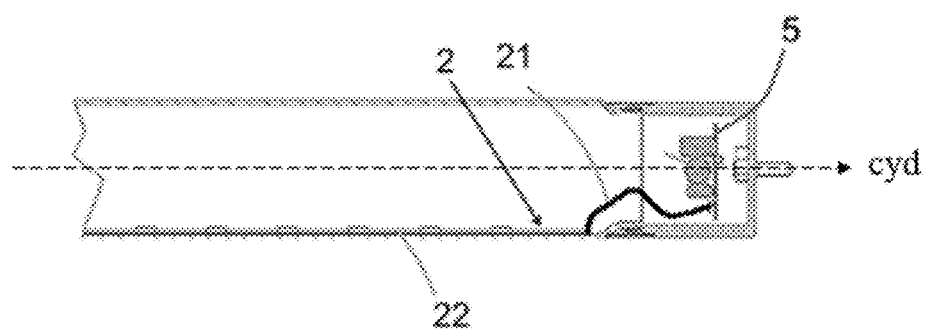

FIG. 1B is another plane cross-sectional view schematically illustrating an LED tube lamp including an LED light strip and a power supply module according to some exemplary embodiments. Referring to FIG. 1B, the difference between the embodiments of FIGS. 1A and 1B is that the power supply module 5 illustrated in FIG. 1B is disposed in the end cap perpendicular to the axial direction cyd of the lamp tube. For example, the power supply module 5 is disposed parallel to the end wall of the end caps. Although the FIG. 1B shows that the electronic components are disposed on the side facing the interior of the lamp tube, the invention is not limited thereto. In certain embodiments, the electronic component can be disposed on the side facing the end wall of the corresponding end cap. Under these configurations, since at least one opening can be formed in the end wall of the end caps, the heat dissipation effect of the electronic components can be improved through the opening.

Figure 1C:
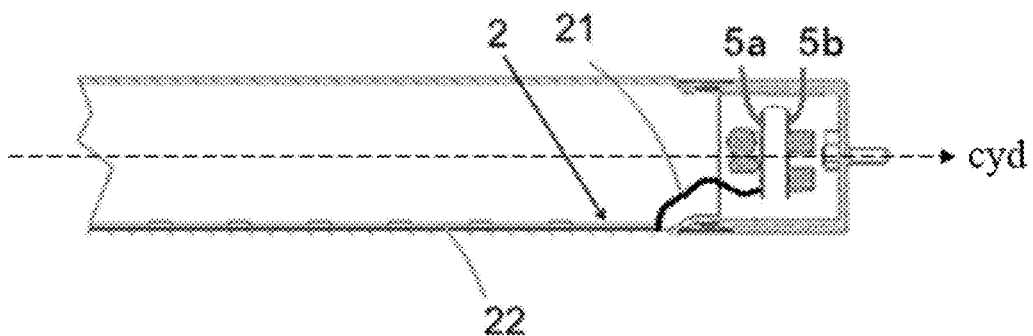

In addition, due to the power supply module 5 being vertically disposed in the end caps, the space within the end caps can be increased so that the power supply module 5 can be further divided into a plurality of separated circuit boards as shown in FIG. 1C. FIG. 1C is still another plane cross-sectional view schematically illustrating an LED tube lamp including an LED light strip and a power supply module according to some exemplary embodiments. The difference between the embodiments of FIGS. 1B and 1C is that the power supply 5 is formed by two power supply modules 5a and 5b. The power supply modules 5a and 5b are disposed in the end cap perpendicular to the axial direction cyd and are arranged, toward to the end wall of the end cap, along the axial direction cyd. Specifically, power supply modules 5a and 5b are respectively provided with each having an independent circuit board. The circuit boards are connected to each other through one or more electrical connection means, so that the overall power supply circuit topology is similar to the embodiment illustrated in FIG. 1A or FIG. 1B. According to the configuration of FIG. 1C, the space within the end caps can be more effectively utilized, such that the circuit layout space can be increased. In some certain embodiments, the electronic components generating more heat (e.g., the capacitor and the inductor) can be disposed on the power supply module 5b, which is close to the end wall, so as to enhance the heat dissipation effect of the electronic components through the opening on the end cap.

In certain embodiments, the circuit boards of the power supply modules 5a and 5b can be designed as a disk shape structure (not shown). The disk-shaped circuit boards are disposed in the same end cap along the same axis. For example, the maximum outer diameter of the circuit boards may be slightly smaller than the inner diameter of the end cap and the normal direction of the disk plane is substantially parallel to the radial direction of the end cap, so that the disk-shaped circuit boards can be disposed into the space of the end cap. In certain embodiments, at least a DC-to-DC converter circuit and a conversion control IC (i.e., lighting control circuit) are disposed on the disk-shaped circuit board of the power supply module 5a, and at least a fuse, a EMI module, a rectifying circuit and an installation detection module are disposed on the disk-shaped circuit board of the power supply module 5b. The disk-shaped circuit board of the power supply module 5b is disposed close to the side wall of the end cap (in relation to the power supply module 5a and other components of the LED tube lamp) and electrically connected to the conduction pins on the end cap. The disk-shaped circuit boards of the power supply modules 5a and 5b are electrically connected to each other. The disk-shaped circuit board of the power supply module 5a is electrically connected to the LED light strip 2.

In certain embodiments, in order to vertically dispose the power supply modules 5a and 5b in the cylindrical end caps and maximize the layout area, the circuit boards of the power supply modules 5a and 5b can adopt an octagon structure. But other shapes can be used.

For the connection means between the power supply modules 5a and 5b, the separate power supply modules 5a and 5b can be connected to each other, for example, through a male plug and a female plug or through bonding a lead. If the lead is utilized to connect the power supply modules 5a and 5b, the outer layer of the lead can be wrapped with an insulating sleeve to serve as electrical insulation protection. In addition, the power supply modules 5a and 5b can also be connected through rivets or solder paste, or bound together by wires.

Referring to FIGS. 1A to 1C, an LED tube lamp may include an LED light strip 2. In certain embodiments, the LED light strip 2 may be formed from a bendable circuit sheet, for example that may be flexible. As described further below, the bendable circuit sheet is also described as a bendable circuit board. The LED light strip 2, and for example the bendable circuit sheet, may also be a flexible strip, such as a flexible or non-rigid tape or a ribbon. The bendable circuit sheet may have ends thereof passing across a transition region of the lamp tube of the LED tube lamp to be connected to a power supply 5. In some embodiments, the ends of the bendable circuit sheet may be connected to a power supply in an end cap of the LED tube lamp. For example, the ends may be connected in a manner such that a portion of the bendable circuit sheet is bent away from the lamp tube and passes through the transition region where a lamp tube narrows, and such that the bendable circuit sheet vertically overlaps part of a power supply within an end cap of the LED tube lamp.

Figure 2:
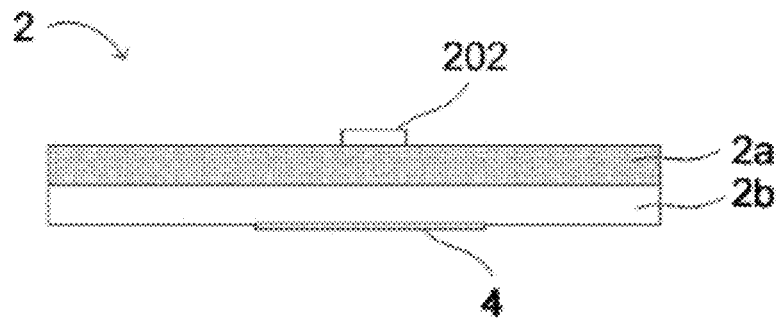
FIG. 2 is a plane cross-sectional view schematically illustrating a bi-layered structure of a bendable circuit sheet of an LED light strip of an LED tube lamp according to some exemplary embodiments.

Referring to FIG. 2, to form an LED light strip 2, a bendable circuit sheet includes a wiring layer 2a with conductive effect. An LED light source 202 is disposed on the wiring layer 2a and is electrically connected to the power supply through the wiring layer 2a. Though only one LED light source 202 is shown in FIG. 2, a plurality of LED light sources 202, as shown in FIG. 1, may be arranged on the LED light strip 2. For example, light sources 202 may be arranged in one or more rows extending along a length direction of the LED light strip 2, which may extend along a length direction of the lamp tube as illustrated in FIG. 1. The wiring layer with conductive effect, in this specification, is also referred to as a conductive layer. Referring to FIG. 2 again, in one embodiment, the LED light strip 2 includes a bendable circuit sheet having a conductive wiring layer 2a and a dielectric layer 2b that are arranged in a stacked manner. In some embodiments, the wiring layer 2a and the dielectric layer 2b may have the same areas or the area of the wiring layer 2a may slightly be smaller than that of the dielectric layer 2b. The LED light source 202 is disposed on one surface of the wiring layer 2a, the dielectric layer 2b is disposed on the other surface of the wiring layer 2a that is away from the LED light sources 202 (e.g., a second, opposite surface from the first surface on which the LED light source 202 is disposed). The wiring layer 2a is electrically connected to a power supply 5 (as shown in FIG. 1) to carry direct current (DC) signals. In some embodiments, the surface of the dielectric layer 2b away from the wiring layer 2a (e.g., a second surface of the dielectric layer 2b opposite a first surface facing the wiring layer 2a) is fixed to an inner circumferential surface of a lamp tube, for example, by means of an adhesive sheet 4. The portion of the dielectric layer 2b fixed to the inner circumferential surface of the lamp tube 1 may substantially conform to the shape of the inner circumferential surface of the lamp tube 1. The wiring layer 2a can be a metal layer or a power supply layer including wires such as copper wires.

A power supply as described herein may include a circuit that converts or generates power based on a received voltage, in order to supply power to operate an LED module and the LED light sources 202 of the LED tube lamp. A power supply, as described in connection with power supply 5, may be otherwise referred to as a power conversion module or circuit or a power module. A power conversion module or circuit, or power module, may supply or provide power from external signal(s), such as from an AC power line or from a ballast, to an LED module and the LED light sources 202. For example, a power supply 5 may refer to a circuit that converts ac line voltage to dc voltage and supplies power to the LED or LED module. The power supply 5 may include one or more power components mounted thereon for converting and/or generating power.

In some example embodiments, the outer surface of the wiring layer 2a or the dielectric layer 2b may be covered with a circuit protective layer made of an ink with function of resisting soldering and increasing reflectivity. Alternatively, in other example embodiments, the dielectric layer may be omitted and the wiring layer may be directly bonded to the inner circumferential surface of the lamp tube, and the outer surface of the wiring layer 2a may be coated with the circuit protective layer. Whether the wiring layer 2a has a one-layered, or two-layered structure, the circuit protective layer may be adopted. In some embodiments, the circuit protective layer is disposed only on one side/surface of the LED light strip 2, such as the surface having the LED light source 202. In some embodiments, the bendable circuit sheet is a one-layered structure made of just one wiring layer 2a, or a two-layered structure made of one wiring layer 2a and one dielectric layer 2b, and thus is more bendable or flexible to curl when compared with the conventional three-layered flexible substrate (one dielectric layer sandwiched with two wiring layers). As a result, the bendable circuit sheet of the LED light strip 2 may be installed in a lamp tube with a customized shape or non-tubular shape, and fitly mounted to the inner surface of the lamp tube. A bendable circuit sheet closely mounted to the inner surface of the lamp tube is desirable in some cases. In addition, using fewer layers of the bendable circuit sheet improves the heat dissipation, lowering the material cost, and is more environmental friendly, and provides the opportunity to increase the flexible effect.

Nevertheless, the bendable circuit sheet is not limited to being one-layered or two-layered; in other embodiments, the bendable circuit sheet may include multiple layers of the wiring layers 2a and multiple layers of the dielectric layers 2b, in which the dielectric layers 2b and the wiring layers 2a are sequentially stacked in a staggered manner, respectively. These stacked layers may be between the outermost wiring layer 2a (with respect to the inner circumferential surface of the lamp tube), which has the LED light source 202 disposed thereon, and the inner circumferential surface of the lamp tube, and may be electrically connected to the power supply 5 (as shown in FIG. 1.) Moreover, in some embodiments, the length of the bendable circuit sheet (e.g., the length along a surface of the bendable circuit sheet from one end of the circuit sheet to a second end of the circuit sheet) (or an axial projection of the length of the bendable circuit sheet) is greater than the length of the lamp tube (or an axial projection of the length of the lamp tube), or at least greater than a central portion of the lamp tube between two transition regions (e.g., where the circumference of the lamp tube narrows) on either end. For example, the length following along the contours of one surface of the bendable circuit sheet (e.g., a top surface of the circuit sheet) may be longer than the length from one terminal end to an opposite terminal end of the lamp tube. Also, a length along a straight line that extends in the same direction as the direction in which the lamp tube extends, from a first end of the bendable circuit sheet to a second, opposite end of the bendable circuit sheet, may be longer than the length along the same straight line of the lamp tube.

Figure 7:
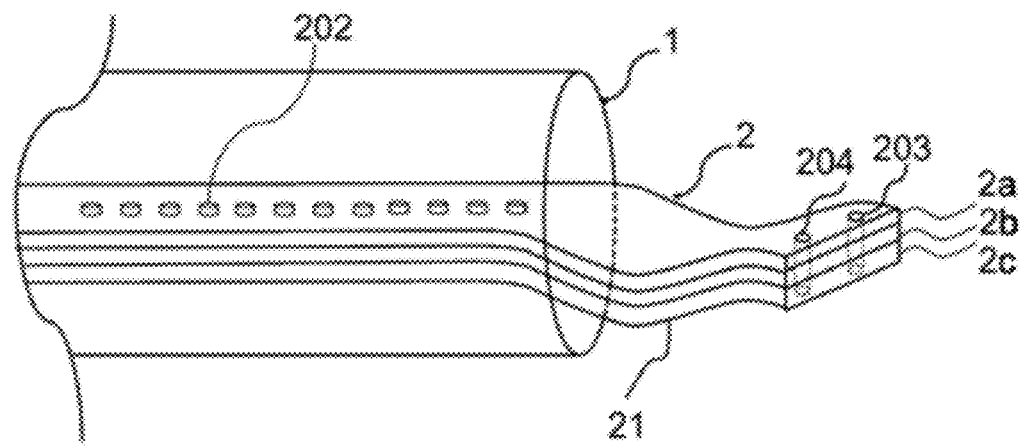
FIG. 7 is a perspective view schematically illustrating a bendable circuit sheet of an LED light strip formed with two conductive wiring layers according to some exemplary embodiments.

Referring to FIG. 7, in one embodiment, an LED light strip 2 includes a bendable circuit sheet having in sequence a first wiring layer 2a, a dielectric layer 2b, and a second wiring layer 2c. In one example, the thickness of the second wiring layer 2c (e.g., in a direction in which the layers 2a through 2c are stacked) is greater than that of the first wiring layer 2a, and the length of the LED light strip 2 (or an axial projection of the length of the LED light strip 2) is greater than that of a lamp tube 1, or at least greater than a central portion of the lamp tube between two transition regions (e.g., where the circumference of the lamp tube narrows) on either end. The end region of the LED light strip 2 extending beyond the end portion of the lamp tube 1 without having a light source 202 disposed thereon is formed with two separate through holes 203 and 204 to respectively electrically communicate the first wiring layer 2a and the second wiring layer 2c. The through holes 203 and 204 are not in communication with each other to avoid short.

In this way, the greater thickness of the second wiring layer 2c allows the second wiring layer 2c to support the first wiring layer 2a and the dielectric layer 2b, and meanwhile allows the LED light strip 2 to be mounted onto the inner circumferential surface without being liable to shift or deform, and thus the yield rate of product can be improved. In addition, the first wiring layer 2a and the second wiring layer 2c are in electrical communication such that the circuit layout of the first wiring later 2a can be extended downward to the second wiring layer 2c to reach the circuit layout of the entire LED light strip 2. Moreover, since the circuit layout becomes two-layered, the area of each single layer and therefore the width of the LED light strip 2 can be reduced such that more LED light strips 2 can be put on a production line to increase productivity.

Furthermore, in some embodiments, the first wiring layer 2a and the second wiring layer 2c of the end region of the LED light strip 2 that extends beyond the end portion of the lamp tube 1 without disposition of the light source 202 can be used to accomplish the circuit layout of a power supply module so that the power supply module can be directly disposed on the bendable circuit sheet of the LED light strip 2.

In a case where two ends of the LED light strip 2 are detached from the inner surface of the lamp tube 1 and where the LED light strip 2 is connected to the power supply 5 via wire-bonding, certain movements in subsequent transportation are likely to cause the bonded wires to break. Therefore, a desirable option for the connection between the LED light strip 2 and the power supply 5 (as shown in FIG. 1) could be soldering. Specifically, referring to FIG. 1, the ends of the LED light strip 2 including the bendable circuit sheet are arranged to pass over the strengthened transition region of a lamp tube, and to be directly solder bonded to an output terminal of the power supply 5. This may improve product quality by avoiding using wires and/or wire bonding. As discussed herein, a transition region of the lamp tube refers to regions outside a central portion of the lamp tube and inside terminal ends of the lamp tube. For example, a central portion of the lamp tube may have a constant diameter, and each transition region between the central portion and a terminal end of the lamp tube may have a changing diameter (e.g., at least part of the transition region may become more narrow moving in a direction from the central portion to the terminal end of the lamp tube).

Figure 3A:
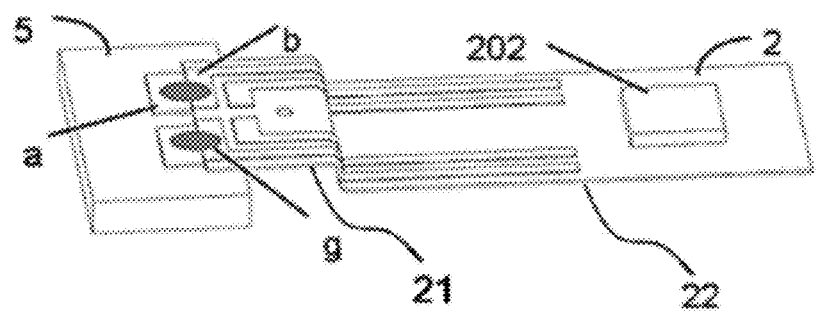
FIG. 3A is a perspective view schematically illustrating a soldering pad of a bendable circuit sheet of an LED light strip for a solder connection with a power supply of an LED tube lamp according to some exemplary embodiments.

Referring to FIG. 3A, an output terminal of a printed circuit board of the power supply 5 may have soldering pads "a" (as shown in FIG. 1A as well) provided with an amount of solder (e.g., tin solder) with a thickness sufficient to later form a solder joint "g" (or a solder ball "g"). Correspondingly, the ends of the LED light strip 2 may have soldering pads "b" (as shown in FIG. 1A as well). The soldering pads "a" on the output terminal of the printed circuit board of the power supply 5 are soldered to the soldering pads "b" on the LED light strip 2 via the tin solder on the soldering pads "a". The soldering pads "a" and the soldering pads "b" may be face to face during soldering such that the connection between the LED light strip 2 and the printed circuit board of the power supply 5 may be the firmest. However, this kind of soldering typically includes a thermo-compression head pressing on the rear surface of the LED light strip 2 and heating the tin solder, i.e., the LED light strip 2 intervenes between the thermo-compression head and the tin solder, and therefore may cause reliability problems. In some embodiments, a through hole may be formed in each of the soldering pads "b" on the LED light strip 2 to allow the soldering pads "b" to overlay the soldering pads "a" without being face-to-face (e.g., both soldering pads "a" and soldering pads "b" can have exposed surfaces that face the same direction) and the thermo-compression head directly presses tin solders on the soldering pads "a" on surface of the printed circuit board of the power supply 5 when the soldering pads "a" and the soldering pads "b" are vertically aligned. This example provides a simple process for manufacturing.

Referring again to FIG. 3A, two ends of the LED light strip 2 detached from the inner surface of the lamp tube 1 (as shown in FIG. 7) are formed as freely extending portions 21 (as shown in FIGS. 1A and 7 as well), while most of the LED light strip 2 is attached and secured to part of the inner surface of the lamp tube to form a fixed portion 22. One of the freely extending portions 21 has the soldering pads "b" as mentioned above. In one embodiment, one end of the freely extending portion 21 is welded to the power supply module 5, and the other end of the freely extending portion 21 is extended and connected, as a whole, to the fixed portion 22 (e.g., is integrally formed with the fixed portion 22). The portions between two ends of the freely extending portion 21 are not attached to the inner surface of the lamp tube 1, which means the middle section of the freely extending portion 21 is suspended (e.g., is not fixedly held by the lamp tube 1). Upon assembling of the LED tube lamp, the freely extending portions 21 along with the soldered connection of the printed circuit board of the power supply 5 and the LED light strip 2 would be coiled, curled up or deformed to be fittingly accommodated inside the lamp tube as shown in FIG. 1. When the bendable circuit sheet of the LED light strip 2 includes in sequence the first wiring layer 2a, the dielectric layer 2b, and the second wiring layer 2c as shown in FIG. 7, the freely extending portions 21, which are the end regions of the LED light strip 2 extending beyond the lamp tube without disposition of the light sources 202, can be used to accomplish the connection between the first wiring layer 2a and the second wiring layer 2c and arrange the circuit layout of the power supply 5. As described above, the freely extending portions 21 may be different from a fixed portion of the LED light strip 2 in that the fixed portion may conform to the shape of the inner surface of the lamp tube and may be fixed thereto, while the freely extending portion 21 may have a shape that does not conform to the shape of the lamp tube. As shown in FIGS. 1A to 1C, the freely extending portion 21 may be bent away from the lamp tube. For example, there may be a space between an inner surface of the lamp tube and the freely extending portion 21.

In designing the conductive pin or external connection terminal in the LED tube lamp, various arrangements of pins may be provided in one end or both ends of the LED tube lamp according to exemplary embodiments. For example, two pins may be provided in one end and no pins may be provided on the other end. Alternatively, in some embodiments, two pins in corresponding ends of two ends of the LED tube lamp, or four pins in corresponding ends of two ends of the LED tube lamp may be provided. When a dual-end power supply between two ends of the LED tube lamp is utilized to provide power to the LED tube lamp, at least one pin of each end of the LED tube lamp is used to receive the external driving signal from the power supply.

Figure 3B:
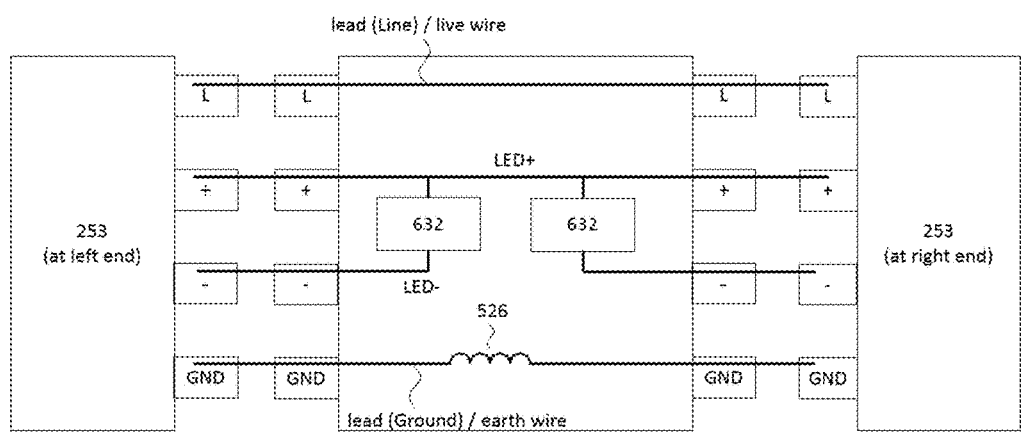
FIG. 3B is a block diagram illustrating leads that are disposed between two end caps of an LED tube lamp according to some exemplary embodiments.

FIG. 3B is a block diagram illustrating leads that are disposed between two end caps of an LED tube lamp according to some exemplary embodiments.

Referring to FIG. 3B, in some embodiments, the LED tube lamp includes a lamp tube (not shown in FIG. 3B), end caps (not shown in FIG. 3B), a light strip 2, short circuit boards 253 (also referred to as right end short circuit board 253 and left end short circuit board 253) respectively provided at two ends of the lamp tube, and an inductive element 526. Each of the lamp tube's two ends may have at least one pin or external connection terminal for receiving the external driving signal. The end caps are disposed respectively at the two ends of the lamp tube, and (at least partial electronic components of) the short circuit boards 253 shown as located respectively at the left and right ends of the lamp tube in FIG. 3B may be disposed respectively in the end caps. The short circuit boards may be, for example, a rigid circuit board such as depicted in and described in connection with FIG. 1 and the various other rigid circuit boards described herein. For example, these circuit boards may include mounted thereon one or more power supply components for generating and/or converting power to be used to light the LED light sources on the light strip 2. The light strip 2 is disposed in the lamp tube and includes an LED module, which includes an LED unit 632.

For an LED tube lamp, such as an 8 ft. 42 W LED tube lamp, to receive a dual-end power supply between two ends of the LED tube lamp, two (partial) power supply circuits (each having a power rating of e.g. 21 W, 17.5 W, or 12.5 W) are typically disposed respectively in the two end caps of the lamp tube, and a lead (typically referred to as lead Line, Neutral and Ground) disposed between two end caps of the lamp tube (e.g., between two pins or external connection terminals at respective end caps of the lamp tube), connected to the power supply circuits disposed on the opposite sides of the light strip and as an input signal line may be needed. The lead Line (also known as the "live wire") and/or the lead Neutral (also known as the "neutral wire") may be disposed along the light strip that may include, e.g., a bendable circuit sheet or flexible circuit board, for receiving and transmitting an external driving signal from the power supply. This lead Line is distinct from two leads typically referred to as LED+ and LED− that are respectively connected to a positive electrode and a negative electrode of an LED unit in the lamp tube. This lead Line is also distinct from a lead Ground (also known as the "earth wire") which is disposed between respective ground terminals of the LED tube lamp. Because the lead Line is typically disposed along the light strip, and because parasitic capacitance(s) (e.g., about 200 pF) may be caused between the lead Line and the lead LED+ due to their close proximity to each other, some high frequency signals (not the intended frequency range of signal for supplying power to the LED module) passing through the lead LED+ will be reflected to the lead Line through the parasitic capacitance(s) and then can be detected there as undesirable EMI effects. The unfavorable EMI effects may lower or degrade the quality of power transmission in the LED tube lamp.

Again referring to FIG. 3B, in some embodiments, the right and left short circuit boards 253 are electrically connected to the light strip 2. In some embodiments, the electrical connection (such as through soldering or bond pad(s)) between the short circuit boards 253 and the light strip 2 may comprise a first terminal (denoted by "L"), a second terminal (denoted by "+" or "LED+"), a third terminal (denoted by "−" or "LED−"), and a fourth terminal (denoted by "GND" or "ground"). The light strip 2 includes the first through fourth terminals at a first end of the light strip 2 adjacent to the right end short circuit board 253 near one end cap of the lamp tube and includes the first through fourth terminals at a second end, opposite to the first end, of the light strip 2 adjacent to the left end short circuit board 253 near the other end cap of the lamp tube. The right end short circuit board 253 also includes the first through fourth terminals to respectively connect to the first through fourth terminals of the light strip 2 at the first end of the light strip 2. The left end short circuit board 253 also includes the first through fourth terminals to respectively connect to the first through fourth terminals of the light strip 2 at the second end of the light strip 2. For example, the first terminal L is utilized to connect a lead (typically referred to as Line or Neutral) for connecting both of the at least one pin of each of the two ends of the lamp tube; the second terminal LED+ is utilized to connect each of the short circuit boards 253 to the positive electrode of the LED unit 632 of the LED module included in the light strip 2. The third terminal LED− is utilized to connect each of the short circuit boards 253 to the negative electrode of the LED unit 632 of the LED module included in the light strip 2. The fourth terminal GND is utilized to connect to a reference potential. Preferably and typically, the reference potential is defined as the electrical potential of ground. Therefore, the fourth terminal is utilized for a grounding purpose of the power supply module of the LED tube lamp.

To address the undesirable EMI effects mentioned above caused by parasitic capacitance(s) between the lead Line and the lead LED+, inductive element 526 disposed in the lead Ground serves to reduce or prevent the EMI effects by blocking the forming of a complete circuit between the lead LED+ and the Ground lead for the high frequency signals mentioned above to pass through, since at these high frequencies inductive element 526 behaves like an open circuit. When the complete circuit is prevented or blocked by inductive element 526, the high frequency signals will be prevented on the lead LED+ and therefore will not be reflected to the lead Line, thus preventing the undesirable EMI effects. In some embodiments, the inductive element 526 is connected between two of the fourth terminals respectively of the right end and left end short circuit boards 253 at the two ends of the lamp tube. In some embodiments, the inductive element 526 may comprise an inductor such as a choke inductor or a dual-inline-package inductor capable of achieving a function of eliminating or reducing the above-mentioned EMI effects of the lead ("Line") disposed along the light strip 2 between two of the first terminals ("L") respectively at two ends of the lamp tube. Therefore, this function can improve signal transmission (which may include transmissions through leads "L", "LED+", and "LED−") of the power supply in the LED tube lamp, and thus the qualities of the LED tube lamp. Therefore, the LED tube lamp comprising the inductive element 526 may effectively reduce EMI effects of the lead "L" or "Line". Moreover, such an LED tube lamp may further comprise an installation detection circuit or module, which is described below with reference to FIG. 15, for detecting whether or not the LED tube lamp is properly installed in a lamp socket.

Figure 5:
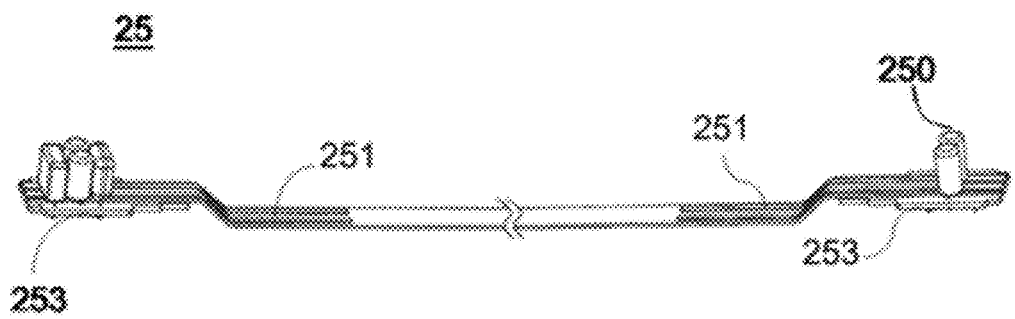
FIG. 5 is a perspective view schematically illustrating a circuit board assembly composed of a bendable circuit sheet of an LED light strip and a printed circuit board of a power supply according to some exemplary embodiments.
Figure 6:
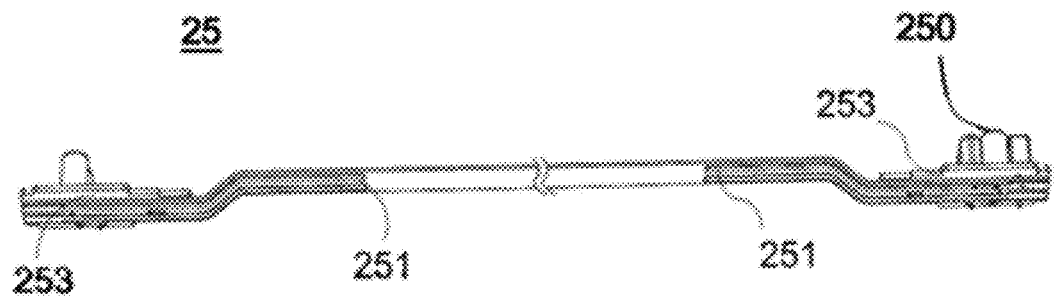
FIG. 6 is a perspective view schematically illustrating another arrangement of a circuit board assembly, according to some exemplary embodiments.

Referring to FIGS. 5 and 6, in another embodiment, the LED light strip and the power supply may be connected by utilizing a circuit board assembly 25 configured with a power supply module 250 instead of solder bonding as described previously. The circuit board assembly 25 has a long circuit sheet 251 and a short circuit board 253 that are adhered to each other with the short circuit board 253 being adjacent to the side edge of the long circuit sheet 251. The short circuit board 253 may be provided with the power supply module 250 to form the power supply. The short circuit board 253 is stiffer or more rigid than the long circuit sheet 251 to be able to support the power supply module 250.

The long circuit sheet 251 may be the bendable circuit sheet of the LED light strip 2 including a wiring layer 2a as shown in FIG. 2. The wiring layer 2a of the LED light strip 2 and the power supply module 250 may be electrically connected in various manners depending on the demand in practice. As shown in FIG. 5, the power supply module 250 and the long circuit sheet 251 having the wiring layer 2a on surface are on the same side of the short circuit board 253 such that the power supply module 250 is directly connected to the long circuit sheet 251. As shown in FIG. 6, alternatively, the power supply module 250 and the long circuit sheet 251 including the wiring layer 2a on surface are on opposite sides of the short circuit board 253 such that the power supply module 250 is directly connected to the short circuit board 253 and indirectly connected to the wiring layer 2a of the LED light strip 2 by way of the short circuit board 253.

The power supply module 250 and power supply 5 described above may include various elements for providing power to the LED light strip 2. For example, they may include power converters or other circuit elements and/or components for providing power to the LED light strip 2. Also, it should be noted that the power supply 5 depicted and discussed in FIG. 1 may also include a power supply module 250, though one is not labeled in FIG. 1. For example, the power supply module may be mounted on the circuit board, as shown in FIG. 1, and may include power converters or other circuit elements and/or components for providing power to the LED light strip 2.

Figure 4A:
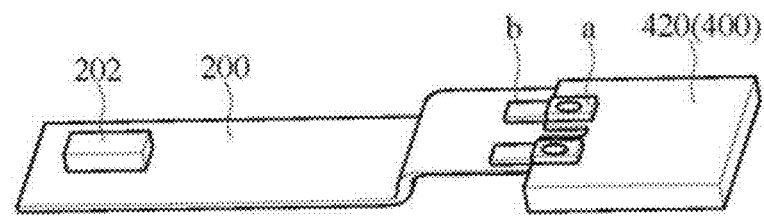
FIG. 4A is a perspective view of a bendable circuit sheet and a printed circuit board of a power supply soldered to each other according to some exemplary embodiments.
Figure 4B:
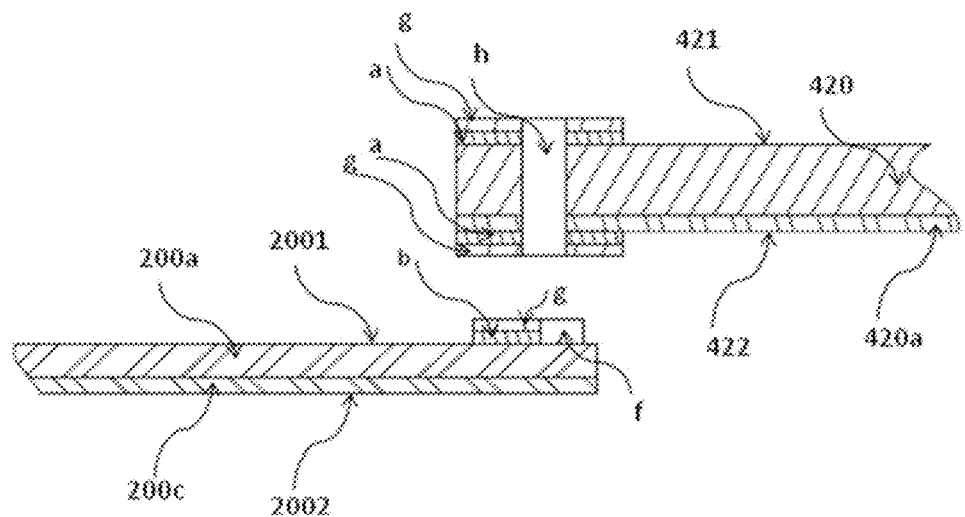
FIGS. 4B, 4C, and 4D are diagrams of a soldering process of the bendable circuit sheet and the printed circuit board of the power supply of FIG. 4A in accordance with an exemplary embodiment.
Figure 4C:
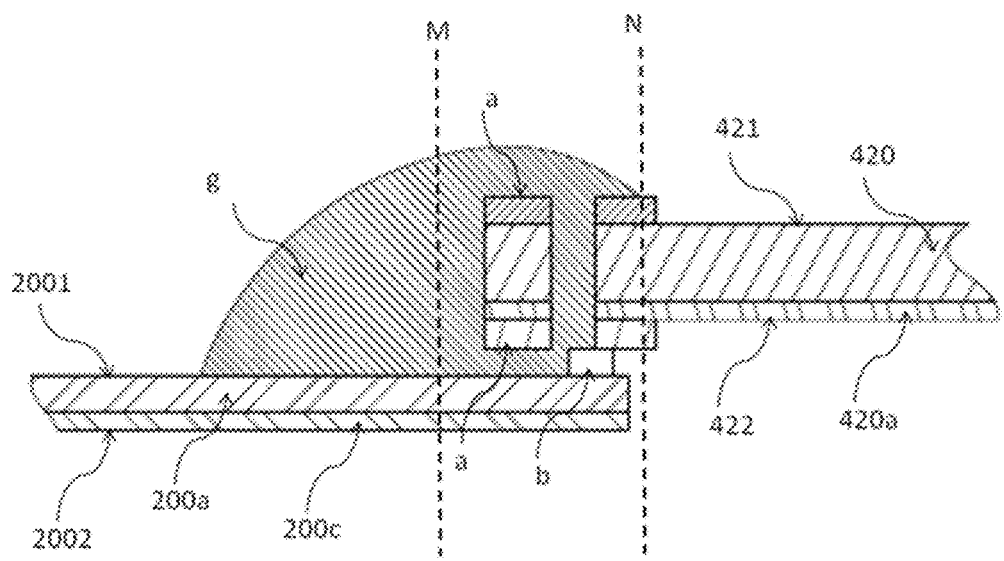
Figure 4D:
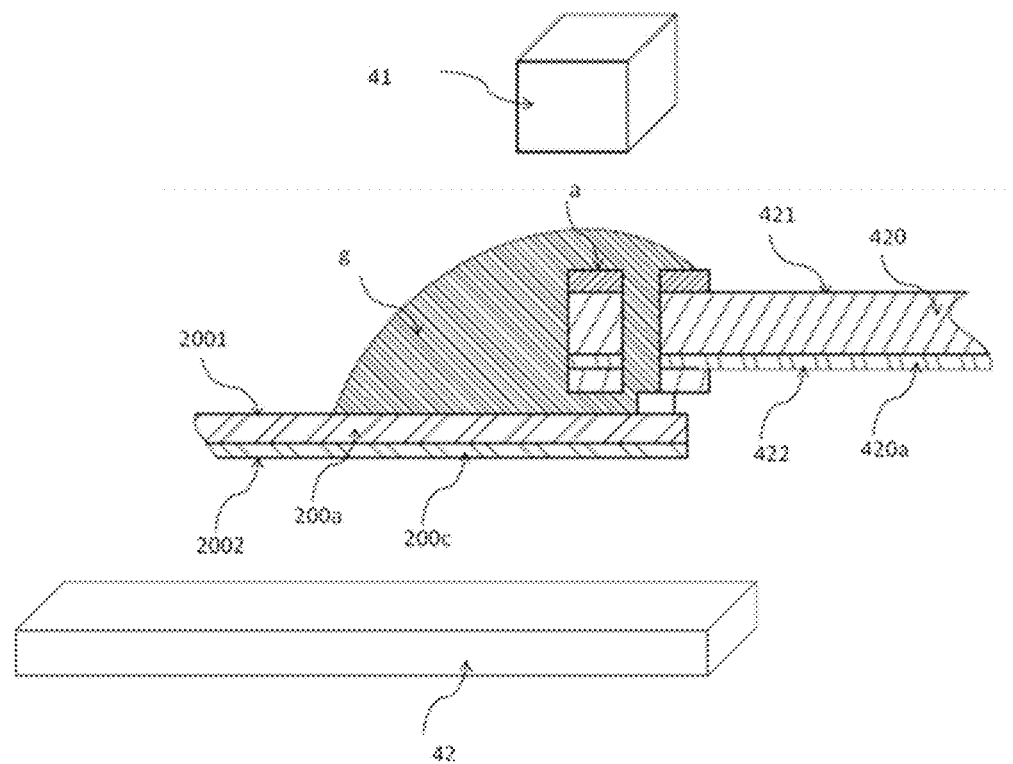

FIG. 4A is a perspective view of an exemplary bendable circuit sheet 200 and a printed circuit board 420 of a power supply 400 soldered to each other. FIG. 4B to FIG. 4D are diagrams illustrating an exemplary soldering process of the bendable circuit sheet 200 and the printed circuit board 420 of the power supply 400. In an embodiment, the structure of the bendable circuit sheet 200 is similar to FIG. 3A. The freely extending portions are the portions of two opposite ends of the bendable circuit sheet 200 and are utilized for being connected to the printed circuit board 420. Fixed portion is part of the light strip 200 attached to the inner circumferential surface of the lamp tube. The bendable circuit sheet 200 and the power supply 400 are electrically connected to each other by soldering. The bendable circuit sheet 200 comprises a circuit layer 200a and a circuit protection layer 200c over a side of the circuit layer 200a. Moreover, the bendable circuit sheet 200 comprises two opposite surfaces which are a first surface 2001 and a second surface 2002. The first surface 2001 is the one on the circuit layer 200a and away from the circuit protection layer 200c. The second surface 2002 is the other one on the circuit protection layer 200c and away from the circuit layer 200a. Several LED light sources 202 are disposed on the first surface 2001 and are electrically connected to circuits of the circuit layer 200a. The circuit protection layer 200c is made, for example, by polyimide (PI) having less thermal conductivity but being beneficial to protect the circuits. The first surface 2001 of the bendable circuit sheet 200 comprises soldering pads "b" (or referred as first soldering pads). Soldering material "g" can be placed on the soldering pads "b". In one embodiment, the bendable circuit sheet 200 further comprises a notch "f". The notch "f" is disposed on an edge of the end of the bendable circuit sheet 200 soldered to the printed circuit board 420 of the power supply 400. In some embodiments instead of a notch, a hole near the edge of the end of the bendable circuit sheet 200 may be used, which may thus provide additional contact material between the printed circuit board 420 and the bendable circuit sheet 200, thereby providing a stronger connection. The printed circuit board 420 comprises a power circuit layer 420a and soldering pads "a". Moreover, the printed circuit board 420 comprises two opposite surfaces which are a first surface (or a top surface) 421 and a second surface (or a bottom surface) 422. The second surface 422 is the one on the power circuit layer 420a. The soldering pads "a" are respectively disposed on the first surface 421 (those soldering pads "a" on the first surface 421 may be referred as second soldering pads) and the second surface 422 (those soldering pads "a" on the second surface 422 may be referred as third soldering pads). The soldering pads "a" on the first surface 421 are corresponding to those on the second surface 422. Soldering material "g" can be placed on the soldering pad "a". In one embodiment, considering the stability of soldering and the optimization of automatic process, the bendable circuit sheet 200 is disposed below the printed circuit board 420 (the direction is referred to FIG. 4B). For example, the first surface 2001 of the bendable circuit sheet 200 is connected to the second surface 422 of the printed circuit board 420. Also, as shown, the soldering material "g" can contact, cover, and be soldered to a top surface of the bendable circuit sheet 200 (e.g., first surface 2001), end side surfaces of soldering pads "a," soldering pad "b," and power circuit layer 420a formed at an edge of the printed circuit board 420, and a top surface of soldering pad "a" at the top surface 421 of the printed circuit board 420. In addition, the soldering material "g" can contact side surfaces of soldering pads "a," soldering pad "b," and power circuit layer 420a formed at a hole in the printed circuit board 420 and/or at a hole or notch in bendable circuit sheet 200. The soldering material may therefore form a bump-shaped portion covering portions of the bendable circuit sheet 200 and the printed circuit board 420, and a rod-shaped portion passing through the printed circuit board 420 and through a hole or notch in the bendable circuit sheet 200. The two portions (e.g., bump-shaped portion and rod-shaped portion) may serve as a rivet, for maintaining a strong connection between the bendable circuit sheet 200 and the printed circuit board 420.

As shown in FIG. 4C and FIG. 4D, in an exemplary soldering process of the bendable circuit sheet 200 and the printed circuit board 420, the circuit protection layer 200c of the bendable circuit sheet 200 is placed on a supporting table 42 (i.e., the second surface 2002 of the bendable circuit sheet 200 contacts the supporting table 42) in advance of soldering. The soldering pads "a" on the second surface 422 of the printed circuit board 420 contact the soldering pads "b" on the first surface 2001 of the bendable circuit sheet 200. And then a heating head 41 presses on a portion of soldering material "g" where the bendable circuit sheet 200 and the printed circuit board 420 are soldered to each other. When soldering, the soldering pads "b" on the first surface 2001 of the bendable circuit sheet 200 contact the soldering pads "a" on the second surface 422 of the printed circuit board 420, and the soldering pads "a" on the first surface 421 of the printed circuit board 420 contact the soldering material "g," which is pressed on by the heating head 41. Under this circumstance, the heat from the heating head 41 can transmit through the soldering pads "a" on the first surface 421 of the printed circuit board 420 and the soldering pads "a" on the second surface 422 of the printed circuit board 420 to the soldering pads "b" on the first surface 2001 of the bendable circuit sheet 200. The transmission of the heat between the heating heads 41 and the soldering pads "a" and "b" won't be affected by the circuit protection layer 200c which has relatively less thermal conductivity, since the circuit protection layer 200c is not between the heating head 41 and the circuit layer 200a. Consequently, the efficiency and stability regarding the connections and soldering process of the soldering pads "a" and "b" of the printed circuit board 420 and the bendable circuit sheet 200 can be improved.

As shown in the exemplary embodiment of FIG. 4C, the printed circuit board 420 and the bendable circuit sheet 200 are firmly connected to each other by the soldering material "g". Components between the virtual line M and the virtual line N of FIG. 4C from top to bottom are the soldering pads "a" on the first surface 421 of printed circuit board 420, the power circuit layer 420a, the soldering pads "a" on the second surface 422 of printed circuit board 420, the soldering pads "b" on the first surface 2001 of bendable circuit sheet 200, the circuit layer 200a of the bendable circuit sheet 200, and the circuit protection layer 200c of the bendable circuit sheet 200. The connection of the printed circuit board 420 and the bendable circuit sheet 200 are firm and stable. The soldering material "g" may extend higher than the soldering pads "a" on the first surface 421 of printed circuit board 420 and may fill in other spaces, as described above.

In other embodiments, an additional circuit protection layer (e.g., PI layer) can be disposed over the first surface 2001 of the circuit layer 200a. For example, the circuit layer 200a may be sandwiched between two circuit protection layers, and therefore the first surface 2001 of the circuit layer 200a can be protected by the circuit protection layer. A part of the circuit layer 200a (the part having the soldering pads "b") is exposed for being connected to the soldering pads "a" of the printed circuit board 420. Other parts of the circuit layer 200a are exposed by the additional circuit protection layer so they can connect to LED light sources 202. Under these circumstances, a part of the bottom of each LED light source 202 contacts the circuit protection layer on the first surface 2001 of the circuit layer 200a, and another part of the bottom of the LED light source 202 contacts the circuit layer 200a.

According to the exemplary embodiments shown in FIG. 4A to FIG. 4D, the printed circuit board 420 comprises through holes "h" passing through the soldering pads "a". In an automatic soldering process, when the heating head 41 automatically presses the printed circuit board 420, the soldering material "g" on the soldering pads "a" can be pushed into the through holes "h" by the heating head 41 accordingly. As a result, a soldered connection may be formed as shown in FIGS. 4C and 4D.

FIGS. 4A-4D illustrate embodiments of a soldering process between the light strip 200 and the power supply module 400. According to FIGS. 4A-4D, a structure of disposing the power supply module 400 on the top of the light strip 200 is provided. The soldering process can be applied to the LED tube lamp with the single-end power supply structure or with the dual-end power supply structure. Under the LED tube lamp with dual-end power supply structure, a route will be formed in the layout of the circuit layer of the light strip 200, so as to provide a current path for the commercial electricity flow through. When the LED tube lamp is powered up, a current will flow through the light strip 200 from one side to the other side via the current path and then will be input to a rectifying circuit (also known as a rectifier).

Figure 4E:
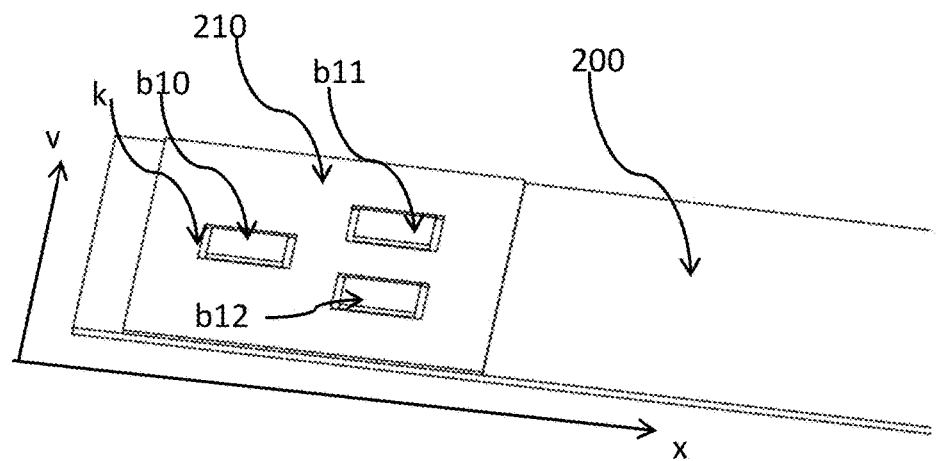
FIG. 4E is a schematic structure of freely extending portion of a light strip according to some exemplary embodiments.

FIG. 4E is a schematic structure of a freely extending portion of a light strip according to some exemplary embodiments. According to the soldering structure of the light strip 200 and the power supply module 400, an insulating sheet 210 having hollow holes k is disposed on the soldering area of the light strip 200 as shown in FIG. 4E. The insulating sheet is formed of an electrically insulating material, which material may also have thermal insulating properties. The insulating sheet 210 can be applied to the light strip 200 having two or more soldering pads. The width of the insulating sheet 210 may be substantially equal to the width of the light strip 200, and in one embodiment, the length of the insulating sheet 210 is 1 to 50 times of the length of the soldering pads. In an exemplary embodiment, the length of the insulating sheet 210 is 10 times of the length of the soldering pads. The thickness of the insulating sheet may be, for example, 0.5 to 5 times of the thickness of the light strip 200. In an exemplary embodiment, the thickness of the insulating sheet is substantially equal to the thickness of the light strip. The shape of the hollow holes correspond to or are the same as the shape of the soldering pads. The area of each hollow hole is slightly larger than the area of each soldering pad. In an exemplary embodiment, the area of each hollow hole ranges from 101% to 200% of the area of each soldering pad.

The insulating sheet 210 is generally in a strip shape or an oval shape, and the design has advantages to overcome the following issues. First, the molten solder paste may diffuse to the periphery and cause a short circuit between the soldering pads when soldering. By disposing the insulating sheet 210 on the light strip 200, the molten solder paste can be surrounded by the hollow holes k, so that the solder paste does not diffuse to the periphery and thus the risk of short circuit between the soldering pads can be reduced. Second, since the ink of the soldering area on the light strip 200 may be damaged when soldering, the leads covered by the ink may be exposed and lead to the risk of short circuit. Disposing the insulating sheet 210 on the soldering area can protect the ink and reduce the risk of short circuit so as to enhance the reliability of the soldering process. Third, since a high power electricity may apply to the lead (Line) of the light strip 200, the voltage at the soldering area of the light strip 200 and the short circuit board may exceed 300V. In this situation, the ink covering the surface of the light strip 200 can be broken down by the high voltage and lead to the risk of a short circuit. Disposing the insulating sheet 210 on the light strip 200 may prevent the ink from being broken down so as to enhance the reliability of the soldering process.

Figure 4F:
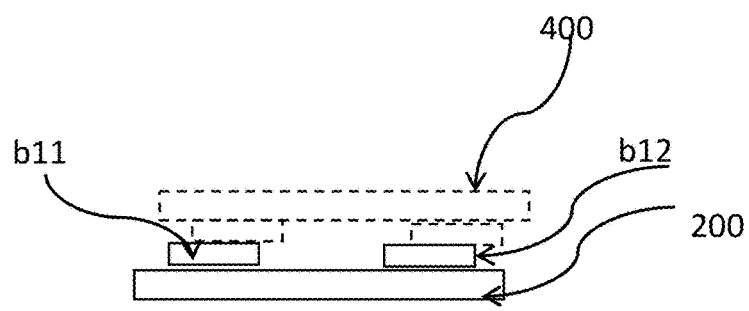
FIG. 4F is a cross-sectional view of a light strip along axis Z to Z1 according to some exemplary embodiments.

The circuit connection between the light strip 200 and the power supply module 400 is described below in accordance with FIGS. 4E and 4F. As shown in FIG. 4E, the light strip 200 has three soldering pads b10, b11 and b12, and the soldering pads b10, b11 and b12 are arranged in two columns in they direction. The circuit board (not shown) of the power supply module 400 has three soldering pads disposed at the position corresponding to the soldering pads b10, b11 and b12. When performing the soldering process by machines, there may be an offset, along the y direction, between the soldering pads on the light strip 200 and the soldering pads on the power supply module 400. As shown in FIG. 4F, the offset may occur due to the soldering pads b11 and b12 and the soldering pads on the circuit board of the power supply module 400. According to FIG. 4F, the soldering pads of the power supply module 400 do not exactly coincide with the corresponding soldering pads b11 and b12, which means at least part of each soldering pad of the power supply module 400 faces an offset region of the light strip 200 without directly attaching to the corresponding soldering pad b11/b12. Due to a conductive layer, configured to conduct high power electricity, being formed in the offset region, the ink coated on the offset region may be broken down by the high voltage in certain situations, so that the short circuit occurs between the conductive layer of the offset region and the soldering pads of the power supply module 400. In the present embodiment, the above issue can be prevented since the insulating sheet is coated on the periphery region, including the offset region, of the soldering pads b10, b11 and b12. Since the offset region is covered by the insulating sheet, the ink of the offset region will not easily be broken down by the high voltage. In some embodiments, the soldering pads on either the light strip 200 or the power supply module 400 are coated with a solder paste. In another some embodiments, there are one or plural through holes formed on at least one of the soldering pads b10, b11 and b12, so as to improve the connection strength between the light strip 200 and the power supply module 400.

Referring to FIG. 3B again, the four soldering pads on the light strip, which are connected to the short circuit board 253 (e.g., pads "L", "+", "−" and "GND"), can be arranged in two columns. In some embodiments, the soldering pad corresponding to the lead Line (or "L") is disposed on a side close to an end portion of the light strip (similar to the arrangement of the soldering pad b10 illustrated in FIG. 4E), the other three soldering pads can be disposed in a column, on another side far away from the end portion (similar to the arrangement of the soldering pads b11 and b12 illustrated in FIG. 4E). In some embodiments, two of the soldering pads are disposed on a side close to the end portion of the light strip and the other two of the soldering pads are disposed on another side far away from the end portion, in which the lead Line is disposed on the side close to the end portion. In some embodiments, the soldering pads of the short circuit board 253 are soldered on the light strip as shown in FIGS. 4A to 4D, and insulating sheets having hollow holes are disposed on the soldering area of the light strip.

In some embodiments, the insulating sheet is made of one or a combination of Polyimide (PI), Polyethylene (PE), Polyvinylidene difluoride (PVDF) and Polytetrafluoroethylene (PTFE). In some embodiments, the insulating sheet can be made of a PI film, which is the same material as the light strip. The insulating sheet may be adhered to the light strip by gluing or other connection means. In some embodiments, the length of the insulating sheet does not exceed the length of the freely extending portion of the light strip. In some embodiments, the number of the soldering pads on the light strip can be 2 or 4, and each soldering pad may further have one or plural through holes for improving the connection strength between the light strip and the circuit board of the power supply module.

Figure 8A:
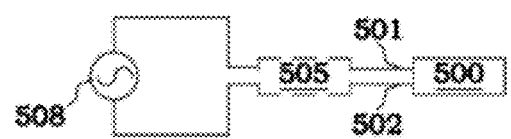
FIG. 8A is a block diagram of an exemplary power supply system for an LED tube lamp according to some exemplary embodiments.

FIG. 8A is a block diagram of a system including an LED tube lamp including a power supply module according to certain embodiments. Referring to FIG. 8A, an alternating current (AC) power supply 508 is used to supply an AC supply signal, and may be an AC powerline with a voltage rating, for example, in 100-277V and a frequency rating, for example, of 50 Hz or 60 Hz. A lamp driving circuit 505 receives the AC supply signal from the AC power supply 508 and then converts it into an AC driving signal. The power supply module and power supply 508 described above may include various elements for providing power to the LED light strip 2. For example, they may include power converters or other circuit elements for providing power to the LED light strip 2. In some embodiments, the power supply 508 and the lamp driving circuit 505 are outside of the LED tube lamp. For example, the lamp driving circuit 505 may be part of a lamp socket or lamp holder into which the LED tube lamp is inserted. The lamp driving circuit 505 could be an electronic ballast and may be used to convert the signal of commercial electricity into high-frequency and high-voltage AC driving signal. The common types of electronic ballast, such as instant-start electronic ballast, program-start electronic ballast, and rapid-start electronic ballast, can be applied for the LED tube lamp. In some embodiments, the voltage of the AC driving signal is bigger than 300V and in some embodiments 400-700V with frequency being higher than 10 kHz and in some embodiments 20-50 kHz. An LED tube lamp 500 receives the AC driving signal from the lamp driving circuit 505 and is thus driven to emit light. In the present embodiment, the LED tube lamp 500 is in a driving environment in which it is power-supplied at its one end cap having two conductive pins 501 and 502 (which can be referred to the external connection terminals), which are used to receive the AC driving signal. The two pins 501 and 502 may be electrically coupled to, either directly or indirectly, the lamp driving circuit 505.

In some embodiments, the lamp driving circuit 505 may be omitted and is therefore depicted by a dotted line. In certain embodiments, if the lamp driving circuit 505 is omitted, the AC power supply 508 is directly coupled to the pins 501 and 502, which then receive the AC supply signal as the AC driving signal.

Figure 8B:
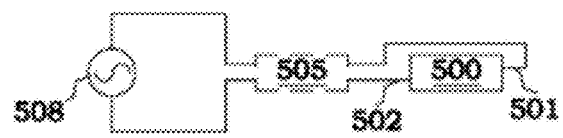
FIG. 8B is a block diagram of an exemplary power supply system for an LED tube lamp according to some exemplary embodiments.
Figure 8C:
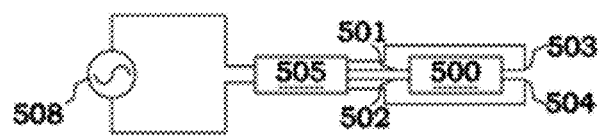
FIG. 8C is a block diagram of an exemplary power supply system for an LED tube lamp according to some exemplary embodiments.

In an alternative to the application of the single-end power supply mentioned above, the LED tube lamp may be power-supplied at its both end caps respectively having two conductive pins, which are coupled to the lamp driving circuit to concurrently receive the AC driving signal. Under the structure where the LED tube lamp having two end caps and each end cap has two conductive pins, the LED tube lamp can be designed for receiving the AC driving signal by one pin in each end cap, or by two pins in each end cap. An example of a circuit configuration of the power supply module receiving the AC driving signal by one pin in each end cap can be seen in FIG. 8B (referred to as a "dual-end-single-pin configuration" hereinafter), which illustrates a block diagram of an exemplary power supply module for an LED tube lamp according to some exemplary embodiments. Referring to FIG. 8B, each end cap of the LED tube lamp 500 could have only one conductive pin for receiving the AC driving signal. For example, it is not required to have two conductive pins used in each end cap for the purpose of passing electricity through the both ends of the LED tube lamp. Compared to FIG. 8A, the conductive pins 501 and 502 in FIG. 8B are correspondingly configured at both end caps of the LED tube lamp 500, and the AC power supply 508 and the lamp driving circuit 505 are the same as those mentioned above. The circuit configuration of the power supply module receiving the AC driving signal by two pins in each end cap can be referred to FIG. 8C (referred to "dual-end-dual-pin configuration" hereinafter), which illustrates a block diagram of an exemplary power supply module for an LED tube lamp according to some exemplary embodiments. Compared to FIG. 8A and FIG. 8B, the present embodiment further includes pins 503 and 504. One end cap of the lamp tube has the pins 501 and 502, and the other end cap of the lamp tube has the pins 503 and 504. The pins 501 to 504 are connected to the lamp driving circuit 505 to collectively receive the AC driving signal, and thus the LED light sources (not shown) in the LED tube lamp 500 are driven to emit light.

Under the dual-end-dual-pin configuration, no matter whether the AC driving signal is provided to two pins on one of the end caps, one pin on each end cap, or two pins on each end cap, the AC driving signal can be used for the operating power of the LED tube lamp by rearranging the circuit configuration of the power supply module. When the AC driving signal is provided to one pin on each end cap (i.e., different polarities of the AC driving signal are respectively provided to the two end caps), in an exemplary embodiment, another one pin on each end cap is set to a floating state. For example, the pins 502 and 503 can be set to the floating state, so that the tube lamp receives the AC driving signal via the pins 501 and 504. The power supply module performs rectification and filtering to the AC driving signal received from the pins 501 and 504. In another exemplary embodiment, both pins on the same end cap are connected to each other, for example, the pin 501 is connected to the pin 502 on the left end cap, and the pin 503 is connected to the pin 504 on the right end cap. Therefore, the pins 501 and 502 can be used for receiving the positive or negative AC driving signal, and the pins 503 and 504 can be used for receiving the AC driving signal having opposite polarity with the signal received by the pins 501 and 502. Thus, the power supply module within the tube lamp may perform the rectification and filtering to the received signal. When the AC driving signal is provided to two pins on each end cap, the pins on the same side may receive the AC driving signal having different polarity. For example, the pins 501 and 502 may receive the AC driving signal having opposite polarity, the pins 503 and 504 may receive the AC driving signal having opposite polarity, and the power supply module within the tube lamp may perform the rectification and filtering to the received signal.

Figure 8D:
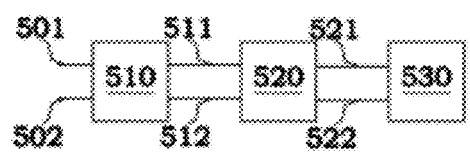
FIG. 8D is a block diagram of an exemplary LED lamp according to some exemplary embodiments.

FIG. 8D is a block diagram of an LED lamp according to one embodiment.

Referring to FIG. 8D, the power supply module of the LED lamp includes a rectifying circuit 510, a filtering circuit 520, and may further include some parts of an LED lighting module 530. The rectifying circuit 510 is coupled to two pins 501 and 502 to receive and then rectify an external driving signal, so as to output a rectified signal at two rectifying output terminals 511 and 512. In some embodiments, the external driving signal may be the AC driving signal or the AC supply signal described with reference to FIGS. 8A and 8B. In some embodiments, the external driving signal may be a direct current (DC) signal without altering the LED tube lamp. The filtering circuit 520 is coupled to the rectifying circuit for filtering the rectified signal to produce a filtered signal. For instance, the filtering circuit 520 is coupled to the rectifying circuit output terminals 511 and 512 to receive and then filter the rectified signal, so as to output a filtered signal at two filtering output terminals 521 and 522. The LED lighting module 530 is coupled to the filtering circuit 520 to receive the filtered signal for emitting light. For instance, the LED lighting module 530 may include a circuit coupled to the filtering output terminals 521 and 522 to receive the filtered signal and thereby to drive an LED unit (not shown) in the LED lighting module 530 to emit light. Details of these operations are described below in accordance with certain embodiments.

Figure 8E:
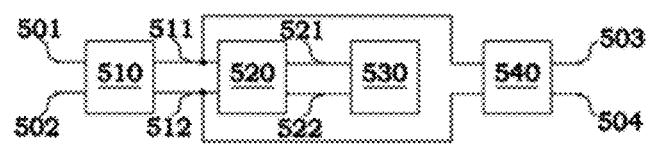
FIG. 8E is a block diagram of an exemplary LED lamp according to some exemplary embodiments.

FIG. 8E is a block diagram of an exemplary LED lamp according to some exemplary embodiments. Referring to FIG. 8E, the power supply module of the LED lamp includes a first rectifying circuit 510, a filtering circuit 520, an LED lighting module 530 and a second rectifying circuit 540, which can be utilized in the single-end power supply configuration illustrated in FIG. 8A or the dual-end power supply configuration illustrated in FIGS. 8B and 8C. The first rectifying circuit 510 is coupled to the pins 501 and 502 to receive and then rectify an external driving signal transmitted by the pins 501 and 502; the second rectifying circuit 540 is coupled to the pins 503 and 504 to receive and then rectify an external driving signal transmitted by pins 503 and 504. The first rectifying circuit 510 and the second rectifying circuit 540 of the power supply module collectively output a rectified signal at two rectifying circuit output terminals 511 and 512. The filtering circuit 520 is coupled to the rectifying circuit output terminals 511 and 512 to receive and then filter the rectified signal, so as to output a filtered signal at two filtering output terminals. The LED lighting module 530 is coupled to the filtering output terminals to receive the filtered signal, so as to drive the LED light source (not shown) for emitting light.

Figure 8F:
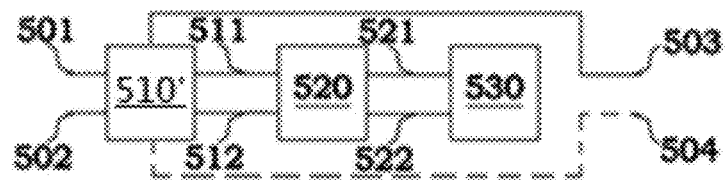
FIG. 8F is a block diagram of an exemplary LED lamp according to some exemplary embodiments.

FIG. 8F is a block diagram of an exemplary LED lamp according to some exemplary embodiments. Referring to FIG. 8F, the power supply module of LED tube lamp includes a rectifying circuit 510', a filtering circuit 520 and part of an LED lighting module 530, which can also be utilized in the single-end power supply configuration illustrated in FIG. 8A or the dual-end power supply configuration illustrated in FIGS. 8B and 8C. The difference between the embodiments illustrated in FIG. 8F and FIG. 8E is that the rectifying circuit 510' has three input terminals to be coupled to the pins 501 to 503, respectively. The rectifying circuit 510' rectifies the signals received from the pins 501 to 503, in which the pin 504 can be set to the floating state or connected to the pin 503. Therefore, the second rectifying circuit 540 can be omitted in the present embodiment. The rest of circuitry operates substantially the same as the embodiment illustrated in FIG. 8E, so that the detailed description is not repeated herein.

Although there are two rectifying output terminals 511 and 512 and two filtering output terminals 521 and 522 in the embodiments of these Figs., in practice the number of ports or terminals for coupling between the rectifying circuit 510, the filtering circuit 520, and the LED lighting module 530 may be one or more depending on the needs of signal transmission between the circuits or devices.

In addition, the power supply module of the LED lamp described in FIG. 8D, and embodiments of a power supply module of an LED lamp described below, may each be used in the LED tube lamp 500 in FIGS. 8A and 8B, and may instead be used in any other type of LED lighting structure having two conductive pins used to conduct power, such as LED light bulbs, personal area lights (PAL), plug-in LED lamps with different types of bases (such as types of PL-S, PL-D, PL-T, PL-L, etc.), etc. Further, the implementation for LED light bulbs may provide better effects on protecting from electric shock as combining this invention and the structures disclosed in PCT patent application WO2016045631.

Figure 8G:
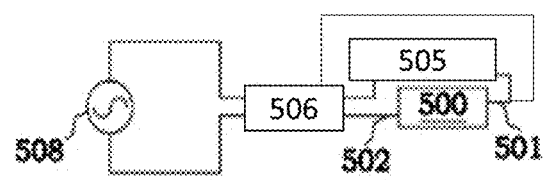
FIG. 8G is a block diagram of a connection configuration between an LED lamp and an external power source according to some exemplary embodiments.

When the LED tube lamp 500 is applied to the dual-end power structure with at least one pin, retrofit can be performed to a lamp socket including a lamp driving circuit or a ballast 505, so as to bypass the ballast 505 and provide the AC power supply (e.g., commercial electricity) as the power source of the LED tube lamp. FIG. 8G is a block diagram of a connection configuration between an LED lamp and an external power source according to some exemplary embodiments. Compared to FIG. 8A, the embodiment illustrated in FIG. 8G further provides a ballast bypass module 506 disposed between the AC power supply 508 and the ballast 505. The rest of the circuit modules perform the same or similar function with the embodiment illustrated in FIG. 8B. The ballast bypass module 506, also described as a ballast bypass circuit, receives the power provided by the AC power supply 508, and is connected to the pins 501 and 502 of the LED tube lamp 500 illustrated in FIG. 8G (in which the ballast bypass module 506 is also connected to the ballast 505 for performing specific control). The ballast bypass module 506 is configured to bypass the electricity received from the AC power supply 508 and then output to the pins 501 and 502 for providing power to the LED tube lamp 500. In some exemplary embodiments, the ballast bypass module 506 includes a switch circuit configured to bypass the ballast 505, in which the switch circuit includes, for example, a component or a device such as an electrical switch or an electronic switch. One skilled in the art of fluorescent lighting may understand or design a feasible structure or circuit that constitutes the ballast bypass module 506. Furthermore, the ballast bypass module 506 can be disposed in a traditional fluorescent lamp socket having the ballast 505, or in the power supply module 5 or 250 of the LED tube lamp 500. Furthermore, if the bypass function of the ballast bypass module 506 is suspended, the equivalent connection configuration between the LED tube lamp and the external power source is similar to the configuration illustrated in FIG. 8A to FIG. 8C, in which the ballast 505 is still coupled to the pins 501 and 502, so that the LED tube lamp 500 still can be powered (i.e., receive AC power supply 508) through the ballast 505. This modification (adding the ballast bypass module 506) allows the LED tube lamp 500 to compatibly receive power, provided by the AC power supply 508 (but not provided by the ballast 505), through the dual-end pin configuration even though the LED tube lamp 500 is installed on a lamp socket having the ballast 505.

Figure 9A:
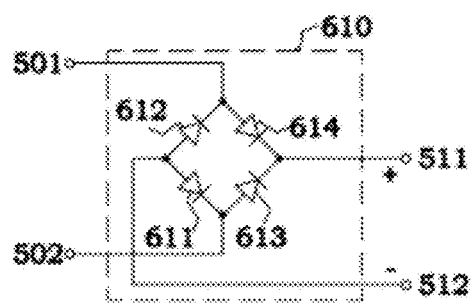
FIG. 9A-9F are schematic diagrams of exemplary rectifying circuits according to some exemplary embodiments.

FIG. 9A is a schematic diagram of a rectifying circuit according to an embodiment. Referring to FIG. 9A, a rectifying circuit 610, i.e. a bridge rectifier, includes four rectifying diodes 611, 612, 613, and 614, configured to full-wave rectify a received signal. The diode 611 has an anode connected to the output terminal 512, and a cathode connected to the pin 502. The diode 612 has an anode connected to the output terminal 512, and a cathode connected to the pin 501. The diode 613 has an anode connected to the pin 502, and a cathode connected to the output terminal 511. The diode 614 has an anode connected to the pin 501, and a cathode connected to the output terminal 511.

When the pins 501 and 502 receive an AC signal, the rectifying circuit 610 operates as follows. During the connected AC signal's positive half cycle, the AC signal is input through the pin 501, the diode 614, and the output terminal 511 in sequence, and later output through the output terminal 512, the diode 611, and the pin 502 in sequence. During the connected AC signal's negative half cycle, the AC signal is input through the pin 502, the diode 613, and the output terminal 511 in sequence, and later output through the output terminal 512, the diode 612, and the pin 501 in sequence.

Therefore, during the connected AC signal's full cycle, the positive pole of the rectified signal produced by the rectifying circuit 610 keeps at the output terminal 511, and the negative pole of the rectified signal remains at the output terminal 512. Accordingly, the rectified signal produced or output by the rectifying circuit 610 is a full-wave rectified signal.

When the pins 501 and 502 are coupled to a DC power supply to receive a DC signal, the rectifying circuit 610 operates as follows. When the pin 501 is coupled to the positive end of the DC power supply and the pin 502 to the negative end of the DC power supply, the DC signal is input through the pin 501, the diode 614, and the output terminal 511 in sequence, and later output through the output terminal 512, the diode 611, and the pin 502 in sequence. When the pin 501 is coupled to the negative end of the DC power supply and the pin 502 to the positive end of the DC power supply, the DC signal is input through the pin 502, the diode 613, and the output terminal 511 in sequence, and later output through the output terminal 512, the diode 612, and the pin 501 in sequence. Therefore, no matter what the electrical polarity of the DC signal is between the pins 501 and 502, the positive pole of the rectified signal produced by the rectifying circuit 610 keeps at the output terminal 511, and the negative pole of the rectified signal remains at the output terminal 512.

Therefore, the rectifying circuit 610 in this embodiment can output or produce a proper rectified signal regardless of whether the received input signal is an AC or DC signal.

Figure 9B:
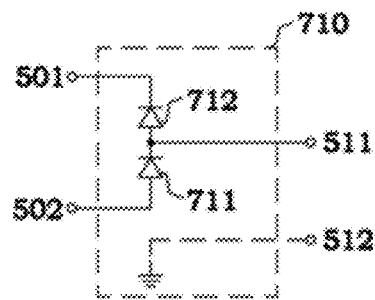

FIG. 9B is a schematic diagram of a rectifying circuit according to an embodiment. Referring to FIG. 9B, a rectifying circuit 710 includes two rectifying diodes 711 and 712, configured to half-wave rectify a received signal. The rectifying diode 711 has an anode connected to the pin 502, and a cathode connected to the rectifying output terminal 511. The rectifying diode 712 has an anode connected to the rectifying output terminal 511, and a cathode connected to the pin 501. The rectifying output terminal 512 can be omitted or connect to ground according to the practical application. Detailed operations of the rectifying circuit 710 are described below.

During the connected AC signal's positive half cycle, the signal level of the AC signal input through the pin 501 is greater than the signal level of the AC signal input through the pin 502. At that time, both the rectifying diodes 711 and 712 are cut off since being reverse biased, and thus the rectifying circuit 710 stops outputting the rectified signal. During the connected AC signal's negative half cycle, the signal level of the AC signal input through the pin 501 is less than the signal level of the AC signal input through the pin 502. At that time, both the rectifying diodes 711 and 712 are conducting since they are forward biased, and thus the AC signal is input through the pin 502, the rectifying diode 711, and the rectifying output terminal 511 in sequence, and later output through the rectifying output terminal 512 or another circuit or ground of the LED tube lamp. Accordingly, the rectified signal produced or output by the rectifying circuit 710 is a half-wave rectified signal.

Figure 9C:
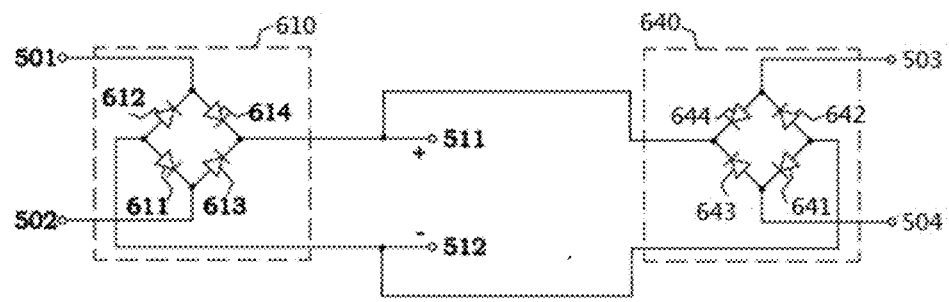

It should be noted that, when the pins 501 and 502 shown in FIG. 9A and FIG. 9B are respectively changed to the pins 503 and 504, the rectifying circuit 610 and 710 can be considered as the rectifying circuit 540 illustrated in FIG. 8E. More specifically, in an exemplary embodiment, when the full-wave rectifying circuit 610 shown in FIG. 9A is applied to the dual-end tube lamp shown in FIG. 8E, the configuration of the rectifying circuits 510 and 540 is shown in FIG. 9C. FIG. 9C is a schematic diagram of a rectifying circuit according to an embodiment.

Referring to FIG. 9C, the rectifying circuit 640 has the same configuration as the rectifying circuit 610, which is the bridge rectifying circuit. The rectifying circuit 610 includes four rectifying diodes 611 to 614, which has the same configuration as the embodiment illustrated in FIG. 9A. The rectifying circuit 640 includes four rectifying diodes 641 to 644 and is configured to perform full-wave rectification on the received signal. The rectifying diode 641 has an anode coupled to the rectifying output terminal 512, and a cathode coupled to the pin 504. The rectifying diode 642 has an anode coupled to the rectifying output terminal 512, and a cathode couple to the pin 503. The rectifying diode 643 has an anode coupled to the pin 502, and a cathode coupled to the rectifying output terminal 511. The rectifying diode 644 has an anode coupled to the pin 503, and a cathode coupled to the rectifying output terminal 511.

In the present embodiment, the rectifying circuits 610 and 640 are configured to correspond to each other, in which the difference between the rectifying circuits 610 and 640 is that the input terminal of the rectifying circuit 610 (which can be used as the rectifying circuit 510 shown in FIG. 8E) is coupled to the pins 501 and 502, but the input terminal of the rectifying circuit 640 (which can be used as the rectifying circuit 540 shown in FIG. 8E) is coupled to the pins 503 and 504. Therefore, the present embodiment applies a structure including two full-wave rectifying circuits for implementing the dual-end-dual-pin circuit configuration.

In some embodiments, in the rectifying circuit illustrated in the example of FIG. 9C, although the circuit configuration is disposed as the dual-end-dual-pin configuration, the external driving signal is not limited to be provided through both pins on each end cap. Under the configuration shown in FIG. 9C, no matter whether the AC signal is provided through both pins on single end cap or through signal pin on each end cap, the rectifying circuit shown in FIG. 9C may correctly rectify the received signal and generate the rectified signal for lighting the LED tube lamp. Detailed operations are described below.

When the AC signal is provided through both pins on single end cap, the AC signal can be applied to the pins 501 and 502, or to the pins 503 and 504. When the AC signal is applied to the pins 501 and 502, the rectifying circuit 610 performs full-wave rectification on the AC signal based on the operation illustrated in the embodiment of FIG. 9A, and the rectifying circuit 640 does not operate. On the contrary, when the external driving signal is applied to the pins 503 and 504, the rectifying circuit 640 performs full-wave rectification on the AC signal based on the operation illustrated in the embodiment of FIG. 9A, and the rectifying circuit 610 does not operate.

When the AC signal is provided through a single pin on each end cap, the AC signal can be applied to the pins 501 and 504, or to the pins 502 and 503. For example, the dual pins on each end cap can be arranged based on standard socket configuration so that the AC signal will be applied to either pins 501 and 504 or pins 502 and 503, but not pins 501 and 503 or pins 502 and 504 (e.g., based on the physical positioning of the pins on each end cap).

When the AC signal is applied to the pins 501 and 504, during the AC signal's positive half cycle (e.g., the voltage at pin 501 is higher than the voltage at pin 504), the AC signal is input through the pin 501, the diode 614, and the output terminal 511 in sequence, and later output through the output terminal 512, the diode 641, and the pin 504 in sequence. In this manner, output terminal 511 remains at a higher voltage than output terminal 512. During the AC signal's negative half cycle (e.g., the voltage at pin 504 is higher than the voltage at pin 501), the AC signal is input through the pin 504, the diode 643, and the output terminal 511 in sequence, and later output through the output terminal 512, the diode 612, and the pin 501 in sequence. In this manner, output terminal 511 still remains at a higher voltage than output terminal 512. Therefore, during the AC signal's full cycle, the positive pole of the rectified signal remains at the output terminal 511, and the negative pole of the rectified signal remains at the output terminal 512. Accordingly, the diodes 612 and 614 of the rectifying circuit 610 and the diodes 641 and 643 of the rectifying circuit 640 are configured to perform the full-wave rectification on the AC signal and thus the rectified signal produced or output by the diodes 612, 614, 641, and 643 is a full-wave rectified signal.

On the other hand, when the AC signal is applied to the pins 502 and 503, during the AC signal's positive half cycle (e.g., the voltage at pin 502 is higher than the voltage at pin 503), the AC signal is input through the pin 502, the diode 613, and the output terminal 511 in sequence, and later output through the output terminal 512, the diode 642, and the pin 503. During the AC signal's negative half cycle (e.g., the voltage at pin 503 is higher than the voltage at pin 502), the AC signal is input through the pin 503, the diode 644, and the output terminal 511 in sequence, and later output through the output terminal 512, the diode 611, and the pin 502 in sequence. Therefore, during the AC signal's full cycle, the positive pole of the rectified signal remains at the output terminal 511, and the negative pole of the rectified signal remains at the output terminal 512. Accordingly, the diodes 611 and 613 of the rectifying circuit 610 and the diodes 642 and 644 of the rectifying circuit 640 are configured to perform the full-wave rectification on the AC signal and thus the rectified signal produced or output by the diodes 611, 613, 642, and 644 is a full-wave rectified signal.

When the AC signal is provided through two pins on each end cap, the operation in each of the rectifying circuits 610 and 640 can be referred to the embodiment illustrated in FIG. 9A, and it will not be repeated herein. The rectified signal produced by the rectifying circuits 610 and 640 is output to the rear-end circuit after superposing on the output terminals 511 and 512.

Figure 9D:
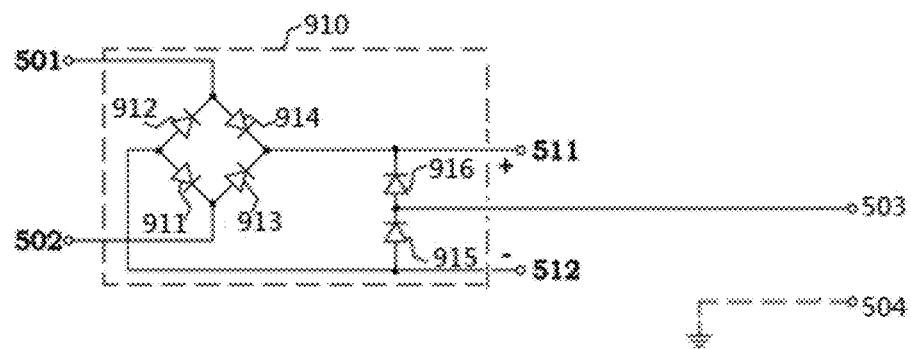

In an exemplary embodiment, the rectifying circuit 510' illustrated in FIG. 8F can be implemented by the configuration illustrated in FIG. 9D. FIG. 9D is a schematic diagram of a rectifying circuit according to an embodiment. Referring to FIG. 9D, the rectifying circuit 910 includes diodes 911 to 914, which are configured as the embodiment illustrated in FIG. 9A. In the present embodiment, the rectifying circuit 910 further includes rectifying diodes 915 and 916. The diode 915 has an anode coupled to the rectifying output terminal 512, and a cathode coupled to the pin 503. The diode 916 has an anode coupled to the pin 503, and a cathode coupled to the rectifying output terminal 511. The pin 504 is set to the float state in the present embodiment.

Specifically, the rectifying circuit 910 can be regarded as a rectifying circuit including three sets of bridge arms, in which each of the bridge arms provides an input signal receiving terminal. For example, the diodes 911 and 913 constitute a first bridge arm for receiving the signal on the pin 502; the diodes 912 and 914 constitute a second bridge arm for receiving the signal on the pin 501; and the diodes 915 and 916 constitute a third bridge arm for receiving the signal on the pin 503. According to the rectifying circuit 910 illustrated in FIG. 9D, the full-wave rectification can be performed as long as different polarity AC signal is respectively received by two of the bridge arms. Accordingly, under the configuration illustrated in FIG. 9D, no matter what kind of power supply configuration, such as the AC signal being provided to both pins on single end cap, a single pin on each end cap, or both pins on each end cap, the rectifying circuit 910 is compatible for producing the rectified signal, correctly. Detailed operations of the present embodiment are described below.

When the AC signal is provided through both pins on single end cap, the AC signal can be applied to the pins 501 and 502. The diodes 911 to 914 perform full-wave rectification on the AC signal based on the operation illustrated in the embodiment of FIG. 9A, and the diodes 915 and 916 do not operate.

When the AC signal is provided through single pin on each end cap, the AC signal can be applied to the pins 501 and 503, or to the pins 502 and 503. When the AC signal is applied to the pins 501 and 503, during the AC signal's positive half cycle (e.g., when the signal on pin 501 has a larger voltage than the signal on pin 503), the AC signal is input through the pin 501, the diode 914, and the output terminal 511 in sequence, and later output through the output terminal 512, the diode 915, and the pin 503 in sequence. During the AC signal's negative half cycle (e.g., when the signal on pin 503 has a larger voltage than the signal on pin 501), the AC signal is input through the pin 503, the diode 916, and the output terminal 511 in sequence, and later output through the output terminal 512, the diode 912, and the pin 501 in sequence. Therefore, during the AC signal's full cycle, the positive pole of the rectified signal remains at the output terminal 511, and the negative pole of the rectified signal remains at the output terminal 512. Accordingly, the diodes 912, 914, 915, and 916 of the rectifying circuit 910 are configured to perform the full-wave rectification on the AC signal and thus the rectified signal produced or output by the diodes 912, 914, 915, and 916 is a full-wave rectified signal.

On the other hand, when the AC signal is applied to the pins 502 and 503, during the AC signal's positive half cycle (e.g., when the signal on pin 502 has a larger voltage than the signal on pin 503), the AC signal is input through the pin 502, the diode 913, and the output terminal 511 in sequence, and later output through the output terminal 512, the diode 915, and the pin 503. During the AC signal's negative half cycle (e.g., when the signal on pin 503 has a larger voltage than the signal on pin 502), the AC signal is input through the pin 503, the diode 916, and the output terminal 511 in sequence, and later output through the output terminal 512, the diode 911, and the pin 502 in sequence. Therefore, during the AC signal's full cycle, the positive pole of the rectified signal remains at the output terminal 511, and the negative pole of the rectified signal remains at the output terminal 512. Accordingly, the diodes 911, 913, 915, and 916 of the rectifying circuit 910 are configured to perform the full-wave rectification on the AC signal and thus the rectified signal produced or output by the diodes 911, 913, 915, and 916 is a full-wave rectified signal.

When the AC signal is provided through two pins on each end cap, the operation of the diodes 911 to 914 can be referred to the embodiment illustrated in FIG. 9A, and it will not be repeated herein. Also, if the signal polarity of the pin 503 is the same as the pin 501, the operation of the diodes 915 and 916 is similar to that of the diodes 912 and 914 (i.e., the first bridge arm). On the other hand, if the signal polarity of the pin 503 is the same as that of the pin 502, the operation of the diodes 915 and 916 is similar with the diodes 912 and 914 (i.e., the second bridge arm).

Figure 9E:
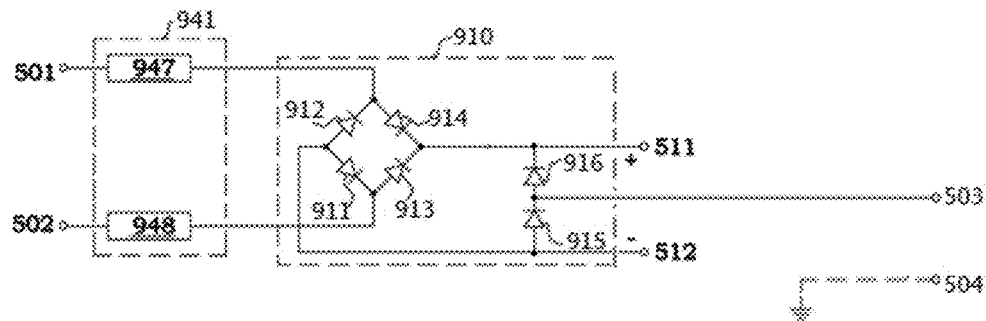

FIG. 9E is a schematic diagram of a rectifying circuit according to an embodiment. Referring to FIG. 9E, the difference between the embodiments of FIG. 9E and FIG. 9D is that the rectifying circuit shown in FIG. 9E further includes a terminal adapter circuit 941. The terminal adapter circuit 941 includes fuses 947 and 948. One end of the fuse 947 is coupled to the pin 501, and the other end of the fuse 947 is coupled to the connection node of the diodes 912 and 914 (i.e., the input terminal of the first bridge arm). One end of the fuse 948 is coupled to the pin 502, and the other end of the fuse 948 is coupled to the connection node of the diodes 911 and 913 (i.e., the input terminal of the second bridge arm). Accordingly, when the current flowing through any one of the pins 501 and 502 is higher than the rated current of the fuses 947 and 948, the fuse 947/948 will be fused (e.g., broken) in response to the current so as to form an open circuit between the pin 501/502 and the rectifying circuit 910, thereby achieving the function of over current protection. In the case of only one of the fuses 947 and 948 being fused (e.g., the over current situation just happens in a brief period and then is eliminated), if the AC driving signal is provided through both pins on each end cap, the rectifying circuit still works, after the over current situation is eliminated, since the AC driving signal can be provided through single pin on each end cap.

Figure 9F:
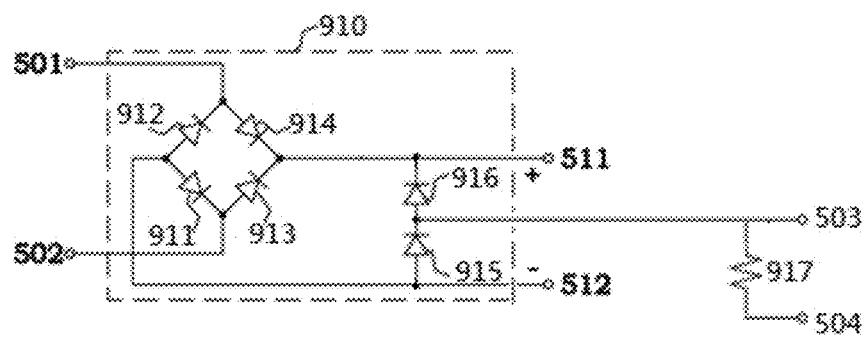

FIG. 9F is a schematic diagram of a rectifying circuit according to an embodiment. Referring to FIG. 9F, the difference between the embodiments of FIG. 9F and FIG. 9D is that the pins are connected to each other through a thin wire 917. Compared to the embodiments illustrated in FIG. 9D or FIG. 9E, when the AC signal is applied to the dual-end-single-pin configuration, no matter the AC signal is applied to the pin 503 or the pin 504, the rectifying circuit of the present embodiment can be normally operated. Furthermore, when the pins 503 and 504 are installed on the wrong lamp socket which provides the AC signal to the single end cap, the thin wire 917 can be reliably fused. Therefore, when the lamp is installed on the correct lamp socket, the tube lamp utilizing the rectifying illustrated in FIG. 9F may keep working, normally.

According to the embodiments mentioned above, the rectifying circuits illustrated in FIG. 9C to 9F are compatible for receiving the AC signal through both pins on single end cap, through single pin on each end cap, and through both pins on each end cap, such that the compatibility of the LED tube lamp's application is improved. In this manner, an LED tube lamp can include a rectifying circuit that is arranged to rectify an AC signal in all of the following situations: when the LED tube lamp is connected (e.g., coupled to a socket) to receive the AC signal through both of two pins on a single end cap; when the LED tube lamp is connected (e.g., coupled to a socket) to receive the AC signal through both of two pins on each end cap; and when the LED tube lamp is connected (e.g., coupled to a socket) to receive the AC signal through a single pin on each end cap. In addition, based on the aspect of the actual circuit layout scenario, the embodiments illustrated in FIG. 9D to 9F require only three power pads for connecting the corresponding pins, so that the process yield can be significant enhanced since the manufacture process of the three pads configuration is easier than the four power pads configuration.

In some embodiments, one or plural varistors (also known as voltage dependent resistor (VDR)) is disposed on the input side or the output side of the rectifying circuit. The varistor is configured to protect against excessive transient voltages by shunting the current created by the excessive voltage. According to some embodiments of disposing the varistor on the input side of the rectifying circuit, the varistor is electrically connected between the pins 501 and 502. According to some embodiments of disposing the varistor on the output side of the rectifying circuit, the varistor is electrically connected between the rectifying output terminals 511 and 512. In some embodiments, the varistor can be designed for smaller size by disposing the varistor on the output side of the rectifying circuit. In some embodiments, the size of the varistor disposed on the output side of the rectifying circuit can be half of the varistor disposed on the input side of the rectifying circuit.

Figure 10A:
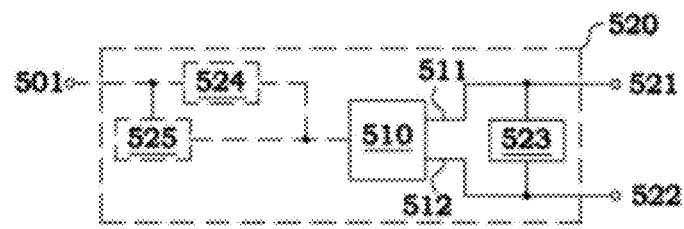
FIGS. 10A-10C are block diagrams of exemplary filtering circuits according to some exemplary embodiments.

FIG. 10A is a block diagram of the filtering circuit according to an embodiment. A rectifying circuit 510 is shown in FIG. 10A for illustrating its connection with other components, without intending a filtering circuit 520 to include the rectifying circuit 510. Referring to FIG. 10A, the filtering circuit 520 includes a filtering unit 523 coupled to two rectifying output terminals 511 and 512 to receive and to filter out ripples of a rectified signal from the rectifying circuit 510. Accordingly, the waveform of a filtered signal is smoother than that of the rectified signal. The filtering circuit 520 may further include another filtering unit 524 coupled between a rectifying circuit and a pin correspondingly, for example, between the rectifying circuit 510 and the pin 501, the rectifying circuit 510 and the pin 502, the rectifying circuit 540 and the pin 503, and/or the rectifying circuit 540 and the pin 504. The filtering unit 524 is used to filter a specific frequency, for example, to filter out a specific frequency of an external driving signal. In this embodiment, the filtering unit 524 is coupled between the rectifying circuit 510 and the pin 501. The filtering circuit 520 may further include another filtering unit 525 coupled between one of the pins 501 and 502 and one of the diodes of the rectifying circuit 510, or between one of the pins 503 and 504 and one of the diodes of the rectifying circuit 540 to reduce or filter out electromagnetic interference (EMI). In this embodiment, the filtering unit 525 is coupled between the pin 501 and one of diodes (not shown in FIG. 10A) of the rectifying circuit 510. Since the filtering units 524 and 525 may be present or omitted depending on actual circumstances of their uses, they are depicted by a dotted line in FIG. 10A.

Figure 10B:
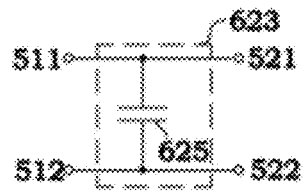

FIG. 10B is a schematic diagram of the filtering unit according to an embodiment. Referring to FIG. 10B, a filtering unit 623 includes a capacitor 625 having an end coupled to the output terminal 511 and a filtering output terminal 521 and the other end thereof coupled to the output terminal 512 and a filtering output terminal 522, and is configured to low-pass filter a rectified signal from the output terminals 511 and 512, so as to filter out high-frequency components of the rectified signal and thereby output a filtered signal at the filtering output terminals 521 and 522.

Figure 10C:
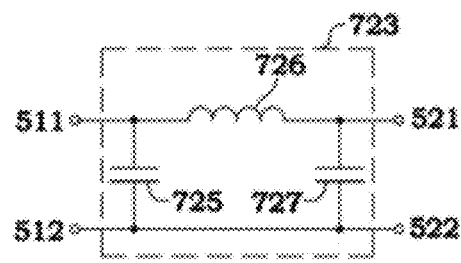

FIG. 10C is a schematic diagram of the filtering unit according to an embodiment. Referring to FIG. 10C, a filtering unit 723 includes a pi filter circuit including a capacitor 725, an inductor 726, and a capacitor 727. As is well known, a pi filter circuit looks like the symbol π in its shape or structure. The capacitor 725 has an end connected to the output terminal 511 and coupled to the filtering output terminal 521 through the inductor 726, and has another end connected to the output terminal 512 and the filtering output terminal 522. The inductor 726 is coupled between output terminal 511 and the filtering output terminal 521. The capacitor 727 has an end connected to the filtering output terminal 521 and coupled to the output terminal 511 through the inductor 726, and has another end connected to the output terminal 512 and the filtering output terminal 522.

As seen between the output terminals 511 and 512 and the filtering output terminals 521 and 522, the filtering unit 723 compared to the filtering unit 623 in FIG. 10B additionally has an inductor 726 and a capacitor 727, which perform the function of low-pass filtering like the capacitor 725 does. Therefore, the filtering unit 723 in this embodiment compared to the filtering unit 623 in FIG. 10B has a better ability to filter out high-frequency components to output a filtered signal with a smoother waveform.

The inductance values of the inductor 726 in the embodiments mentioned above are chosen in the range of, for example in some embodiments, about 10 nH to 10 mH. And the capacitance values of the capacitors 625, 725, and 727 in the embodiments stated above are chosen in the range of, for example in some embodiments, about 100 pF to 1 uF.

Figure 11A:
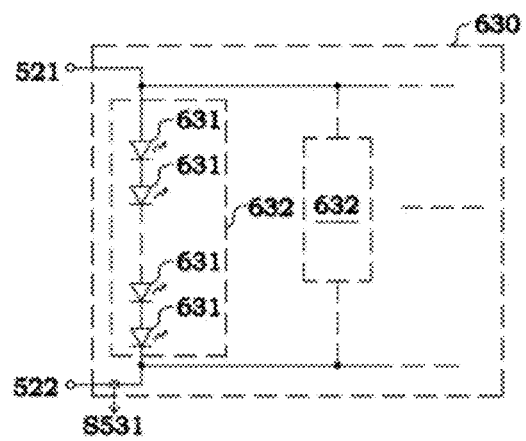
FIGS. 11A-11B are schematic diagrams of exemplary LED modules according to some exemplary embodiments.

FIG. 11A is a schematic diagram of an LED module according to an embodiment. Referring to FIG. 11A, an LED module 630 has an anode connected to a filtering output terminal 521, a cathode connected to a filtering output terminal 522, and includes at least one LED unit 632, such as the light source mentioned above. When two or more LED units are included, they are connected in parallel. The anode of each LED unit 632 is connected to the anode of LED module 630 to couple with the filtering output terminal 521, and the cathode of each LED unit 632 is connected to the cathode of LED module 630 to couple to the filtering output terminal 522. Each LED unit 632 includes at least one LED 631. When multiple LEDs 631 are included in an LED unit 632, they are connected in series with the anode of the first LED 631 connected to the anode of this LED unit 632 (the anode of the first LED 631 and the anode of the LED unit 632 may be the same terminal) and the cathode of the first LED 631 connected to the next or second LED 631. And the anode of the last LED 631 in this LED unit 632 is connected to the cathode of a previous LED 631 and the cathode of the last LED 631 connected to the cathode of this LED unit 632 (the cathode of the last LED 631 and the cathode of the LED unit 632 may be the same terminal).

In some embodiments, the LED module 630 may produce a current detection signal S531 reflecting the magnitude of current through the LED module 630 and being used for controlling or detecting the LED module 630.

Figure 11B:
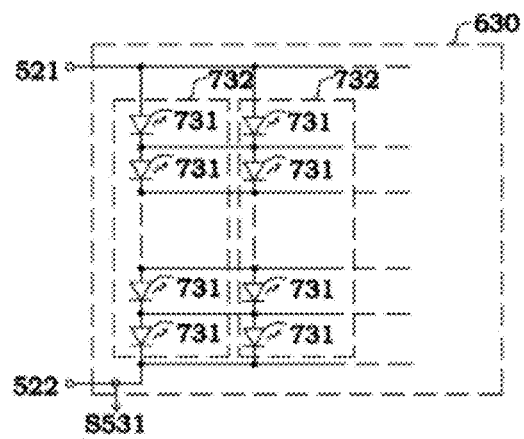

FIG. 11B is a schematic diagram of an LED module according to an exemplary embodiment. Referring to FIG. 11B, an LED module 630 has an anode connected to a filtering output terminal 521, a cathode connected to a filtering output terminal 522, and includes at least two LED units 732 with the anode of each LED unit 732 connected to the anode of LED module 630 and the cathode of each LED unit 732 connected to the cathode of LED module 630 (the anode of each LED unit 732 and the anode of the LED module 630 may be the same terminal, and the cathode of each LED unit 732 and the cathode of the LED module 630 may be the same terminal). Each LED unit 732 includes at least two LEDs 731 connected in the same way as those described in FIG. 11A. For example, the anode of the first LED 731 in an LED unit 732 is connected to the anode of this LED unit 732, the cathode of the first LED 731 is connected to the anode of the next or second LED 731, and the cathode of the last LED 731 is connected to the cathode of this LED unit 732. Further, LED units 732 in an LED module 630 are connected to each other in this embodiment. All of the n-th LEDs 731 in the related LED units 732 thereof are connected by their anodes and cathodes, such as those shown in FIG. 11B but not limit to, where n is a positive integer. In this way, the LEDs in the LED module 630 of this embodiment are connected in the form of a mesh.

In some embodiments, the LED lighting module 530 in the above embodiments includes the LED module 630, but doesn't include a driving circuit for the LED module 630.

Also, the LED module 630 in this embodiment may produce a current detection signal S531 reflecting the magnitude of current through the LED module 630 and being used for controlling or detecting the LED module 630.

In some embodiments, the number of LEDs 731 included by an LED unit 732 is in the range of 15-25, and may be in some embodiments in the range of 18-22.

Figure 11C:
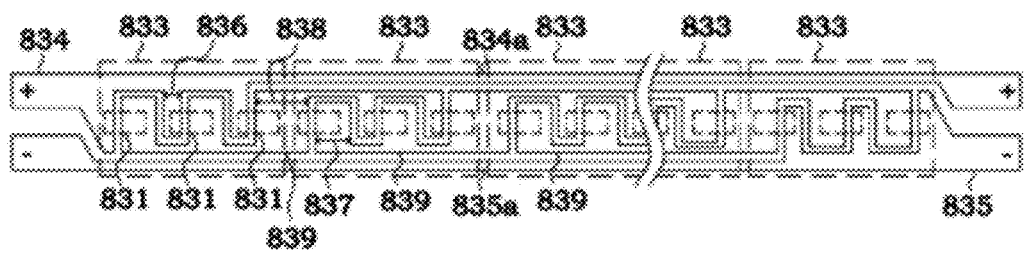
FIGS. 11C-11I, 11K are plan views of a circuit layout of an LED module according to some exemplary embodiments.

FIG. 11C is a plan view of a circuit layout of the LED module according to an embodiment. Referring to FIG. 11C, in this embodiment, multiple LEDs 831 are connected in the same way as described in FIG. 11B, and three LED units are assumed in the LED module 630 and described as follows for illustration. A positive conductive line 834 and a negative conductive line 835 are to receive a driving signal for supplying power to the LEDs 831. For example, the positive conductive line 834 may be coupled to the filtering output terminal 521 of the filtering circuit 520 described above, and the negative conductive line 835 coupled to the filtering output terminal 522 of the filtering circuit 520 to receive a filtered signal. For the convenience of illustration, all three of the n-th LEDs 831 in the three related LED units thereof are grouped as an LED set 833 in FIG. 11C.

The positive conductive line 834 connects the three first LEDs 831 of the leftmost three related LED units thereof, for example, connects the anodes on the left sides of the three first LEDs 831 as shown in the leftmost LED set 833 of FIG. 11C. The negative conductive line 835 connects the three last LEDs 831 of the rightmost three corresponding LED units thereof, for example, connects the cathodes on the right sides of the three last LEDs 831 as shown in the rightmost LED set 833 of FIG. 11C. The cathodes of the three first LEDs 831, the anodes of the three last LEDs 831, and the anodes and cathodes of all the remaining LEDs 831 are connected by conductive lines or parts 839.

For example, the anodes of the three LEDs 831 in the leftmost LED set 833 may be connected together by the positive conductive line 834, and their cathodes may be connected together by a leftmost conductive part 839. The anodes of the three LEDs 831 in the second, next-leftmost LED set 833 are also connected together by the leftmost conductive part 839, whereas their cathodes are connected together by a second, next-leftmost conductive part 839. Since the cathodes of the three LEDs 831 in the leftmost LED set 833 and the anodes of the three LEDs 831 in the second, next-leftmost LED set 833 are connected together by the same leftmost conductive part 839, the cathode of the first LED 831 in each of the three LED units is connected to the anode of the next or second LED 831. As for the remaining LEDs 831 are also connected in the same way. Accordingly, all the LEDs 831 of the three LED units are connected to form the mesh as shown in FIG. 11B.

In this embodiment, the length 836 of a portion of each conductive part 839 that connects to the anode of an LED 831 is smaller than the length 837 of another portion of each conductive part 839 that connects to the cathode of an LED 831. This makes the area of the latter portion connecting to the cathode larger than that of the former portion connecting to the anode. Moreover, the length 837 may be smaller than a length 838 of a portion of each conductive part 839 that connects the cathode of an LED 831 and the anode of the next LED 831 in two adjacent LED sets 833. This makes the area of the portion of each conductive part 839 that connects a cathode and an anode larger than the area of any other portion of each conductive part 839 that connects to only a cathode or an anode of an LED 831. Due to the length differences and area differences, this layout structure improves heat dissipation of the LEDs 831.

In some embodiments, the positive conductive line 834 includes a lengthwise portion 834a, and the negative conductive line 835 includes a lengthwise portion 835a, which are conducive to make the LED module have a positive "+" connective portion and a negative "−" connective portion at each of the two ends of the LED module, as shown in FIG. 11C. Such a layout structure allows for coupling any of other circuits of the power supply module of the LED lamp, including e.g. the filtering circuit 520 and the rectifying circuits 510 and 540, to the LED module through the positive connective portion and/or the negative connective portion at each or both ends of the LED lamp. Thus the layout structure increases the flexibility in arranging actual circuits in the LED lamp.

Figure 11D:
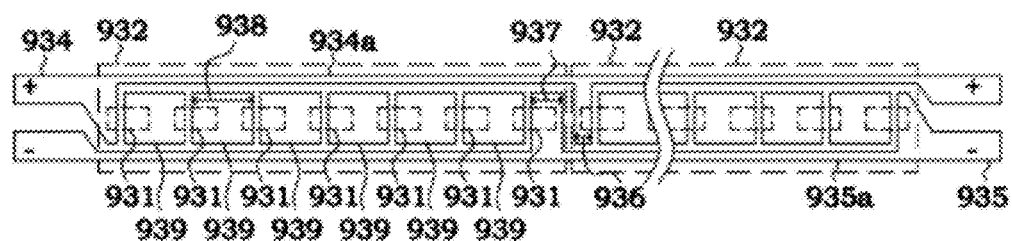

FIG. 11D is a plan view of a circuit layout of the LED module according to another embodiment. Referring to FIG. 11D, in this embodiment, multiple LEDs 931 are connected in the same way as described in FIG. 11A, and three LED units each including 7 LEDs 931 are assumed in the LED module 630 and described as follows for illustration. A positive conductive line 934 and a negative conductive line 935 are to receive a driving signal for supplying power to the LEDs 931. For example, the positive conductive line 934 may be coupled to the filtering output terminal 521 of the filtering circuit 520 described above, and the negative conductive line 935 is coupled to the filtering output terminal 522 of the filtering circuit 520, so as to receive a filtered signal. For the convenience of illustration, all seven LEDs 931 of each of the three LED units are grouped as an LED set 932 in FIG. 11D. Thus there are three LED sets 932 corresponding to the three LED units.

The positive conductive line 934 connects the anode on the left side of the first or leftmost LED 931 of each of the three LED sets 932. The negative conductive line 935 connects the cathode on the right side of the last or rightmost LED 931 of each of the three LED sets 932. In each LED set 932 of each two adjacent LEDs 931, the LED 931 on the left has a cathode connected by a conductive part 939 to an anode of the LED 931 on the right. By such a layout, the LEDs 931 of each LED set 932 are connected in series.

In some embodiments, the conductive part 939 may be used to connect an anode and a cathode of two consecutive LEDs 931 respectively. The negative conductive line 935 connects the cathode of the last or rightmost LED 931 of each of the three LED sets 932. And the positive conductive line 934 connects the anode of the first or leftmost LED 931 of each of the three LED sets 932. Therefore, as shown in FIG. 11D, the length of the conductive part 939 is larger than that of the portion of negative conductive line 935 connecting to a cathode, which length is then larger than that of the portion of positive conductive line 934 connecting to an anode. For example, the length 938 of the conductive part 939 may be larger than the length 937 of the portion of negative conductive line 935 connecting a cathode of an LED 931, which length 937 is then larger than the length 936 of the portion of the positive conductive line 934 connecting an anode of an LED 931. Such a layout structure improves heat dissipation of the LEDs 931 in LED module 630.

The positive conductive line 934 may include a lengthwise portion 934a, and the negative conductive line 935 may include a lengthwise portion 935a, which are conducive to make the LED module have a positive "+" connective portion and a negative "−" connective portion at each of the two ends of the LED module, as shown in FIG. 11D. Such a layout structure allows for coupling any of other circuits of the power supply module of the LED lamp, including e.g. the filtering circuit 520 and the rectifying circuits 510 and 540, to the LED module through the positive connective portion 934a and/or the negative connective portion 935a at each or both ends of the LED lamp. Thus the layout structure increases the flexibility in arranging actual circuits in the LED lamp.

Further, the circuit layouts as shown in FIGS. 11C and 11D may be implemented with a bendable circuit sheet or substrate, or may be a flexible circuit board depending on its specific construction. For example, the bendable circuit sheet may comprise one conductive layer where the positive conductive line 834, the positive lengthwise portion 834a, the negative conductive line 835, the negative lengthwise portion 835a, and the conductive parts 839 shown in FIG. 11C, and the positive conductive line 934, the positive lengthwise portion 934a, the negative conductive line 935, the negative lengthwise portion 935a, and the conductive parts 939 shown in FIG. 11D are formed by the method of etching.

Figure 11E:
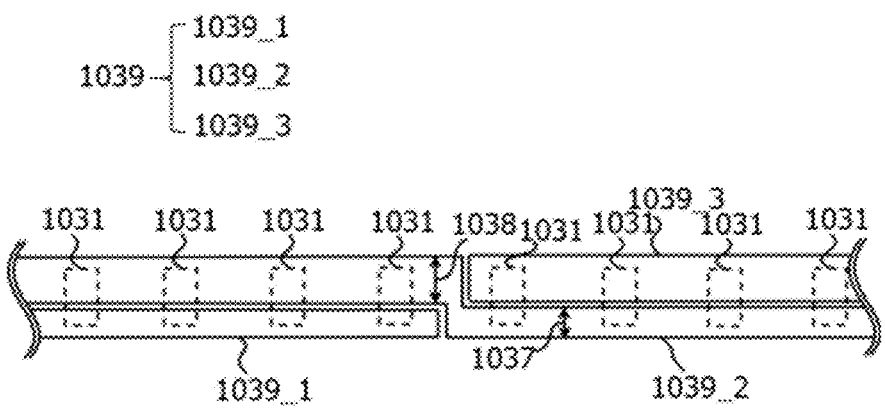

FIG. 11E is a plan view of a circuit layout of the LED module according to another embodiment. Referring to FIG. 11E, the connection relationship of the LEDs 1031 is the same as FIG. 11B. The configuration of the positive conductive line and the negative conductive line (not shown) and the connection relationship between the conductive lines and other circuits is substantially the same as FIG. 11D. The difference between the present embodiment and the above embodiments is that the LEDs 1031 are modified to be arranged in the longitudinal direction (i.e., the positive and negative electrodes of each LEDs are disposed along the direction perpendicular to the lead extension direction) from the transverse direction such as arrangement of the LEDs 831 shown in FIG. 11C (i.e., the positive and negative electrodes of each LEDs are disposed along the lead extension direction), and the connection configuration of the present embodiment are correspondingly adjusted due to the arrangement direction.

Specifically, taking a conductive part 1039_2 for example, the conductive part 1039_2 includes a first long-side portion having a width 1037, a second long-side portion having a width 1038 which is greater than the width of the first long-side portion, and a transition portion connecting the first and the second long-side portions. The conductive part 1039_2 can be formed in a right-angled Z shape, which means the joints of each long-side portions and the transition portion are perpendicular. The first long-side portion of the conductive part 1039_2 and the second long-side portion of the adjacent conductive part 1039_3 are correspondingly disposed; similarly, the second long-side portion of the conductive part 1039_2 and the first long-side portion of the adjacent conductive part 1039_1 are correspondingly disposed. According to the configuration described above, the conductive part 1039 is arranged along the extension direction of the long-side portions, and the first long-side portion of each conductive parts 1039 and the second long-side portion of each adjacent conductive parts 1039 are correspondingly disposed; similarly, the second long-side portion of each conductive parts 1039 and the first long-side portion of each adjacent conductive parts 1039 are correspondingly disposed. Therefore, each of the conductive parts 1039 can be formed as a wiring configuration having consistent width.

The configuration of the other conductive parts 1039 can be similar to the description of the conductive part 1039_2 described above.

The conductive part 1039 is taken as an example for explaining the relative configuration of the LEDs 1031 and the conductive parts 1039 as well. In the present embodiment, the positive electrodes of part of the LEDs 1031 (e.g., the four LEDs 1031 at the right-hand side) are connected to the first long-side portion of the conductive part 1039_2 and connected to each other via the first long-side portion; and the negative electrodes of the part of the LEDs 1031 are connected to the second long-side portion of the adjacent conductive part 1039_3 and connected to each other via the conductive part 1039_3. On the other hand, the positive electrodes of another part of the LEDs 1031 (e.g., the four LEDs 1031 at the left-hand side) are connected to the first long-side portion of the conductive part 1039_1, and the negative electrodes of the another part of the LEDs 1031 are connected to the second long-side portion of the conductive part 1039_2.

As can be seen in FIG. 11E, positive electrodes of the four LEDs 1031 at the left-hand side are connected to each other via the conductive part 1039_1, and the negative electrodes of the four LEDs 1031 at the left-hand side are connected to each other via the conductive part 1039_2. The positive electrodes of the four LEDs 1031 at the right-hand side are connected to each other via the conductive part 1039_2, and the negative electrodes of the four LEDs 1031 at the right-hand side are connected to each other via the conductive part 1039_3. Since the negative electrodes of the four LEDs 1031 at the left-hand side are connected to the positive electrodes of the four LEDs 1031 at the right-hand side via the conductive part 1039_2, the left four LEDs 1031 can be respectively referred to as the first LED in the four LED units, and the right four LEDs can be respectively referred to as the second LED in the four LED units. The connection relationship of the other LEDs can be derived from the above configuration, so as to form the mesh connection as shown in FIG. 11B.

It should be noted that, compared to FIG. 11C, the LEDs 1031 of the present embodiment are modified to be arranged in the longitudinal direction, such that the gap between the LEDs 1031 can be increased, which allows the effective width (which can be referred to the lead width) of the conductive part to be broadened. Therefore, the risk that the circuit is easily punctured when reconditioning the tube lamp can be avoided. Moreover, the short-circuit issue caused by the insufficient coverage area of the copper foil between the LEDs 1031 when the LEDs 1031 require to be arranged tightly can be removed or reduced.

On the other hand, by designing the width 1037 of the first long-side portion connected to the positive electrodes smaller than the width 1038 of the second long-side portion connected to the negative electrodes, the connection area of the negative electrodes on the LEDs 1031 is larger than the connection area of the positive electrodes on the LEDs 1031. Thus, such wiring architecture facilitates heat dissipation of the LEDs.

Figure 11F:
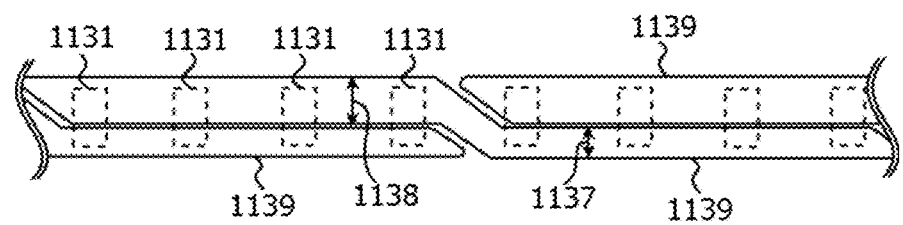

FIG. 11F is a plan view of a circuit layout of the LED module according to another embodiment. Referring to FIG. 11F, the present embodiment is basically similar to the embodiment illustrated in FIG. 11E, the difference between those two embodiments is that the conductive part 1139 is formed in a non right-angled Z shape. In other words, in the present embodiment, the transition portion is formed by an oblique wiring, such that the joints of each long-side portion and the transition portion are non-right angle. In the configuration of the present embodiment, in addition to increasing the gap between each LEDs 1031 by disposing the LEDs 1031 along the longitudinal direction and thus the effective width of the conductive part can be broadened, the oblique wiring configuration may reduce the likelihood of the displacement or the offset when attaching the LED to an uneven soldering pad.

Specifically, according to the embodiment utilizing the flexible circuit board as the LED light strip, the vertical conductive parts/leads (e.g., portions that extend in a vertical direction in the configuration shown in FIG. 11C to FIG. 11E) cause a regular recessed/indented area at the transition portion, so that the soldering spots of the LED soldering pads on the conductive parts are relatively on a raised position. Since the soldering spots are not a flat surface, it is hard to dispose the LEDs on the predetermined position when attaching the LEDs on the LED light strip. Thus, the present embodiment eliminates the recessed area by adjusting the configuration of the vertical wiring to the oblique wiring, so that the strength of the copper foil of the whole wiring can be uniform without a bulge or uneven situation at a specific position crossing the width of the LED light strip. Accordingly, the LEDs 1131 can be attached on the conductive part easier, so as to enhance the reliability of tube lamp installation process. Also, since each of the LED units only passes the oblique wiring once on the LED light strip, the strength of the entire LED light strip can be greatly improved, therefore, the LED light strip can be prevented from being bent and the length of the LED light strip can be shortened.

In addition, in an exemplary embodiment, the copper foil can be covered around the soldering pads of the LEDs 1131, so as to eliminate the offset generated from attaching the LEDs 1131 and avoid the short-circuit caused by the solder ball.

Figure 11G:
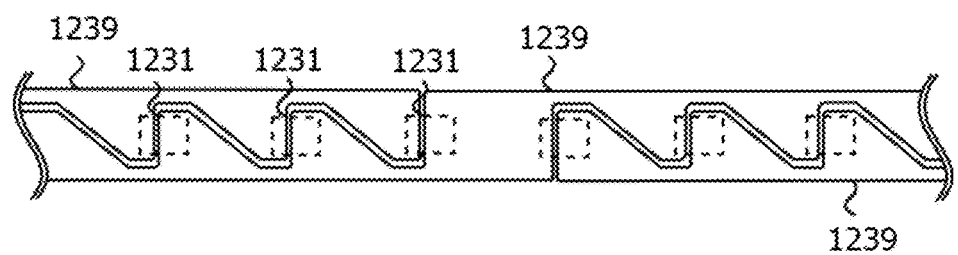

FIG. 11G is a plan view of a circuit layout of the LED module according to another embodiment. Referring to FIG. 11G, the present embodiment is basically similar to the embodiment illustrated in FIG. 11C, the difference between the two embodiments is that the corresponding configuration between the conductive parts 1239 (i.e., not the soldering pad position of the LEDs 1231) is modified to the oblique wiring.

Figure 11H:
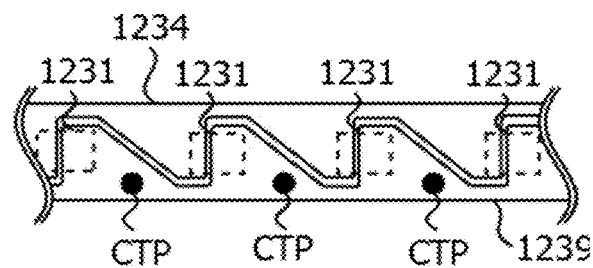

In addition, according to the configuration of the present embodiment, the color temperature points CTP can be disposed between the LEDs 1231 as shown in FIG. 11H. FIG. 11H is a plan view of a circuit layout of the LED module according to another embodiment. In the present embodiment, by disposing the color temperature points CTP between the LEDs in a consistent manner, the corresponding color temperature points CTP on the different conductive parts/LED units is on the same line and can be at a same relative location compared to each LED. As a result, the entire LED module may only use several tapes for covering all of the color temperature points CTP when soldering (e.g., use three tapes if there has three color temperature points CTP on each conductive parts as shown in FIG. 11H). Therefore, the smoothness of the assembly process can be improved and the assembly time can be saved as well.

Figure 11I:
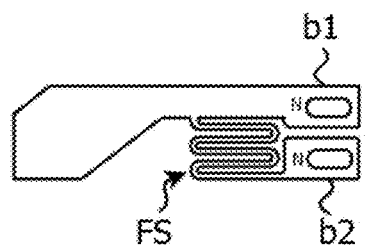

FIG. 11I is a plan view of a circuit layout of the LED module according to another embodiment. Referring to FIG. 11I, the soldering pads b1 and b2 of the LED light strip are adapted to solder with the soldering pads of the power supply circuit board. The soldering pads of the present embodiment can be adapted to the dual-end-single-pin configuration, which means the soldering pads at the same side will receive the external driving signal having the same polarity.

Specifically, the soldering pads b1 and b2 are connected to each other via a S-shaped fuse FS, in which the fuse FS is constituted by, for example, a thin wire. In one embodiment, the resistance of the thin wire is extremely low, so that the soldering pads b1 and b2 can be regarded as short-circuit. In the correct application situation, the soldering pads b1 and b2 receive the external driving signal having the same polarity. Even if the soldering pads b1 and b2 are mis-connected to the external driving signal having opposite polarities, the fuse will be fused (e.g. broken) by a large current passing through, thereby preventing the tube lamp from being damaged. In addition, the soldering pad b2 is at the floating state and the soldering pad b1 is still connected to the LED light strip after the fuse FS is fused, therefore, the LED light strip can be continuously used by receiving the external driving signal via the soldering pad b1.

In an exemplary embodiment, the thickness of the soldering pads b1 and b2 and the wiring connected to the soldering pads b1 and b2 at least reach 0.4 mm, and the actual thickness can be selected from any thickness greater than 0.4 mm that is capable of implementing in the LED light strip design based on the understanding of one of the ordinary skill in the art. Based on the verification result, once the thickness of the soldering pads b1 and b2 and the connection wire reach 0.4 mm, even if the copper foil at the soldering pads b1 and b2 is broken when the soldering pads b1 and b2 are connected to the power supply circuit board and disposed into the lamp tube, the copper foil on the periphery of the soldering pads b1 and b2 can also connect the LED light strip to the circuit on the power supply circuit board, so that the tube lamp can work normally.

In addition, in another exemplary embodiment, the positions where the pads b1 and b2 on the LED light strip are disposed cause the pads b1 and b2 to have a gap from the edge of the LED light strip. Through the gap configuration, a fault-tolerant space can be enhanced when bonding the power circuit board and the LED light strip.

Figure 11J:
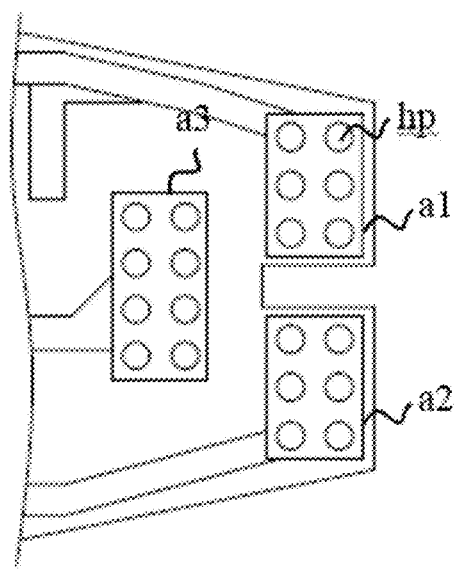
FIG. 11J is a schematic view of a power pad according to an exemplary embodiment.

FIG. 11J is a schematic view of a power pad according to an embodiment of the present invention. Referring to FIG. 11J, the power supply circuit board has, for example, three pads a1, a2, and a3, and the power supply circuit board can be a printed circuit board (PCB), however, the present invention is not limited thereto. There are a plurality through holes hp disposed on each of the pads a1, a2 and a3. During the welding process, the soldering material (e.g., soldering tin) is filled with at least one of the through holes hp so that the soldering pads a1 to a3 on the power supply circuit board (hereinafter "power soldering pad") are connected to the pad on the LED light strip (hereinafter "LED soldering pad"). Herein, the LED light strip is, for example, a flexible circuit board. It should be noted that in some embodiments, a flexible circuit board has a higher rigidity than a bendable circuit sheet or flexible tape or ribbon. For example, a flexible circuit board may substantially maintain its shape when supported by one or two hands of a person, whereas a flexible or bendable circuit sheet, tape, or ribbon may collapse or coil and thus significantly changes shape when supported by one or two hands. Both a flexible circuit board and bendable circuit sheet may be bent or deformed, but the flexible circuit board may be bent by applying a force, whereas a bendable circuit sheet, when held, may bend on its own without the application of any force.

Due to the through holes hp, the contact area between the solder and the power soldering pads a1 to a3, and thus the adhesion force between the power soldering pads a1 to a3 and the LED soldering pad can be enhanced. In addition, duo to the arrangement of the through holes hp, the heat dissipation area can be increased, and the terminal characteristic of the tube lamp can be improved. In the present embodiment, the number of the through holes on each power soldering pads is selected, for example, to be 7 or 9. If the configuration of 7 through holes being selected, the arrangement of the through holes hp can be that 6 through holes are arranged on a circumference on the pad, and the remaining is disposed on the center of the circle. If the configuration of 9 through holes being selected, the arrangement of the through holes hp can be arranged in a 3×3 array. According to the selected arrangement, the effect of the heat dissipation can be preferably improved.

Figure 11K:
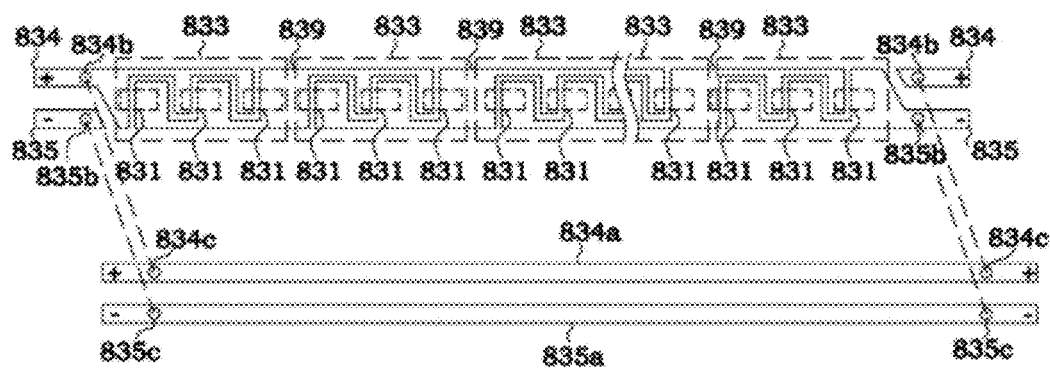

FIG. 11K is a plan view of a circuit layout of the LED module according to another embodiment. The layout structures of the LED module in FIGS. 11K and 11C correspond to the same way of connecting the LEDs 831 as those shown in FIG. 11B, but the layout structure in FIG. 11K comprises two conductive layers instead of only one conductive layer for forming the circuit layout as shown in FIG. 11C. Referring to FIG. 11K, the main difference from the layout in FIG. 11C is that the positive conductive line 834 and the negative conductive line 835 have a lengthwise portion 834a and a lengthwise portion 835a, respectively, that are formed in a second conductive layer instead. The difference is elaborated as follows.

In certain embodiments, referring to FIG. 7 again at the same time, a bendable circuit sheet of the LED module includes a first conductive layer 2a and a second conductive layer 2c electrically insulated from each other by a dielectric layer 2b. Of the two conductive layers, the positive conductive line 834, the negative conductive line 835, and the conductive parts 839 in FIG. 11E are formed in first conductive layer 2a by the method of etching for electrically connecting the plurality of LED components 831 e.g. in a form of a mesh, whereas the positive lengthwise portion 834a and the negative lengthwise portion 835a are formed in second conductive layer 2c by etching for electrically connecting (the filtering output terminal of) the filtering circuit. Further, the positive conductive line 834 and the negative conductive line 835 in the first conductive layer 2a have via points 834b and via points 835b, respectively, for connecting to second conductive layer 2c. And the positive lengthwise portion 834a and the negative lengthwise portion 835a in second conductive layer 2c have via points 834c and via points 835c, respectively. The via points 834b are positioned corresponding to the via points 834c, for connecting the positive conductive line 834 and the positive lengthwise portion 834a. The via points 835b are positioned corresponding to the via points 835c, for connecting the negative conductive line 835 and the negative lengthwise portion 835a. An exemplary desirable way of connecting the two conductive layers 2a and 2c is to form a hole connecting each via point 834b and a corresponding via point 834c, and to form a hole connecting each via point 835b and a corresponding via point 835c, with the holes extending through the two conductive layers 2a and 2c and the dielectric layer 2b in-between. And the positive conductive line 834 and the positive lengthwise portion 834a can be electrically connected by welding metallic part(s) through the connecting hole(s), and the negative conductive line 835 and the negative lengthwise portion 835a can be electrically connected by welding metallic part(s) through the connecting hole(s). It should be noted that, electrically speaking, the positive lengthwise portion 834a and the negative lengthwise portion 835a in second conductive layer 2c are part of the positive conductive line 834 and negative conductive line 835 respectively.

Similarly, the layout structure of the LED module in FIG. 11D may alternatively have the positive lengthwise portion 934a and the negative lengthwise portion 935a disposed in a second conductive layer to constitute a two-layered layout structure.

The positive conductive lines (834 or 934) may be characterized as including two end terminals at opposite ends, a plurality of pads between the two end terminals and for contacting and/or supplying power to LEDs (e.g., anodes of LEDs), and a wire portion, which may be an elongated conductive line extending along a length of an LED light strip and electrically connecting the two end terminals to the plurality of pads. Similarly, the negative conductive lines (835 or 935) may be characterized as including two end terminals at opposite ends, a plurality of pads between the two end terminals and for contacting and/or supplying power to LEDs (e.g., cathodes of LEDs), and a wire portion, which may be an elongated conductive line extending along a length of an LED light strip and electrically connecting the two end terminals to the plurality of pads.

The circuit layouts may be implemented for one of the exemplary LED light strips described previously, for example, to serve as a circuit board or sheet for the LED light strip on which the LED light sources are disposed.

As described herein, an LED unit may refer to a single string of LEDs arranged in series, and an LED module may refer to a single LED unit, or a plurality of LED units connected to a same two nodes (e.g., arranged in parallel). For example, the LED light strip 2 described above may be an LED module and/or LED unit.

In some embodiments, the thickness of the second conductive layer of a two-layered bendable circuit sheet is, larger than that of the first conductive layer in order to reduce the voltage drop or loss along each of the positive lengthwise portion and the negative lengthwise portion disposed in the second conductive layer. Compared to a one-layered bendable circuit sheet, since a positive lengthwise portion and a negative lengthwise portion are disposed in a second conductive layer in a two-layer bendable circuit sheet, the width (between two lengthwise sides) of the two-layered bendable circuit sheet is or can be reduced. On the same fixture or plate in a production process, the number of bendable circuit sheets each with a shorter width that can be laid together at most is larger than the number of bendable circuit sheets each with a longer width that can be laid together at most. Thus adopting a bendable circuit sheet with a shorter width can increase the efficiency of production of the LED module. And reliability in the production process, such as the accuracy of welding position when welding (materials on) the LED components, can also be improved, because a two-layer bendable circuit sheet can better maintain its shape.

As a variant of the above embodiments, a type of an exemplary LED tube lamp is provided that may have at least some of the electronic components of its power supply module disposed on a light strip of the LED tube lamp. For example, the technique of printed electronic circuit (PEC) can be used to print, insert, or embed at least some of the electronic components onto the LED light strip (e.g., as opposed to being on a separate circuit board connected to the LED light strip).

In one embodiment, all electronic components of the power supply module are disposed on the light strip. The production process may include or proceed with the following steps: preparation of the circuit substrate (e.g. preparation of a flexible printed circuit board); ink jet printing of metallic nano-ink; ink jet printing of active and passive components (as of the power supply module); drying/sintering; ink jet printing of interlayer bumps; spraying of insulating ink; ink jet printing of metallic nano-ink; ink jet printing of active and passive components (to sequentially form the included layers); spraying of surface bond pad(s); and spraying of solder resist against LED components. The production process may be different, however, and still result in some or all electronic components of the power supply module being disposed directly on the LED light strip.

In certain embodiments, if all electronic components of the power supply module are disposed on the LED light strip, electrical connection between the terminal pins of the LED tube lamp and the light strip may be achieved by connecting the pins to conductive lines which are welded with ends of the light strip. In this case, another substrate for supporting the power supply module is not required, thereby allowing of an improved design or arrangement in the end cap(s) of the LED tube lamp. In some embodiments, (components of) the power supply module are disposed at two ends of the light strip, in order to significantly reduce the impact of heat generated from the power supply module's operations on the LED components. Since no substrate other than the light strip is used to support the power supply module in this case, the total amount of welding or soldering can be significantly reduced, improving the general reliability of the power supply module.

Another case is that some of all electronic components of the power supply module, such as some resistors and/or smaller size capacitors, are printed onto the light strip, and some bigger size components, such as some inductors and/or electrolytic capacitors, are disposed in the end cap(s). The production process of the light strip in this case may be the same as that described above. And in this case disposing some of all electronic components on the light strip is conducive to achieving a reasonable layout of the power supply module in the LED tube lamp, which may allow of an improved design in the end cap(s).

As a variant embodiment of the above, electronic components of the power supply module may be disposed on the LED light strip by a method of embedding or inserting, e.g. by embedding the components onto a bendable or flexible light strip. In some embodiments, this embedding may be realized by a method using copper-clad laminates (CCL) for forming a resistor or capacitor; a method using ink related to silkscreen printing; or a method of ink jet printing to embed passive components, wherein an ink jet printer is used to directly print inks to constitute passive components and related functionalities to intended positions on the light strip. Then through treatment by ultraviolet (UV) light or drying/sintering, the light strip is formed where passive components are embedded. The electronic components embedded onto the light strip include for example resistors, capacitors, and inductors. In other embodiments, active components also may be embedded. Through embedding some components onto the light strip, a reasonable layout of the power supply module can be achieved to allow of an improved design in the end cap(s), because the surface area on a printed circuit board used for carrying components of the power supply module is reduced or smaller, and as a result the size, weight, and thickness of the resulting printed circuit board for carrying components of the power supply module is also smaller or reduced. Also in this situation since welding points on the printed circuit board for welding resistors and/or capacitors if they were not to be disposed on the light strip are no longer used, the reliability of the power supply module is improved, in view of the fact that these welding points are most liable to (cause or incur) faults, malfunctions, or failures. Further, the length of conductive lines needed for connecting components on the printed circuit board is therefore also reduced, which allows of a more compact layout of components on the printed circuit board thus improving the functionalities of these components.

As mentioned above, electronic components of the power supply module 5 or 250 may be disposed either on the light strip 2 or on a circuit board (such as a printed circuit board) in the end cap(s) of one or two ends of the lamp tube. For improving benefits or advantages of embodiments of the power supply module or the general LED tube lamp, in some embodiments, capacitor(s) in the power supply module may be chip capacitor(s), such as multilayer ceramic chip capacitor(s), disposed either on the light strip 2 or on the short circuit board 253. However, such disposed chip capacitor(s) in use is likely to produce or incur distinct noise due to piezoelectric effects, which may adversely affect the comfort level of using the LED tube lamp by consumers. To address and reduce this problem, in the LED tube lamp of this disclosure, a hole or groove may be disposed (directly) below the chip capacitor by drilling or boring, to significantly reduce the noise by changing the vibration system formed under piezoelectric effects between the chip capacitor and the circuit board carrying the chip capacitor. The shape of the circumference of the hole or groove may be substantially close to, for example, a circle or round, an oval or ellipse, or a rectangle. In some embodiments, the hole or groove is formed in a conductive or wire layer in the light strip 2, or in the short circuit board 253 in the end cap(s), and (directly) below the chip capacitor.

Next, methods to produce embedded capacitors and resistors are explained as follows.

Usually, methods for manufacturing embedded capacitors employ or involve a concept called distributed or planar capacitance. The manufacturing process may include the following step(s). On a substrate of a copper layer a very thin insulation layer is applied or pressed, which is then generally disposed between a pair of layers including a power conductive layer and a ground layer. The very thin insulation layer makes the distance between the power conductive layer and the ground layer very short. A capacitance resulting from this structure can also be realized by a conventional technique of a plated-through hole. Basically, this step is used to create this structure comprising a big parallel-plate capacitor on a circuit substrate.

Of products of high electrical capacity, certain types of products employ distributed capacitances, and other types of products employ separate embedded capacitances. Through putting or adding a high dielectric-constant material, such as barium titanate, into the insulation layer, the high electrical capacity is achieved.

A usual method for manufacturing embedded resistors employ conductive or resistive adhesive. This may include, for example, a resin to which conductive carbon or graphite is added, which may be used as an additive or filler. The additive resin is silkscreen printed to an object location, and is then after treatment laminated inside the circuit board. The resulting resistor is connected to other electronic components through plated-through holes or microvias. Another method is called Ohmega-Ply, by which a two metallic layer structure of a copper layer and a thin nickel alloy layer constitutes a layer resistor relative to a substrate. Then through etching the copper layer and nickel alloy layer, different types of nickel alloy resistors with copper terminals can be formed. These types of resistor are each laminated inside the circuit board.

In an embodiment, conductive wires/lines are directly printed in a linear layout on an inner surface of the LED glass lamp tube, with LED components directly attached on the inner surface and electrically connected by the conductive wires. In some embodiments, the LED components in the form of chips are directly attached over the conductive wires on the inner surface, and connective points are at terminals of the wires for connecting the LED components and the power supply module. After being attached, the LED chips may have fluorescent powder applied or dropped thereon, for producing white light or light of other color by the operating LED tube lamp.

In some embodiments, luminous efficacy of the LED or LED component is 80 lm/W or above, and in some embodiments, it may be 120 lm/W or above. Certain more optimal embodiments may include a luminous efficacy of the LED or LED component of 160 lm/W or above. White light emitted by an LED component in the invention may be produced by mixing fluorescent powder with the monochromatic light emitted by a monochromatic LED chip. The white light in its spectrum has major wavelength ranges of 430-460 nm and 550-560 nm, or major wavelength ranges of 430-460 nm, 540-560 nm, and 620-640 nm.

Figure 12A:
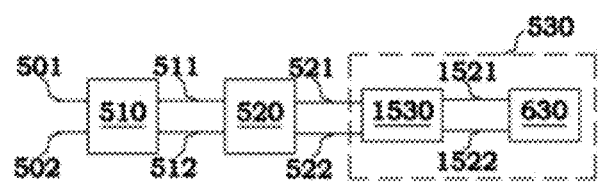
FIG. 12A is a block diagram of an exemplary power supply module in an LED lamp according to some exemplary embodiments.

FIG. 12A is a block diagram of a power supply module in an LED lamp according to an embodiment. As shown in FIG. 12A, the power supply module of the LED lamp includes a rectifying circuit 510, a filtering circuit 520, and may further include some parts of an LED lighting module 530. The LED lighting module 530 in this embodiment comprises a driving circuit 1530 and an LED module 630. The driving circuit 1530 comprises a DC-to-DC converter circuit, and is coupled to the filtering output terminals 521 and 522 to receive a filtered signal and then perform power conversion for converting the filtered signal into a driving signal at the driving output terminals 1521 and 1522. The LED module 630 is coupled to the driving output terminals 1521 and 1522 to receive the driving signal for emitting light. In some embodiments, the current of LED module 630 is stabilized at an objective current value. Descriptions of this LED module 630 can be the same as those provided above with reference to FIGS. 11A-11K.

Referring to FIGS. 11A and 12A, under the configuration where the driving circuit 1530 is included in the LED lighting module 530, the positive terminal of the LED module 630 is changed from being connected to the first filtering output terminal 521 to being connected to the first driving output terminal 1521, and the negative terminal of the LED module 630 is changed from being connected to the second filtering output terminal 522 to being connected to the second driving output terminal 1522.

In some embodiments, the first driving output terminal 1521 connected to the positive terminal of the LED module 630 (i.e., the positive electrode of the LED units 632 or the anode of the first one of the LEDs 631 in a column) is a DC power output terminal of the driving circuit 1530, and the second driving output terminal 1522 connected to the negative terminal of the LED module 630 (i.e., the negative electrode of the LED units 632 or the cathode of the last one of the LEDs 631 in a column) is a ground terminal/reference terminal of the driving circuit 1530. Therefore, in one embodiment, the LED module 630 is coupled between the DC power output terminal and the ground/reference terminal of the driving circuit 1530.

In some embodiments, one of the first and the second driving output terminals 1521 and 1522 is the DC power output terminal of the driving circuit 1530, and the other one of the first and the second driving output terminals 1521 and 1522 is a DC power input terminal of the driving circuit 1530. In this manner, the LED module 630 is coupled between the DC power input terminal and the DC power output terminal of the driving circuit 1530.

It should be noted that, the connection embodiments of the LED module 630 described above is not limited to being utilized in a tube lamp. The connection embodiments can be applied to any kind of LED lamp directly powered by the mains electricity/commercial electricity (i.e., the AC power without passing a ballast), such as an LED bulb, an LED filament lamp, an integrated LED lamp, etc. The invention is not limited to these specific examples.

In some embodiments, the LED lighting module 530 shown in FIG. 8D may include the driving circuit 1530 and the LED module 630 as shown in FIG. 12A. Thus, the power supply module for the LED lamp in the present embodiment can be applied to the single-end power supply structure, such as LED light bulbs, personal area lights (PAL), and so forth.

Figure 12B:
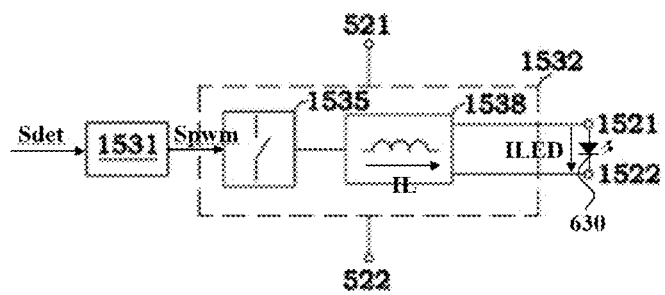
FIG. 12B is a block diagram of a driving circuit according to some exemplary embodiments.

FIG. 12B is a block diagram of the driving circuit according to an embodiment. Referring to FIG. 12B, a driving circuit includes a controller 1531, and a conversion circuit 1532 for power conversion based on a current source, for driving the LED module to emit light. The conversion circuit 1532 includes a switching circuit 1535 (also known as a power switch) and an energy storage circuit 1538. And the conversion circuit 1532 is coupled to the filtering output terminals 521 and 522 to receive and then convert a filtered signal, under the control by the controller 1531, into a driving signal at the driving output terminals 1521 and 1522 for driving the LED module. Under the control by the controller 1531, the driving signal output by the conversion circuit 1532 comprises a steady current, making the LED module emitting steady light.

Figure 12C:
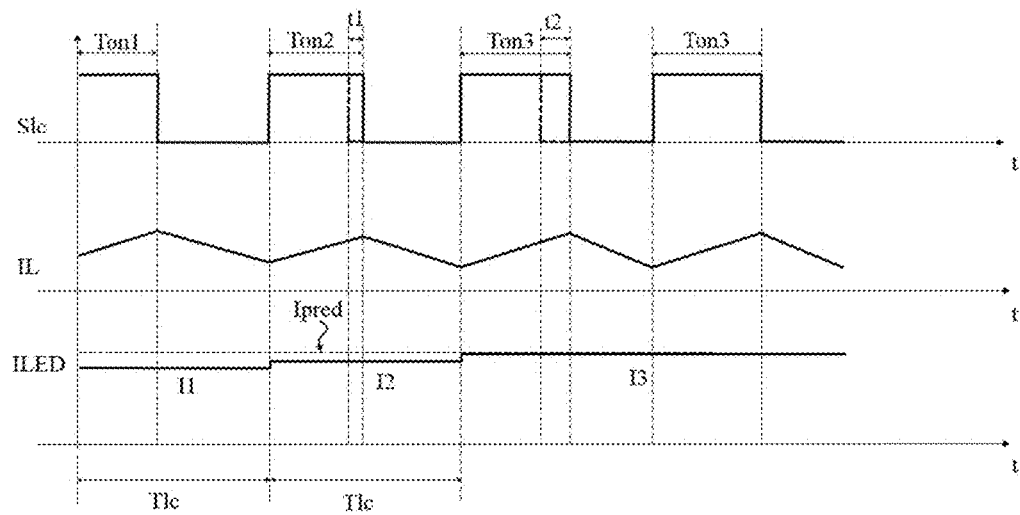
FIGS. 12C-12F are signal waveform diagrams of exemplary driving circuits according to some exemplary embodiments.
Figure 12D:
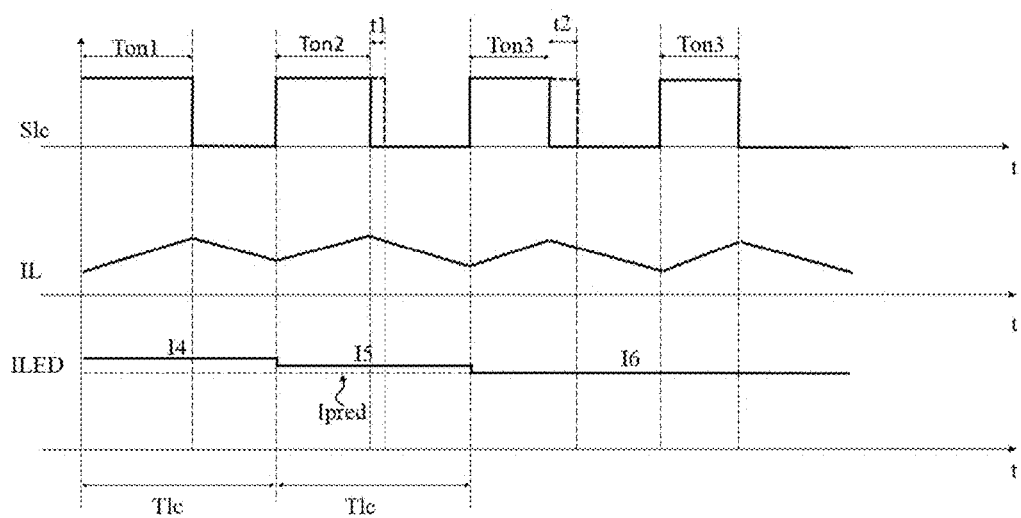
Figure 12E:
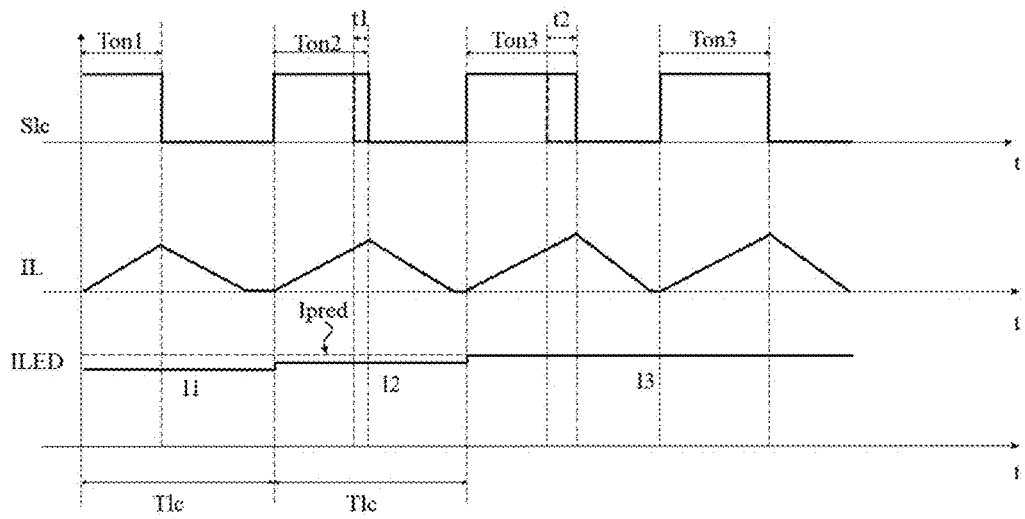
Figure 12F:
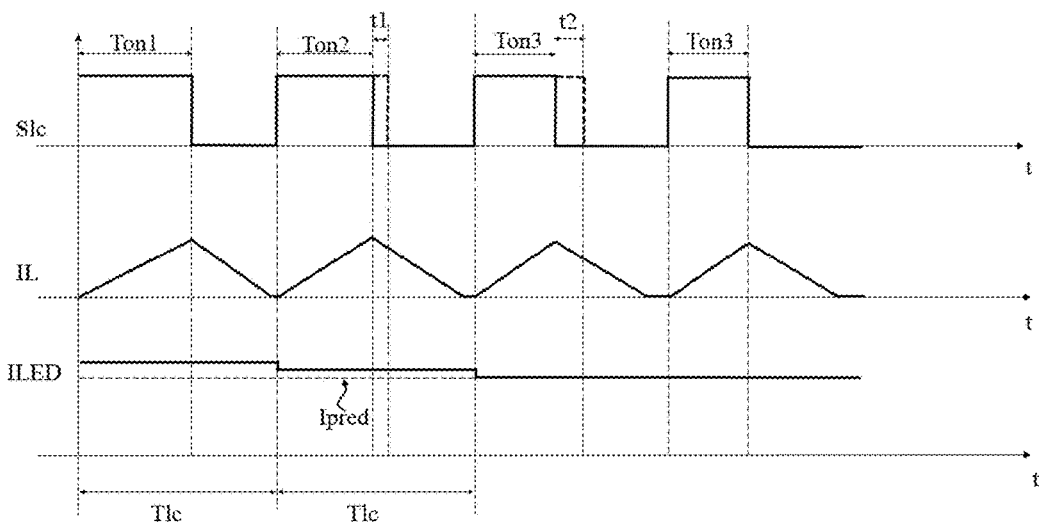

The operation of the driving circuit 1530 is further described based on the signal waveform illustrated in FIGS. 12C to 12F. FIGS. 12C-12F are signal waveform diagrams of exemplary driving circuits according to some exemplary embodiments, in which FIGS. 12C and 12D illustrate the signal waveform and the control condition when the driving circuit 1530 is operated in a Continuous-Conduction Mode (CCM) and FIGS. 12E and 12F illustrate the signal waveform and the control condition when the driving circuit 1530 is operated in a Discontinuous-Conduction Mode (DCM). In signal waveform diagrams, the horizontal axis represents time (represent by a symbol "t"), and the vertical axis represents a voltage or current value (depending on the type of the signal).

The controller 1531 can be, for example, a constant current controller which can generate a lighting control signal Slc and adjust the duty cycle of the lighting control signal Slc based on a current detection signal Sdet, so that the switch circuit 1535 is turned on or off in response to the lighting control signal Slc. The energy storage circuit 1538 is repeatedly charged and discharged according to the on/off state of the switch circuit 1535, so that the driving current ILED received by the LED module 630 can be stably maintained at a predetermined current value Ipred. In some embodiments, the lighting control signal Slc may have fixed signal period Tlc and signal amplitude, and the pulse-on time (also known as the pulse width) of each signal period Tlc, such as Ton1, Ton2 and Ton3, can be adjusted according to the control requirement. In the present embodiment, the duty cycle of the lighting control signal Slc represents a ratio of the pulse-on time and the signal period Tlc. For example, when the pulse-on time Ton1 is 40% of the signal period Tlc, the duty cycle of the lighting control signal Slc under the first signal period Tlc is 0.4.

In addition, the signal level of the current detection signal may represent the magnitude of the current flowing through the LED module 630, or represent the magnitude of the current flowing through the switching circuit 1535; the present invention is not limited thereto.

Referring to FIGS. 12B and 12C, FIG. 12C illustrates the signal waveform variation of the driving circuit 1530 during a plurality of signal periods Tlc when the driving current ILED is smaller than the predetermined current value Ipred. Specifically, under the first signal period Tlc, the switching circuit 1535 is turned on during the pulse-on time Ton1 in response to the high level voltage of the lighting control signal Slc. In the meantime, the conversion circuit 1532 provides the driving current ILED to the LED module 630 according to an input power received from the first and the second filtering output terminals 521 and 522, and further charges the energy storage circuit 1538 via the turned-on switch circuit 1535, so that the current IL flowing through the energy storage circuit 1538 gradually increases. In this manner, during the pulse-on time Ton1, the energy storage circuit 1538 is charged in response to the input power received from the first and the second filtering output terminals 521 and 522.

After the pulse-on time Ton1, the switch circuit 1535 is turned off in response to the low level voltage of the lighting control signal Slc. During a cut-off period of the switch circuit 1535, the input power output from the first and the second filtering output terminals 521 and 522 would not be provided to the LED module 630, and the driving current ILED is dominated by the energy storage circuit 1538 (i.e., the driving current ILED is generated by the energy storage circuit 1538 by discharging). Due to the energy storage circuit 1538 discharging during the cut-off period, the current IL is gradually decreased. Therefore, even when the lighting control signal Slc is at the low level (i.e., the disable period of the lighting control signal Slc), the driving circuit 1530 continuously supply power to the LED module 630 by discharging the energy storage circuit 1538. In this embodiment, no matter whether the switch circuit 1535 is turned on or off, the driving circuit 1530 continuously provides a stable driving current ILED to the LED module 630, and the current value of the driving current ILED is I1 during the first signal period Tlc.

Under the first signal period Tlc, the controller 1531 determines the current value I1 of the driving current ILED is smaller than the predetermined current value Ipred, so that the pulse-on time of the lighting control signal Slc is adjusted to Ton2 when entering the second signal period Tlc. The length of the pulse-on time Ton2 equals to the length of the pulse-on time Ton1 plus a unit period t1.

Under the second signal period Tlc, the operation of the switch circuit 1535 and the energy storage circuit 1538 are similar to the operation under the first signal period Tlc. The difference of the operation between the first and the second signal periods Tlc is the energy storage circuit 1538 has relatively longer charging time and shorter discharging time since the pulse-on time Ton2 is longer than pulse-on time Ton1. Therefore, the average current value of the driving current ILED under the second signal period Tlc is increased to a current value I2 closer to the predetermined current value Ipred.

Similarly, since the current value I2 of the driving current ILED is still smaller than the predetermined current value Ipred, the controller 1531 further adjusts, under the third signal period Tlc, the pulse-on time of the lighting control signal Slc to Ton3, in which the length of the pulse-on time Ton3 equals to the length of the pulse-on time Ton2 plus the unit period t1. Under the third signal period Ton3, the operation of the switch circuit 1535 and the energy storage circuit 1538 are similar to the operation under the first and the second signal periods Tlc. Due to the pulse-on time Ton3 being further increased in comparison with the pulse-on time Ton1 and Ton2, the current value of the driving current ILED is increased to I3, and substantially reaches the predetermined current value Ipred. Since the current value I3 of the driving current ILED has reached the predetermined current value Ipred, the controller 1531 maintains the same duty cycle after the third signal period Tlc, so that the driving current ILED can be substantially maintained at the predetermined current value Ipred.

Referring to FIGS. 12B and 12D, FIG. 12D illustrates the signal waveform variation of the driving circuit 1530 during a plurality of signal periods Tlc when the driving current ILED is larger than the predetermined current value Ipred. Specifically, under the first signal period Tlc, the switching circuit 1535 is turned on during the pulse-on time Ton1 in response to the high level voltage of the lighting control signal Slc. In the meantime, the conversion circuit 1532 provides the driving current ILED to the LED module 630 according to an input power received from the first and the second filtering output terminals 521 and 522, and further charges the energy storage circuit 1538 via the turned-on switch circuit 1535, so that the current IL flowing through the energy storage circuit 1538 gradually increases. As a result, during the pulse-on time Ton1, the energy storage circuit 1538 is charged in response to the input power received from the first and the second filtering output terminals 521 and 522.

After the pulse-on time Ton1, the switch circuit 1535 is turned off in response to the low level voltage of the lighting control signal Slc. During a cut-off period of the switch circuit 1535, the input power output from the first and the second filtering output terminals 521 and 522 would not be provided to the LED module 630, and the driving current ILED is dominated by the energy storage circuit 1538 (i.e., the driving current ILED is generated by the energy storage circuit 1538 by discharging). Due to the energy storage circuit 1538 discharging during the cut-off period, the current IL is gradually decreased. Therefore, even when the lighting control signal Slc is at the low level (i.e., the disable period of the lighting control signal Slc), the driving circuit 1530 continuously supplies power to the LED module 630 by discharging the energy storage circuit 1538. Accordingly, no matter whether the switch circuit 1535 is turned on or turned off, the driving circuit 1530 continuously provides a stable driving current ILED to the LED module 630, and the current value of the driving current ILED is I4 during the first signal period Tlc.

Under the first signal period Tlc, the controller 1531 determines the current value I4 of the driving current ILED is larger than the predetermined current value Ipred, so that the pulse-on time of the lighting control signal Slc is adjusted to Ton2 when entering the second signal period Tlc. The length of the pulse-on time Ton2 equals to the length of the pulse-on time Ton1 minus the unit period t1.

Under the second signal period Tlc, the operation of the switch circuit 1535 and the energy storage circuit 1538 are similar to the operation under the first signal period Tlc. The difference of the operation between the first and the second signal periods Tlc is the energy storage circuit 1538 has relatively shorter charging time and longer discharging time since the pulse-on time Ton2 is shorter than pulse-on time Ton1. Therefore, the average current value of the driving current ILED under the second signal period Tlc is decreased to a current value I5 closer to the predetermined current value Ipred.

Similarly, since the current value I5 of the driving current ILED is still larger than the predetermined current value Ipred, the controller 1531 further adjusts, under the third signal period Tlc, the pulse-on time of the lighting control signal Slc to Ton3, in which the length of the pulse-on time Ton3 equals to the length of the pulse-on time Ton2 minus the unit period t1. Under the third signal period Tlc, the operation of the switch circuit 1535 and the energy storage circuit 1538 are similar to the operation under the first and the second signal periods Tlc. Since the pulse-on time Ton3 is further decreased in comparison with the pulse-on time Ton1 and Ton2, the current value of the driving current ILED is decreased to I6, so that the driving current ILED substantially reaches the predetermined current value Ipred. Since the current value I6 of the driving current ILED has reached the predetermined current value Ipred, the controller 1531 maintains the same duty cycle after the third signal period Tlc, so that the driving current ILED can be substantially maintained on the predetermined current value Ipred.

According to the above operations, the driving circuit 1530 may adjust, by a stepped approach, the pulse-on time/pulse width of the lighting control signal Slc, so that the driving current ILED is gradually adjusted to be close to the predetermined current value Ipred. Therefore, the constant current output can be realized.

In the present embodiment, the driving circuit 1530 is operated in CCM for example, which means the energy storage circuit 1538 will not be discharged to zero current (i.e., the current IL will not be decreased to zero) during the cut-off period of the switch circuit 1535. By utilizing the driving circuit 1530 operating in CCM to provide power to the LED module 630, the power provided to the LED module 630 can be more stable and has a low ripple.

The control operation of the driving circuit 1530 operating in DCM will be described below. Referring to FIGS. 12B and 12E, the operation and the signal waveform of the driving circuit 1530 illustrated in FIG. 12E are similar to the FIG. 12C. The difference between the FIGS. 12C and 12E is that the driving circuit 1530 operates in DCM, so that the energy storage circuit 1538 discharges, during the pulse-off time of the lighting control signal Slc, to zero current (i.e., the current IL equals to zero) and then re-charges in the next signal period Tlc. The other operation of the driving circuit 1530 can be referred to the embodiments of FIG. 12C, and will not be described in detail herein.

Referring to FIGS. 12B and 12F, the operation and the signal waveform of the driving circuit 1530 illustrated in FIG. 12F are similar to that of FIG. 12D. The difference between the FIGS. 12D and 12F is that the driving circuit 1530 operates in DCM, so that the energy storage circuit 1538 discharges, during the pulse-off time of the lighting control signal Slc, to zero current (i.e., the current IL decreases to zero) and then re-charges in the next signal period Tlc. The other operation of the driving circuit 1530 can be referred to the embodiments of FIG. 12D, and will not be described in detail herein.

By utilizing the driving circuit 1530 operating in DCM to provide power to the LED module 630, the driving circuit 1530 may have lower power consumption, so as to obtain higher power conversion efficiency.

In addition, the embodiments of the power conversion operation described above are not limited to be utilized in a tube lamp. The embodiments can be applied to any kind of LED lamp directly powered by the mains electricity/commercial electricity (i.e., the AC power without passing a ballast), such as an LED bulb, an LED filament lamp, an integrated LED lamp or etc. The invention is not limited to these specific examples.

Figure 12G:
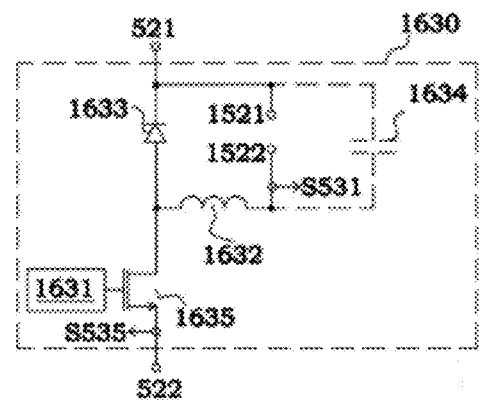
FIGS. 12G-12J are schematic diagrams of exemplary driving circuits according to some exemplary embodiments.

FIG. 12G is a schematic diagram of the driving circuit according to an embodiment. Referring to FIG. 12G, a driving circuit 1630 in this embodiment comprises a buck DC-to-DC converter circuit having a controller 1631 and a converter circuit. The converter circuit includes an inductor 1632, a diode 1633 for "freewheeling" of current, a capacitor 1634, and a switch 1635. The driving circuit 1630 is coupled to the filtering output terminals 521 and 522 to receive and then convert a filtered signal into a driving signal for driving an LED module connected between the driving output terminals 1521 and 1522.

In this embodiment, the switch 1635 includes a metal-oxide-semiconductor field-effect transistor (MOSFET) and has a first terminal coupled to the anode of freewheeling diode 1633, a second terminal coupled to the filtering output terminal 522, and a control terminal coupled to the controller 1631 used for controlling current conduction or cutoff between the first and second terminals of switch 1635. The driving output terminal 1521 is connected to the filtering output terminal 521, and the driving output terminal 1522 is connected to an end of the inductor 1632, which has another end connected to the first terminal of switch 1635. The capacitor 1634 is coupled between the driving output terminals 1521 and 1522 to stabilize the voltage between the driving output terminals 1521 and 1522. The freewheeling diode 1633 has a cathode connected to the driving output terminal 1521.

Next, a description follows as to an exemplary operation of the driving circuit 1630.

The controller 1631 is configured for determining when to turn the switch 1635 on (in a conducting state) or off (in a cutoff state) according to a current detection signal S535 and/or a current detection signal S531. For example, in some embodiments, the controller 1631 is configured to control the duty cycle of switch 1635 being on and switch 1635 being off in order to adjust the size or magnitude of the driving signal. The current detection signal S535 represents the magnitude of current through the switch 1635. The current detection signal S531 represents the magnitude of current through the LED module coupled between the driving output terminals 1521 and 1522. The controller 1631 may control the duty cycle of the switch 1635 being on and off, based on, for example, a magnitude of a current detected based on current detection signal S531 or S535. As such, when the magnitude is above a threshold, the switch may be off (cutoff state) for more time, and when magnitude goes below the threshold, the switch may be on (conducting state) for more time. According to any of current detection signal S535 and current detection signal S531, the controller 1631 can obtain information on the magnitude of power converted by the converter circuit. When the switch 1635 is switched on, a current of a filtered signal is input through the filtering output terminal 521, and then flows through the capacitor 1634, the driving output terminal 1521, the LED module, the inductor 1632, and the switch 1635, and then flows out from the filtering output terminal 522. During this flowing of current, the capacitor 1634 and the inductor 1632 are performing storing of energy. On the other hand, when the switch 1635 is switched off, the capacitor 1634 and the inductor 1632 perform releasing of stored energy by a current flowing from the freewheeling diode 1633 to the driving output terminal 1521 to make the LED module continuing to emit light.

In some embodiments, the capacitor 1634 is an optional element, so it can be omitted and is thus depicted in a dotted line in FIG. 12C. In some application environments, the natural characteristic of an inductor to oppose instantaneous change in electric current passing through the inductor may be used to achieve the effect of stabilizing the current through the LED module, thus omitting the capacitor 1634. It should be noted that, since the present embodiment utilizes the non-isolating driving circuit for performing power conversion, which means there is no transformer in the driving circuit, the switch 1635 is capable of being controlled by detecting the magnitude of the current flowing through the switch 1635 (e.g., the current detection signal S535). If the isolating driving circuit is utilized for performing power conversion, due to the LED module and the controller being isolated by a transformer, the switch 1635 can merely be controlled by detecting the magnitude of the current flowing through the LED module (e.g., the current detection signal S531). In addition, in one embodiment, when the isolating driving circuit is adopted, a detection resistor (not shown) is required for detecting current flowing through the LED module, and a photo-coupler (not shown) is required for transmitting the detection result to the controller 1631 at the primary side as the basis of controlling the switch 1635.

As described above, because the driving circuit 1630 is configured for determining when to turn a switch 1635 on (in a conducting state) or off (in a cutoff state) according to a current detection signal S535 and/or a current detection signal S531, the driving circuit 1630 can maintain a stable current flow through the LED module. Therefore, the color temperature may not change with current to some LED module, such as white, red, blue, green LED modules. For example, an LED can retain the same color temperature under different illumination conditions. In some embodiments, because the inductor 1632 playing the role of the energy-storing circuit releases the stored power when the switch 1635 cuts off, the voltage/current flowing through the LED module remains above a predetermined voltage/current level so that the LED module may continue to emit light maintaining the same color temperature. In this way, when the switch 1635 conducts again, the voltage/current flowing through the LED module does not need to be adjusted to go from a minimum value to a maximum value. Accordingly, the LED module lighting with flickering can be avoided, the entire illumination can be improved, the lowest conducting period can be smaller, and the driving frequency can be higher.

Figure 12H:
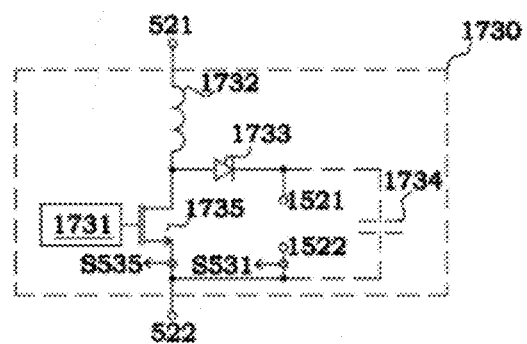

FIG. 12H is a schematic diagram of the driving circuit according to an embodiment. Referring to FIG. 12H, a driving circuit 1730 in this embodiment comprises a boost DC-to-DC converter circuit having a controller 1731 and a converter circuit. The converter circuit includes an inductor 1732, a diode 1733 for "freewheeling" of current, a capacitor 1734, and a switch 1735. The driving circuit 1730 is configured to receive and then convert a filtered signal from the filtering output terminals 521 and 522 into a driving signal for driving an LED module coupled between the driving output terminals 1521 and 1522.

The inductor 1732 has an end connected to the filtering output terminal 521, and another end connected to the anode of freewheeling diode 1733 and a first terminal of the switch 1735, which has a second terminal connected to the filtering output terminal 522 and the driving output terminal 1522. The freewheeling diode 1733 has a cathode connected to the driving output terminal 1521. And the capacitor 1734 is coupled between the driving output terminals 1521 and 1522.

The controller 1731 is coupled to a control terminal of switch 1735, and is configured for determining when to turn the switch 1735 on (in a conducting state) or off (in a cutoff state), according to a current detection signal S535 and/or a current detection signal S531. When the switch 1735 is switched on, a current of a filtered signal is input through the filtering output terminal 521, and then flows through the inductor 1732 and the switch 1735, and then flows out from the filtering output terminal 522. During this flowing of current, the current through the inductor 1732 increases with time, with the inductor 1732 being in a state of storing energy, while the capacitor 1734 enters a state of releasing energy, making the LED module continuing to emit light. On the other hand, when the switch 1735 is switched off, the inductor 1732 enters a state of releasing energy as the current through the inductor 1732 decreases with time. In this state, the current through the inductor 1732 then flows through the freewheeling diode 1733, the capacitor 1734, and the LED module, while the capacitor 1734 enters a state of storing energy.

In some embodiments, the capacitor 1734 is an optional element, so it can be omitted and is thus depicted in a dotted line in FIG. 12D. When the capacitor 1734 is omitted and the switch 1735 is switched on, the current of inductor 1732 does not flow through the LED module, making the LED module not emit light; but when the switch 1735 is switched off, the current of inductor 1732 flows through the freewheeling diode 1733 to reach the LED module, making the LED module emit light. Therefore, by controlling the time that the LED module emits light, and the magnitude of current through the LED module, the average luminance of the LED module can be stabilized to be above a defined value, thus also achieving the effect of emitting a steady light. It should be noted that, since the present embodiment utilizes the non-isolating driving circuit for performing power conversion, which means there is no transformer in the driving circuit, the switch 1735 is capable of being controlled by detecting the magnitude of the current flowing through the switch 1735 (e.g., the current detection signal S535). If the isolating driving circuit is utilized for performing power conversion, due to the LED module and the controller being isolated by a transformer, the magnitude of the current flowing through the switch 1735 cannot be used for the reference of controlling the switch 1735.

As described above, because the controller 1731 included in the driving circuit 1730 is coupled to the control terminal of switch 1735, and is configured for determining when to turn a switch 1735 on (in a conducting state) or off (in a cutoff state), according to a current detection signal S535 and/or a current detection signal S531, the driving circuit 1730 can maintain a stable current flow through the LED module. Therefore, the color temperature may not change with current to some LED modules, such as white, red, blue, or green LED modules. For example, an LED can retain the same color temperature under different illumination conditions. In some embodiments, because the inductor 1732 playing the role of the energy-storing circuit releases the stored power when the switch 1735 cuts off, the voltage/current flowing through the LED module remains above a predetermined voltage/current level so that the LED module may continue to emit light maintaining the same color temperature. In this way, when the switch 1735 conducts again, the voltage/current flowing through the LED module does not need to be adjusted to go from a minimum value to a maximum value. Accordingly, the LED module lighting with flickering can be avoided, the entire illumination can be improved, the lowest conducting period can be smaller, and the driving frequency can be higher.

Figure 12I:
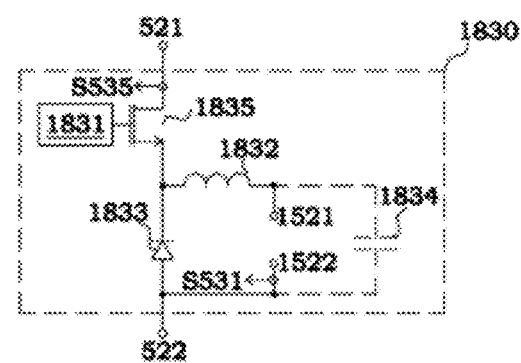

FIG. 12I is a schematic diagram of the driving circuit according to an exemplary embodiment. Referring to FIG. 12I, a driving circuit 1830 in this embodiment comprises a buck DC-to-DC converter circuit having a controller 1831 and a converter circuit. The converter circuit includes an inductor 1832, a diode 1833 for "freewheeling" of current, a capacitor 1834, and a switch 1835. The driving circuit 1830 is coupled to the filtering output terminals 521 and 522 to receive and then convert a filtered signal into a driving signal for driving an LED module connected between the driving output terminals 1521 and 1522.

The switch 1835 has a first terminal coupled to the filtering output terminal 521, a second terminal coupled to the cathode of freewheeling diode 1833, and a control terminal coupled to the controller 1831 to receive a control signal from the controller 1831 for controlling current conduction or cutoff between the first and second terminals of the switch 1835. The anode of freewheeling diode 1833 is connected to the filtering output terminal 522 and the driving output terminal 1522. The inductor 1832 has an end connected to the second terminal of switch 1835, and another end connected to the driving output terminal 1521. The capacitor 1834 is coupled between the driving output terminals 1521 and 1522 to stabilize the voltage between the driving output terminals 1521 and 1522.

The controller 1831 is configured for controlling when to turn the switch 1835 on (in a conducting state) or off (in a cutoff state) according to a current detection signal S535 and/or a current detection signal S531. When the switch 1835 is switched on, a current of a filtered signal is input through the filtering output terminal 521, and then flows through the switch 1835, the inductor 1832, and the driving output terminals 1521 and 1522, and then flows out from the filtering output terminal 522. During this flowing of current, the current through the inductor 1832 and the voltage of the capacitor 1834 both increase with time, so the inductor 1832 and the capacitor 1834 are in a state of storing energy. On the other hand, when the switch 1835 is switched off, the inductor 1832 is in a state of releasing energy and thus the current through it decreases with time. In this case, the current through the inductor 1832 circulates through the driving output terminals 1521 and 1522, the freewheeling diode 1833, and back to the inductor 1832.

In some embodiments the capacitor 1834 is an optional element, so it can be omitted and is thus depicted in a dotted line in FIG. 12E. When the capacitor 1834 is omitted, no matter whether the switch 1835 is turned on or off, the current through the inductor 1832 will flow through the driving output terminals 1521 and 1522 to drive the LED module to continue emitting light. It should be noted that, since the present embodiment utilizes the non-isolating driving circuit for performing power conversion, which means there is no transformer in the driving circuit, the switch 1835 is capable of being controlled by detecting the magnitude of the current flowing through the switch 1835 (e.g., the current detection signal S535). If the isolating driving circuit is utilized for performing power conversion, due to the LED module and the controller being isolated by a transformer, the magnitude of the current flowing through the switch 1835 cannot be used for the reference of controlling the switch 1835.

As described above, because the controller 1831 included in the driving circuit 1830 is configured for controlling when to turn a switch 1835 on (in a conducting state) or off (in a cutoff state) according to a current detection signal S535 and/or a current detection signal S531, the driving circuit 1730 can maintain a stable current flow through the LED module. Therefore, the color temperature may not change with current to some LED modules, such as white, red, blue, or green LED modules. For example, an LED can retain the same color temperature under different illumination conditions. In some embodiments, because the inductor 1832 playing the role of the energy-storing circuit releases the stored power when the switch 1835 cuts off, the voltage/current flowing through the LED module remains above a predetermined voltage/current level so that the LED module may continue to emit light maintaining the same color temperature. In this way, when the switch 1835 conducts again, the voltage/current flowing through the LED module does not need to be adjusted to go from a minimum value to a maximum value. Accordingly, the LED module lighting with flickering can be avoided, the entire illumination can be improved, the lowest conducting period can be smaller, and the driving frequency can be higher.

Figure 12J:
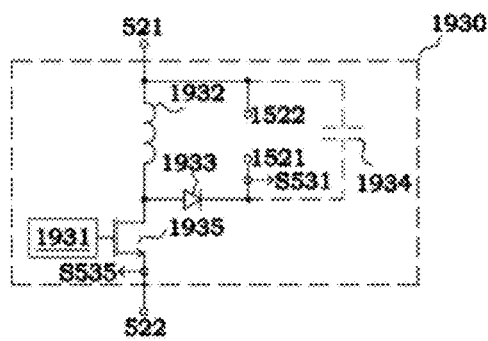

FIG. 12J is a schematic diagram of the driving circuit according to an exemplary embodiment. Referring to FIG. 12J, a driving circuit 1930 in this embodiment comprises a buck DC-to-DC converter circuit having a controller 1931 and a converter circuit. The converter circuit includes an inductor 1932, a diode 1933 for "freewheeling" of current, a capacitor 1934, and a switch 1935. The driving circuit 1930 is coupled to the filtering output terminals 521 and 522 to receive and then convert a filtered signal into a driving signal for driving an LED module connected between the driving output terminals 1521 and 1522.

The inductor 1932 has an end connected to the filtering output terminal 521 and the driving output terminal 1522, and another end connected to a first end of the switch 1935. The switch 1935 has a second end connected to the filtering output terminal 522, and a control terminal connected to controller 1931 to receive a control signal from controller 1931 for controlling current conduction or cutoff of the switch 1935. The freewheeling diode 1933 has an anode coupled to a node connecting the inductor 1932 and the switch 1935, and a cathode coupled to the driving output terminal 1521. The capacitor 1934 is coupled to the driving output terminals 1521 and 1522 to stabilize the driving of the LED module coupled between the driving output terminals 1521 and 1522.

The controller 1931 is configured for controlling when to turn the switch 1935 on (in a conducting state) or off (in a cutoff state) according to a current detection signal S531 and/or a current detection signal S535. When the switch 1935 is turned on, a current is input through the filtering output terminal 521, and then flows through the inductor 1932 and the switch 1935, and then flows out from the filtering output terminal 522. During this flowing of current, the current through the inductor 1932 increases with time, so the inductor 1932 is in a state of storing energy; but the voltage of the capacitor 1934 decreases with time, so the capacitor 1934 is in a state of releasing energy to keep the LED module continuing to emit light. On the other hand, when the switch 1935 is turned off, the inductor 1932 is in a state of releasing energy and its current decreases with time. In this case, the current through the inductor 1932 circulates through the freewheeling diode 1933, the driving output terminals 1521 and 1522, and back to the inductor 1932. During this circulation, the capacitor 1934 is in a state of storing energy and its voltage increases with time.

In some embodiments the capacitor 1934 is an optional element, so it can be omitted and is thus depicted in a dotted line in FIG. 12F. When the capacitor 1934 is omitted and the switch 1935 is turned on, the current through the inductor 1932 doesn't flow through the driving output terminals 1521 and 1522, thereby making the LED module not emit light. On the other hand, when the switch 1935 is turned off, the current through the inductor 1932 flows through the freewheeling diode 1933 and then the LED module to make the LED module emit light. Therefore, by controlling the time that the LED module emits light, and the magnitude of current through the LED module, the average luminance of the LED module can be stabilized to be above a defined value, thus also achieving the effect of emitting a steady light. It should be noted that, since the present embodiment utilizes the non-isolating driving circuit for performing power conversion, which means there is no transformer in the driving circuit, the switch 1935 is capable of being controlled by detecting the magnitude of the current flowing through the switch 1935 (e.g., the current detection signal S535). If the isolating driving circuit is utilized for performing power conversion, due to the LED module and the controller being isolated by a transformer, the magnitude of the current flowing through the switch 1935 cannot be used for the reference of controlling the switch 1935.

As described above, because the controller 1931 included in the driving circuit 1930 is configured for controlling when to turn a switch 1935 on (in a conducting state) or off (in a cutoff state) according to a current detection signal S535 and/or a current detection signal S531, the driving circuit 1930 can maintain a stable current flow through the LED module. Therefore, the color temperature may not change with current to some LED modules, such as white, red, blue, or green LED modules. For example, an LED can retain the same color temperature under different illumination conditions. In some embodiments, because the inductor 1932 playing the role of the energy-storing circuit releases the stored power when the switch 1935 cuts off, the voltage/current flowing through the LED module remains above a predetermined voltage/current level so that the LED module may continue to emit light maintaining the same color temperature. In this way, when the switch 1935 conducts again, the voltage/current flowing through the LED module does not need to be adjusted to go from a minimum value to a maximum value. Accordingly, the LED module lighting with flickering can be avoided, the entire illumination can be improved, the lowest conducting period can be smaller, and the driving frequency can be higher.

With reference back to FIGS. 5 and 6, a short circuit board 253 includes a first short circuit substrate and a second short circuit substrate respectively connected to two terminal portions of a long circuit sheet 251, and electronic components of the power supply module are respectively disposed on the first short circuit substrate and the second short circuit substrate. The first short circuit substrate and the second short circuit substrate may have roughly the same length, or different lengths. In general, the first short circuit substrate (i.e. the right circuit substrate of short circuit board 253 in FIG. 5 and the left circuit substrate of short circuit board 253 in FIG. 6) has a length that is about 30%-80% of the length of the second short circuit substrate (i.e. the left circuit substrate of short circuit board 253 in FIG. 5 and the right circuit substrate of short circuit board 253 in FIG. 6). In some embodiments the length of the first short circuit substrate is about ⅓-⅔ of the length of the second short circuit substrate. For example, in one embodiment, the length of the first short circuit substrate may be about half the length of the second short circuit substrate. The length of the second short circuit substrate may be, for example in the range of about 15 mm to about 65 mm, depending on actual application occasions. In certain embodiments, the first short circuit substrate is disposed in an end cap at an end of the LED tube lamp, and the second short circuit substrate is disposed in another end cap at the opposite end of the LED tube lamp.

For example, capacitors of the driving circuit, such as the capacitors 1634, 1734, 1834, and 1934 in FIGS. 12C-12F, in practical use may include two or more capacitors connected in parallel. Some or all capacitors of the driving circuit in the power supply module may be arranged on the first short circuit substrate of short circuit board 253, while other components such as the rectifying circuit, filtering circuit, inductor(s) of the driving circuit, controller(s), switch(es), diodes, etc. are arranged on the second short circuit substrate of short circuit board 253. Since the inductors, controllers, switches, etc. are electronic components with higher temperature, arranging some or all capacitors on a circuit substrate separate or away from the circuit substrate(s) of high-temperature components helps prevent the working life of capacitors (especially electrolytic capacitors) from being negatively affected by the high-temperature components, thus improving the reliability of the capacitors. Further, the physical separation between the capacitors and both the rectifying circuit and filtering circuit also contributes to reducing the problem of EMI.

In certain exemplary embodiments, the conversion efficiency of the driving circuits is above 80%. In some embodiments, the conversion efficiency of the driving circuits is above 90%. In still other embodiments, the conversion efficiency of the driving circuits is above 92%. The illumination efficiency of the LED lamps is above 120 lm/W. In some embodiments, the illumination efficiency of the LED lamps is above 160 lm/W. The illumination efficiency including the combination of the driving circuits and the LED modules is above 120 lm/W*90%=108 lm/W. In some embodiments, the illumination efficiency including the combination of the driving circuits and the LED modules is above 160 lm/W*92%=147.21 lm/W.

In some embodiments, the transmittance of the diffusion film in the LED tube lamp is above 85%. As a result, in certain embodiments, the illumination efficiency of the LED lamps is above 108 lm/W*85%=91.8 lm/W. In some embodiments, the illumination efficiency of the LED lamps is above 147.21 lm/W*85%=125.12 lm/W.

Figure 13A:
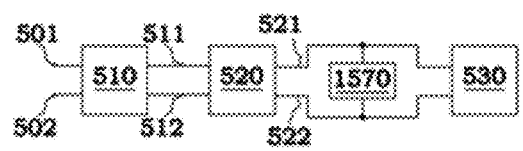
FIG. 13A is a block diagram of an exemplary power supply module in an LED tube lamp according to some exemplary embodiments.

FIG. 13A is a block diagram of a power supply module in an LED tube lamp according to an exemplary embodiment. Compared to that shown in FIG. 8D, the present embodiment comprises a rectifying circuit 510, a filtering circuit 520, and a driving circuit 1530, and further comprises an over voltage protection (OVP) circuit 1570. In this embodiment, a driving circuit 1530 and an LED module 630 compose the LED lighting module 530. The OVP circuit 1570 is coupled to the filtering output terminals 521 and 522 for detecting the filtered signal. The OVP circuit 1570 clamps the logic level of the filtered signal when determining the logic level thereof higher than a defined OVP value. Hence, the OVP circuit 1570 protects the LED lighting module 530 from damage due to an OVP condition.

Figure 13B:
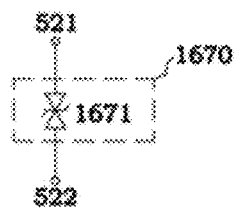
FIG. 13B is a schematic diagram of an over-voltage protection (OVP) circuit according to some exemplary embodiments.

FIG. 13B is a schematic diagram of an overvoltage protection (OVP) circuit according to an exemplary embodiment. An OVP circuit 1670 comprises a voltage clamping diode 1671, such as zener diode, coupled to the filtering output terminals 521 and 522. The voltage clamping diode 1671 is conducted to clamp a voltage difference at a breakdown voltage when the voltage difference of the filtering output terminals 521 and 522 (i.e., the logic level of the filtered signal) reaches the breakdown voltage. In some embodiments, the breakdown voltage may be in a range of about 40 V to about 100 V. In certain embodiments, the breakdown voltage may be in a range of about 55 V to about 75V.

Figure 14A:
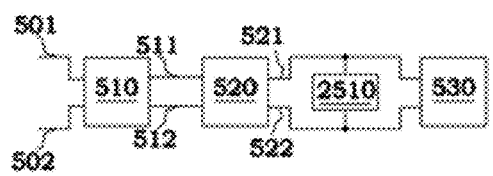
FIG. 14A is a block diagram of an exemplary power supply module in an LED tube lamp according to some exemplary embodiments.

FIG. 14A is a block diagram of a power supply module in an LED tube lamp according to an exemplary embodiment. Compared to that shown in FIG. 8D, the present embodiment comprises a rectifying circuit 510, a filtering circuit 520, and a driving circuit 1530, and further comprises an auxiliary power module 2510. The auxiliary power module 2510 is coupled between the filtering output terminals 521 and 522. The auxiliary power module 2510 detects the filtered signal in the filtering output terminals 521 and 522, and determines whether to provide an auxiliary power to the filtering output terminals 521 and 522 based on the detected result. When the supply of the filtered signal is stopped or a logic level (i.e., a voltage) thereof is insufficient, i.e., when a drive voltage for the LED module is below a defined voltage, the auxiliary power module provides auxiliary power to keep the LED lighting module 530 continuing to emit light. The defined voltage is determined according to an auxiliary power voltage of the auxiliary power module 2510.

Figure 14B:
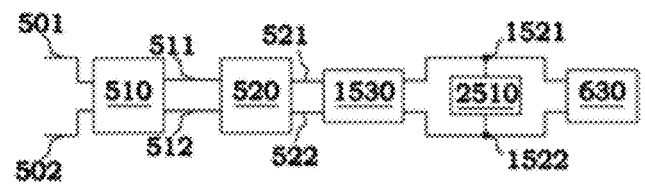
FIG. 14B is a block diagram of an exemplary power supply module in an LED tube lamp according to some exemplary embodiments.

FIG. 14B is a block diagram of a power supply module in an LED tube lamp according to an exemplary embodiment. Compared to that shown in FIG. 14A, the present embodiment comprises a rectifying circuit 510, a filtering circuit 520, and may further include some parts of an LED lighting module 530, and an auxiliary power module 2510, and the LED lighting module 530 further comprises a driving circuit 1530 and an LED module 630. The auxiliary power module 2510 is coupled between the driving output terminals 1521 and 1522. The auxiliary power module 2510 detects the driving signal in the driving output terminals 1521 and 1522, and determines whether to provide an auxiliary power to the driving output terminals 1521 and 1522 based on the detected result. When the driving signal is no longer being supplied or a logic level thereof is insufficient, the auxiliary power module 2510 provides the auxiliary power to keep the LED module 630 continuously light.

In an exemplary embodiment of FIG. 14A, an energy storage unit of the auxiliary power module 2510 can be implemented by a supercapacitor (e.g., electric double-layer capacitor, EDLC). In such an embodiment, since the supercapacitor provides the filtering function which is the same as the filtering circuit 520, the filtering circuit 520 can be removed in this embodiment.

In another exemplary embodiment, the LED lighting module 530 or LED module 630 can be driven merely by the auxiliary power provided by the auxiliary power module 2510, and the external driving signal is merely used for charging the auxiliary power module 2510. Since such an embodiment applies the auxiliary power provided by the auxiliary power module 2510 as the only power source for the LED lighting module 530 or the LED module 630, regardless of whether the external driving signal is provided by commercial electricity or a ballast, the external driving signal charges the energy storage unit first, and then the energy storage unit is used for supplying power to the LED module. Accordingly, the LED tube lamp applying said power architecture may be compatible with the external driving signal provided by commercial electricity or a ballast.

From the perspective of the structure, since the auxiliary power module 2510 is connected between the outputs of the filtering circuit 520 (i.e., the first filtering output 521 and the second filtering output 522) or the outputs of the driving circuit 1530 (i.e., the first driving output terminal 1521 and the second driving output terminal 1522), the circuit components of the auxiliary power module 2510 can be placed, in an exemplary embodiment, in the lamp tube (e.g., the position adjacent to the LED lighting module 530 or LED module 630 and between the two end caps), such that the power transmission loss caused by the long wiring can be avoided. In another exemplary embodiment, the circuit components of the auxiliary power can be placed in at least one of the end caps, such that the heat generated by the auxiliary power module 2510 when charging and discharging does not affect operation and illumination of the LED module.

Figure 14C:
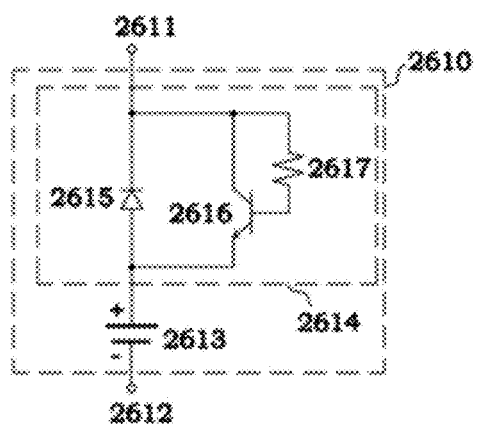
FIG. 14C is a schematic diagram of an auxiliary power module according to some exemplary embodiments.

FIG. 14C is a schematic diagram of an auxiliary power module according to an embodiment. The auxiliary power module 2610 can be applied, for example, to the configuration of the auxiliary power module 2510 illustrated in FIG. 14B. The auxiliary power module 2610 comprises an energy storage unit 2613 and a voltage detection circuit 2614. The auxiliary power module further comprises an auxiliary power positive terminal 2611 and an auxiliary power negative terminal 2612 for being respectively coupled to the filtering output terminals 521 and 522 or the driving output terminals 1521 and 1522. The voltage detection circuit 2614 detects a logic level of a signal at the auxiliary power positive terminal 2611 and the auxiliary power negative terminal 2612 to determine whether releasing outward the power of the energy storage unit 2613 through the auxiliary power positive terminal 2611 and the auxiliary power negative terminal 2612.

In some embodiments, the energy storage unit 2613 is a battery or a supercapacitor. When a voltage difference of the auxiliary power positive terminal 2611 and the auxiliary power negative terminal 2612 (the drive voltage for the LED module) is higher than the auxiliary power voltage of the energy storage unit 2613, the voltage detection circuit 2614 charges the energy storage unit 2613 by the signal in the auxiliary power positive terminal 2611 and the auxiliary power negative terminal 2612. When the drive voltage is lower than the auxiliary power voltage, the energy storage unit 2613 releases the stored energy outward through the auxiliary power positive terminal 2611 and the auxiliary power negative terminal 2612.

The voltage detection circuit 2614 comprises a diode 2615, a bipolar junction transistor (BJT) 2616 and a resistor 2617. A positive end of the diode 2615 is coupled to a positive end of the energy storage unit 2613 and a negative end of the diode 2615 is coupled to the auxiliary power positive terminal 2611. The negative end of the energy storage unit 2613 is coupled to the auxiliary power negative terminal 2612. A collector of the BJT 2616 is coupled to the auxiliary power positive terminal 2611, and an emitter thereof is coupled to the positive end of the energy storage unit 2613. One end of the resistor 2617 is coupled to the auxiliary power positive terminal 2611 and the other end is coupled to a base of the BJT 2616. When the collector of the BJT 2616 is a cut-in voltage higher than the emitter thereof, the resistor 2617 conducts the BJT 2616. When the power source provides power to the LED tube lamp normally, the energy storage unit 2613 is charged by the filtered signal through the filtering output terminals 521 and 522 and the conducted BJT 2616 or by the driving signal through the driving output terminals 1521 and 1522 and the conducted BJT 2616 until that the collector-emitter voltage of the BJT 2616 is lower than or equal to the cut-in voltage. When the filtered signal or the driving signal is no longer being supplied or the logic level thereof is insufficient, the energy storage unit 2613 provides power through the diode 2615 to keep the LED lighting module 530 or the LED module 630 continuously light.

In some embodiments, the maximum voltage of the charged energy storage unit 2613 is at least one cut-in voltage of the BJT 2616 lower than the voltage difference applied between the auxiliary power positive terminal 2611 and the auxiliary power negative terminal 2612. The voltage difference provided between the auxiliary power positive terminal 2611 and the auxiliary power negative terminal 2612 is a turn-on voltage of the diode 2615 lower than the voltage of the energy storage unit 2613. Hence, when the auxiliary power module 2610 provides power, the voltage applied at the LED module 630 is lower (about the sum of the cut-in voltage of the BJT 2616 and the turn-on voltage of the diode 2615). In the embodiment shown in the FIG. 14B, the brightness of the LED module 630 is reduced when the auxiliary power module supplies power thereto. Thereby, when the auxiliary power module is applied to an emergency lighting system or a constant lighting system, the user realizes the main power supply, such as commercial power, is abnormal and then performs necessary precautions therefor.

In addition to utilizing the embodiments illustrated in FIG. 14A to FIG. 14C in a single tube lamp architecture for emergency power supply, the embodiments also can be utilized in a lamp module including a multi tube lamp. Taking the lamp module having four parallel arranged LED tube lamps as an example, in an exemplary embodiment, one of the LED tube lamps includes the auxiliary power module. When the external driving signal is abnormal, the LED tube lamp including the auxiliary power module is continuously lighted up and the others LED tube lamps go off. According to the consideration of the uniformity of illumination, the LED tube lamp having the auxiliary power module can be arranged in the middle position of the lamp module.

In another exemplary embodiment, a plurality of the LED tube lamps respectively include the auxiliary power module. When the external driving signal is abnormal, the LED tube lamps including the auxiliary power module are continuously lighted up and the other LED tube lamps (if any) go off. In this way, even if the lamp module is operated in an emergency situation, a certain brightness can still be provided for the lamp module. In addition, if there are two LED lamps that have the auxiliary power module, the LED tube lamps having the auxiliary power module can be arranged, according to the consideration of the uniformity of illumination, in a staggered way with the LED tube lamps that don't have the auxiliary power module.

In still another exemplary embodiment, a plurality of the LED tube lamps respectively include the auxiliary power module. When the external driving signal is abnormal, part of the LED tube lamps including the auxiliary power module is first lighted up by the auxiliary power, and the other part of the LED tube lamps including the auxiliary power module is then lighted up by the auxiliary power after a predetermined period. In this way, the lighting time of the lamp module can be extended during the emergency situation by coordinating the auxiliary power supply sequence of the LED tube lamps.

The embodiment of coordinating the auxiliary power supply sequence of the LED tube lamps can be implemented by setting different start-up time for the auxiliary power module disposed in different tube lamp, or by disposing controllers in each tube lamp for communicating the operation state of each auxiliary power module. The present invention is not limited thereto.

Figure 14D:
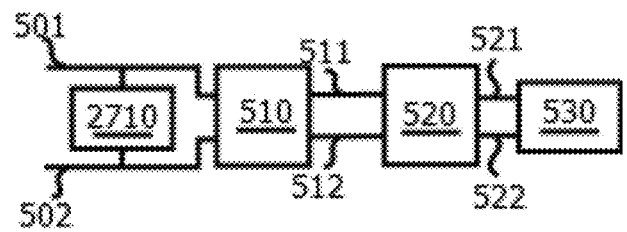
FIG. 14D is a block diagram of an exemplary power supply module of an LED tube lamp according to some exemplary embodiments.

FIG. 14D is a block diagram of a power supply module in an LED tube lamp according to an exemplary embodiment. Referring to FIG. 14D, the LED tube lamp of the present embodiment includes a rectifying circuit 510, a filtering circuit 520, an LED lighting module 530, and an auxiliary power module 2710. The LED lighting module 530 of the present embodiment can only include the LED module or include the driving circuit and the LED module, the present invention is not limited thereto. Compared to the embodiment of FIG. 14B, the auxiliary power module 2710 of the present embodiment is connected between the pins 501 and 502 to receive the external driving signal and perform a charge-discharge operation based on the external driving signal.

In some embodiments, the operation of the auxiliary power module 2710 can be similar to an Off-line uninterruptible power supply (Off-line UPS). Specifically, when an AC power source (e.g., the mains electricity, the commercial electricity or the power grid) normally supplies the external driving signal to the LED tube lamp, the external driving signal is supplied to the rectifying circuit 510 while charging the auxiliary power module 2710. Once the AC power source is unstable or abnormal, the auxiliary power module 2710 takes the place of the AC power source to supply power to the rectifying circuit 510 until the AC power source recovers normal power supply. Therefore, the auxiliary power module 2710 can operate in a backup manner, wherein the auxiliary power module 2710 intervenes the power supply process only when the AC power source is unstable or abnormal. Herein, the power supplied by the auxiliary power module 2710 can be an AC power or a DC power.

In some embodiments, the current path between the AC power source and the rectifying circuit 510 is cut off when the AC power source is unstable or abnormal. For example, the unstable AC power source refers to at least one of the voltage variation, the current variation, and the frequency variation of the external driving signal exceed a threshold. The abnormal AC power source refers to at least one of the voltage, the current, and the frequency of the external driving signal being lower or higher than a normal operation range.

The auxiliary power module 2710 includes an energy storage unit and a voltage detection circuit. The voltage detection circuit detects the external driving signal, and determines whether the energy storage unit provides the auxiliary power to the input terminal of the rectifying circuit 510 according to the detection result. When the external driving signal stops providing or the AC signal level of the external driving signal is insufficient, the energy storage unit of the auxiliary power module 2710 provides the auxiliary power, such that the LED lighting module 530 continues to emit light based on the auxiliary power provided by the auxiliary power module 2710. In the practical application, the energy storage unit for providing auxiliary power can be implemented by an energy storage assembly such as a battery or a supercapacitor, however, the present invention is not limited thereto.

Figure 14E:
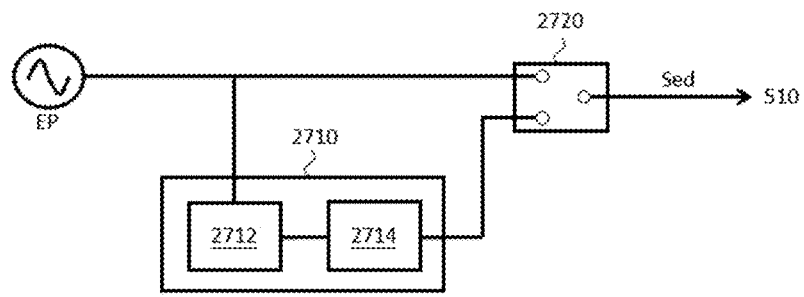
FIG. 14E is a block diagram of an exemplary auxiliary power module according to some exemplary embodiments.

FIG. 14E illustrates an exemplary configuration of the auxiliary power module 2710 operating in an Off-line UPS mode according to some embodiments of the present invention. Referring to FIG. 14E, the auxiliary power module 2710 includes a charging unit 2712 and an auxiliary power supply unit 2714. The charging unit 2712 has an input terminal coupled to an external AC power source EP and an output terminal coupled to an input terminal of the auxiliary power supply unit 2714. The auxiliary power supply unit 2714 has the input terminal coupled to the output terminal of the charging unit 2712 and an output terminal coupled to a power loop between the external AC power source EP and the rectifying circuit 510. Specifically, when the external AC power source EP operates normally, the power, supplied by the external AC power source EP, will be provided to the input terminal of the rectifying circuit 510 as an external driving signal Sed. In the meantime, the charging unit 2712 charges the auxiliary power supply unit 2714 based on the power supplied by the external AC power source EP, and the auxiliary power supply unit 2714 does not output power to the rectifying circuit 510 in response to the external driving signal Sed that is correctly transmitted on the power loop. When the external AC power source EP is unstable or abnormal, the auxiliary power supply unit 2714 starts to supply an auxiliary power, served as the external driving signal Sed, to the rectifying circuit 510.

Figure 14F:
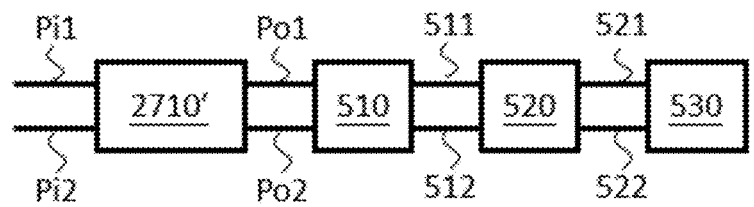
FIG. 14F is a block diagram of an exemplary power supply module in an LED tube lamp according to some exemplary embodiments.

FIG. 14F is a block diagram of a power supply module in an LED tube lamp according to an exemplary embodiment. Referring to FIG. 14F, the LED tube lamp of the present embodiment includes a rectifying circuit 510, a filtering circuit 520, a LED lighting module 530 and an auxiliary power module 2710'. Compared to the embodiment illustrated in FIG. 14D, the input terminals Pi1 and Pi2 of the auxiliary power module 2710' are configured to receive an external driving signal and perform a charge-discharge operation based on the external driving signal, and then supply an auxiliary power, generated from the output terminals Po1 and Po2, to the rectifying circuit 510. From the perspective of the structure of the LED tube lamp, the input terminals Pi1 and Pi2 or the output terminals Po1 and Po2 of the auxiliary power module 2710' are connected to the pins of the LED tube lamp (e.g., 501 and 502 in FIG. 14A or 14B). If the pins 501 and 502 of the LED tube lamp are connected to the input terminals Pi1 and Pi2 of the auxiliary power module 2710', it means the auxiliary power module 2710' is disposed inside the LED tube lamp and receives the external driving signal through the pins 501 and 502. On the other hand, if the pins 501 and 502 of the LED tube lamp are connected to the output terminals Po1 and Po2 of the auxiliary power module 2710', it means the auxiliary power module 2710' is disposed outside the LED tube lamp and outputs the auxiliary power to the rectifying circuit through the pins 501 and 502. The detail structure of the auxiliary power module will be further described in the following embodiments.

In some embodiments, the operation of the auxiliary power module 2710' can be similar to an On-line uninterruptible power supply (On-line UPS). Under the On-line UPS operation, the external AC power source would not directly supply power to the rectifying circuit 510, but supplies power through the the auxiliary power module 2710'. Therefore, the external AC power source can be isolated from the LED tube lamp, and the auxiliary power module 2710' intervenes the whole power supply process, so that the power supplied to the rectifying circuit 510 is not affected by the unstable or abnormal AC power source.

Figure 14G:
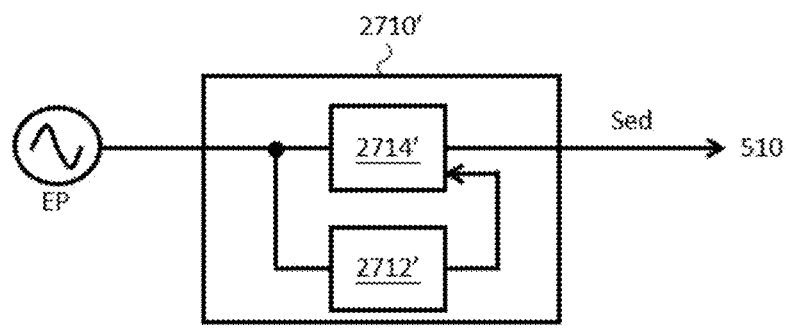
FIGS. 14G-14H are block diagrams of exemplary auxiliary power modules according to some exemplary embodiments.

FIG. 14G illustrates an exemplary configuration of the auxiliary power module 2710' operating in an On-line UPS mode according to some embodiments of the present invention. Referring to FIG. 14G, the auxiliary power module 2710' includes a charging unit 2712' and an auxiliary power supply unit 2714'. The charging unit 2712' has an input terminal coupled to an external AC power source EP and an output terminal coupled to a first input terminal of the auxiliary power supply unit 2714'. The auxiliary power supply unit 2714' further has a second input terminal coupled to the external AC power source EP and an output terminal coupled to the rectifying circuit 510. Specifically, when the external AC power source EP operates normally, the auxiliary power supply unit 2714' performs the power conversion based on the power supplied by the external AC power source EP, and accordingly provides an external driving signal Sed to the rectifying circuit 510. In the meantime, the charging unit 2712' charges an energy storage unit of the auxiliary power supply unit 2714'. When the external AC power source is unstable or abnormal, the auxiliary power supply unit 2714' performs the power conversion based on the power stored in the energy storage unit, and accordingly provides the external driving signal Sed to the rectifying circuit 510. It should be noted that the power conversion described herein could be rectification, filtering, boost-conversion, buck-conversion or a reasonable combination of above operations. The present invention is not limited thereto.

In some embodiments, the operation of the auxiliary power module 2710' can be similar to a Line-Interactive UPS. The basic operation of the auxiliary power module 2710' under a Linear-Interactive UPS mode is similar to the auxiliary power module 2710 under the Off-line UPS mode, the difference between the Line-Interactive UPS mode and the Off-line UPS mode is the auxiliary 2710' has a boost and buck compensation circuit and can monitor the power supply condition of the external AC power source at any time. Therefore, the auxiliary power module 2710' can correct the power output to the power supply module of the LED tube lamp when the external AC power source is not ideal (e.g., the external driving signal is unstable but the variation does not exceed the threshold value), so as to reduce the frequency of using the battery for power supply.

Figure 14H:
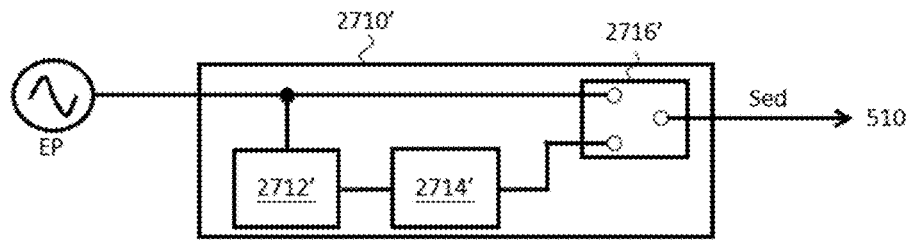

FIG. 14H illustrates an exemplary configuration of the auxiliary power module 2710' operating in the Line-Interactive mode according to some embodiments of the present invention. Referring to FIG. 14H, the auxiliary power module 2710' includes a charging unit 2712', an auxiliary power supply unit 2714' and a switching unit 2716'. The charging unit 2712' has an input terminal coupled to an external AC power source EP. The switching unit 2716' is coupled between an output terminal of the auxiliary power supply unit 2714' and an input terminal of the rectifying circuit 510, in which the switching unit 2716' may selectively conduct a current on a path between the external AC power source EP and the rectifying circuit 510 or on a path between the auxiliary power supply unit 2714' and the rectifying circuit 510 according to the power supply conduction of the external AC power source EP. In detail, when the external AC power source is normal, the switching unit 2716' is switched to conduct a current on the path between the external AC power source EP and the rectifying circuit 510 and cut off the path between the auxiliary power supply unit 2714' and the rectifying circuit 510. Thus, when the external AC power source is normal, the external AC power source EP provides power, regarded as the external driving signal Sed, to the input terminal of the rectifying circuit 510 via the switching unit 2716'. In the meantime, the charging unit 2712' charges the auxiliary power supply unit 2714' based on the external AC power source EP. When the external AC power source is unstable or abnormal, the switching unit 2716' is switched to conduct a current on the path between the auxiliary power supply unit 2714' and the rectifying circuit 510 and cut off the path between the AC power source EP and the rectifying circuit 510. The auxiliary power supply unit 2714' starts to supply power, regarded as the external driving signal Sed, to the rectifying circuit 510.

In the embodiments of the auxiliary power module, the auxiliary power provided by the auxiliary power supply unit 2714/2714' can be in either AC or DC. When the auxiliary power is provided in AC, the auxiliary power supply unit 2714/2714' includes, for example, an energy storage unit and a DC-to-AC converter. When the auxiliary power is provided in DC, the auxiliary power supply unit 2714/2714' includes, for example, an energy storage unit and a DC-to-DC converter, or simply includes an energy storage unit; the present invention is not limited thereto. The energy storage unit can be a set of batteries. The DC-to-DC converter can be a boost converter, a buck converter or a buck-boost converter.

In an exemplary embodiment, the brightness of the LED module on the external driving signal is different from the brightness of the LED module on the auxiliary power. Therefore, a user may find the external power is abnormal when observing that the brightness of LED module changed, and thus the user can eliminate the problem as soon as possible. In this manner, the operation of the auxiliary power module 2710 can be considered as an indication for indicating whether the external driving signal is normally provided, by providing the auxiliary power having the output power different from the external driving signal when the external driving signal is abnormal. For example, in some embodiments, the luminance of the LED module is 1600 to 2000 lm when being lighted up by the external driving signal; and the luminance of the LED module is 200 to 250 lm when being lighted up by the auxiliary power. From the perspective of the auxiliary power module 2710, in order to let the luminance of the LED module reach 200-250 lm, the output power of the auxiliary power module 2710 is, for example, 1 watt to 5 watts, but the present invention is not limited thereto. In addition, the electrical capacity of the energy storage unit in the auxiliary power module 2710 may be, for example, 1.5 to 7.5 Wh (watt-hour) or above, so that the LED module can be lighted up for 90 minutes under 200-250 lm based on the auxiliary power. However, the present invention is not limited thereto.

Figure 14I:
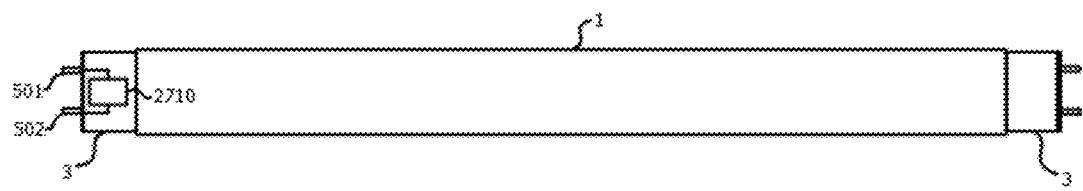
FIGS. 14I-14J are schematic structures of an auxiliary power module disposed in an LED tube lamp according to some exemplary embodiments.

From the perspective of the structure, FIG. 14I illustrates a schematic structure of an auxiliary power module disposed in an LED tube lamp according to an exemplary embodiment. In the present embodiment, in addition, or as an alternative, to disposing the auxiliary power module 2710/2710' in the lamp tube 1 as the embodiment mentioned above, the auxiliary power module 2710/2170' can be disposed in the end cap 3 as well. In order to make the description more clear, the auxiliary power module 2710 is chosen as a representative of the auxiliary power modules 2710 and 2710' in the following paragraph, and only 2710 is marked on the figures. When the auxiliary power module 2710 is disposed in the end cap 3, the auxiliary power module 2710 connects to the corresponding pins 501 and 502 via internal wiring of the end cap 3, so as to receive the external driving signal provided to the pins 501 and 502. Compared to the structure of disposing the auxiliary power module into the lamp tube 1, the auxiliary power module 2710 can be disposed far apart from the LED module since the auxiliary power module 2710 is disposed in the end cap 3 which is connected to the respective end of the lamp tube 1. Therefore, the operation and illumination of the LED module won't be affected by the charging or discharging heat generated by the auxiliary power module 2710. In addition, the auxiliary power module 2710 and the power supply module of the LED tube lamp can be disposed in the same end cap, or disposed in the different end caps on the respective ends of the lamp tube. In some embodiments, if the auxiliary power module 2710 and the power supply module of the LED tube lamp are respectively disposed in the different end caps, each module may have more area for circuit layout.

Figure 14J:
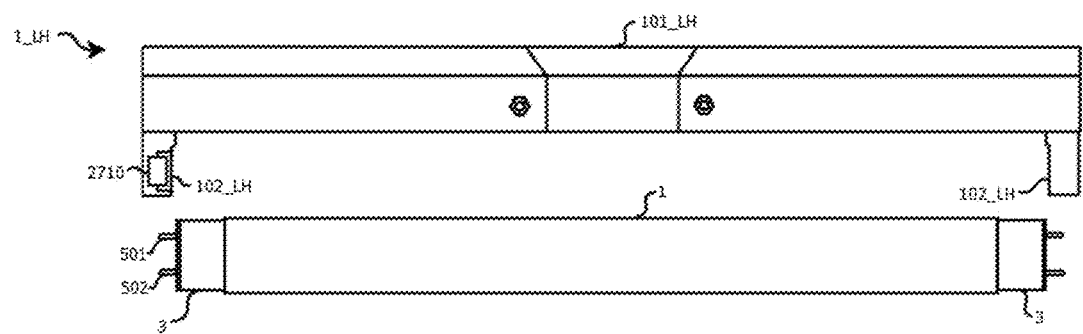

In another exemplary embodiment, the auxiliary power module 2710 can be disposed in a lamp socket corresponding to the LED tube lamp as shown in FIG. 14J, which illustrates a schematic structure of an auxiliary power module disposed in a lamp socket according to an exemplary embodiment. The lamp socket 1_LH includes a base 101_LH and a connecting socket 102_LH. The base 101_LH has power line disposed inside and is adapted to lock/attach to a fixed object such as a wall or a ceiling. The connecting socket 102_LH has slot corresponding to the pin (e.g., the pins 501 and 502) on the LED tube lamp, in which the slot is electrically connected to the corresponding power line. In the present embodiment, the connecting socket 102_LH and the base 101_LH can be formed in one piece, or the connecting socket 102_LH can be removably disposed on the base 101_LH. The invention is not limited one of these embodiments.

When the LED tube lamp is installed on the lamp socket 1_LH, the pins on both end caps 3 are respectively inserted into the slot of the corresponding connecting socket 102_LH, and thus the power line can be connected to the LED tube lamp for providing the external driving signal to the corresponding pins of the LED tube lamp. Taking the configuration of the left end cap 3 as an example, when the pins 501 and 502 are inserted into the slots of the connecting socket 102_LH, the auxiliary power module 2710 is electrically connected to the pins 501 and 502 via the slots, so as to implement the connection configuration shown in FIG. 14D.

Compared to the embodiment of disposing the auxiliary power module 2710 in the end cap 3, the connecting socket 102_LH and the auxiliary power module 2710 can be integrated as a module since the connecting socket can be designed as a removable configuration in an exemplary embodiment. Under such configuration, when the auxiliary power module 2710 has a fault or the service life of the energy storage unit in the auxiliary power module 2710 has run out, a new auxiliary power module can be replaced for use by replacing the modularized connecting socket 102_LH, instead of replacing the entire LED tube lamp. Thus, in addition to reducing the thermal effect of the auxiliary power module, the modularized design of the auxiliary power module makes the replacement of the auxiliary power module easier. Therefore, the durability of the LED tube lamp is improved since it is no longer necessary to replace the entire LED tube lamp when a problem occurs to the auxiliary power module. In addition, in some embodiments, the auxiliary power module 2710 can be disposed inside the base 101_LH or outside the base 101_LH, the present invention is not limited thereto.

In summary, the structural configuration of the auxiliary power module 2710 can be divided into the following two types: (1) the auxiliary power module is integrated into the LED tube lamp; and (2) the auxiliary power module 2710 is disposed independent from the LED tube lamp. Under the configuration of disposing the auxiliary power module 2710 independent from the LED tube lamp, if the auxiliary power module 2710 operates in the Off-line UPS mode, the auxiliary power module 2710 and the external AC power source can provide power, through different pins or through sharing at least one pin, to the LED tube lamp. On the other hand, if the auxiliary power module 2710 operates in the On-line UPS mode or the Line-Interactive mode, the external AC power source provides power through the auxiliary power module 2710 rather than directly to the pins of the LED tube lamp. The detailed configuration of disposing the auxiliary power module independent from the LED tube lamp (hereinafter the independent auxiliary power module) is further described below.

It should be noted that the combination of the lamp and the lamp socket could be regarded as a light fixture, a lamp fixture, a light fitting or luminaries. For example, the lamp socket in the disclosure can be regarded as a part of the light fixture for securing, attaching or appending as to a house, apartment building, etc, and for holding and providing power to the lamps. In addition, the connecting sockets 102_LH can be described as tombstone sockets of the light fixture.

Figure 14K:
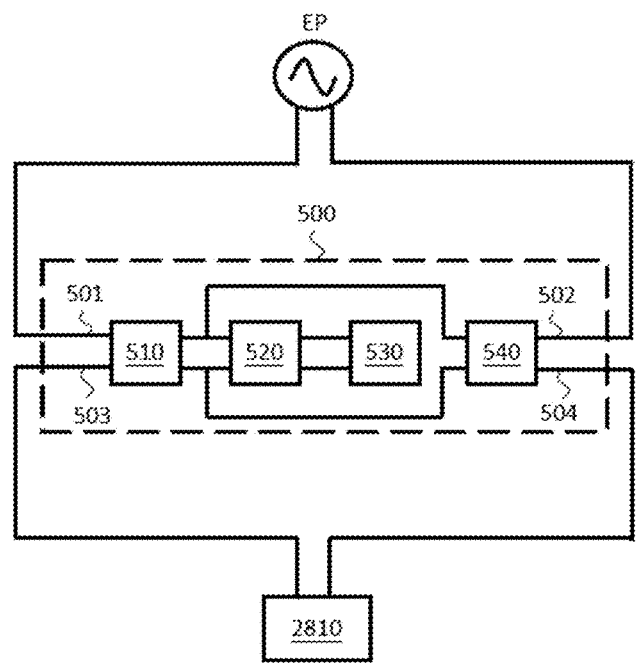
FIGS. 14K-14M are block diagrams of LED lighting systems according to some exemplary embodiments.

FIG. 14K is a block diagram of an LED lighting system according to an exemplary embodiment. Referring to FIG. 14K, the LED lighting system includes an LED tube lamp 500 and an auxiliary power module 2810. The LED tube lamp 500 includes rectifying circuits 510 and 540, a filtering circuit 520 and an LED lighting module 530. The LED lighting module 530 includes a driving circuit (optional) and an LED module. The rectifying circuits 510 and 540 can be respectively implemented by the full-wave rectifier 610 illustrated in FIG. 9A or the half-wave rectifier 710 as shown in FIG. 9B, in which two input terminals of the rectifying circuit 510 are coupled to the pins 501 and 502 and two input terminals of the rectifying circuit 540 are coupled to the pins 503 and 504.

In present embodiment, the LED tube lamp 500 is configured as a dual-end power supply structure for example. The external AC power source EP is coupled to the pins 501 and 502 on the respective end caps of the LED tube lamp 500, and the auxiliary power module 2810 is coupled to the pins 503 and 504 on the respective end caps of the LED tube lamp 500. In this embodiment, the external AC power source EP and the auxiliary power module 2810 provide power to the LED tube lamp 500 through different pairs of the pins. Although the present embodiment is illustrated in dual-end power supply structure for example, the present invention is not limited thereto. In another embodiment, the external AC power source EP can provide power throughout the pins 501 and 503 on the end cap at one side of the lamp tube (i.e., the single-end power supply structure), and the auxiliary power module 2810 can provide power through the pins 502 and 504 on the end cap at the other side of the lamp tube. Accordingly, no matter whether the LED tube lamp 500 is configured in the single-end or the dual-end power supply structure, the unused pins of the original LED tube lamp (e.g., 503 and 504 illustrated in FIG. 14K) can be the interface for receiving the auxiliary power, so that the emergency lighting function can be integrated in the LED tube lamp 500.

Figure 14L:
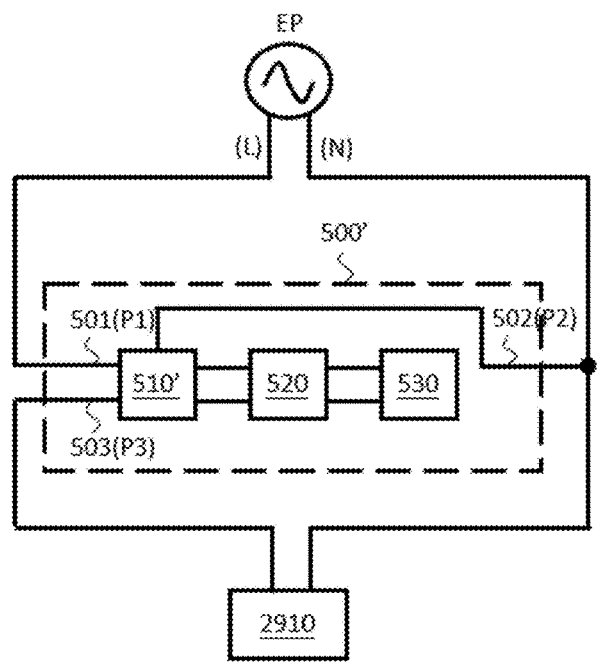

FIG. 14L is a block diagram of an LED lighting system according to another exemplary embodiment. Referring to FIG. 14L, the LED lighting system includes an LED tube lamp 500' and an auxiliary power module 2910. The LED tube lamp 500' includes a rectifying circuit 510', a filtering circuit 520 and an LED lighting module 530. The LED lighting module 530 includes a driving circuit (optional) and an LED module. The rectifying circuit 510' can be implemented by the rectifying circuit 910 having three bridge arms as shown in FIGS. 9D to 9F, in which the rectifying circuit 510' has a first signal input terminal P1 coupled to the pin 501, a second signal input terminal P2 coupled to the pin 502 and the auxiliary power module 2910 and a third input terminal P3 coupled to the auxiliary power module 2910.

In the present embodiment, the LED tube lamp 500' is configured as a dual-end power supply structure for example. The external AC power source EP is coupled to the pins 501 and 502 on the respective end caps of the LED tube lamp 500. The difference between the present embodiment and the embodiment illustrated in FIG. 14K is that besides being coupled to the pin 503, the auxiliary power module 2910 further shares the pin 502 with the external AC power source EP. Under the configuration of FIG. 14L, the external AC power source EP provides power to the signal input terminals P1 and P2 of the rectifying circuit 510' though the pins 501 and 502, and the auxiliary power module 2910 provides power to the signal input terminals P2 and P3 of the rectifying circuit 510' through the pins 502 and 503. In detail, if the leads connected to the pins 501 and 502 are respectively configured as a live wire (denoted by "(L)") and a neutral wire (denoted by "(N)"), the auxiliary power module 2910 shares the lead (N) with the external AC power source EP and has a lead for transmitting power as a live wire distinct from the external AC power source EP.

From the perspective of operation, when the external AC power source normally operates, the rectifying circuit 510' performs the full-wave rectification by the bridge arms corresponding to the signal input terminals P1 and P2, so as to provide power to the LED lighting module 530 based on the external AC power source EP. When the external AC power source is unstable or abnormal, the rectifying circuit 510' performs the full-wave rectification by the bridge arms corresponding to the signal input terminals P2 and P3, so as to provide power to the LED lighting module based on the auxiliary power provided by the auxiliary power module 2910.

In addition, since the LED tube lamp receives the auxiliary power provided by the auxiliary power module 2910 through sharing the pin 502, an unused pin 504 can be used as a signal input interface of other control functions. Said other control functions can be at least one of a dimming function, a communication function and a sensing function, though the present invention is not limited thereto. The embodiment of integrating the dimming function through the unused pin 504 is further described below.

Figure 14M:
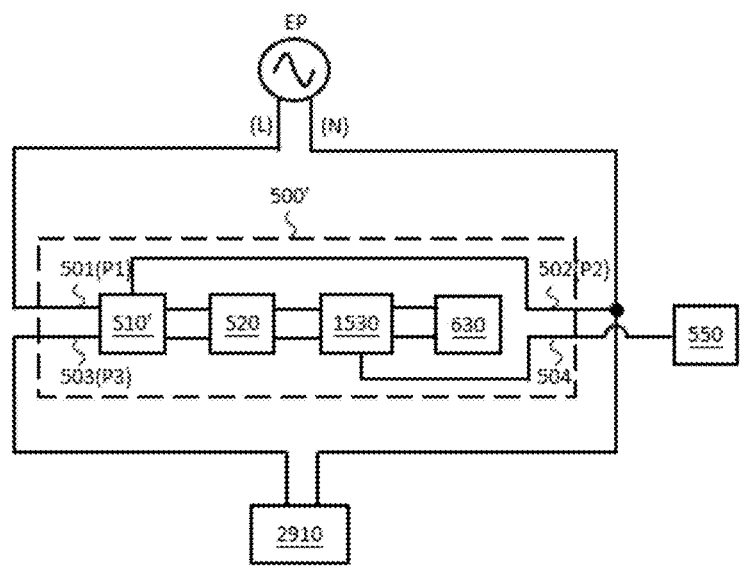

FIG. 14M is a block diagram of an LED lighting system according to still another exemplary embodiment. Referring to FIG. 14M, the LED lighting system includes an LED tube lamp 500' and an auxiliary power module 2910. The LED tube lamp 500' includes a rectifying circuit 510', a filtering circuit 520, a driving circuit 1530 and an LED module 630. The configuration of the present embodiment is similar to the embodiment illustrated in FIG. 14L. The difference between the embodiments of FIGS. 14M and 14L is, as shown in FIG. 14M, the pin 504 of the LED tube lamp 500' is further coupled to a dimming control circuit 550, in which the dimming control circuit 550 is coupled to the driving circuit 1530 through the pin 504, so that the driving circuit 1530 can adjust the magnitude of the driving current, supplied to the LED module 630, according to a dimming signal received from the dimming control circuit 550. Therefore, the brightness and/or the color temperature of the LED module 630 can be varied according to the dimming signal.

For example, the dimming control circuit 550 can be implemented by a circuit including a variable impedance component (e.g., a variable resistor, a variable capacitor or a variable inductor) and a signal conversion circuit. The impedance of the variable impedance component can be tuned by a user, so that the dimming control circuit 550 generates the dimming signal having signal level corresponding to the impedance. After converting the signal formation (e.g., signal level, frequency or phase) of the dimming signal to conform the signal formation of the driving circuit 1530, the converted dimming signal is transmitted to the driving circuit 1530, so that the driving circuit 1530 adjusts the magnitude of the driving current based on the converted dimming signal. In some embodiments, the brightness of the LED module 630 can be adjusted by tuning the frequency or the reference level of the driving signal. In some embodiments, the color temperature of the LED module 630 can be adjusted by tuning the brightness of the red LED units.

It should be noted that, by utilizing the structural configurations as shown in FIGS. 14I and 14J, the auxiliary power module 2810/2910 can obtain the similar benefits and advantages described in the embodiments of FIGS. 14I and 14J. In addition, although the dummy pins (i.e., the pins not for receiving the external driving signal, such as the pins 503 and 504) illustrated in FIGS. 11K to 11M are used for receiving the auxiliary power and the dimming signal, the invention is not limited thereto. In some embodiments, the dummy pins can be used for other functions, such as receiving a remote control signal or outputting a sensing signal, by correspondingly disposing circuits connected to the dummy pins for performing the functions. For example, the dummy pins in the LED tube lamp can be configured to a signal input/output interface for performing certain functions.

Under a lamp module architecture having multi tube lamps, which is similar with the embodiments described in FIG. 14A to FIG. 14N, the auxiliary power module can be disposed in one tube lamp, or in plural tube lamps, in which the multi tube lamps architectures based on the consideration of the uniformity of illumination are adapted to the present embodiment as well. The difference between the embodiment having multi tube lamps and the embodiments illustrated in FIG. 14A to FIG. 14N is that the auxiliary power module disposed in one of the tube lamps may supply power to the other tube lamps.

It should be noted that, although the description of the lamp module having multi tube lamps herein is taking the four parallel LED tube lamps as an example, those skilled in the art should understand, based on the description mentioned above, how to implement an auxiliary power supply by selecting and disposing the suitable energy storage unit. Therefore, any embodiments illustrated in which the auxiliary power module 2710 provides auxiliary power to one or plural tube lamps, such that the corresponding LED tube lamp has a specific illuminance in response to the auxiliary power, may be implemented according to the disclosed embodiments.

In another exemplary embodiment, the auxiliary power modules 2510, 2610, 2710, 2810 and 2910 determine whether to provide the auxiliary power to the LED tube lamp according to a lighting signal. Specifically, the lighting signal is an indication signal indicating the switching state of the lamp switch. For example, the signal level of the lighting signal can be adjusted to a first level (e.g., high logic level) or a second level different from the first level (e.g., low logic level) according to the switching of the lamp switch. When a user toggles the lamp switch to an on-position, the lighting signal is adjusted to the first level; and when the user toggles the lamp switch to an off-position, the lighting signal is adjusted to the second level. For example, the lamp switch may be switched to the on-position when the lighting signal is at the first level and to the off-position when the lighting signal is at the second level. The generation of the lighting signal can be implemented by a circuit capable of detecting the switching state of the lamp switch.

In still another exemplary embodiment, the auxiliary power module 2510/2610/2710/2810/2910 further includes a lighting determination circuit for receiving the lighting signal and determining whether the energy storage unit provides the auxiliary power to the end of the LED tube lamp (e.g., to provide the auxiliary power to the LED module) according to the signal level of the lighting signal and the detection result of the voltage detection circuit. Specifically, based on the signal level of the lighting signal and the detection result, there are three different states as follows: (1) the lighting signal is at the first level and the external driving signal is normally provided; (2) the lighting signal is at the first level and the external driving signal stops being provided or the AC signal level of the external driving signal is insufficient; and (3) the lighting signal is at the second level and the external driving signal stops being provided. Herein, state (1) is the situation where a user turns on the lamp switch and the external driving signal is normally provided, state (2) is the situation where a user turns on the lamp switch however a problem occurs to the external power supply, and state (3) is the situation where a user turns off the lamp switch so that the external power supply is stopped.

In the present exemplary embodiment, states (1) and (3) belong to normal states, which means the external power is normally provided or stops in accordance with the user's control. Therefore, under states (1) and (3), the auxiliary power module does not provide auxiliary power to the end of the LED tube lamp (e.g., to the LED module). More specifically, the lighting determination circuit controls the energy storage unit not to provide the auxiliary power to the end of the LED tube lamp according to the determination result of states (1) and (3). In state (1), the external driving signal is directly input to the rectifying circuit 510 and charges the energy storage unit. In state (3), the external driving signal stops being provided so that the energy unit is not charged by the external driving signal.

State (2) represents the external power is not provided to the tube lamp when the user turns on the light, therefore, the lighting determination circuit controls the energy storage unit to provide the auxiliary power to the rear end according to the determination result indicating state (2), so that the LED lighting module 530 emits light based on the auxiliary power provided by the energy storage unit.

Accordingly, based on the application of the lighting determination circuit, the LED lighting module 530 may have three different luminance variations. The LED lighting module 530 has a first luminance (e.g., 1600 to 2200 lm) when the external power is normally supplied; the lighting module 530 has a second luminance (e.g., 200 to 250 lm) when the external power is abnormal and the power supply is changed to the auxiliary power; and the lighting module 530 has a third luminance (e.g., does not light up the LED module) when the user turns off the power on their own such that the external power is not provided to the LED tube lamp.

More specifically, in accordance with the embodiment of FIG. 14C, the lighting determination circuit is, for example, a switch circuit (not shown) connected between the auxiliary power positive terminal 2611 and the auxiliary power negative terminal 2612 in series. The control terminal of the switch circuit receives the lighting signal. When the lighting signal is at the first level, the switch circuit is conducted in response to the lighting signal, such that the external driving signal charges the energy storage unit 2613 via the auxiliary power positive terminal 2611 and the auxiliary power negative terminal 2612 when the external driving signal is normally supplied (state (1)), or makes the energy storage unit 2613 discharge to the LED lighting module 530 or LED module 630 via the auxiliary power positive terminal 2611 and the auxiliary power negative terminal 2612 when the external driving signal stops providing or the AC signal level of the external driving signal is insufficient (state (2)). On the other hand, when the lighting signal is at the second level, the switch circuit is cut off in response to the lighting signal (state (3)). At this time, even though the external driving signal stops being provided or the AC signal level is insufficient, the energy storage unit 2613 won't provide the auxiliary power to the rear end.

Figure 15A:
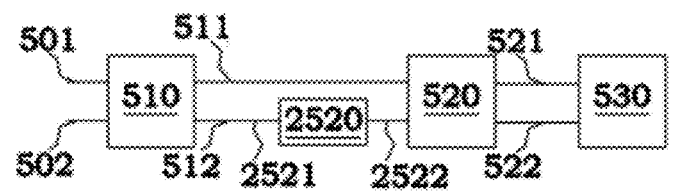
FIG. 15A is a block diagram of an LED tube lamp according to some exemplary embodiments.

Referring to FIG. 15A, a block diagram of an LED tube lamp including a power supply module in accordance with certain embodiments is illustrated. Compared to the LED lamp shown in FIG. 8D, the LED tube lamp of FIG. 15A includes a rectifying circuit 510, a filtering circuit 520, and an LED lighting module 530, and further includes an installation detection module 2520 (also known as an electric shock protection module). The installation detection module 2520 is coupled to the rectifying circuit 510 via an installation detection terminal 2521 and is coupled to the filtering circuit 520 via an installation detection terminal 2522. The installation detection module 2520 detects the signal passing through the installation detection terminals 2521 and 2522 and determines whether to cut off an LED driving signal (e.g., an external driving signal) passing through the LED tube lamp based on the detected result. The installation detection module 2520 includes circuitry configured to perform the steps of detecting the signal passing through the installation detection terminals 2521 and 2522 and determining whether to cut off an LED driving signal, and thus may be referred to as an installation detection circuit, or more generally as a detection circuit or cut-off circuit. When an LED tube lamp is not yet installed on a lamp socket or holder, or in some cases if it is not installed properly or is only partly installed (e.g., one side is connected to a lamp socket, but not the other side yet), the installation detection module 2520 detects a smaller current compared to a predetermined current (or current value) and determines the signal is passing through a high impedance through the installation detection terminals 2521 and 2522. In this case, in certain embodiments, the installation detection circuit 2520 is in a cut-off state to make the LED tube lamp stop working or limit the current flowing through the power loop to less than 5 MIU, which can be referred to 5 mA at a certain frequency and is the requirement, defined in the safety certification standard such as UL, of the Type-B LED tube lamp. The unit of "MIU" is defined by American National Standards Institute (ANSI) C101-1992. Otherwise, the installation detection module 2520 determines that the LED tube lamp has already been installed on the lamp socket or holder (e.g., when the installation detection module 2520 detects a current equal to or larger than a predetermined current and determines the signal is passing through a low impedance through the installation detection terminals 2521 and 2522), and maintains conducting state/current limiting state to make the LED tube lamp working normally.

For example, in some embodiments, when a current passing through the installation detection terminals 2521 and 2522 is greater than or equal to a specific, defined installation current (or a current value), which may indicate that the current supplied to the LED lighting module 530 is greater than or equal to a specific, defined operating current, the installation detection module 2520 is conducting to make the LED tube lamp operate in a conducting state. For example, a current greater than or equal to the specific current value may indicate that the LED tube lamp has correctly been installed in the lamp socket or holder. When the current passing through the installation detection terminals 2521 and 2522 is smaller than the specific, defined installation current (or the current value), which may indicate that the current supplied to the LED lighting module 530 is less than a specific, defined operating current, the installation detection module 2520 cuts off current to make the LED tube lamp enter in a non-conducting state based on determining that the LED tube lamp has been not installed in, or does not properly connect to, the lamp socket or holder. In certain embodiments, the installation detection module 2520 determines conducting or cutting off based on the impedance detection to make the LED tube lamp operate in a conducting state or enter non-conducting state. The LED tube lamp operating in a conducting state may refer to the LED tube lamp including a sufficient current passing through the LED module to cause the LED light sources to emit light. The LED tube lamp operating in a cut-off state may refer to the LED tube lamp including an insufficient current or no current passing through the LED module so that the LED light sources do not emit light. Accordingly, the occurrence of electric shock caused by touching the conductive part of the LED tube lamp which is incorrectly installed on the lamp socket or holder can be efficiently avoided.

Compared with a general LED power supply module, since the power supply module provided with the installation detection module 2520 has the effect of preventing electric shock, there is no need to dispose a safety capacitor (i.e., X capacitor) between the input terminals of the rectifying circuit 510 (i.e., between the live wire (L) and the neutral wire (N)). From the perspective of the equivalent circuit of the power supply module, having no X capacitor disposed between the input terminals of the rectifying circuit 510 means the effective capacitance between the input terminals of the rectifying circuit 510 is, for example, smaller than 47 nF. In the present embodiment, the power loop refers to the current path in the LED tube lamp, for example, the path formed between the pins on the respective end caps.

More precisely, when an external AC power source is applied to the LED tube lamp 500, the current flows from the pin on one end cap (e.g., left end cap) to the pin on the other end cap (e.g., right end cap) and passes through the leads and the components serially connected to the first terminal of the LED module (e.g., the positive terminal), the LED module, the leads and the components serially connected to the second terminal of the LED module (e.g., the negative terminal) in sequence. The pins, the leads, the components, and the LED module that the current passes through form the power loop.

It should be noted that, the issue of electric shock is raised since the power loop is formed between the respective ends of the LED tube lamp under the dual-end power supply structure.

Figure 15B:
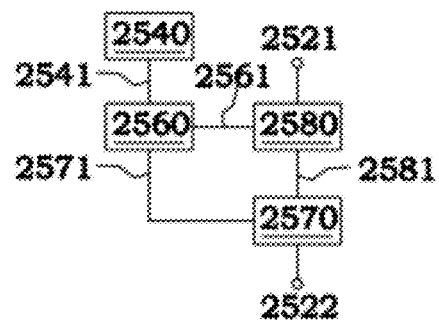
FIG. 15B is a block diagram of an installation detection module according to some exemplary embodiments.

Referring to FIG. 15B, a block diagram of an installation detection module in accordance with certain embodiments is illustrated. The installation detection module includes a switch circuit 2580, a detection pulse generating module 2540, a detection result latching circuit 2560, and a detection determining circuit 2570. Certain of these circuits or modules may be referred to as first, second, third, etc., circuits as a naming convention to differentiate them from each other.

The detection determining circuit 2570 is coupled to and detects the signal between the installation detection terminals 2521 (through a switch circuit coupling terminal 2581 and the switch circuit 2580) and 2522. The detection determining circuit 2570 is also coupled to the detection result latching circuit 2560 via a detection result terminal 2571 to transmit the detection result signal to the detection result latching circuit 2560. The detection determining circuit 2570 may be configured to detect a current passing through terminals 2521 and 2522 (e.g., to detect whether the current is above or below a specific current value).

The detection pulse generating module 2540 is coupled to the detection result latching circuit 2560 via a pulse signal output terminal 2541, and generates a pulse signal to inform the detection result latching circuit 2560 of a time point for latching (storing) the detection result. For example, the detection pulse generating module 2540 may be a circuit configured to generate a signal that causes a latching circuit, such as the detection result latching circuit 2560 to enter and remain in a state that corresponds to one of a conducting state or a cut-off state for the LED tube lamp. The detection result latching circuit 2560 stores the detection result according to the detection result signal (or detection result signal and pulse signal), and transmits or provides the detection result to the switch circuit 2580 coupled to the detection result latching circuit 2560 via a detection result latching terminal 2561. The switch circuit 2580 controls the state between conducting or cut off between the installation detection terminals 2521 and 2522 according to the detection result.

In some embodiments, the detection pulse generating module 2540 may be referred to as a first circuit 2540, the detection result latching circuit 2560 may be referred to as a second circuit 2560, the switch circuit 2580 may be referred to as a third circuit 2580, the detection determining circuit 2570 may be referred to as a fourth circuit 2570, the switch circuit coupling terminal 2581 may be referred to as a first terminal 2581 and the detection result terminal 2571 may be referred to as a second terminal 2571, the pulse signal output terminal 2541 may be referred to as a third terminal 2541, the detection result latching terminal 2561 may be referred to as a fourth terminal 2561, the installation detection terminal 2521 may be referred to as a first installation detection terminal 2521, and the installation detection terminal 2522 may be referred to as a second installation detection terminal 2522. In this exemplary embodiment, the fourth circuit 2570 is coupled to the third circuit 2580 and the second circuit 2560 via the first terminal 2581 and the second terminal 2571, respectively, the second circuit 2560 is also coupled to the first circuit 2540 and the third circuit 2580 via the third terminal 2541 and the fourth terminal 2561, respectively.

In some embodiments, the fourth circuit 2570 is configured for detecting a signal between the first installation detection terminal 2521 and the second installation detection terminal 2522 through the first terminal 2581 and the third circuit 2580. For example, because of the above configuration, the fourth circuit 2570 is capable of detecting and determining whether a current passing through the first installation detection terminal 2521 and the second installation detection terminal 2522 is below or above a predetermined current value and transmitting or providing a detection result signal to the second circuit 2560 via the second terminal 2571.

In some embodiments, the first circuit 2540 generates a pulse signal through the second circuit 2560 to make the third circuit 2580 working in a conducting state during the pulse signal. Meanwhile, as a result, the power loop of the LED tube lamp between the installation detection terminals 2521 and 2522 is thus conducting as well. The fourth circuit 2570 detects a sample signal on the power loop and generates a signal based on a detection result to inform the second circuit 2560 of a time point for latching (storing) the detection result received by the second circuit 2560 from the fourth circuit 2570. For example, the fourth circuit 2570 may be a circuit configured to generate a signal that causes a latching circuit, such as the second circuit 2560 to enter and remain in a state that corresponds to one of a conducting state or a cut-off state for the LED tube lamp. The second circuit 2560 stores the detection result according to the detection result signal (or detection result signal and pulse signal), and transmits or provides the detection result to the third circuit 2580 coupled to the second circuit 2560 via the fourth terminal 2561. The third circuit 2580 receives the detection result transmitted from the second circuit 2560 and controls the state between conducting or cut off between the installation detection terminals 2521 and 2522 according to the detection result. It should be noted that the labels "first," "second," "third," etc., described in connection with these embodiments can be interchangeable and are merely used here in order to more easily differentiate the different circuits, nodes, and other components from each other.

In some embodiments, the first circuit 2540, the second circuit 2560 and the fourth circuit 2570 can be referred to a detection circuit or an electric shock detection/protection circuit, which is configured to control the switching state of the switch circuit/third circuit 2580.

Figure 15C:
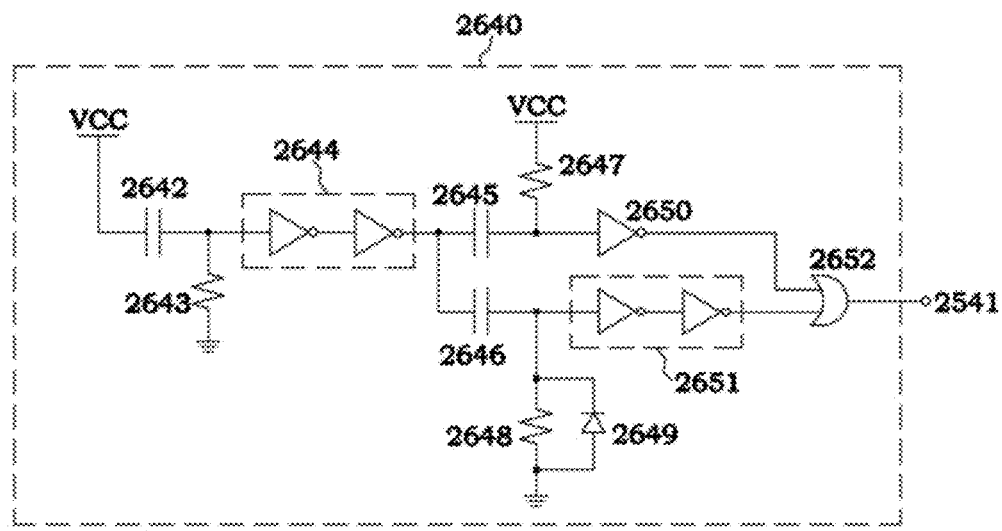
FIG. 15C is a schematic detection pulse generating module according to some exemplary embodiments.

Referring to FIG. 15C, a block diagram of a detection pulse generating module in accordance with certain embodiments is illustrated. A detection pulse generating module 2640 may be a circuit that includes multiple capacitors 2642, 2645, and 2646, multiple resistors 2643, 2647, and 2648, two buffers 2644 and 2651, an inverter 2650, a diode 2649, and an OR gate 2652. The capacitor 2642 may be referred to as a first capacitor 2642, the capacitor 2645 may be referred to as a second capacitor 2645, and the capacitor 2646 may be referred to as a third capacitor 2646. The resistor 2643 may be referred to as a first resistor 2643, the resistor 2647 may be referred to as a second resistor 2647, and the resistor 2648 may be referred to as a third resistor 2648. The buffer 2644 may be referred to as a first buffer 2644 and the buffer 2651 may be referred to as a second buffer 2651. The diode 2649 may be referred to as a first diode 2649 and the OR gate 2652 may be referred to as a first OR gate 2652. With use or operation, the capacitor 2642 and the resistor 2643 connect in series between a driving voltage (e.g., a driving voltage source, which may be a node of a power supply), such as VCC usually defined as a high logic level voltage, and a reference voltage (or potential), such as ground potential in this embodiment. The connection node between the capacitor 2642 and the resistor 2643 is coupled to an input terminal of the buffer 2644. In this exemplary embodiment, the buffer 2644 includes two inverters connected in series between an input terminal and an output terminal of the buffer 2644. The resistor 2647 is coupled between the driving voltage, e.g., VCC, and an input terminal of the inverter 2650. The resistor 2648 is coupled between an input terminal of the buffer 2651 and the reference voltage, e.g. ground potential in this embodiment. An anode of the diode 2649 is grounded and a cathode of the diode 2649 is coupled to the input terminal of the buffer 2651. First ends of the capacitors 2645 and 2646 are jointly coupled to an output terminal of the buffer 2644, and second, opposite ends of the capacitors 2645 and 2646 are respectively coupled to the input terminal of the inverter 2650 and the input terminal of the buffer 2651. In this exemplary embodiment, the buffer 2651 includes two inverters connected in series between an input terminal and an output terminal of the buffer 2651. An output terminal of the inverter 2650 and an output terminal of the buffer 2651 are coupled to two input terminals of the OR gate 2652. According to certain embodiments, the voltage (or potential) for "high logic level" and "low logic level" mentioned in this specification are all relative to another voltage (or potential) or a certain reference voltage (or potential) in circuits, and further may be described as "logic high logic level" and "logic low logic level."

Figure 17A:
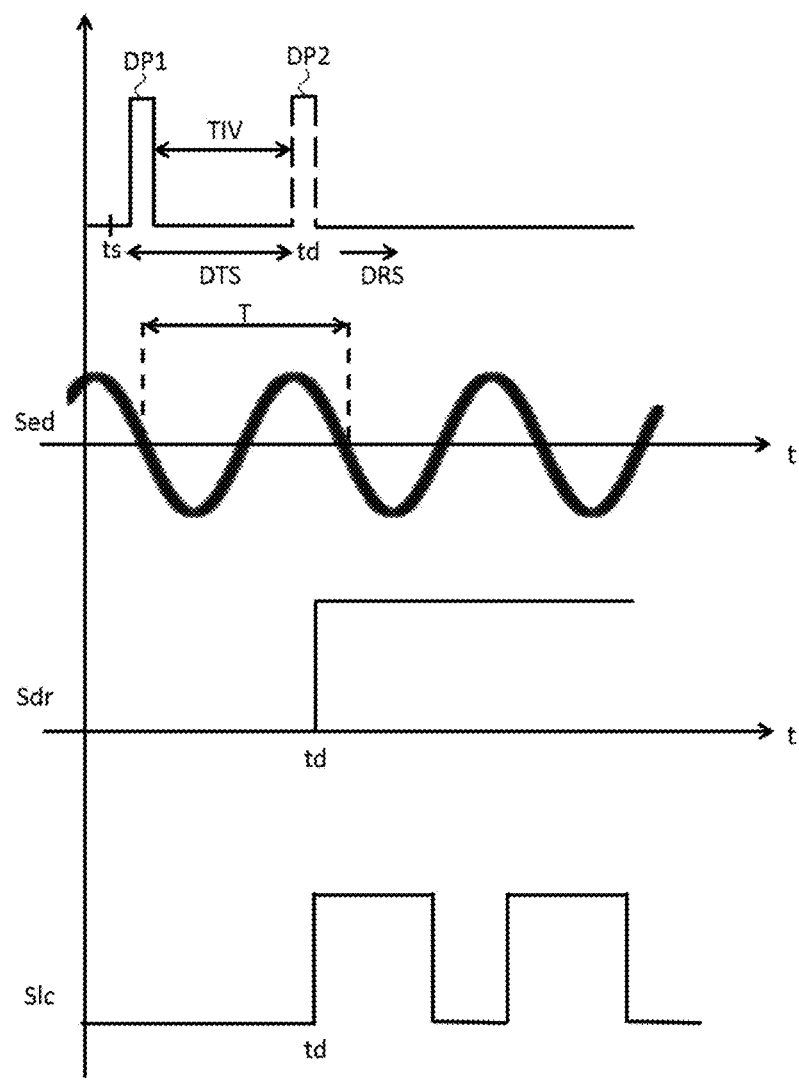
FIGS. 17A-17C are signal waveform diagrams of exemplary power supply modules according to some exemplary embodiments.

FIG. 17A is a signal waveform diagram of an exemplary power supply module according to an exemplary embodiment. The installation detection operation is described further in accordance with FIG. 17A, which shows an example when an end cap of an LED tube lamp is inserted into a lamp socket and the other end cap thereof is electrically coupled to a human body, or when both end caps of the LED tube lamp are inserted into the lamp socket (e.g., at the timepoint ts), the LED tube lamp is conductive with electricity. At this moment, the installation detection module (e.g., the installation detection module 2520 as illustrated in FIG. 15A) enters a detection stage DTS. The voltage on the connection node of the capacitor 2642 and the resistor 2643 is high initially (equals to the driving voltage, VCC) and decreases with time to zero finally. The input terminal of the buffer 2644 is coupled to the connection node of the capacitor 2642 and the resistor 2643, so the buffer 2644 outputs a high logic level signal at the beginning and changes to output a low logic level signal when the voltage on the connection node of the capacitor 2642 and the resistor 2643 decreases to a low logic trigger logic level. As a result, the buffer 2644 is configured to produce an input pulse signal and then remain in a low logic level thereafter (stops outputting the input pulse signal.) The width for the input pulse signal may be described as equal to one (initial setting) time period, which is determined by the capacitance value of the capacitor 2642 and the resistance value of the resistor 2643.

Next, the operations for the buffer 2644 to produce the pulse signal with the initial setting time period will be described below. Since the voltage on a first end of the capacitor 2645 and on a first end of the resistor 2647 is equal to the driving voltage VCC, the voltage on the connection node of both of them is also a high logic level. The first end of the resistor 2648 is grounded and the first end of the capacitor 2646 receives the input pulse signal from the buffer 2644, so the connection node of the capacitor 2646 and the resistor 2648 has a high logic level voltage at the beginning but this voltage decreases with time to zero (in the meantime, the capacitor stores the voltage being equal to or approaching the driving voltage VCC.) Accordingly, initially the inverter 2650 outputs a low logic level signal and the buffer 2651 outputs a high logic level signal, and hence the OR gate 2652 outputs a high logic level signal (a first pulse signal DP1) at the pulse signal output terminal 2541. At this moment, the detection result latching circuit 2560 (as illustrated in FIG. 15B) stores the detection result for the first time according to the detection result signal Sdr received from the detection determining circuit 2570 (as illustrated in FIG. 15B) and the pulse signal generated at the pulse signal output terminal 2541. During that initial pulse time period, as illustrated in FIG. 15B, the detection pulse generating module 2540 outputs a high logic level signal, which results in the detection result latching circuit 2560 outputting the result of that high logic level signal.

When the voltage on the connection node of the capacitor 2646 and the resistor 2648 decreases to the low logic trigger logic level, the buffer 2651 changes to output a low logic level signal to make the OR gate 2652 output a low logic level signal at the pulse signal output terminal 2541 (stops outputting the first pulse signal DP1.) The width of the first pulse signal DP1 output from the OR gate 2652 is determined by the capacitance value of the capacitor 2646 and the resistance value of the resistor 2648.

The operation after the buffer 2644 stops outputting the pulse signal is described as below. For example, the operation may be initially in an operating stage DRS. Since the capacitor 2646 stores the voltage being almost equal to the driving voltage VCC, and when the buffer 2644 instantaneously changes its output from a high logic level signal to a low logic level signal, the voltage on the connection node of the capacitor 2646 and the resistor 2648 is below zero but will be pulled up to zero by the diode 2649 rapidly charging the capacitor 2646. Therefore, the buffer 2651 still outputs a low logic level signal.

In some embodiments, when the buffer 2644 instantaneously changes its output from a high logic level signal to a low logic level signal, the voltage on the one end of the capacitor 2645 also changes from the driving voltage VCC to zero instantly. This makes the connection node of the capacitor 2645 and the resistor 2647 have a low logic level signal. At this moment, the output of the inverter 2650 changes to a high logic level signal to make the OR gate output a high logic level signal (a second pulse signal DP2) at the pulse signal output terminal 2541. The detection result latching circuit 2560 as illustrated in FIG. 15B stores the detection result for a second time according to the detection result signal Sdr received from the detection determining circuit 2570 (as illustrated in FIG. 15B) and the pulse signal generated at the pulse signal output terminal 2541. Next, the driving voltage VCC charges the capacitor 2645 through the resistor 2647 to make the voltage on the connection node of the capacitor 2645 and the resistor 2647 increase with time to the driving voltage VCC. When the voltage on the connection node of the capacitor 2645 and the resistor 2647 increases to reach a high logic trigger logic level, the inverter 2650 outputs a low logic level signal again to make the OR gate 2652 stop outputting the second pulse signal DP2. The width of the second pulse signal DP2 is determined by the capacitance value of the capacitor 2645 and the resistance value of the resistor 2647.

As those mentioned above, in certain embodiments, the detection pulse generating module 2640 generates two high logic level pulse signals in the detection stage DTS, which are the first pulse signal DP1 and the second pulse signal DP2. These pulse signals are output from the pulse signal output terminal 2541. Moreover, there is an interval TIV with a defined time between the first and second pulse signals DP2 (e.g., an opposite-logic signal, which may have a low logic level when the pulse signals have a high logic level), and the defined time is determined by the capacitance value of the capacitor 2642 and the resistance value of the resistor 2643.

From the detection stage DTS entering the operating stage DRS, the detection pulse generating module 2640 does not produce the pulse signal any more, and keeps the pulse signal output terminal 2541 on a low logic level potential. As described herein, the operating stage DRS is the stage following the detection stage (e.g., following the time after the second pulse signal DP2 ends). The operating stage DRS occurs when the LED tube lamp is at least partly connected to a power source, such as provided in a lamp socket. For example, the operating stage DRS may occur when part of the LED tube lamp, such as only one side of the LED tube lamp, is properly connected to one side of a lamp socket, and part of the LED tube lamp is either connected to a high impedance, such as a person, and/or is improperly connected to the other side of the lamp socket (e.g., is misaligned so that the metal contacts in the socket do not contact metal contacts in the LED tube lamp). The operating stage DRS may also occur when the entire LED tube lamp is properly connected to the lamp socket.

Figure 15D:
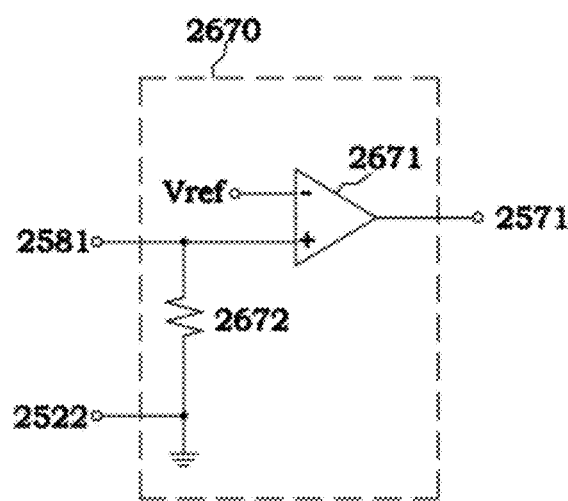
FIG. 15D is a schematic detection determining circuit according to some exemplary embodiments.

Referring to FIG. 15D, a detection determining circuit in accordance with certain embodiments is illustrated. An exemplary detection determining circuit 2670 includes a comparator 2671 and a resistor 2672. The comparator 2671 may also be referred to as a first comparator 2671 and the resistor 2672 may also be referred to as a fifth resistor 2672. A negative input terminal of the comparator 2671 receives a reference logic level signal (or a reference voltage) Vref, a positive input terminal thereof is grounded through the resistor 2672 and is also coupled to a switch circuit coupling terminal 2581. Referring to FIGS. 15B and 15D, the signal flowing into the switch circuit 2580 from the installation detection terminal 2521 outputs to the switch circuit coupling terminal 2581 to the resistor 2672. When the current of the signal passing through the resistor 2672 reaches a certain level (for example, bigger than or equal to a defined current for installation, (e.g. 2 A) and this makes the voltage on the resistor 2672 higher than the reference voltage Vref (referring to two end caps inserted into the lamp socket,) the comparator 2671 produces a high logic level detection result signal Sdr and outputs it to the detection result terminal 2571. For example, when an LED tube lamp is correctly installed on a lamp socket, the comparator 2671 outputs a high logic level detection result signal Sdr at the detection result terminal 2571, whereas the comparator 2671 generates a low logic level detection result signal Sdr and outputs it to the detection result terminal 2571 when a current passing through the resistor 2672 is insufficient to make the voltage on the resistor 2672 higher than the reference voltage Vref (referring to only one end cap inserted into the lamp socket.) Therefore, in some embodiments, when the LED tube lamp is incorrectly installed on the lamp socket or one end cap thereof is inserted into the lamp socket but the other one is grounded by an object such as a human body, the current will be too small to make the comparator 2671 output a high logic level detection result signal Sdr to the detection result terminal 2571.

Figure 15E:
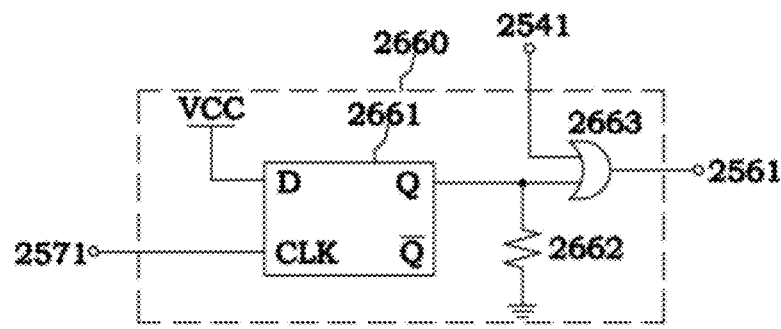
FIG. 15E is a schematic detection result latching circuit according to some exemplary embodiments.

Referring to FIG. 15E, a schematic detection result latching circuit according to some embodiments of the present invention is illustrated. A detection result latching circuit 2660 includes a D flip-flop 2661, a resistor 2662, and an OR gate 2663. The D flip-flop 2661 may also be referred to as a first D flip-flop 2661, the resistor 2662 may also be referred to as a fourth resistor 2662, and the OR gate 2663 may also be referred to as a second OR gate 2663. The D flip-flop 2661 has a CLK input terminal coupled to a detection result terminal 2571, and a D input terminal coupled to a driving voltage VCC. When the detection result terminal 2571 first outputs a low logic level detection result signal Sdr, the D flip-flop 2661 initially outputs a low logic level signal at a Q output terminal thereof, but the D flip-flop 2661 outputs a high logic level signal at the Q output terminal thereof when the detection result terminal 2571 outputs a high logic level detection result signal Sdr. The resistor 2662 is coupled between the Q output terminal of the D flip-flop 2661 and a reference voltage, such as ground potential. When the OR gate 2663 receives the first or second pulse signals DP1/DP2 from the pulse signal output terminal 2541 or receives a high logic level signal from the Q output terminal of the D flip-flop 2661, the OR gate 2663 outputs a high logic level detection result latching signal at a detection result latching terminal 2561. The detection pulse generating module 2640 only in the detection stage DTS outputs the first and the second pulse signals DP1/DP2 to make the OR gate 2663 output the high logic level detection result latching signal, and thus the D flip-flop 2661 decides the detection result latching signal to be the high logic level or the low logic level the rest of the time, e.g., including the operating stage DRS after the detection stage DTS. Accordingly, when the detection result terminal 2571 has no high logic level detection result signal Sdr, the D flip-flop 2661 keeps a low logic level signal at the Q output terminal to make the detection result latching terminal 2561 also keep a low logic level detection result latching signal in the detection stage DTS. On the contrary, once the detection result terminal 2571 has a high logic level detection result signal Sdr, the D flip-flop 2661 outputs and keeps a high logic level signal (e.g., based on VCC) at the Q output terminal. In this way, the detection result latching terminal 2561 keeps a high logic level detection result latching signal in the operating stage DRS as well.

Figure 15F:
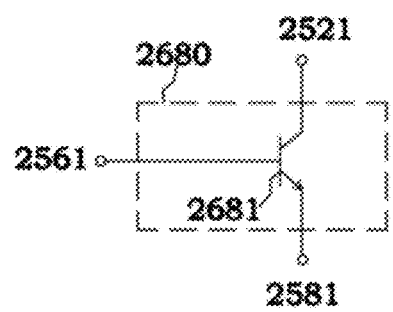
FIG. 15F is a schematic switch circuit according to some exemplary embodiments.

Referring to FIG. 15F, a schematic switch circuit according to some embodiments is illustrated. A switch circuit 2680 includes a transistor, such as a bipolar junction transistor (BJT) 2681, as being a power transistor, which has the ability of dealing with high current/power and is suitable for the switch circuit. The BJT 2681 may also be referred to as a first transistor 2681. The BJT 2681 has a collector coupled to an installation detection terminal 2521, a base coupled to a detection result latching terminal 2561, and an emitter coupled to a switch circuit coupling terminal 2581. When the detection pulse generating module 2640 produces the first and second pulse signals DP1/DP2, the BJT 2681 is in a transient conducting state. This allows the detection determining circuit 2670 to perform the detection for determining the detection result latching signal to be a high logic level or a low logic level. When the detection result latching circuit 2660 outputs a high logic level detection result latching signal at the detection result latching terminal 2561, this means the LED tube lamp is correctly installed on the lamp socket, so that the BJT 2681 is in the conducting state to make the installation detection terminals 2521 and 2522 conducting (i.e., make the power loop conducting). In the meantime, the driving circuit (not shown) in the power supply module starts to operate in response to the voltage received from the power loop and generates the lighting control signal Slc for controlling the conducting state of the power switch (not shown), so that the driving current can be produced to light up the LED module. In contrast, when the detection result latching circuit 2660 outputs a low logic level detection result latching signal at the detection result latching terminal 2561 and the output from detection pulse generating module 2640 is a low logic level, the BJT 2681 is cut-off or in the blocking state to make the installation detection terminals 2521 and 2522 cut-off or blocking. In this case, the driving circuit of the power supply module would not be started, so that the lighting control signal Slc would not be generated.

Since the external driving signal Sed is an AC signal and in order to avoid the detection error resulting from the logic level of the external driving signal being just around zero when the detection determining circuit 2670 detects, the detection pulse generating module 2640 generates the first and second pulse signals DP1/DP2 to let the detection determining circuit 2670 perform two detections. So the issue of the logic level of the external driving signal being just around zero in a single detection can be avoided. In some cases, the time difference between the productions of the first and second pulse signals DP1/DP2 is not multiple times of half one cycle T of the external driving signal Sed. For example, it does not correspond to the multiple phase differences of 180 degrees of the external driving signal Sed. In this way, when one of the first and second pulse signals DP1/DP2 is generated and unfortunately the external driving signal Sed is around zero, it can be avoided that the external driving signal Sed is again around zero when the other pulse signal is generated.

The time difference between the productions of the first and second pulse signals DP1/DP2, for example, an interval TIV with a defined time between both of them can be represented as following:

$TIV=(X+Y)(T/2)$, where T represents the cycle of an external driving signal Sed, X is a natural number, 0<Y<1, with Y in some embodiments in the range of 0.05-0.95, and in some embodiments in the range of 0.15-0.85.

Furthermore, in order to avoid the installation detection module entering the detection stage DTS from misjudgment resulting from the logic level of the driving voltage VCC being too small, the first pulse signal DP1 can be set to be produced when the driving voltage VCC reaches or is higher than a defined logic level. For example, in some embodiments, the detection determining circuit 2670 works after the driving voltage VCC reaching a high enough logic level in order to prevent the installation detection module from misjudgment due to an insufficient logic level.

According to the examples mentioned above, when one end cap of an LED tube lamp is inserted into a lamp socket and the other one floats or electrically couples to a human body or other grounded object, the detection determining circuit outputs a low logic level detection result signal Sdr because of high impedance. The detection result latching circuit stores the low logic level detection result signal Sdr based on the pulse signal of the detection pulse generating module, making it as the low logic level detection result latching signal, and keeps the detection result in the operating stage DRS, without changing the logic value. In this way, the switch circuit keeps cutting-off or blocking instead of conducting continually. And further, the electric shock situation can be prevented and the requirement of safety standard can also be met. On the other hand, when two end caps of the LED tube lamp are correctly inserted into the lamp socket (e.g., at the timepoint td), the detection determining circuit outputs a high logic level detection result signal Sdr because the impedance of the circuit for the LED tube lamp itself is small. The detection result latching circuit stores the high logic level detection result signal Sdr based on the pulse signal of the detection pulse generating module, making it as the high logic level detection result latching signal, and keeps the detection result in the operating stage DRS. So the switch circuit keeps conducting to make the LED tube lamp work normally in the operating stage DRS.

In some embodiments, when one end cap of the LED tube lamp is inserted into the lamp socket and the other one floats or electrically couples to a human body, the detection determining circuit outputs a low logic level detection result signal Sdr to the detection result latching circuit, and then the detection pulse generating module outputs a low logic level signal to the detection result latching circuit to make the detection result latching circuit output a low logic level detection result latching signal to make the switch circuit cutting-off or blocking. As such, the switch circuit blocking makes the installation detection terminals, e.g. the first and second installation detection terminals, blocking. As a result, the LED tube lamp is in non-conducting or blocking state.

However, in some embodiments, when two end caps of the LED tube lamp are correctly inserted into the lamp socket, the detection determining circuit outputs a high logic level detection result signal Sdr to the detection result latching circuit to make the detection result latching circuit output a high logic level detection result latching signal to make the switch circuit conducting. As such, the switch circuit conducting makes the installation detection terminals, e.g. the first and second installation detection terminals, conducting. As a result, the LED tube lamp operates in a conducting state.

Thus, according to the operation of the installation detection module, a first circuit, upon connection of at least one end of the LED tube lamp to a lamp socket, generates and outputs two pulses, each having a pulse width, with a time period between the pulses. The first circuit may include various of the elements described above configured to output the pulses to a base of a transistor (e.g., a BJT transistor) that serves as a switch. The pulses occur during a detection stage DTS for detecting whether the LED tube lamp is properly connected to a lamp socket. The timing of the pulses may be controlled based on the timing of various parts of the first circuit changing from high to low logic levels, or vice versa.

The pulses can be timed such that, during that detection stage DTS time, if the LED tube lamp is properly connected to the lamp socket (e.g., both ends of the LED tube lamp are correctly connected to conductive terminals of the lamp socket), at least one of the pulse signals occurs when an AC current from a driving signal is at a non-zero level. For example, the pulse signals can occur at intervals TIV that are different from half of the period of the AC signal. For example, respective start points or mid points of the pulse signals, or a time between an end of the first pulse signal DP1 and a beginning of the second pulse signal DP2 may be separated by an amount of time that is different from half of the period of the AC signal (e.g., it may be between 0.05 and 0.95 percent of a multiple of half of the period of the AC signal). During a pulse that occurs when the AC signal is at a non-zero level, a switch that receives the AC signal at the non-zero level may be turned on, causing a latch circuit to change states such that the switch remains permanently on so long as the LED tube lamp remains properly connected to the lamp socket. For example, the switch may be configured to turn on when each pulse is output from the first circuit. The latch circuit may be configured to change state only when the switch is on and the current output from the switch is above a threshold value, which may indicate a proper connection to a light socket. As a result, the LED tube lamp operates in a conducting state.

Accordingly, under the process of installing the LED tube lamp by a user, once the LED tube lamp is powered up (no matter whether the LED tube lamp is lighted up or not), the installation detection module of the LED tube lamp generates the pulse for detecting the installation state or the occurrence of electric shock before continuously conducting the power loop, so that the driving current is conducted through the power loop to drive the LED module after confirming the LED tube lamp is correctly installed or is not touched by the user. Therefore, the LED tube lamp would not be lighted up until the first pulse being generated, which means the power loop would not be conducted or the current on the power loop would be limited to less than 5 mA/MIU. In practical application, the period from the timepoint of the LED tube lamp being powered up to the timepoint of the first pulse being generated is substantially not less than 100 ms. For example, the LED tube lamp provided with the installation detection module of the present embodiment does not emit light until at least 100 ms after being installed and powered up. In some embodiments, since the installation detection module continuously generates the pulses before determining whether the installation state is correct or determining that the user does not touch the LED tube lamp, the LED tube lamp will be lighted up after at least the interval TIV (i.e., after the second pulse is generated) if the LED tube lamp is not lighted up after the first pulse is generated. In this example, if the LED tube lamp is not lighted up after 100 ms, the LED tube lamp does not emit light in at least 100+TIV ms as well.

It should be noted that, the LED tube lamp being powered up refers to the external driving signal being applied to at least one pin of the LED tube lamp and causing a current flowing through the LED tube lamp, in which the current can be the driving current or the leakage current.

On the other hand, if both pulses occur when a driving signal at the LED tube lamp has a near-zero current level, or a current level below a particular threshold, then the state of the latch circuit is not changed, and so the switch is only on during the two pulses, but then remains permanently off after the pulses and after the detection mode is over. For example, the latch circuit can be configured to remain in its present state if the current output from the switch is below the threshold value. In this manner, the LED tube lamp remains in a non-conducting state, which prevents electric shock, even though part of the LED tube lamp is connected to an electrical power source.

It is worth noting that according to certain embodiments, the pulse width of the pulse signal generated by the detection pulse generating module is between 10 μs to 1 ms, and it is used to make the switch circuit conducting for a short period when the LED tube lamp conducts instantaneously. In an exemplary embodiment, the pulse width of the pulse signal is between 10 μs to 30 μs. In another exemplary embodiment, the pulse width of the pulse signal is 20 μs. In some embodiments, a pulse current is generated to pass through the detection determining circuit for detecting and determining. Since the pulse is for a short time and not for a long time, the electric shock situation will not occur. Furthermore, the detection result latching circuit also keeps the detection result during the operating stage DRS (e.g., the operating stage DRS being the period after the detection stage DTS and during which part of the LED tube lamp is still connected to a power source), and no longer changes the detection result stored previously complying with the circuit state changing. A situation resulting from changing the detection result can thus be avoided. In some embodiments, the installation detection module, such as the switch circuit, the detection pulse generating module, the detection result latching circuit, and the detection determining circuit, could be integrated into a chip and then embedded in circuits for saving the circuit cost and layout space.

In addition, although the detection pulse generating module 2640 generates two pulse signals DP1 and DP2 for example, the detection pulse generating module 2540 of the present invention is not limited thereto. The detection pulse generating module 2540 is a circuit capable of generating a single pulse or plural pulses (greater than two pulses).

For example, in some embodiments, the detection pulse generating module 2640 merely includes the capacitor 2642, resistor 2643 and buffer 2644. Under such configuration, the detection pulse generating module can only generate a single pulse signal DP1.

In some embodiments, the detection pulse generating module 2640 further includes a reset circuit (not shown). The reset circuit may reset the operation state of the circuits in the detection pulse generating module 2640 after the first pulse signal DP1 and/or the second pulse signal DP2 being generated, so that the detection pulse generating module 2640 can generate the first pulse signal DP1 and/or the second pulse signal DP2 again after a while.

In some embodiments, the timepoint for generating the pulse signal DP1/DP2 can be determined by sampling the external driving signal/AC signal and the pulse width of the pulse signal DP1/DP2 is designed to be fixed. For example, the detection pulse generating module includes a sampling circuit and a pulse generating circuit. The sampling circuit outputs a pulse generating signal to the pulse generating circuit when the AC voltage of the external driving signal rises or falls to exceed a reference voltage, so that the pulse generating circuit outputs a pulse signal when receiving the pulse generating signal. In some embodiments, the pulse width of the pulse signal generated by the detection pulse generating module is between 10 μs and 1 ms, and it is used to make the switch circuit conducting for a short period when the LED tube lamp conducts instantaneously. In an exemplary embodiment, the pulse width of the pulse signal is between 10 μs to 30 μs. In another exemplary embodiment, the pulse width of the pulse signal is 20 μs.

As discussed in the above examples, in some embodiments, an LED tube lamp includes an installation detection circuit comprising a first circuit configured to output two pulse signals, the first pulse signal DP1 output at a first time and the second pulse signal DP2 output at a second time after the first time, and a switch configured to receive an LED driving signal and to receive the two pulse signals, wherein the two pulse signals control turning on and off of the switch. The installation detection circuit may be configured to, during a detection stage DTS, detect during each of the two pulse signals whether the LED tube lamp is properly connected to a lamp socket. When it is not detected during either pulse signal that the LED tube lamp is properly connected to the lamp socket, the switch may remain in an off state after the detection stage DTS. When it is detected during at least one of the pulse signals that the LED tube lamp is properly connected to the lamp socket, the switch may remain in an on state after the detection stage DTS. The two pulse signals may occur such that they are separated by a time different from a multiple of half of a period of the LED driving signal, and such that at least one of them does not occur when the LED driving signal has a current value of substantially zero. It should be noted that although a circuit for producing two pulse signals is described, the disclosure is not intended to be limiting as such. For example, a circuit may be implemented such that a plurality of pulse signals may occur, wherein at least two of the plurality of pulse signals are separated by a time different from a multiple of half of a period of the LED driving signal, and such that at least one of the plurality of pulse signals does not occur when the LED driving signal has a current value of substantially zero.

Figure 15G:
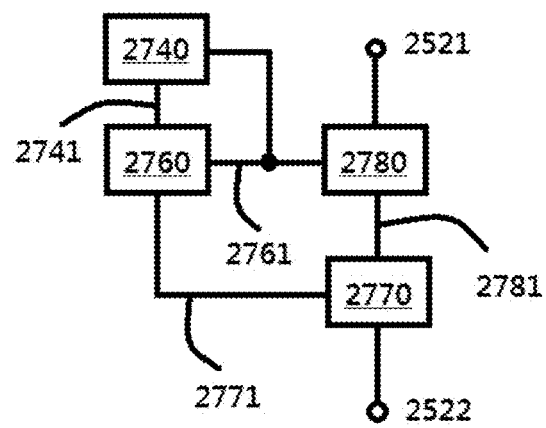
FIG. 15G is a block diagram of an installation detection module according to some exemplary embodiments.

Referring to FIG. 15G, an installation detection module according to an exemplary embodiment is illustrated. The installation detection module includes a detection pulse generating module 2740 (which may also be referred to as a detection pulse generating circuit or a first circuit), a detection result latching circuit 2760 (which may also be referred to as a second circuit), a switch circuit 2780 (which may also be referred to as a third circuit), and a detection determining circuit 2770 (which may also be referred to as a fourth circuit). In some embodiments, the first circuit 2740, the second circuit 2760 and the fourth circuit 2770 can be referred to a detection circuit or an electric shock detection/protection circuit, which is configured to control the switching state of the switch circuit/third circuit 2780.

Figure 17B:
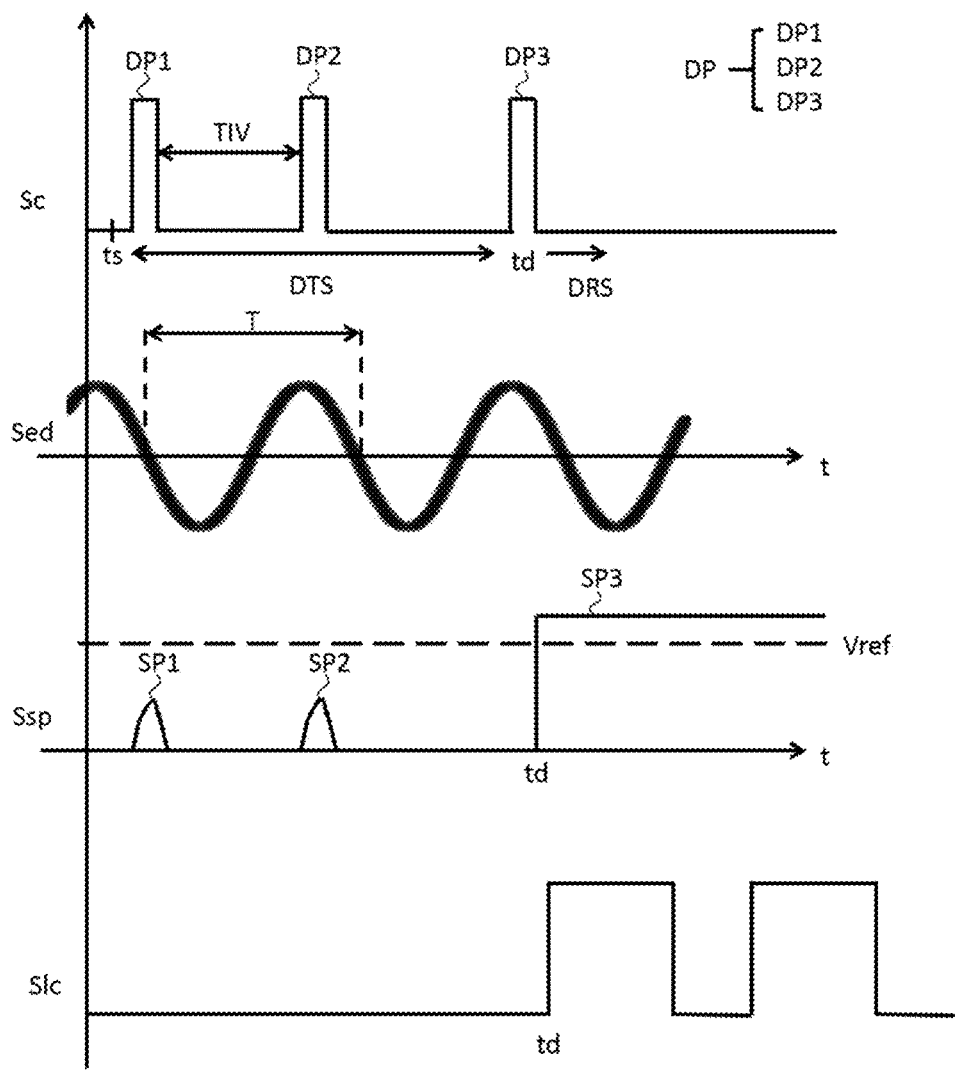

FIG. 17B is a signal waveform diagram of an exemplary power supply module according to an exemplary embodiment. The installation detection operation is described further in accordance with FIG. 17B. The detection pulse generating module 2740 is coupled (e.g., electrically connected) to the detection result latching circuit 2760 via a path 2741, and is configured to generate a control signal Sc having at least one pulse signal DP. A path as described herein may include a conductive line connecting between two components, circuits, or modules, and may include opposite ends of the conductive line connected to the respective components, circuits or modules. The detection result latching circuit 2760 is coupled (e.g., electrically connected) to the switch circuit 2780 via a path 2761, and is configured to receive and output the control signal Sc from the detection pulse generating module 2740. The switch circuit 2780 is coupled (e.g., electrically connected) to one end (e.g., a first installation detection terminal 2521) of a power loop of an LED tube lamp and the detection determining circuit 2770, and is configured to receive the control signal Sc output from the detection result latching circuit 2760, and configured to conduct (or turn on) during the control signal Sc so as to cause the power loop of the LED tube lamp to be conducting. The detection determining circuit 2770 is coupled (e.g., electrically connected) to the switch circuit 2780, the other end (e.g., a second installation detection terminal 2522) of the power loop of the LED tube lamp and the detection result latching circuit 2760, and is configured to detect at least one sample signal Ssp on the power loop when the switch circuit 2780 and the power loop are conductive, so as to determine an installation state between the LED tube lamp and a lamp socket. The power loop of the present embodiment can be regarded as a detection path of the installation detection module. The detection determining circuit 2770 is further configured to transmit detection result(s) to the detection result latching circuit 2760 for next control. In some embodiments, the detection pulse generating module 2740 is further coupled (e.g., electrically connected) to the output of the detection result latching circuit 2760 to control the time of the pulse signal DP.

In some embodiments, one end of a first path 2781 is coupled to a first node of the detection determining circuit 2770 and the opposite end of the first path 2781 is coupled to a first node of the switch circuit 2780. In some embodiments, a second node of the detection determining circuit 2770 is coupled to the second installation detection terminal 2522 of the power loop and a second node of the switch circuit 2780 is coupled to the first installation detection terminal 2521 of the power loop. In some embodiments, one end of a second path 2771 is coupled to a third node of the detection determining circuit 2770 and the opposite end of the second path 2771 is coupled to a first node of the detection result latching circuit 2760, one end of a third path 2741 is coupled to a second node of the detection result latching circuit 2760 and the opposite end of the third path 2741 is coupled to a first node of the detection pulse generating circuit 2740. In some embodiments, one end of a fourth path 2761 is coupled to a third node of the switch circuit 2780 and the opposite end of the fourth path 2761 is coupled to a third node of the detection result latching circuit 2760. In some embodiments, the fourth path 2761 is also coupled to a second node of the detection pulse generating circuit 2740.

In some embodiments, the detection determining circuit 2770 is configured for detecting a signal between the first installation detection terminal 2521 and the second installation detection terminal 2522 through the first path 2781 and the switch circuit 2780. For example, because of the above configuration, the detection determining circuit 2770 is capable of detecting and determining whether a current passing through the first installation detection terminal 2521 and the second installation detection terminal 2522 is below or above a predetermined current value and transmitting or providing a detection result signal Sdr to the detection result latching circuit 2760 via the second path 2771.

In some embodiments, the detection pulse generating circuit 2740, also referred to generally as a pulse generating circuit, generates a pulse signal DP through the detection result latching circuit 2760 to make the switch circuit 2780 remain in a conducting state during the pulse signal. For example, the pulse signal DP generated by the detection pulse generating circuit 2740 controls turning on the switch circuit 2780 which is coupled to the detection pulse generating circuit 2740. As a result of maintaining a conducting state of the switch circuit 2780, the power loop of the LED tube lamp between the installation detection terminals 2521 and 2522 is also maintained in a conducting state. The detection determining circuit 2770 detects a sample signal Ssp on the power loop and generates a signal based on a detection result to inform the detection result latching circuit 2760 of a time point for latching (storing) the detection result received by the detection result latching circuit 2760 from the detection determining circuit 2770. For example, the detection determining circuit 2770 may be a circuit configured to generate a signal that causes a latching circuit, such as the detection result latching circuit 2760 to enter and remain in a state that corresponds to one of a conducting state (e.g., "on" state) and a cut-off state for the LED tube lamp. The detection result latching circuit 2760 stores the detection result according to the detection result signal Sdr (or detection result signal Sdr and pulse signal DP1/DP2), and transmits or provides the detection result to the switch circuit 2780 coupled to the third node of the detection result latching circuit 2760 via the fourth path 2761. The switch circuit 2780 receives the detection result transmitted from the detection result latching circuit 2760 via the third node of the switch circuit 2780 and controls the state between conducting or cut off between the installation detection terminals 2521 and 2522 according to the detection result. For example, when the detection determining circuit 2770 detects during the pulse signal DP that the LED tube lamp is not properly installed on the lamp socket, the pulse signal DP controls the switch circuit 2780 to remain in an off state to cause a power loop of the LED tube lamp to be open, and when the detection determining circuit 2770 detects during the pulse signal DP that the LED tube lamp is properly installed on the lamp socket, the pulse signal DP controls the switch circuit 2780 to remain in a conducting state to cause the power loop of the LED tube lamp to maintain a conducting state.

The detailed circuit structure and the entire operation thereof of each of the detection pulse generating module 2740 (or circuit), the detection result latching circuit 2760, the switch circuit 2780, and the detection determining circuit 2770 will be described below.

Figure 15H:
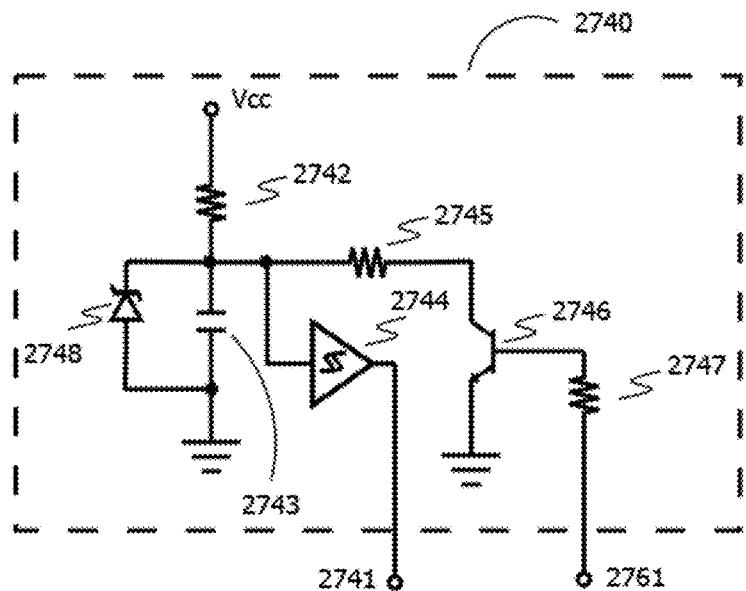
FIG. 15H is a schematic detection pulse generating module according to some exemplary embodiments.

Referring to FIG. 15H, a detection pulse generating module according to an exemplary embodiment is illustrated. The detection pulse generating module 2740 includes: a resistor 2742 (which also may be referred to as a sixth resistor), a capacitor 2743 (which also may be referred to as a fourth capacitor), a Schmitt trigger 2744, a resistor 2745 (which also may be referred to as a seventh resistor), a transistor 2746 (which also may be referred to as a second transistor), and a resistor 2747 (which also may be referred to as an eighth resistor).

In some embodiments, one end of the resistor 2742 is connected to a driving signal, for example, Vcc, and the other end of the resistor 2742 is connected to one end of the capacitor 2743. The other end of the capacitor 2743 is connected to a ground node. In some embodiments, the Schmitt trigger 2744 has an input end and an output end, the input end connected to a connection node of the resistor 2742 and the capacitor 2743, the output end connected to the detection result latching circuit 2760 via the third path 2741 (FIG. 15G). In some embodiments, one end of the resistor 2745 is connected to the connection node of the resistor 2742 and the capacitor 2743 and the other end of the resistor 2745 is connected to a collector of the transistor 2746. An emitter of the transistor 2746 is connected to a ground node. In some embodiments, one end of the resistor 2747 is connected to a base of the transistor 2746 and the other end of the resistor 2747 is connected to the detection result latching circuit 2760 (FIG. 15G) and the switch circuit 2780 (FIG. 15G) via the fourth path 2761. In certain embodiments, the detection pulse generating module 2740 further includes: a Zener diode 2748, having an anode and a cathode, the anode connected to the other end of the capacitor 2743 to the ground, the cathode connected to the end of the capacitor 2743 (the connection node of the resistor 2742 and the capacitor 2743).

Figure 15I:
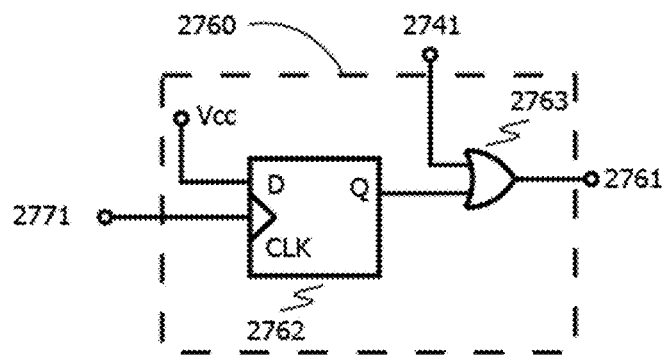
FIG. 15I is a schematic detection result latching circuit according to some exemplary embodiments.

Referring to FIG. 15I, a detection result latching circuit according to an exemplary embodiment is illustrated. The detection result latching circuit 2760 includes: a D flip-flop 2762 (which also may be referred to as a second D flip-flop), having a data input end D, a clock input end CLK, and an output end Q, the data input end D connected to the driving signal mentioned above (e.g., Vcc), the clock input end CLK connected to the detection determining circuit 2770 (FIG. 15G); and an OR gate 2763 (which also may be referred to as a third OR gate), having a first input end, a second input end, and an output end, the first input end connected to the output end of the Schmitt trigger 2744 (FIG. 15H), the second input end connected to the output end Q of the D flip-flop 2762, the output end of the OR gate 2763 connected to the other end of the resistor 2747 (FIG. 15H) and the switch circuit 2780 (FIG. 15G).

Figure 15J:
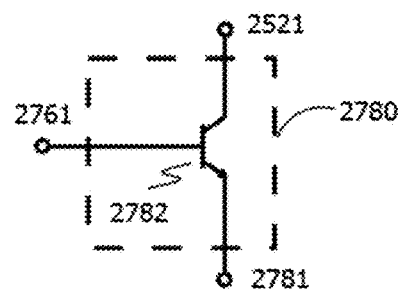
FIG. 15J is a schematic switch circuit according to some exemplary embodiments.

Referring to FIG. 15J, a switch circuit according to an exemplary embodiment is illustrated. The switch circuit 2780 includes: a transistor 2782 (which also may be referred to as a third transistor), having a base, a collector, and an emitter, the base connected to the output of the OR gate 2763 via the fourth path 2761 (FIG. 15I), the collector connected to one end of the power loop, such as the first installation detection terminal 2521, the emitter connected to the detection determining circuit 2770 (FIG. 15G). In some embodiments, the transistor 2782 may be replaced by other equivalently electronic parts, e.g., a MOSFET.

Figure 15K:
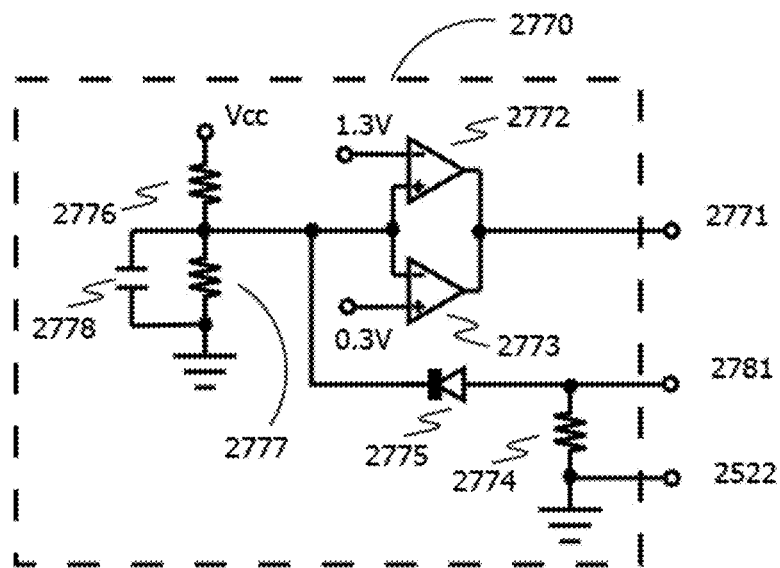
FIG. 15K is a schematic detection determining circuit according to some exemplary embodiments.

Referring to FIG. 15K, a detection determining circuit according to an exemplary embodiment is illustrated. The detection determining circuit 2770 includes: a resistor 2774

(which also may be referred to as a ninth resistor), one end of the resistor 2774 connected to the emitter of the transistor 2782 (FIG. 15J), the other end of the resistor 2774 connected to the other end of the power loop, such as the second installation detection terminal 2522; a diode 2775 (which also may be referred to as a second diode), having an anode and a cathode, the anode connected to an end of the resistor 2744 that is not connected to a ground node; a comparator 2772 (which also may be referred to as a second comparator), having a first input end, a second input end, and an output end; a comparator 2773 (which also may be referred to as a third comparator), having a first input end, a second input end, and an output end; a resistor 2776 (which also may be referred to as a tenth resistor); a resistor 2777 (which also may be referred to as an eleventh resistor); and a capacitor 2778 (which also may be referred to as a fifth capacitor).

In some embodiments, the first input end of the comparator 2772 is connected to a predefined signal, for example, a reference voltage, Vref=1.3V, but the reference voltage value is not limited thereto, the second input end of the comparator 2772 is connected to the cathode of the diode 2775, and the output end of the comparator 2772 is connected to the clock input end of the D flip-flop 2762 (FIG. 15I). In some embodiments, the first input end of the comparator 2773 is connected to the cathode of the diode 2775, the second input end of the comparator 2773 is connected to another predefined signal, for example, a reference voltage, Vref=0.3V, but the reference voltage value is not limited thereto, and the output end of the comparator 2773 is connected to the clock input end of the D flip-flop 2762 (FIG. 15I). In some embodiments, one end of the resistor 2776 is connected to the driving signal mentioned above (e.g., Vcc) and the other end of the resistor 2776 is connected to the second input end of the comparator 2772 and one end of the resistor 2777 that is not connected to a ground node and the other end of the resistor 2777 is connected to the ground node. In some embodiments, the capacitor 2778 is connected to the resistor 2777 in parallel. In certain embodiments, the diode 2775, the comparator 2773, the resistors 2776 and 2777, and the capacitor 2778 may be omitted, and the second input end of the comparator 2772 may be directly connected to the end of the resistor 2774 (e.g., the end of the resistor 2774 that is not connected to the ground node) when the diode 2775 is omitted. In certain embodiments, the resistor 2774 may include two resistors connected in parallel based on the consideration of power consumption having an equivalent resistance value ranging from about 0.1 ohm to about 5 ohm.

In some embodiments, some parts of the installation detection module may be integrated into an integrated circuit (IC) in order to provide reduced circuit layout space resulting in reduced manufacturing cost of the circuit. For example, the Schmitt trigger 2744 of the detection pulse generating module 2740, the detection result latching circuit 2760, and the two comparators 2772 and 2773 of the detection determining circuit 2770 may be integrated into an IC, but the disclosure is not limited thereto.

An operation of the installation detection module will be described in more detail in accordance with some example embodiments. In one exemplary embodiment, the capacitor voltage may not mutate; the voltage of the capacitor in the power loop of the LED tube lamp before the power loop is conductive is zero and the capacitor's transient response may appear to have a short-circuit condition; when the LED tube lamp is correctly installed to the lamp socket, the power loop of the LED tube lamp in a transient response may have a smaller current-limiting resistance and a bigger peak current; and when the LED tube lamp is incorrectly installed to the lamp socket, the power loop of the LED tube lamp in transient response may have a bigger current-limiting resistance and a smaller peak current. This embodiment may also meet the UL standard to make the leakage current of the LED tube lamp less than 5 MIU (Measurement Indication Unit), in which the unit "MIU" is defined by. The following table illustrates the current comparison in a case when the LED tube lamp works normally (e.g., when the two end caps of the LED tube lamp are correctly installed to the lamp socket) and in a case when the LED tube lamp is incorrectly installed to the lamp socket (e.g., when one end cap of the LED tube lamp is installed to the lamp socket but the other one is touched by a human body).

|  | Correct installation | Incorrect installation |
|---|---|---|
| Maximum transient current |  | $i_{pk\_max} = \dfrac{V_{in\_pk}}{R_{fuse} + 500} = \dfrac{305 \times 1.414}{10 + 500} = 845$ mA |
| Minimum transient current | $i_{pk\_min} = \dfrac{\Delta V_{in}}{R_{fuse}} = \dfrac{50}{10} = 5$ A |  |

As illustrated in the above table, in the part of the denominator: Rfuse represents the resistance of the fuse of the LED tube lamp. For example, 10 ohm may be used, but the disclosure is not limited thereto, as resistance value for Rfuse in calculating the minimum transient current ipk_min and 510 ohm may be used as resistance value for Rfuse in calculating the maximum transient current ipk_max (an additional 500 ohms is used to emulate the conductive resistance of human body in transient response). In the part of the numerator: maximum voltage from the root-mean-square voltage (Vmax=Vrms*1.414=305*1.414) is used in calculating the maximum transient current ipk_max and minimum voltage difference, for example, 50V (but the disclosure is not limited thereto) is used in calculating the minimum transient current ipk_min. Accordingly, when the LED tube lamp is correctly installed to the lamp socket (e.g., when two end caps of the LED tube lamp are installed to the lamp socket correctly) and works normally, its minimum transient current is 5 A. But, when the LED tube lamp is incorrectly installed to the lamp socket (e.g., when one end cap is installed to the lamp socket but the other one is touched by human body), its maximum transient current is only 845 mA. Therefore, certain examples of the disclosed embodiments use the current which passes transient response and flows through the capacitor in the LED power loop, such as the capacitor of the filtering circuit, to detect and determine the installation state between the LED tube lamp and the lamp socket. For example, such embodiments may detect whether the LED tube lamp is correctly installed to the lamp socket. Certain examples of the disclosed embodiments further provide a protection mechanism to protect the user from electric shock caused by touching the conductive part of the LED tube lamp which is incorrectly installed to the lamp socket. The embodiments mentioned above are used to illustrate certain aspects of the disclosed invention but the disclosure is not limited thereto.

Further, referring to FIG. 15G again, in some embodiments, when an LED tube lamp is being installed to a lamp socket, after a period (e.g., the period utilized to determine the cycle of a pulse signal), the detection pulse generating module 2740 outputs a first high level voltage rising from a first low level voltage to the detection result latching circuit 2760 through a path 2741 (also referred to as a third path). The detection result latching circuit 2760 receives the first high level voltage, and then simultaneously outputs a second high level voltage to the switch circuit 2780 and the detection pulse generating module 2740 through a path 2761 (also referred to as a fourth path). In some embodiments, when the switch circuit 2780 receives the second high level voltage, the switch circuit 2780 conducts to cause the power loop of the LED tube lamp to be conducting as well. In this exemplary embodiment, the power loop at least includes the first installation detection terminal 2521, the switch circuit 2780, the path 2781 (also referred to as a first path), the detection determining circuit 2770, and the second installation detection terminal 2522. In the meantime, the detection pulse generating module 2740 receives the second high level voltage from the detection result latching circuit 2760, and after a period (e.g., the period utilized to determine the width (or period) of pulse signal), its output from the first high level voltage falls back to the first low level voltage (the first time of the first low level voltage, the first high level voltage, and the second time of the first low level voltage form a first pulse signal DP1). In some embodiments, when the power loop of the LED tube lamp is conductive, the detection determining circuit 2770 detects a first sample signal, such as a voltage signal, on the power loop. When the first sample signal is greater than or equal to a predefined signal, such as a reference voltage, the installation detection module determines that the LED tube lamp is correctly installed to the lamp socket according to the application principle of this disclosed embodiments described above. Therefore, the detection determining circuit 2770 included in the installation detection module outputs a third high level voltage (also referred to as a first high level signal) to the detection result latching circuit 2760 through a path 2771 (also referred to as a second path). The detection result latching circuit 2760 receives the third high level voltage (also referred to as the first high level signal) and continues to output a second high level voltage (also referred to as a second high level signal) to the switch circuit 2780. The switch circuit 2780 receives the second high level voltage (also referred to as the second high level signal) and maintains conducting state to cause the power loop to remain conducting. The detection pulse generating module 2740 does not generate any pulse signal while the power loop remains conductive.

However, in some embodiments, when the first sample signal is smaller than the predefined signal, the installation detection module, according to certain exemplary embodiments as described above, determines that the LED tube lamp has not been correctly installed to the lamp socket. Therefore, the detection determining circuit 2770 outputs a third low level voltage (also referred to as a first low level signal) to the detection result latching circuit 2760. The detection result latching circuit 2760 receives the third low level voltage (also referred to as the first low level signal) and continues to output a second low level voltage (also referred to as a second low level signal) to the switch circuit 2780. The switch circuit 2780 receives the second low level voltage (also referred to as the second low level signal) and then keeps blocking to cause the power loop to remain open. Accordingly, the occurrence of electric shock caused by touching the conductive part of the LED tube lamp which is incorrectly installed on the lamp socket can be sufficiently avoided.

In some embodiments, when the power loop of the LED tube lamp remains open for a period (a period that represents the width (or period) of pulse signal DP or the pulse-on time of the control signal Sc), the detection pulse generating module 2740 outputs the first high level voltage rising from the first low level voltage to the detection result latching circuit 2760 through the path 2741 once more. The detection result latching circuit 2760 receives the first high level voltage, and then simultaneously outputs a second high level voltage to the switch circuit 2780 and the detection pulse generating module 2740. In some embodiments, when the switch circuit 2780 receives the second high level voltage, the switch circuit 2780 conducts again to cause the power loop of the LED tube lamp (in this exemplary embodiment, the power loop at least includes the first installation detection terminal 2521, the switch circuit 2780, the path 2781, the detection determining circuit 2770, and the second installation detection terminal 2522) to be conducting as well. In the meantime, the detection pulse generating module 2740 receives the second high level voltage from the detection result latching circuit 2760, and after a period (a period that is utilized to determine the width (or period) of pulse signal DP), its output from the first high level voltage falls back to the first low level voltage (the third time of the first low level voltage, the second time of the first high level voltage, and the fourth time of the first low level voltage form a second pulse signal DP2). In some embodiments, when the power loop of the LED tube lamp is conductive again, the detection determining circuit 2770 also detects a second sample signal SP2, such as a voltage signal, on the power loop yet again. When the second sample signal SP2 is greater than or equal to the predefined signal (e.g., the reference voltage Vref), the installation detection module determines, according to certain exemplary embodiments described above, that the LED tube lamp is correctly installed to the lamp socket. Therefore, the detection determining circuit 2770 outputs a third high level voltage (also referred to as a first high level signal) to the detection result latching circuit 2760 through the path 2771. The detection result latching circuit 2760 receives the third high level voltage (also referred to as the first high level signal) and continues to output a second high level voltage (also referred to as a second high level signal) to the switch circuit 2780. The switch circuit 2780 receives the second high level voltage (also referred to as the second high level signal) and maintains a conducting state to cause the power loop to remain conducting. The detection pulse generating module 2740 does not generate any pulse signal while the power loop remains conductive.

In some embodiments, when the second sample signal SP2 is smaller than the predefined signal, the installation detection module determines, according to certain exemplary embodiments described above, that the LED tube lamp has not been correctly installed to the lamp socket. Therefore, the detection determining circuit 2770 outputs the third low level voltage (also referred to as the first low level signal) to the detection result latching circuit 2760. The detection result latching circuit 2760 receives the third low level voltage (also referred to as the first low level signal) and continues to output the second low level voltage (also referred to as the second low level signal) to the switch circuit 2780. The switch circuit 2780 receives the second low level voltage (also referred to as the second low level signal) and then keeps blocking to cause the power loop to remain open. According to the disclosure mentioned above, the pulse width (i.e., pulse on-time) and the pulse period are dominated by the pulse signal provided by the detection pulse generating module 2740 during the detection stage DTS; and the signal level of the control signal is determined according to the detection result signal Sdr provided by the detection determining circuit 2770 after the detection stage DTS.

According to the embodiments of FIG. 17B, since the signal level of the first sample signal SP1 generated based on the first pulse signal DP1 and the second sample signal SP2 generated based on the second pulse signal DP2 are smaller than the reference voltage Vref, the switch circuit 2780 is maintained to be cut off and the driving circuit (not shown) does not perform effective power conversion during the timepoint is to td (i.e., the detection stage DTS). The effective power conversion refers to generating sufficient power for driving the LED module to emit light. The detection determining circuit 2770 generates a detection result, indicating the LED tube lamp has been correctly installed or is not touched by a user, according to the third sample signal SP3 greater than the reference voltage Vref during the pulse-on time of the third pulse signal DP3, so that the switch circuit 2780 is maintained in the conducting state in response to the high level voltage output by the detection result latching circuit 2760 and the power loop is therefore maintained in the conducting state as well. After the power loop is conducting, the driving circuit of the power supply module starts to operate based on the voltage on the power loop, so as to generate the lighting control signal Slc for controlling the conducting state of the power switch (not shown).

Next, referring to FIG. 15H to FIG. 15K at the same time, in some embodiments when an LED tube lamp is being installed to a lamp socket, the capacitor 2743 is charged by the driving signal, for example, Vcc, through the resistor 2742. And when the voltage of the capacitor 2743 rises enough to trigger the Schmitt trigger 2744, the Schmitt trigger 2744 outputs a first high level voltage rising from a first low level voltage in an initial state to an input end of the OR gate 2763. After the OR gate 2763 receives the first high level voltage from the Schmitt trigger 2744, the OR gate 2763 outputs a second high level voltage to the base of the transistor 2782 and the resistor 2747. When the base of the transistor 2782 receives the second high level voltage from the OR gate 2763, the collector and the emitter of the transistor 2782 are conducting to further cause the power loop of the LED tube lamp (in this exemplary embodiment, the power loop at least includes the first installation detection terminal 2521, the transistor 2782, the resistor 2744, and the second installation detection terminal 2522) to be conducting as well. In the meantime, the base of the transistor 2746 receives the second high level voltage from the OR gate 2763 through the resistor 2747, and then the collector and the emitter of the transistor 2746 are conductive and grounded to cause the voltage of the capacitor 2743 to be discharged to the ground through the resistor 2745. In some embodiments, when the voltage of the capacitor 2743 is not enough to trigger the Schmitt trigger 2744, the Schmitt trigger 2744 outputs the first low level voltage falling from the first high level voltage (a first instance of a first low level voltage at a first time, followed by a first high level voltage, followed by a second instance of the first low level voltage at a second time form a first pulse signal DP1). When the power loop of the LED tube lamp is conductive, the current passing through the capacitor in the power loop, such as, the capacitor of the filtering circuit, by transient response flows through the transistor 2782 and the resistor 2774 and forms a voltage signal on the resistor 2774. The voltage signal is compared to a reference voltage, for example, 1.3V, but the reference voltage is not limited thereto, by the comparator 2772. When the voltage signal is greater than and/or equal to the reference voltage, the comparator 2772 outputs a third high level voltage to the clock input end CLK of the D flip-flop 2762. In the meantime, since the data input end D of the D flip-flop 2762 is connected to the driving signal, the D flip-flop 2762 outputs a high level voltage (at its output end Q) to another input end of the OR gate 2763. This causes the OR gate 2763 to keep outputting the second high level voltage to the base of the transistor 2782, and further results in the transistor 2782 and the power loop of the LED tube lamp remaining in a conducting state. Besides, since the OR gate 2763 keeps outputting the second high level voltage to cause the transistor 2746 to be conducting to the ground, the capacitor 2743 is unable to reach an enough voltage to trigger the Schmitt trigger 2744.

However, when the voltage signal on the resistor 2774 is smaller than the reference voltage, the comparator 2772 outputs a third low level voltage to the clock input end CLK of the D flip-flop 2762. In the meantime, since the initial output of the D flip-flop 2762 is a low level voltage (e.g., zero voltage), the D flip-flop 2762 outputs a low level voltage (at its output end Q) to the other input end of the OR gate 2763. Moreover, the Schmitt trigger 2744 connected by the input end of the OR gate 2763 also restores outputting the first low level voltage, the OR gate 2763 thus keeps outputting the second low level voltage to the base of the transistor 2782, and further results in the transistor 2782 to remain in a blocking state (or an off state) and the power loop of the LED tube lamp to remain in an open state. Still, since the OR gate 2763 keeps outputting the second low level voltage to cause the transistor 2764 to remain in a blocking state (or an off state), the capacitor 2743 is charged by the driving signal through the resistor 2742 once again for next (pulse signal) detection.

In some embodiments, the cycle (or interval) of the pulse signal is determined by the values of the resistor 2742 and the capacitor 2743. In certain cases, the cycle of the pulse signal may include a value ranging from about 3 milliseconds to about 500 milliseconds or may be ranging from about 20 milliseconds to about 50 milliseconds. In some embodiments, the width (or period) of the pulse signal is determined by the values of the resistor 2745 and the capacitor 2743. In certain cases, the width of the pulse signal may include a value ranging from about 1 microsecond to about 100 microseconds or may be ranging from about 10 microseconds to about 20 microseconds. The Zener diode 2748 provides a protection function but it may be omitted in certain cases. The resistor 2744 may include two resistors connected in parallel based on the consideration of power consumption in certain cases, and its equivalent resistance may include a value ranging from about 0.1 ohm to about 5 ohm. The resistors 2776 and 2777 provides the function of voltage division to make the input of the comparator 2773 bigger than the reference voltage, such as 0.3V, but the value of the reference voltage is not limited thereto. The capacitor 2778 provides the functions of regulation and filtering. The diode 2775 limits the signal to be transmitted in one way. In addition, the installation detection module disclosed by the example embodiments may also be adapted to other types of LED lighting equipment with dual-end power supply, e.g., the LED lamp directly using commercial power as its external driving signal, the LED lamp using the signal outputted from the ballast as its external driving signal, etc. However, the invention is not limited to the above example embodiments.

Based on the embodiments illustrated in FIG. 15G to FIG. 15K, compared to the installation detection module of FIG. 15B, the installation detection module illustrated in FIG. 15G uses the control signal output by the detection result latching circuit 2760 for the reference of determining the end of the pulse or resetting the pulse signal by feeding back the control signal to the detection pulse generating module 2740. Since the pulse on-time is not merely determined by the detection pulse generating module 2740, the circuit design of the detection pulse generating module can be simplified. Compared to the detection pulse generating module illustrated in FIG. 15C, the number of the components of the detection pulse generating module illustrated in FIG. 15H is less than the detection pulse generating module 2640, and thus the detection pulse generating module 2740 may have lower power consumption and may be more suitable for integrated design.

Figure 15L:
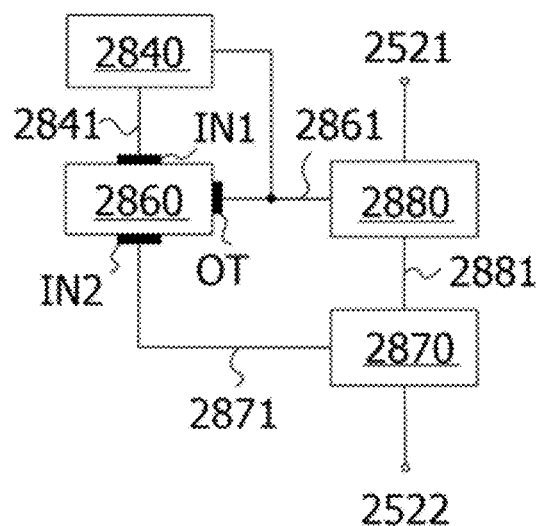
FIG. 15L is a block diagram of an installation detection module according to some exemplary embodiments.

Referring to FIG. 15L, a block diagram of an installation detection module according to an exemplary embodiment is illustrated. The installation detection module 2520 includes a pulse generating auxiliary circuit 2840, an integrated control module 2860, a switch circuit 2880, and a detection determining auxiliary circuit 2870. The operation of the installation detection module of the present embodiment is similar to the embodiment of FIGS. 15G to 15K, and thus the signal waveform of the present embodiment can refer to the embodiment illustrated in FIG. 17B. The integrated control module 2860 includes at least three pins such as two input terminals IN1 and IN2 and an output terminal OT. The pulse generating auxiliary circuit 2840 is connected to the input terminal IN1 and the output terminal OT of the integrated control module 2860 and configured to assist the integrated control module 2860 for generating a control signal. The detection determining auxiliary circuit 2870 is connected to the input terminal IN2 of the integrated control module 2860 and the switch circuit 2880 and configured to transmit a sample signal related to the signal passing through the LED power loop to the input terminal IN2 of the integrated control module 2860 when the switch circuit 2880 and the LED power loop are conducting, such that the integrated control module 2860 may determine an installation state between the LED tube lamp and the lamp socket according to the sample signal. For example, the sample signal may be based on an electrical signal passing through the power loop during the pulse-on time of the pulse signal (e.g., the rising portion of the pulse signal). Switch circuit 2880 is connected between one end of the LED power loop and the detection determining auxiliary circuit 2870 and configured to receive the control signal, outputted by the integrated control module 2860, in which the LED power loop is conducting during an enable period of the control signal (i.e., the pulse-on time).

Specifically, under the detection stage DTS, the integrated control module 2860 temporarily causes the switch circuit 2880 to conduct, according to the signal received from the input terminal IN1, by outputting the control signal having at least one pulse. During the detection stage DTS, the integrated control module 2860 may detect whether the LED tube lamp is properly connected to the lamp socket and latch the detection result according to the signal on the input terminal IN2. The detection result is regarded as the basis of whether to cause the switch circuit 2880 to conduct after the detection stage DTS (i.e., it determines whether to provide power to LED module). The detail circuit structure and operations of the present embodiment will be described below.

Figure 15M:
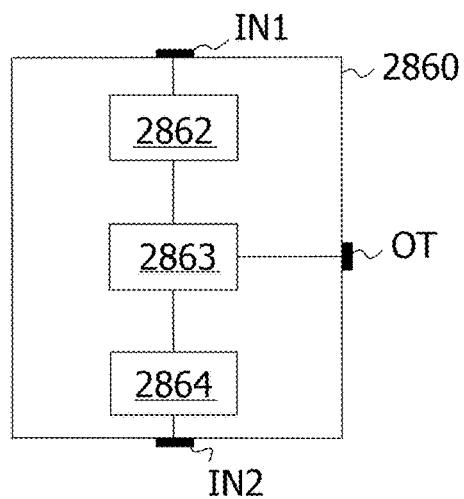
FIG. 15M is an internal circuit block diagram of an integrated control module according to some exemplary embodiments.

Referring to FIG. 15M, an inner circuit diagram of an integrated control module according to some exemplary embodiments is illustrated. The integrated control module includes a pulse generating unit 2862, a detection result latching unit 2863, and a detection unit 2864. The pulse generating unit 2862 receives the signal provided by the pulse generating auxiliary circuit 2840 from the input terminal IN1 and accordingly generates a pulse signal. The generated pulse signal will be provided to the detection result latching unit 2863. In an exemplary embodiment, the pulse generating unit 2862 can be implemented by a Schmitt trigger (not shown, it can use a Schmitt trigger such as 2744 illustrated in FIG. 15H). According to the exemplary embodiment mentioned above, the Schmitt trigger has an input end coupled to the input terminal IN1 of the integrated control module 2860 and an output terminal coupled to the output terminal OT of the integrated control module 2860 (e.g., through the detection result latching unit 2863). It should be noted that, the pulse generating unit 2862 is not limited to be implemented by the Schmitt trigger, any analog/digital circuit capable of implementing the function of generating the pulse signal having at least one pulse may be utilized in the disclosed embodiments.

The detection result latching unit 2863 is connected to the pulse generating unit 2862 and the detection unit 2864. During the detection stage DTS, the detection result latching unit 2863 outputs the pulse signal generated by the pulse generating unit 2862 as the control signal to the output terminal OT. On the other hand, the detection result latching unit 2863 further stores the detection result signal Sdr provided by the detection unit 2864 and outputs the stored detection result signal Sdr to the output terminal OT after the detection stage DTS, so as to determine whether to cause the switch circuit 2880 to conduct according to the installation state of the LED tube lamp. In an exemplary embodiment, the detection latching unit 2863 can be implemented by a circuit structure constituted by a D flip-flop and an OR gate (not shown, for example it can use the D flip-flop 2762 and OR gate 2763 illustrated in FIG. 15I). According to the exemplary embodiment mentioned above, the D flip-flop has a data input end connected to the driving voltage VCC, a clock input end connected to the detection unit 2864, and an output end. The OR gate has a first input end connected to the pulse generating unit 2862, a second input end connected to the output end of the D flip-flop, and an output end connected to the output terminal OT. It should be noted that, the detection result latching unit 2863 is not limited to be implemented by the aforementioned circuit structure, any analog/digital circuit capable of implementing the function of latching and outputting the control signal to control the switching of the switch circuit may be utilized in the present invention.

The detection unit 2864 is coupled to the detection result latching unit 2863. The detection unit 2864 receives the signal provided by the detection determining auxiliary circuit 2870 from the input terminal IN2 and accordingly generates the detection result signal Sdr indicating the installation state of the LED tube lamp, in which the generated detection result signal Sdr will be provided to the detection result latching unit 2863. In an exemplary embodiment, detection unit 2864 can be implemented by a comparator (not shown, it can be, for example, the comparator 2772 illustrated in FIG. 15K). According to the exemplary embodiment mentioned above, the comparator has a first input end receiving a setting signal, a second input end connected to the input terminal IN2, and an output end connected to the detection result latching unit 2863. It should be noted that, the detection unit 2864 is not limited to be implemented by the comparator, any analog/digital circuit capable of implementing the function of determining the installation state based on the signal on the input terminal IN2 may be utilized in the disclosed embodiments.

Figure 15N:
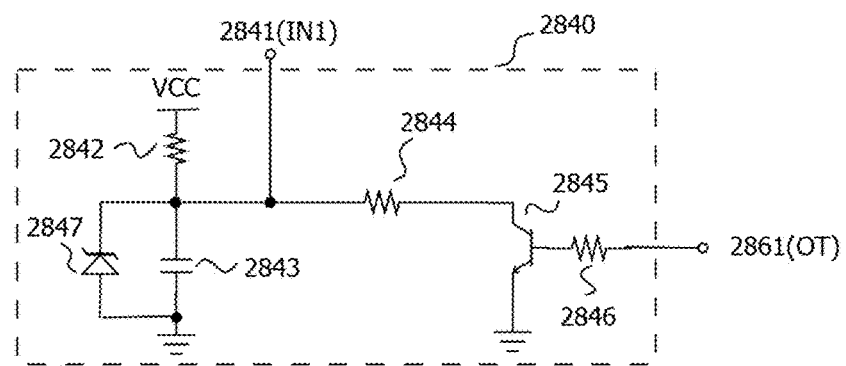
FIG. 15N is a schematic pulse generating auxiliary circuit according to some exemplary embodiments.

Referring to FIG. 15N, a circuit diagram of a pulse generating auxiliary circuit according to some exemplary embodiments is illustrated. The pulse generating auxiliary circuit 2840 includes resistors 2842, 2844, and 2846, a capacitor 2843, and a transistor 2845. The resistor 2842 has an end connected to a driving voltage (e.g., VCC). The capacitor 2843 has an end connected to another end of the resistor 2842, and another end connected to ground. The resistor 2844 has an end connected to the connection node of the resistor 2842 and the capacitor 2843. The transistor 2845 has a base, a collector connected to another end of the resistor 2844, and an emitter connected to the ground. The resistor 2846 has an end connected to the base of the transistor 2845, and another end connected to the output terminal OT of the integrated control module 2840 and the control terminal of the switch circuit 2880 via the path 2841. The pulse generating auxiliary circuit 2840 further includes a Zener diode 2847. The Zener diode 2847 has an anode connected to another end of the capacitor 2843 and the ground and a cathode connected to the end connecting the capacitor 2843 and the resistor 2842.

Figure 15O:
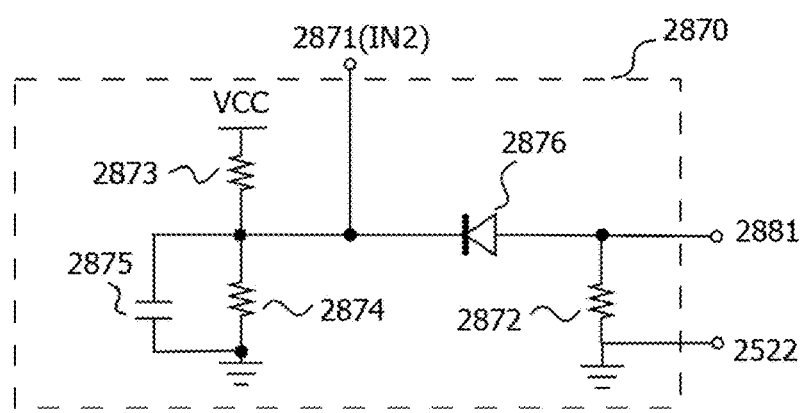
FIG. 15O is a schematic detection determining auxiliary circuit according to some exemplary embodiments.

Referring to FIG. 15O, a circuit diagram of a detection determining auxiliary circuit according to some exemplary embodiments is illustrated. The detection determining auxiliary circuit 2870 includes resistors 2872, 2873 and 2874, a capacitor 2875 and diode 2876. The resistor 2872 has an end connected to the switch circuit 2880, and another end connected to another end of the LED power loop (e.g., the second installation detection terminal 2522). The resistor 2873 has an end connected to the driving voltage (e.g., VCC). The resistor 2874 has an end connected to another end of the resistor 2873 and the input terminal IN2 of the integrated control module 2860 via the path 2871, and another end connected to the ground. The capacitor 2875 is connected to the resistor 2874 in parallel. The diode 2876 has an anode connected to the end of the resistor 2872 and a cathode connected to the connection node of the resistors 2873 and 2874. In one exemplary embodiment, the resistors 2873 and 2874, the capacitor 2875, and the diode 2876 can be omitted. When the diode 2876 is omitted, one end of the resistor 2872 is directly connected to the input terminal IN2 of the integrated control module 2860 via the path 2871. In another one exemplary embodiment, the resistor 2872 can be implemented by two paralleled resistors based on the power consideration, in which the equivalent resistance of each resistors can be 0.1 ohm to 5 ohm.

Figure 15P:
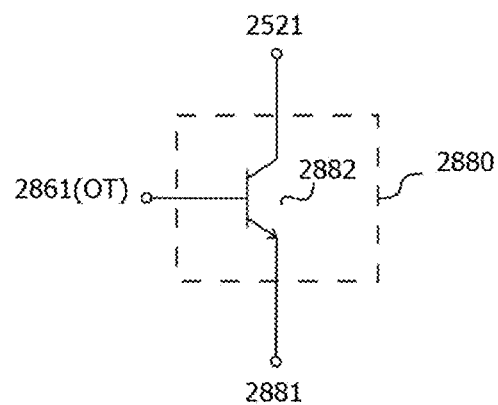
FIG. 15P is a schematic switch circuit according to some exemplary embodiments.

Referring to FIG. 15P, a circuit diagram of a switch circuit according to some exemplary embodiments is illustrated. The switch circuit 2880 includes a transistor 2882. The transistor 2882 has a base connected to the output terminal OT of the integrated control module 2860 via the path 2861, a collector connected to one end of the LED power loop (e.g., the first installation detection terminal 2521), and an emitter connected to the detection determining auxiliary circuit. In some embodiments, the transistor 2882 may be replaced by other equivalently electronic parts, e.g., a MOSFET.

It should be noted that, the installation detection module of the present embodiment utilizes the same installation detection principle as the aforementioned embodiment. For example, the capacitor voltage may not mutate; the voltage of the capacitor in the power loop of the LED tube lamp before the power loop being conductive is zero and the capacitor's transient response may appear to have a short-circuit condition; when the LED tube lamp is correctly installed to the lamp socket, the power loop of the LED tube lamp in transient response may have a smaller current-limiting resistance and a bigger peak current; and when the LED tube lamp is incorrectly installed to the lamp socket, the power loop of the LED tube lamp in transient response may have a bigger current-limiting resistance and a smaller peak current. This embodiment may also meet the UL standard to make the leakage current of the LED tube lamp less than 5 MIU. For example, the present embodiment may determine whether the LED tube lamp is correctly/properly connected to the lamp socket by detecting the transient response of the peak current. Therefore, the detail operation of the transient current under the correct installation state and the incorrect installation state may be seen by referring to the aforementioned embodiment, and it will not be repeated herein. The following disclosure will focus on describing the entire circuit operation of the installation detection module illustrated in FIG. 15L to 15P.

Referring to FIG. 15L again, when an LED tube lamp is being installed to a lamp socket, the driving voltage may be provided to modules/circuits within the installation detection module 2520 when power is provided to at least one end cap of the LED tube lamp. The pulse generating auxiliary circuit 2840 starts charging in response to the driving voltage. The output voltage (referred to "first output voltage" hereinafter) of the pulse generating auxiliary circuit 2840 rises from a first low level voltage to a voltage level greater than a forward threshold voltage after a period (e.g., the period utilized to determine the cycle of a pulse signal), in which the first output voltage may output to the input terminal of the integrated control module 2860 via the path 2841. After receiving the first output voltage from the input terminal IN1, the integrated control module 2860 outputs an enabled control signal (e.g., a high level voltage) to the switch circuit 2880 and the pulse generating auxiliary circuit 2840. When the switch circuit 2880 receives the enabled control signal, the switch circuit 2880 is turned on so that a power loop of the LED tube lamp is conducted as well. Herein, at least the first installation detection terminal 2521, the switch circuit 2880, the path 2881, the detection determining auxiliary circuit 2870 and the second installation detection terminal 2522 are included in the power loop. In the meantime, the pulse generating auxiliary circuit 2840 conducts a discharge path for discharging in response to the enabled control signal. The first output voltage falls down to the first low level voltage from the voltage greater than the forward threshold voltage. When the first output voltage is less than a reverse threshold voltage (which can be defined based on the circuit design), the integrated control module 2860 pulls the enabled control signal down to a disable level in response to the first output voltage (i.e., the integrated control module 2860 outputs a disabled control signal, in which the disabled control signal is, for example, a low level voltage), and thus the control signal has a pulse-type signal waveform (i.e., the first time of the first low level voltage, the first high level voltage, and the second time of the first low level voltage form a first pulse signal DP1). When the power loop is conducting, the detection determining auxiliary circuit 2870 detects a first sample signal (e.g., voltage signal) on the power loop and provides the first sample signal to the integrated control module 2860 via the input terminal IN2. When the integrated control module 2860 determines the first sample signal is greater than or equal to a setting signal (e.g., a reference voltage), which may represent the LED tube lamp has been properly installed on the lamp socket, the integrated control module 2860 outputs and keeps the enabled control signal to the switch circuit 2880. Since receiving the enabled control signal, the switch circuit 2880 remains in the conductive state so that the power loop of the LED tube lamp is kept on the conductive state as well. During the period when the switch circuit 2880 receives the enabled control signal, the integrated control module 2860 does not output the pulses anymore.

On the contrary, when the integrated control module 2860 determines the first sample signal is less than the setting signal, which may represent the LED tube lamp has not been properly installed on the lamp socket yet, the integrated control module 2860 outputs and keeps the disabled control signal to the switch circuit 2880. As a result of receiving the disabled control signal, the switch circuit 2880 remains in the non-conducting state so that the power loop of the LED tube lamp is kept on the non-conducting state as well.

Since the discharge path of the pulse generating auxiliary circuit 2840 is cut off, the pulse generating auxiliary circuit 2840 starts to charge again. Therefore, after the power loop of the LED tube lamp remains in a non-conducting state for a period (i.e., pulse on-time), the first output voltage of the pulse generating auxiliary circuit 2840 rises from the first low level voltage to the voltage greater than the forward threshold voltage again, in which the first output voltage may output to the input terminal of the integrated control module 2860 via the path 2841. After receiving the first output voltage from the input terminal IN1, the integrated control module 2860 pulls up the control signal from the disable level to an enable level (i.e., the integrated control module 2860 outputs the enabled control signal) and provides the enabled control signal to the switch circuit 2880 and the pulse generating auxiliary circuit 2840. When the switch circuit 2880 receives the enabled control signal, the switch circuit 2880 is turned on so that the power loop of the LED tube lamp is conducted as well. Herein, at least the first installation detection terminal 2521, the switch circuit 2880, the path 2881, the detection determining auxiliary circuit 2870 and the second installation detection terminal 2522 are included in the power loop. In the meantime, the pulse generating auxiliary circuit 2840 conducts, in response to the enabled control signal, a discharge path again for discharging. The first output voltage gradually falls down to the first low level voltage from the voltage greater than the forward threshold voltage again. When the first output voltage is less than a reverse threshold voltage (which can be defined based on the circuit design), the integrated control module 2860 pulls the enabled control signal down to a disable level in response to the first output voltage (i.e., the integrated control module 2860 outputs a disabled control signal, in which the disabled control signal is, for example, a low level voltage), and thus the control signal has a pulse-type signal waveform (i.e., the third time of the first low level voltage, the second time of the high level voltage, and the fourth time of the first low level voltage form a second pulse signal DP2). When the power loop is conducted again, the detection determining auxiliary circuit 2870 detects a second sample signal (e.g., voltage signal) on the power loop and provides the second sample signal to the integrated control module 2860 via the input terminal IN2. When the integrated control module 2860 determines the second sample signal is greater than or equal to a setting signal (e.g., a reference voltage), which may represent the LED tube lamp has been properly installed on the lamp socket, the integrated control module 2860 outputs and keeps the enabled control signal to the switch circuit 2880. Since receiving the enabled control signal, the switch circuit 2880 remains in the conductive state so that the power loop of the LED tube lamp is kept on the conductive state as well. During the period when the switch circuit 2880 receives the enabled control signal, the integrated control module 2860 does not output the pulses anymore.

When the integrated control module 2860 determines the second sample signal is less than the setting signal, which may represent the LED tube lamp has not been properly installed on the lamp socket yet, the integrated control module 2860 outputs and keeps the disabled control signal to the switch circuit 2880. Since receiving the disabled control signal, the switch circuit 2880 remains in the non-conducting state so that the power loop of the LED tube lamp is kept on the non-conducting state as well. Based on the above operation, when the LED tube lamp has not been properly installed on the lamp socket, the problem in which users may get electric shock caused by touching the conductive part of the LED tube lamp can be prevented.

Operation of circuits/modules within the installation detection module is further described below. Referring to FIG. 15M to 15P, when the LED tube lamp is installed in the lamp socket, the capacitor 2843 is charged by a driving voltage VCC via resistor 2842. When the voltage of the capacitor 2843 is raised to trigger the pulse generating unit 2862 (i.e., the voltage of the capacitor 2843 is raised greater than the forward threshold voltage), the output of the pulse generating unit 2862 changes to a first high level voltage from an initial first low level voltage and provides to the detection result latching unit 2863. After receiving the first high level voltage outputted by the pulse generating unit 2862, the detection result latching unit 2863 outputs a second high level voltage to the base of the transistor 2882 and the resistor 2846 via the output terminal OT. After the second high level voltage outputted from the detection result latching unit 2863 is received by the base of the transistor 2882, the collector and the emitter of the transistor are conducted so as to conduct the power loop of the LED tube lamp. Herein, at least the first installation detection terminal 2521, the transistor 2882, the resistor 2872, and the second installation detection terminal 2522 are included in the power loop.

In the meantime, the base of the transistor 2845 receives the second high level voltage on the output terminal OT via the resistor 2846. The collector and the emitter of the transistor 2845 are conducting and connected to the ground, such that the capacitor 2843 discharges to the ground via the resistor 2844. When the voltage of the capacitor 2843 is insufficient so that the pulse generating unit 2862 cannot be triggered, the output of the pulse generating unit 2862 is pulled down to the first low level voltage from the first high level voltage (i.e., the first time of the first low level voltage, the first high level voltage, and the second time of the first low level voltage form a first pulse signal DP1). When the power loop is conducting, the current, generated by the transient response, passing through a capacitor (e.g., filtering capacitor in the filtering circuit) in the LED power loop flows through the transistor 2882 and the resistor 2872 so as to build a voltage signal on the resistor 2872. The voltage signal is provided to the input terminal IN2, and thus the detection unit 2864 may compare the voltage signal on the input terminal IN2 (i.e., the voltage on the resistor 2872) with a reference voltage.

When the detection unit 2864 determines the voltage signal on the resistor 2872 is greater than or equal to the reference voltage, the detection unit outputs a third high level voltage to the detection result latching unit 2863. On the contrary, when the detection unit 2864 determines the voltage signal on the resistor 2872 is less than the reference voltage, the detection unit 2864 outputs a third low level voltage to the detection result latching unit 2863.

The detection result latching unit 2863 latches/stores the third high level voltage/third low level voltage provided by the detection unit 2864 and performs a logic operation based on the latched/stored signal and the signal provided by the pulse generating unit 2862, such that the detection result latching unit 2863 outputs the control signal. Herein, the result of the logic operation determines whether the signal level of the outputted control signal is the second high level voltage or the second low level voltage.

More specifically, when the detection unit 2864 determines that the voltage signal on the resistor is greater than or equal to the reference voltage, the detection result latching unit 2863 may latch the third high level voltage outputted by the detection unit 2864, and the second high level voltage is maintained to be output to the base of the transistor 2882, so that the transistor 2882 and the power loop of the LED tube lamp maintain the conductive state. Since the detection result latching unit 2863 may continuously output the second high level voltage, the transistor 2845 is conducted to the ground as well, so that the voltage of the capacitor 2843 cannot rise enough to trigger the pulse generating unit 2862. When the detection unit 2864 determines that the voltage signal on the resistor 2872 is less than the reference voltage, both the detection unit 2864 and the pulse generating unit 2862 provide a low level voltage, and thus the detection result latching unit 2863 continuously outputs, after performing the OR logical operation, the second low level voltage to the base of the transistor 2882. Therefore, the transistor 2882 is maintained to be cut off and the power loop of the LED tube lamp is maintained in the non-conducting state. However, since the control signal on the output terminal OT is maintained at a second low level voltage, the transistor 2845 is thus maintained in a cut-off state as well, and repeatedly performs the next (pulse) detection until the capacitor 2843 is charged by the driving voltage VCC via the resistor 2842 again.

It should be noted that, the detection stage DTS described in this embodiment can be defined as the period that the driving voltage VCC is provided to the installation detection module 2520, however, the detection unit 2864 has not yet determined that the voltage signal on the resistor 2872 is greater than or equal to the reference voltage. During the detection stage DTS, since the control signal outputted by the detection result latching unit 2863 alternatively conducts and cuts off the transistor 2845, the discharge path is periodically conducted and cut off, correspondingly. Thus, the capacitor 2843 is periodically charged and discharged in response to the conducting state of the transistor 2845, so that the detection result latching unit 2863 outputs the control signal having a periodic pulse waveform during the detection stage DTS. The detection stage DTS ends when the detection unit 2864 determines that the voltage signal on the resistor 2872 is greater than or equal to the reference voltage or the driving voltage VCC is stopped. The detection result latching unit 2863 is maintained to output the control signal having the second high level voltage or the second low level voltage after the detection stage DTS.

In one embodiment, compared to the exemplary embodiment illustrated in FIG. 15G, the integrated control module 2860 is constituted by integrating part of the circuit components in the detection pulse generating module 2740, the detection result latching circuit 2760, and the detection determining circuit 2770 (e.g., as part of an integrated circuit). Another part of the circuit components which are not integrated in the integrated control module 2860 constitutes the pulse generating auxiliary circuit 2840 and the detection determining auxiliary circuit 2870 of the embodiment illustrated in FIG. 15L. In some embodiments, the function/circuit configuration of the combination of the pulse generating unit 2862 in the integrated control module 2860 and the pulse generating auxiliary circuit 2840 can be equivalent to the detection pulse generating module 2740. The function/circuit configuration of the detection result latching unit 2863 in the integrated control module 2860 can be equivalent to the detection result latching module 2760. The function/circuit configuration of the combination of the detection unit 2864 in the integrated control module 2860 and the detection determining auxiliary circuit 2870 can be equivalent to the detection determining circuit 2770. In these embodiments, the circuit elements included in the pulse generating unit 2862, the detection result latching unit 2863, and the detection unit 2864 are included in an integrated circuit (e.g., formed on a die or chip).

Figure 15Q:
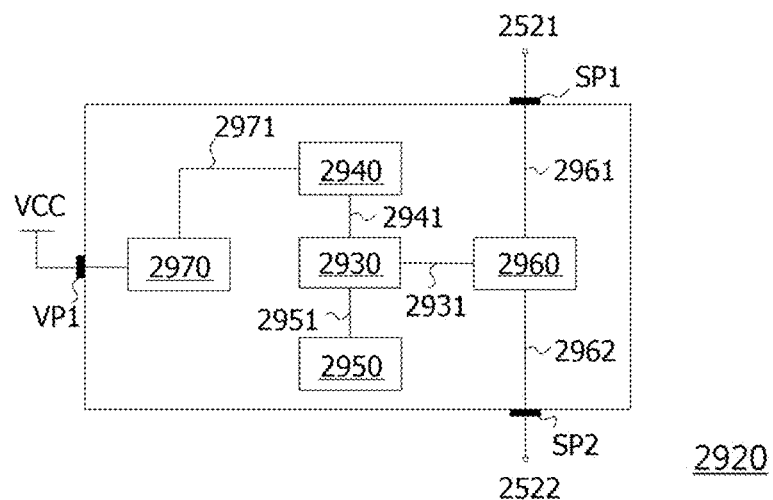
FIG. 15Q is an internal circuit block diagram of a three-terminal switch device according to some exemplary embodiments.

Referring to FIG. 15Q, an internal circuit block diagram of a three-terminal switch device according to an exemplary embodiment is illustrated. The installation detection module according to one embodiment is, for example, a three-terminal switch device 2920 including a power terminal VP1, a first switching terminal SP1, and a second switching terminal SP2. The power terminal VP1 of the three-terminal switch device 2920 is adapted to receive a driving voltage VCC. The first switching terminal SP1 is adapted to connect one of the first installation detection terminal 2521 and the second installation detection terminal 2522 (the first switching terminal SP1 is illustrated as being connected to the first installation detection terminal 2521 in FIG. 15Q, but the invention is not limited thereto), and the second switching terminal SP2 is adapted to connect to the other one of the first installation detection terminal 2521 and the second installation detection terminal 2522 (the second switching terminal SP2 is illustrated as being connected to the second installation detection terminal 2522 in FIG. 15Q, but the invention is not limited thereto).

The three-terminal switch device 2920 includes a signal processing unit 2930, a signal generating unit 2940, a signal capturing unit 2950, and a switch unit 2960. In addition, the three-terminal switch device 2920 further includes an internal power detection unit 2970. The signal processing unit 2930 outputs a control signal having a pulse or multi-pulse waveform during a detection stage DTS, according to the signal provided by the signal generating unit 2940 and the signal capturing unit 2950. The signal processing unit 2930 outputs the control signal, in which the signal level of the control signal remains at a high level voltage or a low voltage level, after the detection stage DTS, so as to control the conducting state of the switch unit 2960 and determine whether to conduct the power loop of the LED tube lamp. The pulse signal generated by the signal generating unit 2940 can be generated according to a reference signal received from outside, or by itself, and the present invention is not limited thereto. The term "outside" described in this paragraph is relative to the signal generating unit 2940, which means the reference signal is not generated by the signal generating unit 2940. As such, whether the reference signal is generated by any of the other circuits within the three-terminal switch device 2920, or by an external circuit of the three-terminal switch device 2920, those embodiments belong the scope of "the reference signal received from the outside" as described in this paragraph. The signal capturing unit 2950 samples an electrical signal passing through the power loop of the LED tube lamp to generate a sample signal and detects an installation state of the LED tube lamp according to the sample signal, so as to transmit a detection result signal Sdr indicating the detection result to the signal processing unit 2930 for processing.

In an exemplary embodiment, the three-terminal switch device 2920 can be implemented by an integrated circuit. For example, the three-terminal switch device 2920 can be a three-terminal switch control chip, which can be utilized in any type of the LED tube lamp having two end caps for receiving power so as to provide the function of preventing electric shock. It should be noted that, the three-terminal switch device 2920 is not limited to merely include three pins/connection terminals. For example, a multi-pins switch device (with more than three pins) having at least three pins having the same configuration and function as the embodiment illustrated in FIG. 15Q can include additional pins for other purposes, even though those pins may be not described in detail herein. It should be noted that the various "units" described herein, in some embodiments, are circuits, and will be described as circuits.

In an exemplary embodiment, the signal processing unit 2930, the signal generating unit 2940, the signal capturing unit 2950, the switch unit 2960, and the internal power detection unit 2970 can be respectively implemented the circuit configurations illustrated in FIG. 15R to 15V, but the present invention is not limited thereto. Detail exemplary operation of each of the units in the three-terminal control chip are described below.

Figure 15R:
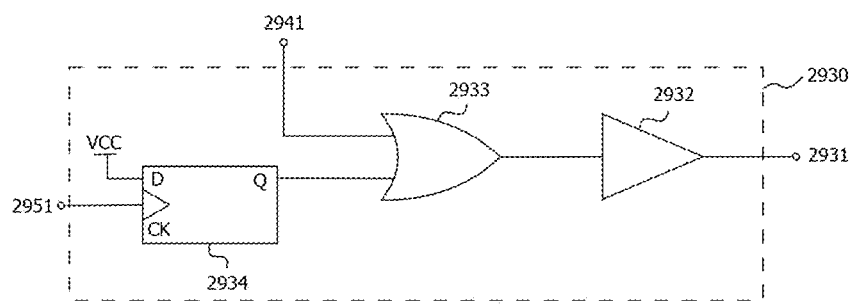
FIG. 15R is a schematic signal processing unit according to some exemplary embodiments.

Referring to FIG. 15R, a block diagram of a signal processing unit according to an exemplary embodiment is illustrated. The signal processing unit 2930, which in one embodiment is a circuit, includes a driver 2932, an OR gate 2933, and a D flip-flop 2934. The driver 2932 has an input end, and has an output end connected to the switch unit 2960 via the path 2931, in which the driver 2932 provides the control signal to the switch unit 2960 via the output end and the path 2931. The OR gate 2933 has a first input end connected to the signal generating unit 2940 via the path 2941, a second input end, and an output end connected to the input end of the driver 2932. The D flip-flop 2934 has a data input end (D) receiving a driving voltage VCC, a clock input end (CK) connected to the signal capturing unit 2950 via the path 2951, and an output connected to the second input terminal of the OR gate 2933.

Figure 15S:
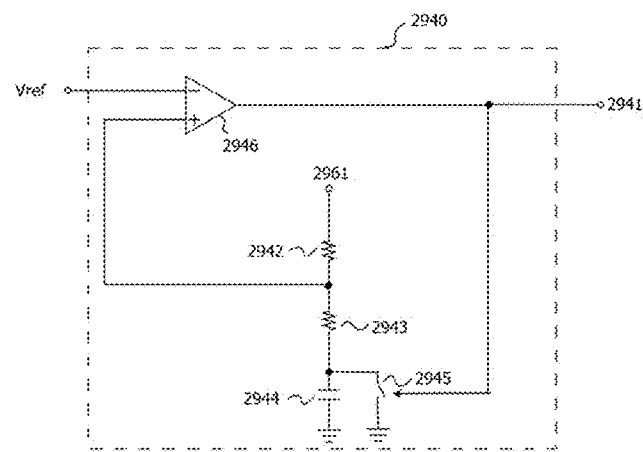
FIG. 15S is a schematic signal generating unit according to some exemplary embodiments.

Referring to FIG. 15S, a block diagram of a signal generating unit according to an exemplary embodiment is illustrated. The signal generating unit 2940 includes resistors 2942 and 2943, a capacitor 2944, a switch 2945, and a comparator 2946. One end of the resistor 2942 receives the driving voltage VCC, and the resistors 2942 and 2943 and the capacitor 2944 are serial connected between the drying voltage VCC and the ground. The switch 2945 is connected to the capacitor 2944 in parallel. The comparator 2946 has a first input end connected to the connection node of the resistors 2942 and 2943, a second input end receives a reference voltage Vref, and an output end connected to the control terminal of the switch 2945.

Figure 15T:
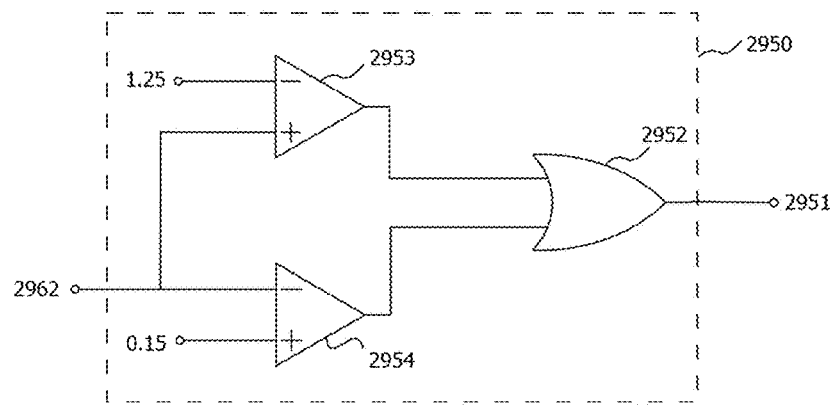
FIG. 15T is a schematic signal capturing unit according to some exemplary embodiments.

Referring to FIG. 15T, a block diagram of a signal capturing unit according to an exemplary embodiment is illustrated. The signal capturing unit 2950 includes an OR gate and comparators 2953 and 2954. The OR gate 2952 has a first input end and a second input end, and an output end connected to the signal processing unit 2930 via the path 2951. The comparator 2953 has a first input end connected to one end of the switch unit 2960 (i.e., a node on the power loop of the LED tube lamp) via the path 2962, a second input end receiving a first reference voltage (e.g., 1.25V, but not limited thereto), and an output end connected to the first input end of the OR gate 2952. The comparator 2954 has a first input end connected to a second reference voltage (e.g., 0.15V, but not limited thereto), a second input end connected to the first input end of the comparator 2953, and an output end connected to the second input end of the OR gate 2952.

Figure 15U:
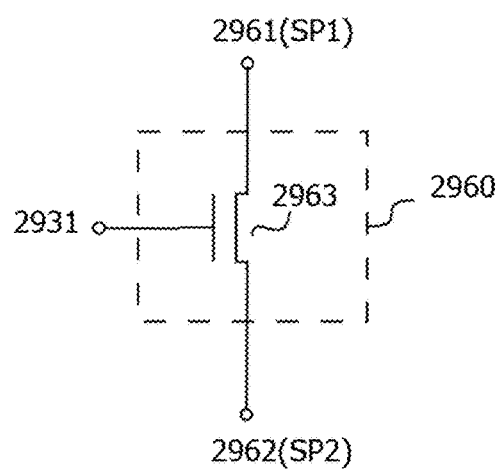
FIG. 15U is a schematic switch unit according to some exemplary embodiments.

Referring to FIG. 15U, a block diagram of a switch unit according to an exemplary embodiment is illustrated. The switch unit 2960 includes a transistor 2963. The transistor 2963 has a gate connected to the signal processing unit 2930 via the path 2931, a drain connected to the first switch terminal SP1 via the path 2961, and a source connected to the second switch terminal SP2, the first input end of the comparator 2953, and the second input end of the comparator 2954 via the path 2962. In one embodiment, for example, the transistor 2963 is an NMOS transistor.

Figure 15V:
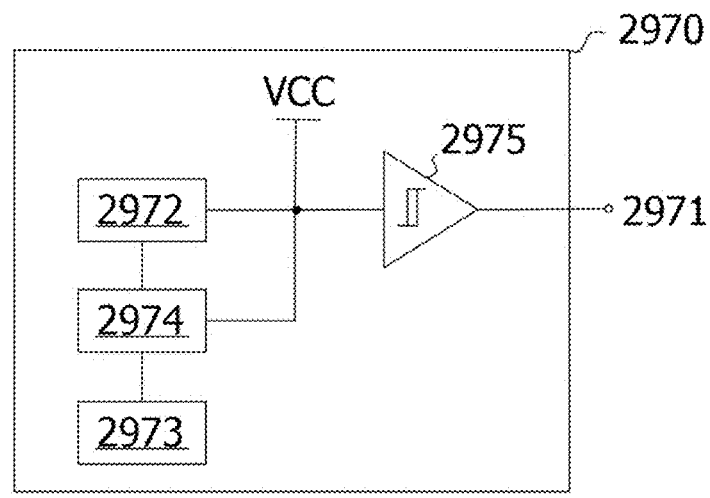
FIG. 15V is a schematic internal power detection unit according to some exemplary embodiments.

Referring to FIG. 15V, a block diagram of an internal power detection unit according to an exemplary embodiment is illustrated. The internal power detection unit 2970 includes a clamp circuit 2972, a reference voltage generating circuit 2973, a voltage adjustment circuit 2974, and a Schmitt trigger 2975. The clamp circuit 2972 and the voltage adjustment circuit 2974 are respectively connected to the power terminal VP1 for receiving the driving voltage, so as to perform a voltage clamp operation and a voltage level adjustment operation, respectively. The reference voltage generating circuit 2973 is coupled to the voltage adjustment circuit 2974 and is configured to generate a reference voltage to the voltage adjustment circuit 2974. The Schmitt trigger 2975 has an input end coupled to the clamp circuit 2972 and the voltage adjustment circuit 2974, and an output end to output a power confirmation signal for indicating whether the driving voltage VCC is normally supplied. If the driving voltage VCC is normally supplied, the Schmitt trigger 2975 outputs the enabled power confirmation signal, such that the driving voltage VCC is allowed to be provided to the component/circuit within the three-terminal switch device 2920. On the contrary, if the driving voltage VCC is abnormal, the Schmitt trigger 2975 outputs the disabled power confirmation signal, such that the component/circuit within the three-terminal switch device 2920 won't be damaged based on working under the abnormal driving voltage VCC.

Referring to FIG. 15Q to 15V, under the circuit operation of the present embodiment, when the LED tube lamp is installed on the lamp socket, the driving voltage VCC is provided to the three-terminal switch device 2920 via the power terminal VP1. At this time, the driving voltage VCC charges the capacitor 2944 via the resistors 2942 and 2943. When the capacitor voltage is raised greater than the reference voltage Vref, the comparator 2946 switches to output a high level voltage to the first input end of the OR gate 2933 and the control terminal of the switch 2945. The switch 2945 is conducted in response to the received high level voltage, such that the capacitor starts to discharge to the ground. The comparator 2946 outputs an output signal having pulse-type waveform through this charge and discharge process.

During the period when the comparator 2946 outputs the high level voltage, the OR gate 2952 correspondingly outputs the high level voltage to conduct the transistor 2963, such that the current flows through the power loop of the LED tube lamp. When the current passes the power loop, a voltage signal corresponding to the current size can be established on the path 2962. The comparator 2953 samples the voltage signal and compares the signal level of the voltage signal with the first reference voltage (e.g., 1.25V).

When the signal level of the sampled voltage signal is greater than the first reference voltage, the comparator 2953 outputs the high level voltage. The OR gate 2952 generates another high level voltage to the clock input end of the D flip-flop 2934 in response to the high level voltage outputted by the comparator 2953. The D flip-flop 2934 continuously outputs the high level voltage based on the output of the OR gate 2952. Driver 2932 generates an enabled control signal to conduct the transistor 2963 in response to the high level voltage on the input terminal. At this time, even if the capacitor 2944 has been discharged to below the reference voltage Vref and thus the output of the comparator 2946 is pulled down to the low level voltage, the transistor 2963 still remains in the conductive state since the output of the D flip-flop 2934 is kept on the high level voltage.

When the sampled voltage signal is less than the first reference voltage (e.g., 1.25V), the comparator 2953 outputs the low level voltage. The OR gate 2952 generates another low level voltage in response to the low level voltage outputted by the comparator, and provides the generated low level voltage to the clock input end of the D flip-flop 2934. The output end of the D flip-flop 2934 remains on the low level voltage based on the output of the OR gate 2952. At this time, once the capacitor 2944 discharges to the capacitor voltage below the reference voltage Vref, the output of comparator 2946 is pulled down to the low level voltage which represents the end of the pulse on-time (i.e., the fallen edge of the pulse). Since the two input ends of the OR gate 2952 are at the low level voltage, the output end of the OR gate 2952 also outputs the low level voltage, therefore, the driver 2932 generates the disabled control signal to cut off the transistor 2963 in response to the received low level voltage, so as to cut off the power loop of the LED tube lamp.

As noted above, the operation of the signal processing unit 2930 of the present embodiment is similar to that of the detection result latching circuit 2760 illustrated in FIG. 15I, the operation of the signal generating unit 2940 is similar to that of the detection pulse generating module 2740 illustrated in FIG. 15H, the operation of the signal capturing unit 2950 is similar to that of the detection determining circuit 2770 illustrated in FIG. 15K, and the operation of the switch unit 2960 is similar to that of the switch circuit 2780 illustrated in 15J.

Figure 15W:
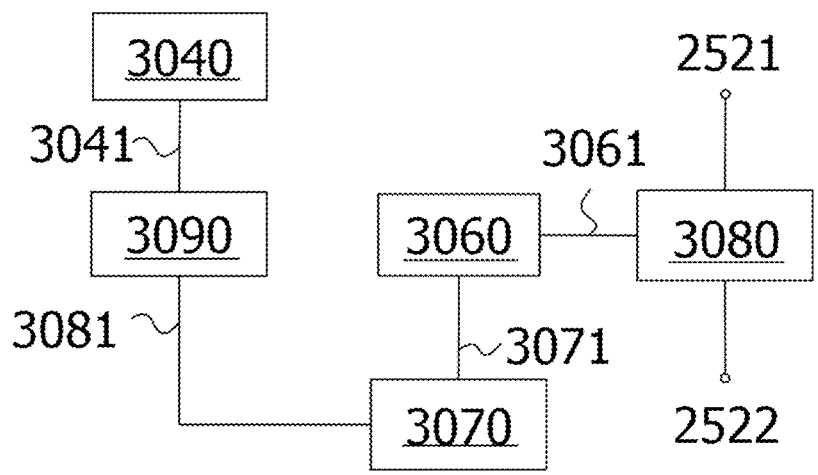
FIG. 15W a block diagram of an installation detection module according to some exemplary embodiments.

Referring to FIG. 15W, a block diagram of an installation detection module according to an exemplary embodiment is illustrated. The installation detection module 2520 includes a switch circuit 3080, a detection pulse generating module 3040, a control circuit 3060, a detection determining circuit 3070, and a detection path circuit 3090. The detection determining circuit 3070 is coupled to the detection path circuit 3090 via the path 3081 for detecting the signal on the detection path circuit 3090. The detection determining circuit 3070 is coupled to the control circuit 3060 via the path 3071 for transmitting the detection result signal Sdr to the control circuit 3060 via the path 3071. The detection pulse generating module 3040 is coupled to the detection path circuit 3090 via the path 3041 and generates a pulse signal to inform the detection path circuit 3090 of a time point for conducting the detection path. The control circuit 3060 outputs a control signal according to the detection result signal Sdr and is coupled to the switch circuit 3080 via the path 3061, so as to transmit the control signal to the switch circuit 3080. The switch circuit 3080 determines whether to conduct the current path between the installation detection terminals 2521 and 2522 (i.e., part of the power loop).

In some embodiments, the detection pulse generating module 3040, the control circuit 3060, the detection determining circuit 3070, and the detection path circuit 3080 can be referred to a detection circuit or an electric shock detection/protection circuit, which is configured to control the switching state of the switch circuit 3080.

In the present embodiment, the configuration of the detection pulse generating module 3040 can correspond to the configurations of the detection pulse generating module 2640 shown in FIG. 15C or the detection pulse generating module 2740 shown in FIG. 15H. Referring to FIG. 15C, when the detection pulse generating module 2640 is applied to implement the detection pulse generating module 3040, the path 3041 of the present embodiment can correspond to the path 2541, which means the OR gate 2652 is connected to the detection path circuit 3090 via the path 3041. Referring to FIG. 15H, when the detection pulse generating module 2740 is applied to implement the detection pulse generating module 3040, the path 3041 can correspond to the path 2741. In one embodiment, the detection pulse generating module is also connected to the output terminal of the control circuit 3060 via the path 3061, so that the path 3061 can correspond to the path 2761.

The control circuit 3060 can be implemented by a control chip or any circuit capable of performing signal processing. When the control circuit 3060 determines the tube lamp is properly installed (e.g., the pins on both ends of the tube lamp are properly electrically connected to into the lamp socket and/or are properly plugged in to the lamp socket, and a user is not touching the pins on one end of the tube lamp with the other end plugged in) according to the detection result signal Sdr, the control circuit 3060 may control the switch state of the switch circuit 3080 so that the external power can be normally provided to the LED module when the tube lamp is properly installed into the lamp socket. In this case, the detection path will be cut off by the control circuit 3060. On the contrary, when the control circuit 3060 determines the tube lamp is not properly installed (e.g., a user is touching the pins on one end of the tube lamp with the other end plugged in) according to the detection result signal Sdr, the control circuit 3060 keeps the switch circuit 3080 at the off-state since the user has the risk from getting electric shock.

In an exemplary embodiment, the control circuit 3060 and the switch circuit 3080 can be part of the driving circuit in the power supply module. For example, if the driving circuit is a switch-type DC-to-DC converter, the switch circuit 3080 can be the power switch of the converter, and the control circuit 3060 can be the controller of the power switch.

An example of the configuration of the detection determining circuit 3070 can be seen referring to the configurations of the detection determining circuit 2670 shown in FIG. 15D or the detection determining circuit 2770 shown in FIG. 15K. Referring to FIG. 15D, when the detection determining circuit 2670 is applied to implement the detection determining circuit 3070, the resistor 2672 can be omitted. The path 3081 of the present embodiment can correspond to the path 2581, which means the positive input terminal of the comparator 2671 is connected to the detection path circuit 3090. The path 3071 of the present embodiment can correspond to the path 2571, which means the output terminal of the comparator 2671 is connected to the detection result latching circuit 3060. Referring to FIG. 15K, when the detection determining circuit 2770 is applied to implement the detection determining circuit 3070, the resistor 2774 can be omitted. The path 3081 of the present embodiment can correspond to the path 2781, which means the anode of the diode 2775 is connected to the detection path circuit 3090. The path 3071 of the present embodiment can correspond to the path 2771, which means the output terminal of the comparators 2772 and 2773 are connected to the detection result latching circuit 3060.

The configuration of the switch circuit 3080 can correspond to the configurations of the switch circuit 2680 shown in FIG. 15F or the switch circuit 2780 shown in FIG. 15J. Since the switch circuit in both embodiments of FIG. 15F and FIG. 15J are similar to each other, the following description discusses the switch circuit 2680 shown in FIG. 15F as an example. Referring to FIG. 15F, when the switch circuit 2680 is applied to implement the switch circuit 3080, the path 3061 of the present embodiment can correspond to the path 2561. The path 2581 is not connected to the detection determining circuit 2570, but directly connected to the installation detection terminal 2522.

Figure 15X:
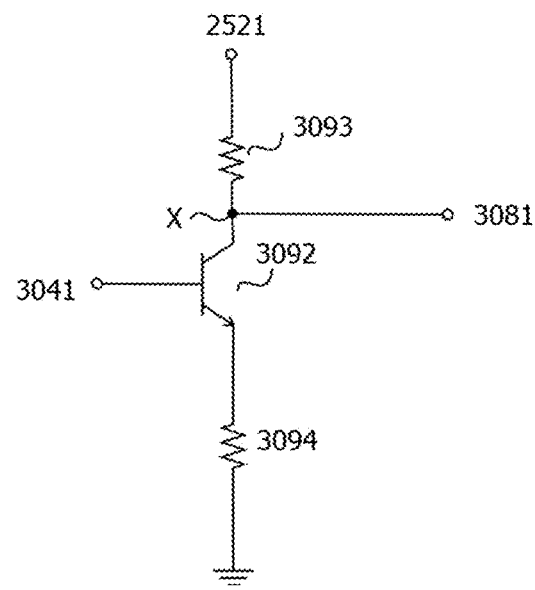
FIG. 15X is a block diagram of a detection path circuit according to some exemplary embodiments.

An exemplary configuration of the detection path circuit 3090 is shown in FIG. 15X. The detection path circuit 3090 includes a transistor 3092 and resistors 3093 and 3094. The transistor 3092 has a base, a collector, and an emitter. The base of the transistor 3092 is connected to the detection pulse generating module 3040 via the path 3041. The resistor 3092 is serially connected between the emitter of the transistor 3092 and the ground. The resistor 3093 is serially connected between the collector of the transistor 3092 and the installation detection terminal 2521.

In the present embodiment, the transistor 3092 is conducting during a pulse-on time when receiving the pulse signal provided by the detection pulse generating module 3040. Under the situation where at least one end of the tube lamp is inserted in the lamp socket, a detection path is built from the installation detection terminal 2521 to the ground (via the resistor 3094, the transistor 3092, and the resistor 3093) in response to the conducted transistor 3092, so as to establish a voltage signal on the node X of the detection path. In one embodiment, the detection path is built from one of the rectifying circuit input terminals to another one of the rectifying circuit input terminals (via the rectifying diodes, the resistors 3093 and 3094, and the transistor 3092). When the user does not touch the tube lamp (e.g., but one end of the tube lamp is plugged in), the signal level of the voltage signal is determined by the voltage division of the resistors 3093 and 3094. When the user touches the tube lamp, a human body resistor is equivalent to connect between the resistor 3094 and the ground, which means it is connected to the resistors 3093 and 3094 in series. At this time, the signal level of the voltage signal is determined by the voltage division of the resistor 3093, the resistor 3094, and the impedance of human body. The human body resistor refers to an equivalent resistor of human body. The impedance of the human body resistor is usually between 500 ohm to 2000 ohm, depending on the skin humidity. Accordingly, by setting the resistors 3093 and 3094 having reasonable resistance, the voltage signal on the node X may reflect the state of whether the user touches the tube lamp, and thus the detection determining circuit 3070 may generate the corresponding detection result signal Sdr according to the voltage signal on the node X.

It should be noted that, although the transistor 3092 is illustrated as a BJT for example, the invention is not limited thereto. In some embodiments, the transistor 3092 can be implemented by a MOSFET. When utilizing the MOSFET as the transistor 3092, the gate of the transistor 3092 is connected to the detection pulse generating module 3040 via the path 3041. The resistor 3092 is serially connected between the source of the transistor 3092 and the ground. The resistor 3093 is serially connected between the drain of the transistor 3092 and the installation detection terminal 2521.

In addition, although the sample node X is selected from the first terminal of the transistor 3092 for example, in which the first terminal is the collector terminal if the transistor 3092 is BJT and the first terminal is the drain terminal if the transistor 3092 is MOSFET, the present invention is not limited thereto. The sample node X can be selected from the second terminal of the transistor 3092 as well, in which case the second terminal is the emitter terminal if the transistor 3092 is BJT and the second terminal is the source terminal if the transistor 3092 is MOSFET. As a result, the detection determining circuit 3070 can detects the signal feature on at least one of the first terminal and the second terminal of the transistor 3092.

As noted above, the present embodiment may determine whether a user has a chance to get an electric shock by conducting a detection path and detecting a voltage signal on the detection path. Compared to the embodiment mentioned above, the detection path of the present embodiment is additionally built, but does not use the power loop as the detection path. In some embodiments, the additional detection path refers to at least one electronic element of the detection path circuit 3090 being different from electronic elements included in the power loop. In some embodiments, the additional detection path refers to all of the electronic elements of the detection path circuit 3090 being different from electronic elements included in the power loop.

Since the configuration of the components on the additional detection path is much simpler than the power loop, the voltage signal on the detection path may reflect a user's touching state more accurately.

Furthermore, similar to the above embodiment, part or all of the circuit/module can be integrated as a chip, as illustrated in the embodiments in FIG. 15L to FIG. 15V, and it will not be repeated herein.

It should be noted that, the switch circuits 2580, 2680, 2780, 2880, 2960 and 3080 mentioned above are embodiments of a current limiting module, which is configured to limit the current on the power loop to less than a predetermined value (e.g., 5 MIU) when enabling. People having ordinary skill in the art may understand how to implement the current limiting module by circuits operated like a switch according to the embodiments described above. For example, the current limiting module can be implemented by electronic switch (e.g., MOSFET, BJT), electromagnetic switch, relay, triode AC semiconductor switch (TRIAC), Thyristor, impedance variable component (e.g., variable capacitor, variable resistor, variable inductor) and combination of the above.

Further, according to the embodiments illustrated in FIG. 15G to 15X, one skilled in the art should understand that the installation detection module illustrated in FIG. 15G can not only be designed as a distributed circuit applied in the LED tube lamp, but rather some components of the installation detection module can be integrated into an integrated circuit in an exemplary embodiment (e.g., the embodiment illustrated in FIG. 15L). Alternatively, all circuit components of the installation detection module can be integrated into an integrated circuit in another exemplary embodiment (e.g., the embodiment illustrated in FIG. 15Q). Therefore, the circuit cost and the size of the installation detection module can be saved. In addition, by integrating/modularizing the installation detection module, the installation detection module can be more easily utilized in different types of the LED tube lamps so that the design compatibility of the LED tube lamp can be improved. Also, under the application of utilizing the integrated installation detection module in the LED tube lamp, the light emitting area of the LED tube lamp can be significantly improved since the circuit size within the tube lamp is reduced. For example, the integrated circuit design may reduce the working current (reduced by about 50%) and enhance the power efficiency of the integrated components. As a result, the saved power can be used for being supplied to the LED module for emitting light, so that the luminous efficiency of the LED tube lamp can be further improved.

The embodiments of the installation detection module illustrated in FIG. 15B, FIG. 15G, FIG. 15L, FIG. 15Q and FIG. 15W teach the installation detection module includes a pulse generating mechanism such as the detection pulse generating modules 2540, 2740, and 3040, the pulse generating auxiliary circuit 2840, and the signal generating unit 2940 for generating a pulse signal, however, the present invention is not limited thereto. In an exemplary embodiment, the installation detection module can use the original clock signal in the power supply module to replace the function of the pulse generating mechanism in the above embodiments. For example, in order to generate a lighting control signal having a pulse waveform, the driving circuit (e.g., DC-to-DC converter) in the power supply module has a reference clock, originally. The function of the pulse generating mechanism can be implemented by using the reference clock of the lighting control signal as a reference, so that the hardware of the detection pulse generating module 2540, 2740, 3040/pulse generating auxiliary module 2840/signal generating unit 2940 can be omitted. In this case, the installation detection module can share the circuit configuration with another part of the circuit in the power supply module, so as to realize the function of generating the pulse signal. In addition, the duty cycle of the pulse generating mechanism can be any value in the interval of a real number greater than 0 to 1, in which the duty cycle equal to 0 means the power loop is normally closed, and the duty cycle equal to 1 means the power loop is normally open.

In some embodiments, when the duty cycle is set to smaller than 1, the detection operation of the installation detection module is performed by temporarily conducting a current on the power loop/detection path and detecting a signal on the power loop/detection path to obtain the installation state of the LED tube lamp without causing electric shock. When the LED tube lamp is correctly installed on the lamp socket (i.e., the pins on the both end caps are correctly connected to the connecting sockets), the current limiting module is disabled for conducting the driving current on the power loop, so as to drive/light up the LED module. Under such configuration, the current limiting module is preset to be in an enable state, so that the power loop can be maintained in the non-conducting state before confirming whether there is the risk of electric shock (or whether the LED tube lamp is correctly installed). The current limiting module is switched to a disable state when the LED tube lamp is correctly installed. Taking the switch circuit for example, the enable state of the current limiting module refers to the switch circuit being cut-off, and the disable state of the current limiting module refers to the switch circuit being turned on. Such configuration can be referred to as a pulse detection setting (the duty cycle is greater than 0 and smaller than 1). Under the pulse detection setting, the installation detection means performs during the pulse-on time of each pulse after powering up, and the electric shock protection means is implemented by suspending the current flowing through the power loop until the correct installation state is detected or the risk of electric shock is excluded.

In some embodiments, when the duty cycle is set to equal to 1, the detection operation of the installation detection module is performed by continuously monitoring/sampling the signal on the power loop/detection path. The sample signal can be used for determining the equivalent impedance of the power loop/detection path. When the equivalent impedance indicates there is a risk of electric shock (i.e., a user touches the conductive part of the LED tube lamp), the current limiting module is switched to be in the enable state for cutting off the power loop. Under such configuration, the current limiting module is preset to be in the disable state, so that the power loop can be maintained in the conducting/non-limiting state before confirming whether there is the risk of electric shock (or whether the LED tube lamp is correctly installed), in which case the LED tube lamp can be lighted up in the preset condition. The current limiting module is switched to the enable state when the risk of electric shock is detected. Such configuration can be referred to a continuous detection setting (the duty cycle equals to 1). Under the continuous detection setting, the installation detection means performs continuously without considering whether the LED tube lamp is lighted up or not, after powering up, and the electric shock protection means is implemented by allowing the current to flow through the power loop until the incorrect installation state or the risk of electric shock is detected. Either the incorrect installation state or the risk of electric shock being detected can be referred to an abnormal state.

Figure 15Y:
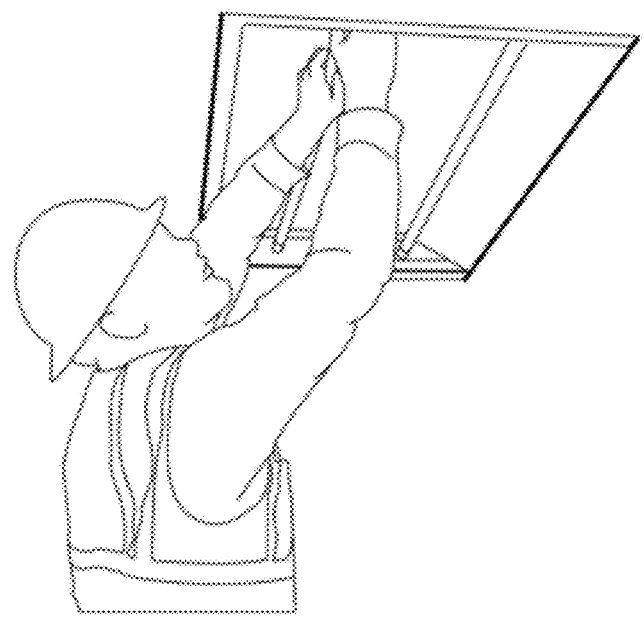
FIG. 15Y is a schematic diagram illustrating an installation state of an LED tube lamp according to some exemplary embodiments.

Specifically, as shown in FIG. 15Y, the risk of electric shock may occur as long as one end of the LED tube lamp is connected to the external power. Therefore, no matter whether installing or removing the LED tube lamp, once the user touches the conductive part of the tube lamp, the user is exposed to the risk of electric shock. In order to avoid the risk of electric shock, no matter whether the LED tube lamp is lighted up or not, the installation detection module operates based on the pulse detection setting or the continuous detection setting to detect the installation state and the user touching state and protect the user from being electrically shocked. Therefore, the safety of the LED tube lamp can be further improved.

Under the continuous detection setting, the pulse generating mechanism can be referred to as a path enabling mechanism, which is configured to provide a conduction signal for turning on the power loop/detection path. In some embodiments, for circuit structures of the detection pulse generating modules 2540, 2740 and 3040, the pulse generating auxiliary module 2840 and signal generating unit 2940 can be correspondingly modified to a circuit for providing fixed voltage. In addition, the switch circuits 2580, 2680, 2780, 2880, 2960 and 3080 can be modified to be preset to be in the conducting state/turn-on state, and to switch to the non-conducting state/cut-off state when the risk of electric shock is detected (it can be implemented by modifying the logic gate of the detection result latching circuit). In some embodiments, the circuit for generating a pulse can be omitted by modifying the circuit structure of the detection determining circuit and the detection path circuit. For example, under the continuous detection setting, the detection pulse generating module 2540 in the installation detection module of FIG. 15B and the detection pulse generating module 2740 in the installation detection module of FIG. 15G can be omitted, and so on. In addition, according to the embodiment of disposing the additional detection path in the installation detection module, the detection pulse generating module 3040 can be omitted if the continuous detection setting is applied, and the detection path circuit 3090 is maintained in the conducting state (e.g., the transistor 3092 is omitted).

Figure 16A:
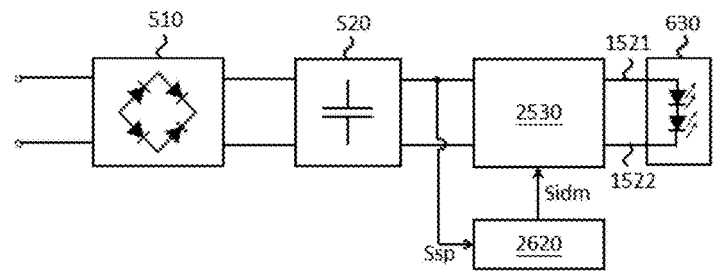
FIG. 16A is a block diagram of an exemplary power supply module in an LED tube lamp according to some exemplary embodiments.

FIG. 16A is a block diagram of an exemplary power supply module in an LED tube lamp according to some exemplary embodiments. Referring to FIG. 16A, the LED tube lamp includes a rectifying circuit 510, a filtering circuit 520 and a driving circuit 2530. Compared with the embodiment of FIG. 12A, the LED tube lamp of the present embodiment further includes a detection circuit 2620. The connection between the rectifying circuit 510, the filtering circuit 520, the driving circuit 2530 and the LED module 630 are similar to the embodiment illustrated in FIG. 12A, and thus is not described in detail herein. The detection circuit 2620 has an input terminal coupled to the power loop of the LED tube lamp and an output terminal coupled to the driving circuit 2530.

Specifically, after the LED tube lamp is powered up (no matter whether or not the LED tube lamp is correctly installed on the lamp socket), the driving circuit 2530 enters an installation detection mode. Under the installation detection mode, the driving circuit 2530 provides a lighting control signal having narrow pulse (e.g., the pulse-on time is smaller than 1 ms) for driving the power switch (not shown), so that the driving current, generated under the installation detection mode, is smaller than 5 MIU or 5 mA. On the other hand, under the installation detection mode, the detection circuit 2620 detects an electrical signal on the power loop/detection path and generates an installation detection signal Sidm, in which the installation detection signal Sidm is transmitted to the driving circuit. The driving circuit 2530 determines whether to enter a normal driving mode according to the received installation detection signal Sidm. If the driving circuit 2530 determines to maintain in the installation detection mode, which means the LED tube lamp is not correctly installed on the lamp socket during the first pulse, the next pulse is output, according to a frequency setting, for temporarily conducting the power loop/detection path, so that the electrical signal on the power loop/detection path can be detected by the detection circuit 2620 again. On the contrary, if the driving circuit 2530 determines to enter the normal driving mode, the driving circuit 2530 generates, according to at least one of the input voltage, the output voltage, the input current, the output current and the combination of the above, the lighting control signal capable of modulating the pulse width for maintaining the brightness of the LED module 630. In the present embodiment, the input/output voltage and the input/output current can be sampled by a feedback circuit (not shown) in the driving circuit 2530.

Figure 16B:
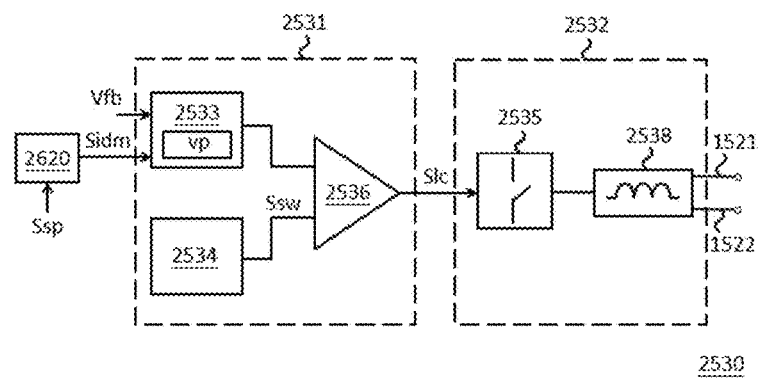
FIG. 16B is a schematic diagram of an exemplary driving circuit according to some exemplary embodiments.

FIG. 16B is a schematic diagram of an exemplary driving circuit according to some exemplary embodiments. Referring to FIG. 16B, the driving circuit 2530 includes a controller 2531 and a conversion circuit 2532. The controller 2531 includes a signal receiving unit 2533, a sawtooth wave generating unit 2534 and a comparison unit 2536, and the conversion circuit 2532 includes a switch circuit (also known as power switch) 2535 and energy release circuit 2538. The signal receiving unit 2533 has input terminals for receiving a feedback signal Vfb and installation detection signal Sidm and an output terminal coupled to a first input terminal of the comparison unit 2536. The sawtooth wave generating unit 2534 has an output terminal coupled to a second input terminal of the comparison unit 2536. An output terminal of the comparison unit 2536 is coupled to a control terminal of the switch circuit 2535. The circuit arrangement of the switch circuit 2535 and the energy release circuit 2538 can be referred to with respect to the embodiments of FIGS. 12A, 12B, 12G-12J, and it will not be repeated herein.

In the controller 2531, the signal receiving unit 2533 can be implemented by, for example, a circuit constituted by an error amplifier. The error amplifier is configured to receive the feedback signal Vfb related to the voltage/current information of the power supply module and the installation detection module Sidm. In the present embodiment, the signal receiving unit 2533 selectively outputs a preset voltage Vp or the feedback signal Vfb to the first input terminal of the comparison unit 2536. The sawtooth wave generating unit 2534 is configured to generate and provide a sawtooth signal Ssw to the second input terminal of the comparison unit 2536. In the waveform of the sawtooth signal Ssw of each cycle, the slope of at least one of the rising edge and the falling edge is not infinity. In some embodiments, the sawtooth wave generating unit 2534 generates the sawtooth signal Ssw, according to a fixed operation frequency, no matter what the operation mode of the driving circuit 2530 is. In some embodiments, the sawtooth wave generating unit 2534 generates the sawtooth signal Ssw according to different operation frequencies when operating in different operation modes. For example, the sawtooth wave generating unit 2534 can change the operation frequency according to the installation detection signal Sidm. The comparison unit 2536 compares the signal level of the signal on the first and the second input terminal, in which the comparison unit 2536 outputs the lighting control signal Slc with high voltage level when the signal level on the first input terminal is greater than the second input terminal and outputs the lighting control signal Slc with low voltage level when the signal level on the first input terminal is not greater than the second input terminal. For example, the comparison unit 2536 outputs high voltage when the signal level of the sawtooth signal Ssw is greater than the preset voltage Vp or the feedback signal Vfb, so as to generate the lighting control signal having pulse waveform.

Figure 17C:
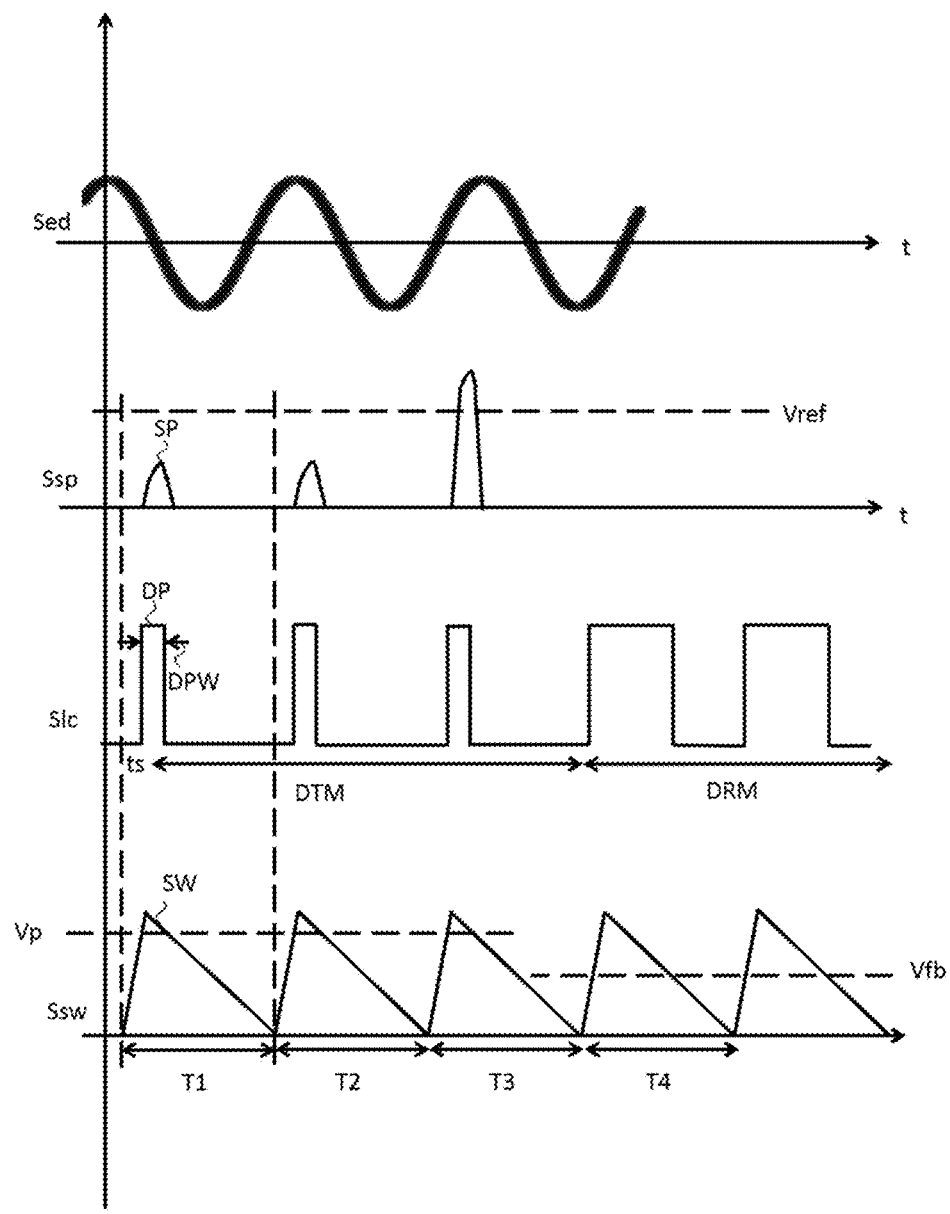

FIG. 17C is a signal waveform diagram of an exemplary power supply module according to an exemplary embodiment. Referring to FIGS. 16B and 17C, when the LED tube lamp is powered up (including the pins on the both end caps being connected to the connecting sockets, or the pins on one end cap being connected to the corresponding connecting socket and the pins on the other end cap being touched by the user), the driving circuit 2530 starts to operate and enter the installation detection mode DTM. The operation in the first period T1 is described below. Under the installation detection mode, the signal receiving unit 2533 outputs the preset voltage Vp to the first input terminal of the comparison unit 2536, and the sawtooth wave generating unit 2534 provides the sawtooth signal SW to the second input terminal of the comparison unit 2536. From the perspective of the variation of the sawtooth wave SW, the signal level of the sawtooth wave SW gradually increases, after the start timepoint ts, from the initial level to a peak level. Aftering reaching the peak level, the sawtooth wave SW is gradually decreased to the initial level. Before the signal level of the sawtooth wave SW rises to the preset voltage Vp, the comparison unit 2536 outputs the lighting control signal Slc with low voltage. During the period from the timepoint of the signal level rising to exceed the preset voltage Vp to the timepoint falling back below the preset voltage Vp, the comparison unit 2536 pulls the signal level up to the high voltage. After the signal level falling to lower than the preset voltage Vp, the comparison unit 2536 pulls the signal level down to the low voltage again. By performing the above operation, the comparison unit 2536 can generate the pulse DP based on the sawtooth wave SW and the preset voltage Vp, in which the pulse width/pulse-on time DPW of the pulse DP is the duration that the signal level of the sawtooth wave SW is higher than the preset voltage Vp.

The lighting control signal Slc having the pulse DP is transmitted to the control terminal of the switch circuit 2535, so that the switch circuit 2535 is turned on during the pulse-on time DPW. Therefore, the energy release unit 2538 absorbs power and a current is generated on the power loop/detection path in response to the switch circuit being turned on. Since the current generated on the power loop/detection path leads to a signal feature, such as signal level, waveform, and/or frequency changing, the signal feature variation of the sample signal Ssp will be detected by the detection circuit 2620. In the present embodiment, the detection circuit 2620 detects the voltage for example, but the invention is not limited thereto. Under the first period T1, since the voltage variation SP does not exceed the reference voltage Vref, the detection circuit 2620 output the corresponding installation detection signal Sidm to the signal receiving unit 2533, so that the signal receiving unit 2533 is maintained in the installation detection mode DTM and continuously outputs the preset voltage Vp to the comparison unit 2536. Since the voltage variation of the sample signal Ssp under the second period T2 is similar to the sample signal Ssp under the first period T1, the circuit operation under the first and the second periods T1 and T2 are similar, so that the detailed description is not repeated herein.

Conclusively, under the first and the second periods T1 and T2, the LED tube lamp is determined to be not correctly installed. In addition, during the first and the second periods T1 and T2, although the driving circuit 2530 generates the driving current on the power loop, the current value of the driving current does not cause electric shock to the human body because of the turn-on time of the switch circuit 2535 is relatively short, in which the current value is smaller than 5 MIU/mA and can be reduced to 0.

After entering the third period T3, the detection circuit 2620 determines the voltage variation of the sample signal Ssp exceeds the reference voltage Vref, so as to provide the corresponding installation detection signal Sidm, indicating the LED tube lamp is correctly installed, to the signal receiving unit 2533. When the signal receiving unit 2533 receives the installation detection signal Sidm indicating the correct installation state, the driving circuit 2530 enters, after the end of the third period T3, the normal driving mode DRM from the installation detection mode DTM. Under the fourth period T4 of the normal driving mode DRM, the signal receiving unit 2533 generates the corresponding signal to the comparison unit 2536 according to the feedback signal Vfb instead of the preset voltage Vp, so that the comparison unit 2536 is capable of dynamically modulating the pulse-on time of the lighting control signal Slc according to the driving information such as the input voltage, the output voltage and/or the driving current. From the perspective of the signal waveform of the lighting control signal Sc, since the pulse DP is configured to detect the installation state/risk of electric shock, the pulse width of the pulse DP is relatively narrow, compared to the pulse width under the normal driving mode DRM. For example, the pulse width of the pulse under the installation detection mode DTM (e.g., DP) is less than the minimum pulse width under the normal driving mode DRM.

In some embodiments, the detection circuit 2620 stops operating under the normal driving mode DRM. In some embodiments, under the normal driving mode DRM, the signal receiving unit 2533 ignores the installation detection signal Sidm regardless of whether the detection circuit 2620 continuously operates.

In summary, comparing the power supply module illustrated in FIGS. 16A and 16B to the power supply module described above, one difference is that circuits for implementing the installation detection function and the electric shock protection function are integrated into the driving circuit, so that the driving circuit becomes the driving circuit having the installation detection function and the electric shock protection function. Specifically, for the circuit structure, only an additional detection circuit (2620), for detecting the electrical signal on the power loop/detection path, is used to implement the installation detection function and the electric shock protection function with the driving circuit 2530. Since the detection pulse generating module, the detection result latching circuit, the detection determining circuit and the switch circuit are not required, the cost of the overall power supply module can be effectively reduced. In addition, since the circuit components/elements are reduced, the power supply module may have more area for layout and the power consumption can be reduced. The saved power can be used for driving the LED module so as to enhance the luminous efficiency, and the heat caused by the power supply module can be reduced as well.

Figure 16C:
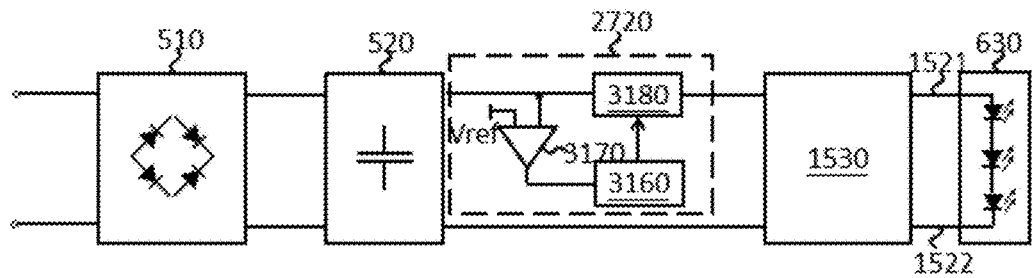
FIGS. 16C-16D are block diagrams of exemplary power supply modules according to some exemplary embodiments.

FIG. 16C is a block diagram of an exemplary power supply module in an LED tube lamp according to some exemplary embodiments. Referring to FIG. 16C, the installation detection module 2720 has a circuit configuration for continuously detecting the signal on the power loop. The installation detection module 2720 includes the control circuit 3160, the detection determining circuit 3170 and the current limiting circuit 3180. The control circuit 3160 is configured to control the current limiting circuit 3180 according to the detection result generated by the detection determining circuit 3170, so that the current limiting circuit 3180 determines whether to perform the current limiting operation, for limiting the current on the power loop, based on the control of the control circuit 3160. In the present embodiment, the control circuit 3160 is preset to not perform the current limiting operation, which means the current on the power loop is not limited by the current limiting circuit 3180 at the preset state. Therefore, under the preset state, as long as the external AC power source is connected to the LED tube lamp, the input power can be provided to the LED module 630 through the power loop.

The following description describes the operation of detecting the signal on the power loop for example, but the invention is not limited thereto. In detail, when the external AC power source connects to the LED tube lamp, the input power enables the detection determining circuit 3170 for starting to detect the signal on a specific node of the power loop, and the detection result is transmitted to the control circuit 3160. The control circuit 3160 determines whether the conductive part is touched by a user according to at least one signal feature, such as the voltage/current level, the waveform, the frequency and other features, of the detection result signal. When the control circuit 3160 determines the LED tube lamp is touched by a user according to the detection result signal, the control circuit 3160 controls the current limiting circuit 3180 to perform the current limiting operation, so that the current on the power loop is limited to lower than a predetermined value, and therefore the occurrence of electric shock can be prevented/avoided.

Figure 16D:
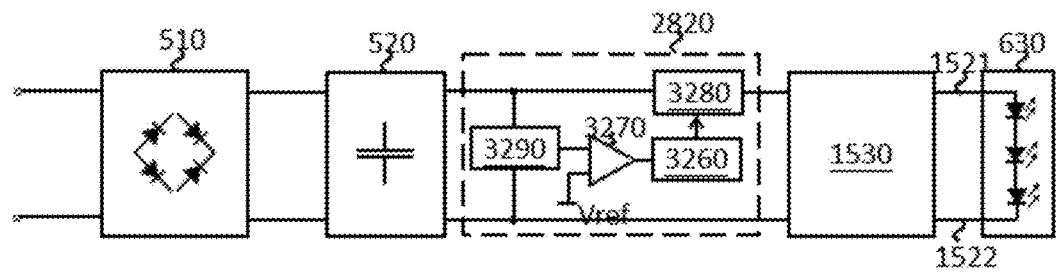

FIG. 16D is a block diagram of an exemplary power supply module in an LED tube lamp according to some exemplary embodiments. Referring to FIG. 16D, the installation detection module 2820 of the present embodiment is substantially the same as the installation detection module 2720. The difference is the installation detection module 2820 has a circuit configuration for continuously detecting the signal on the detection path. The installation detection module 2820 includes a control circuit 3260, a detection determining circuit 3270, a current limiting circuit 3280 and a detection path circuit 3290. The operation of the control circuit 3260, detection determining circuit 3270 and the current limiting circuit 3280 can be referred to in connection with the embodiments of FIG. 16C, and it will not be repeated herein.

The detection path circuit 3290 can be disposed on the input side or the output side of one of the rectifying circuit 510, the filtering circuit 520, the driving circuit 1530 and the LED module 630, and the present invention is not limited thereto. In addition, in the practical application, the detection path circuit 3290 can be implemented by any circuit structure capable of responding the impedance variation caused by the human body. For example, the detection path circuit 3290 can be formed by at least one passive component (e.g., resistor, capacitor, inductor), at least one active component (e.g., MOSFET, silicon controlled rectifier (SCR)) or the combination of the above.

In summary, the power supply modules illustrated in FIGS. 16C and 16D are configured in a continuous detection setting, which refers to the power supply module having a circuit (e.g., the installation detection module 2720/2820) for continuously detecting the installation state or the risk of electric shock. In some embodiments, under the continuous detection setting, the power loop/detection path is preset to be in a conducting state or a non-limiting state, and the current on the power loop would not be limited until the incorrect installation state or the risk of electric shock (the LED tube lamp is touched by a user) is detected.

Some embodiments of the power supply module illustrated in FIGS. 15A to 15X are configured in a pulse detection setting, which refers to the power supply module having a circuit (e.g., the installation detection module 2520 and the detection circuit 2620) for detecting the installation state or the risk of electric shock in certain duration (e.g., the pulse-on time). For example, under the pulse detection setting, the power loop/detection path is preset to be in a non-conducting state or a current limiting state. Before confirming the installation state or the risk of electric shock, the power loop/detection path is only turned on when the pulse-on time occurs. In addition, the current on the power would be limited until the correct installation state or no risk of electric shock (the LED tube lamp is not touched by a user) is detected. From the perspective of the current limiting circuit such as the switch circuit 2580, 2780, 2880, 2960 or 3080, the current limiting circuit being disabled refers to the current limiting circuit not limiting the current on the power loop, which causes the power loop to be in the conducting state or the non-limiting state. On the other hand, the current limiting circuit being enabled refers to the current limiting circuit limiting the current on the power loop, which causes the power loop to be in the non-conducting state or the current limiting state.

In some embodiments, the continuous detection setting can be independently used for implementing the installation detection and the electric shock protection mechanism.

In some embodiments, the continuous detection setting and the pulse detection setting can be used together for implementing the installation detection and the electric shock protection mechanism. For example, the LED tube lamp can utilize the pulse detection setting before the LED module is lighted up and can then change to the continuous detection setting during the LED tube lamp emitting light.

From the perspective of the circuit operation, the switching of the pulse detection setting and the continuous detection setting can be determined based on the current on the power loop. For example, when the current on the power loop is smaller than the predetermined value (e.g., 5 MIU), the installation detection module enables the pulse detection setting. If the current on the power loop is detected to be greater than the predetermined value, the installation detection module changes to enable the continuous detection setting. From the perspective of the operation and the installation of the LED tube lamp, the installation detection module is preset to enable the pulse detection setting, so that the installation detection module utilizes the pulse detection setting for detecting the installation state (or the risk of electric shock) and performing the electric shock protection when the LED tube lamp is powered up. As long as the correct installation state is detected, the installation detection module changes to utilize the continuous detection setting for detecting whether the conductive part of the LED tube lamp is touched by a user during the LED tube lamp emitting light. In addition, the installation detection module will be reset to the pulse detection setting if the LED tube lamp is powered off.

Although the modules/circuits are named by their functionality in the embodiments described in the present disclosure, it should be understood by those skilled in the art that the same circuit component may be considered to have different functions based on the circuit design. That is, different modules/circuits may share the same circuit component to implement their respective circuit functions. Thus, the functional naming of the present disclosure is not intended to limit a particular unit, circuit, or module to particular circuit components.

To summarize, the embodiments illustrated in FIG. 15A to FIG. 15X teach a concept of electric shock protection by utilizing electrical control and detection method. Compared to mechanical electric shock protection (i.e., using the mechanical structure interaction/shifting for implementing the electric shock protection), the electrical electric shock protection has higher reliability and durability since the mechanical fatigue issue may not occur in the electrical installation detection module.

In some embodiments, the power supply module can be divided into two sub-modules, in which the two sub-modules are respectively disposed in the different end caps and the sum of power of the sub-modules equals to the predetermined output power of the power supply module.

According to some embodiments, the present invention further provides a detection method adopted by a light-emitting diode (LED) tube lamp for preventing a user from electric shock when the LED tube lamp is being installed on a lamp socket. The detection method includes: generating a first pulse signal by a detection pulse generating module, wherein the detection pulse generating module is configured in the LED tube lamp; receiving the first pulse signal through a detection result latching circuit by a switch circuit, and making the switch circuit conducting during the first pulse signal to cause a power loop of the LED tube lamp to be conducting, wherein the switch circuit is on the power loop; and detecting a first sample signal on the power loop by a detection determining circuit as the power loop being conductive, and comparing the first sample signal with a predefined signal, wherein when the first sample signal is greater than or equal to the predefined signal, the detection method further includes: outputting a first high level signal by the detection determining circuit; receiving the first high level signal by the detection result latching circuit and outputting a second high level signal; and receiving the second high level signal by the switch circuit and conducting to cause the power loop to remain conductive.

In some embodiments, when the first sample signal is smaller than the predefined signal, the detection method further includes: outputting a first low level signal by the detection determining circuit; receiving the first low level signal by the detection result latching circuit and outputting a second low level signal; and receiving the second low level signal by the switch circuit and maintaining an off state of the switch circuit to cause the power loop to remain open.

In some embodiments, when the power loop remains open, the detection method further includes: generating a second pulse signal by the detection pulse generating module; receiving the second pulse signal through the detection result latching circuit by the switch circuit, and changing an off state of the switch circuit to a conducting state again during the second pulse signal to cause the power loop to be conducting once more; and detecting a second sample signal on the power loop by the detection determining circuit as the power loop being conductive once more, and comparing the second sample signal with the predefined signal, wherein when the second sample signal is greater than or equal to the predefined signal, the detection method further includes: outputting the first high level signal by the detection determining circuit; receiving the first high level signal by the detection result latching circuit and outputting the second high level signal; and receiving the second high level signal by the switch circuit and maintaining a conducting state of the switch circuit to cause the power loop to remain conducting.

In some embodiments, when the second sample signal is smaller than the predefined signal, the detection method further includes: outputting the first low level signal by the detection determining circuit; receiving the first low level signal by the detection result latching circuit and outputting the second low level signal; and receiving the second low level signal by the switch circuit and maintaining an off state of the switch circuit to cause the power loop to remain open.

In some embodiments, a period (or a width) of the first pulse signal is between 10 microseconds-1 millisecond, a period (or a width) of the second pulse signal is between 10 microseconds-1 millisecond.

In some embodiments, a time interval between the first and the second pulse signals (or a cycle of the pulse signal) includes $(X+Y)(T/2)$, where T is the cycle of the driving signal, X is an integer which is bigger than or equal to zero, $0<Y<1$.

In some embodiments, a period (or a width) of the first pulse signal is between 1 microsecond-100 microseconds, a period (or a width) of the second pulse signal is between 1 microsecond-100 microseconds.

In some embodiments, a time interval between the first and the second pulse signals (or a cycle of the pulse signal) is between 3 milliseconds-500 milliseconds.

In some embodiments, a protection device is electrically connected between the power supply module and the pins on the end caps. For example, a rated current fuse or a resistance type fuse (e.g., pico fuse) may be used.

In some embodiments, at least two protection elements, such as two fuses, are respectively connected between the internal circuits of the LED tube lamp and the conductive pins of the LED tube lamp, and which are on the power loop of the LED tube lamp. In some embodiments, four fuses are used for an LED tube lamp having power-supplied at its both end caps respectively having two conductive pins. In this case, for example, two fuses are respectively connected between two conductive pins of one end cap and between one of the two conductive pins of this end cap and the internal circuits of the LED tube lamp; and the other two fuses are respectively connected between two conductive pins of the other end cap and between one of the two conductive pins of the other end cap and the internal circuits of the LED tube lamp. In some embodiment, the capacitance between a power supply (or an external driving source) and the rectifying circuit of the LED tube lamp may be ranging from 0 to about 100 pF. In some embodiments, the above-mentioned installation detection module may be configured to use an external power supply.

According to the design of the power supply module, the external driving signal may be a low frequency AC signal (e.g., commercial power), a high frequency AC signal (e.g., that provided by an electronic ballast), or a DC signal (e.g., that provided by a battery or external configured driving source), input into the LED tube lamp through a drive architecture of dual-end power supply. For the drive architecture of dual-end power supply, the external driving signal may be input by using only one end thereof as single-end power supply.

The LED tube lamp may omit the rectifying circuit in the power supply module when the external driving signal is a DC signal.

According to the design of the rectifying circuit in the power supply module, there may be a dual rectifying circuit. First and second rectifying circuits of the dual rectifying circuit are respectively coupled to the two end caps disposed on two ends of the LED tube lamp. The dual rectifying circuit is applicable to the drive architecture of dual-end power supply. Furthermore, the LED tube lamp having at least one rectifying circuit is applicable to the drive architecture of a low frequency AC signal, high frequency AC signal or DC signal.

The dual rectifying circuit may comprise, for example, two half-wave rectifier circuits, two full-wave bridge rectifying circuits or one half-wave rectifier circuit and one full-wave bridge rectifying circuit.

According to the design of the pin in the LED tube lamp, there may be two pins in single end (the other end has no pin), two pins in corresponding ends of two ends, or four pins in corresponding ends of two ends. The designs of two pins in single end and two pins in corresponding ends of two ends are applicable to a single rectifying circuit design of the rectifying circuit. The design of four pins in corresponding ends of two ends is applicable to a dual rectifying circuit design of the rectifying circuit, and the external driving signal can be received by two pins in only one end or any pin in each of two ends.

According to the design of the filtering circuit of the power supply module, there may be a single capacitor, or $\pi$ filter circuit. The filtering circuit filers the high frequency component of the rectified signal for providing a DC signal with a low ripple voltage as the filtered signal. The filtering circuit also further comprises the LC filtering circuit having a high impedance for a specific frequency for conforming to current limitations in specific frequencies of the UL standard. Moreover, the filtering circuit according to some embodiments further comprises a filtering unit coupled between a rectifying circuit and the pin(s) for reducing the EMI resulted from the circuit(s) of the LED tube lamp. The LED tube lamp may omit the filtering circuit in the power supply module when the external driving signal is a DC signal.

According to the design of the LED lighting module in some embodiments, the LED lighting module may comprise the LED module and the driving circuit or only the LED module. The LED module may be connected with a voltage stabilization circuit in parallel for preventing the LED module from over voltage. The voltage stabilization circuit may be a voltage clamping circuit, such as Zener diode, DIAC and so on. When the rectifying circuit has a capacitive circuit, in some embodiments, two capacitors are respectively coupled between two corresponding pins in two end caps and so the two capacitors and the capacitive circuit as a voltage stabilization circuit perform a capacitive voltage divider.

If there are only the LED module in the LED lighting module and the external driving signal is a high frequency AC signal, a capacitive circuit (e.g., having at least one capacitor) is in at least one rectifying circuit and the capacitive circuit is connected in series with a half-wave rectifier circuit or a full-wave bridge rectifying circuit of the rectifying circuit and serves as a current modulation circuit (or a current regulator) to modulate or to regulate the current of the LED module due to that the capacitor equates a resistor for a high frequency signal. Thereby, even different ballasts provide high frequency signals with different voltage logic levels, the current of the LED module can be modulated into a defined current range for preventing overcurrent. In addition, an energy-releasing circuit is connected in parallel with the LED module. When the external driving signal is no longer supplied, the energy-releasing circuit releases the energy stored in the filtering circuit to lower a resonance effect of the filtering circuit and other circuits for restraining the flicker of the LED module. In some embodiments, if there are the LED module and the driving circuit in the LED lighting module, the driving circuit may be a buck converter, a boost converter, or a buck-boost converter. The driving circuit stabilizes the current of the LED module at a defined current value, and the defined current value may be modulated based on the external driving signal. For example, the defined current value may be increased with the increasing of the logic level of the external driving signal and reduced with the reducing of the logic level of the external driving signal. Moreover, a mode switching circuit may be added between the LED module and the driving circuit for switching the current from the filtering circuit directly or through the driving circuit inputting into the LED module.

A protection circuit may be additionally added to protect the LED module. The protection circuit detects the current and/or the voltage of the LED module to determine whether to enable corresponding over current and/or over voltage protection.

According to the design of the auxiliary power module of the power supply module, the energy storage unit may be a battery (e.g., lithium battery, graphene battery) or a supercapacitor, connected in parallel with the LED module. The auxiliary power module is applicable to the LED lighting module having the driving circuit.

According to the design of the LED module of the power supply module, the LED module comprises plural strings of LEDs connected in parallel with each other, wherein each LED may have a single LED chip or plural LED chips emitting different spectrums. Each LEDs in different LED strings may be connected with each other to form a mesh connection.

In other words, the abovementioned features can be implemented in any combination to improve the LED tube lamp.

The above-mentioned exemplary features of the present invention can be accomplished in any combination to improve the LED tube lamp, and the above embodiments are described by way of example only. The present invention is not herein limited, and many variations are possible without departing from the spirit of the present invention and the scope as defined in the appended claims.

What is claimed is:

1. A ballast-bypass light-emitting diode (LED) tube lamp having at least a first and second external connection terminal each connected to an opposite side of the ballast by-pass LED tube lamp, comprising:
    an LED module, configured to emit light in response to a lamp driving signal; and
    a power supply module, electrically connected to the first and second external connection terminals for receiving an external driving signal, and configured to supply the lamp driving signal according to the external driving signal, wherein the external driving signal has a frequency substantially equal to 50 Hz or 60 Hz; and
    wherein the power supply module has a first current path electrically connected to the LED module so as to form a power loop, and the power supply module comprises:
        an electric shock detection circuit, configured to form a second current path for detecting whether an external impedance is electrically connected to the ballast-bypass LED tube lamp,
        wherein when the external impedance is not connected, the electric shock detection circuit cuts off the second current path.

2. The ballast-bypass LED tube lamp according to claim 1, wherein the electric shock detection circuit controls a conduction state of the second current path during detecting whether the external impedance is electrically connected to the ballast-bypass LED tube lamp, so as to cause a discontinuous current being generated on the power loop.

3. The ballast-bypass LED tube lamp according to claim 1, wherein the power supply module further comprises a rectifying circuit, a filtering circuit, and a driving circuit, which are electrically connected in sequence via the first current path, and the electric shock detection circuit comprises:
    a detection path circuit, configured to form the second current path between a ground terminal and an input side of one of the rectifying circuit, the filtering circuit, and the driving circuit, and determine whether to conduct a current passing through the second current path.

4. The ballast-bypass LED tube lamp according to claim 3, wherein the electric shock detection circuit further comprises:
    a pulse generating circuit, electrically connected to the detection path circuit, and configured to generate a detection control signal having pulse waveform, so as to cause a discontinuous current on the power loop.

5. The ballast-bypass LED tube lamp according to claim 4, wherein a pulse period of the discontinuous current is between 10 μs and 1 ms.

6. The ballast-bypass LED tube lamp according to claim 3, wherein the electric shock detection circuit further comprises:
    a detection determining circuit, electrically connected to the detection path circuit, and configured to detect a signal which reflects size of the current passing through the second current path and to output a detection result indicating whether the external impedance is detected.

7. The ballast-bypass LED tube lamp according to claim 6, wherein the driving circuit is disabled from generating the lamp driving signal when the detection result indicates the external impedance is detected.

8. The ballast-bypass LED tube lamp according to claim 3, wherein the input side has two input terminals, and the detection path circuit comprises:
   at least one resistor, having a first end and a second end and electrically connected to either the input side or the ground terminal; and
   a transistor, having a first terminal, a second terminal electrically connected to the first end of the resistor, and a control terminal for receiving a detection control signal, wherein when the first terminal of the transistor is electrically connected to the ground terminal, the second end of the resistor is electrically connected to the input side;
   wherein when the first terminal of the transistor is electrically connected to the input side, the second end of the resistor is electrically connected to the ground terminal; and
   wherein the transistor and the resistor form the second current path.

9. The ballast-bypass LED tube lamp according to claim 3, wherein the second current path is formed between the ground terminal and an input terminal of the rectifying circuit.

10. The ballast-bypass LED tube lamp according to claim 3, wherein the second current path is formed between the ground terminal and an input terminal of the filtering circuit.

11. The ballast-bypass LED tube lamp according to claim 3, wherein the second current path is formed between the ground terminal and an input terminal of the driving circuit.

12. The ballast-bypass LED tube lamp according to claim 1, wherein a number of electronic elements disposed on the second current path is less than a number of electronic elements disposed on the first current path.

13. A ballast-bypass light-emitting diode (LED) tube lamp, comprising:
   a lamp tube;
   two end caps, respectively disposed on opposite sides of the lamp tube, wherein each end cap has an external connection terminal for receiving an external driving signal having a frequency substantially equal to 50 Hz or 60 Hz;
   an LED module, configured to emit light in response to a lamp driving signal; and
   a power supply module, electrically connected to the external connection terminals and the LED module, wherein the power supply module comprises:
      a rectifying circuit, having an input side electrically connected to the external connection terminals, and configured to generate a rectified signal as a basis of generating the lamp driving signal; and
      an electric shock detection circuit, configured to form a detection current path between the input side of the rectifying circuit and a ground terminal, for detecting whether an external impedance is electrically connected to the ballast-bypass LED tube lamp.

14. The ballast-bypass LED tube lamp according to claim 13, wherein the electric shock detection circuit controls a conduction state of the detection current path during detecting whether the external impedance is electrically connected to the ballast-bypass LED tube lamp, so as to cause a discontinuous current being generated in the power supply module.

15. The ballast-bypass LED tube lamp according to claim 13, wherein when the external impedance is not detected, the electric shock detection circuit cuts off the detection current path.

16. The ballast-bypass LED tube lamp according to claim 13, wherein the electric shock detection circuit comprises:
   a detection path circuit, configured to form the detection current path and configured to determine, according to a detection control signal, whether to conduct a current passing through the detection current path.

17. The ballast-bypass LED tube lamp according to claim 16, wherein the electric shock detection circuit further comprises:
   a pulse generating circuit, electrically connected to the detection path circuit, and configured to generate the detection control signal having a pulse waveform, so as to cause a discontinuous current in the power supply module.

18. The ballast-bypass LED tube lamp according to claim 17, wherein a pulse period of the discontinuous current is between 10 μs to 1 ms.

19. The ballast-bypass LED tube lamp according to claim 16, wherein the electric shock detection circuit further comprises:
   a detection determining circuit, electrically connected to the detection path circuit, and configured to detect a signal which reflects a size of the current passing through the detection current path and to output a detection result indicating whether the external impedance is detected.

20. The ballast-bypass LED tube lamp according to claim 19, wherein the power supply module further comprises:
   a filtering circuit, electrically connected to the rectifying circuit for receiving the rectified signal, and configured to generate a filtered signal based on the rectified signal; and
   a driving circuit, electrically connected to the filtering circuit for receiving the filtered signal, wherein the driving circuit comprises:
      a controller, configured to generate a lighting control signal;
      a switch circuit, configured to be turned on or off in response to the lighting control signal; and
      an energy storage circuit, configured to be charged or discharged according to the on/off state of the switch circuit, so as to convert the filtered signal into the lamp driving signal,
   wherein the controller is disabled from generating the lighting control signal when the detection result indicates the external impedance is detected.

21. The ballast-bypass LED tube lamp according to claim 16, wherein the detection path circuit comprises:
   at least a first resistor, having a first end and a second end and electrically connected to an input terminal of the rectifying circuit; and
   a transistor, having a first terminal electrically connected to the ground terminal, a second terminal electrically connected to the first end of the first resistor, and a control terminal for receiving the detection control signal,
   wherein the transistor and the first resistor form the detection current path.

22. A ballast-bypass light-emitting diode (LED) tube lamp, comprising:

a lamp tube;

two end caps, respectively disposed on opposite sides of the lamp tube, wherein each end cap has an external connection terminal for receiving an external driving signal having a frequency substantially equal to 50 Hz or 60 Hz;

a rectifying circuit, electrically connected to the external connection terminals for receiving the external driving signal, and configured to generate a rectified signal based on the external driving signal;

a filtering circuit, electrically connected to the rectifying circuit for receiving the rectified signal, and configured to generate a filtered signal based on the rectified signal;

a driving circuit, electrically connected to the filtering circuit for receiving the filtered signal, and configured to convert the filtered signal into a lamp driving signal;

an LED module, electrically connected to the driving circuit for receiving the lamp driving signal, wherein a power loop is formed by a current path passing through the rectifying circuit, the filtering circuit, the driving circuit and the LED module; and an electric shock detection circuit, configured to detect whether an external impedance is electrically connected to the ballast-bypass LED tube lamp, wherein when the external impedance is detected, the electric shock detection circuit disables the driving circuit from converting the filtered signal, so as to limit a current from conducting on the power loop.

23. The ballast-bypass LED tube lamp according to claim 22, wherein the driving circuit comprises:

a controller, configured to generate a lighting control signal;

a switch circuit, configured to be turned on or off in response to the lighting control signal; and an energy storage circuit, configured to be charged or discharged according to the on/off state of the switch circuit, so as to convert the filtered signal into the lamp driving signal, wherein the controller is disabled from generating the lighting control signal when the external impedance is detected.

24. The ballast-bypass LED tube lamp according to claim 22, wherein the electric shock detection circuit forms a detection current path that performs current detection and controls a conduction state of the detection current path during the current detection, so as to cause a discontinuous current being generated on the power loop.

25. The ballast-bypass LED tube lamp according to claim 24, wherein when the external impedance is not detected, the electric shock detection circuit cuts off the detection current path.

26. The ballast-bypass LED tube lamp according to claim 24, wherein a number of electronic elements disposed on the detection current path is less than a number of electronic elements disposed on the power loop.

27. The ballast-bypass LED tube lamp according to claim 24, wherein the electric shock detection circuit comprises:

a detection path circuit, configured to form the detection current path between a ground terminal and an input side of one of the rectifying circuit, the filtering circuit, and the driving circuit, and configured to determine, according to a detection control signal, whether to conduct a current passing through the detection current path.

28. The ballast-bypass LED tube lamp according to claim 27, wherein the detection path circuit comprises:

at least one resistor, having a first end and a second end and electrically connected to the input side or the ground terminal; and a transistor, having a first terminal, a second terminal electrically connected to the first end of the resistor, and a control terminal for receiving the detection control signal, wherein when the first terminal of the transistor is electrically connected to the ground terminal, the second end of the resistor is electrically connected to the input side;

wherein when the first terminal of the transistor is electrically connected to the input side, the second end of the resistor is electrically connected to the ground terminal; and wherein the transistor and the resistor form the detection current path.

29. The ballast-bypass LED tube lamp according to claim 27, wherein the electric shock detection circuit further comprises:

a pulse generating circuit, electrically connected to the detection path circuit, and configured to generate the detection control signal having pulse waveform, wherein a pulse period of the detection control signal is between 10 μs to 1 ms.

30. The ballast-bypass LED tube lamp according to claim 27, wherein the electric shock detection circuit further comprises:

a detection determining circuit, electrically connected to the detection path circuit, and configured to detect a signal which reflects size of the current passing through the detection current path and to output a detection result indicating whether the external impedance is detected.

31. The ballast-bypass LED tube lamp according to claim 27, wherein the detection current path is formed between the ground terminal and an input terminal of the rectifying circuit.

32. The ballast-bypass LED tube lamp according to claim 27, wherein the detection current path is formed between the ground terminal and an input terminal of the filtering circuit.

33. The ballast-bypass LED tube lamp according to claim 27, wherein the detection current path is formed between the ground terminal and an input terminal of the driving circuit.

* * * * *